US011248009B2

(12) United States Patent
Hatakeyama et al.

(10) Patent No.: US 11,248,009 B2
(45) Date of Patent: Feb. 15, 2022

(54) POLYCYCLIC AROMATIC COMPOUND, MATERIAL FOR AN ORGANIC DEVICE, ORGANIC ELECTROLUMINESCENT ELEMENT, DISPLAY APPARATUS AND LIGHTING APPARATUS

(71) Applicants: Kwansei Gakuin Educational Foundation, Nishinomiya (JP); SK Materials JNC Co., Ltd., Gyeonggi-do (KR)

(72) Inventors: Takuji Hatakeyama, Hyogo (JP); Hiroyuki Imai, Chiba (JP); Yuko Yamaga, Tokyo (JP); Daisuke Inoue, Chiba (JP); Akio Tajima, Tokyo (JP)

(73) Assignees: Kwansei Gakuin Educational Foundation, Hyogo (JP); SK Materials JNC Co., Ltd., Gyeonggi-do (KR)

( * ) Notice: Subject to any disclaimer, the term of this patent is extended or adjusted under 35 U.S.C. 154(b) by 229 days.

(21) Appl. No.: 16/724,228

(22) Filed: Dec. 21, 2019

(65) Prior Publication Data

US 2020/0207787 A1 Jul. 2, 2020

(30) Foreign Application Priority Data

Dec. 27, 2018 (JP) ............................ JP2018-243976
Dec. 19, 2019 (JP) ............................ JP2019-229310

(51) Int. Cl.
*H01L 51/50* (2006.01)
*C07F 5/02* (2006.01)
*H01L 51/00* (2006.01)

(52) U.S. Cl.
CPC .............. *C07F 5/02* (2013.01); *H01L 51/008* (2013.01); *H01L 51/5012* (2013.01); *H01L 51/5072* (2013.01); *H01L 51/5092* (2013.01)

(58) Field of Classification Search
CPC .................................. H01L 51/50; C07F 5/02
See application file for complete search history.

(56) References Cited

U.S. PATENT DOCUMENTS 8,304,096 B2 * 11/2012 Watanabe ............ C07C 211/61 428/690
2007/0106103 A1 5/2007 Ikeda et al.
2015/0097162 A1 * 4/2015 Ono ...................... H01L 51/008 257/40

FOREIGN PATENT DOCUMENTS

EP 3109253 A1 12/2016
JP 2001-172232 A 6/2001
JP 2005-170911 A 6/2005
WO WO 2004/061047 A2 7/2004
WO WO 2015/102118 A1 7/2015

* cited by examiner

*Primary Examiner* — Dung A. Le
(74) *Attorney, Agent, or Firm* — Foley & Lardner LLP

(57) ABSTRACT

A polycyclic aromatic compound in which a plurality of aromatic rings are connected by a boron atom and an oxygen atom, a sulfur atom or a selenium atom and substituted by a specific aryl such as anthracene, is useful as a material for an organic device. By the polycyclic aromatic compound, an organic EL device having at least one of efficiency and device life can be provided.

16 Claims, 1 Drawing Sheet

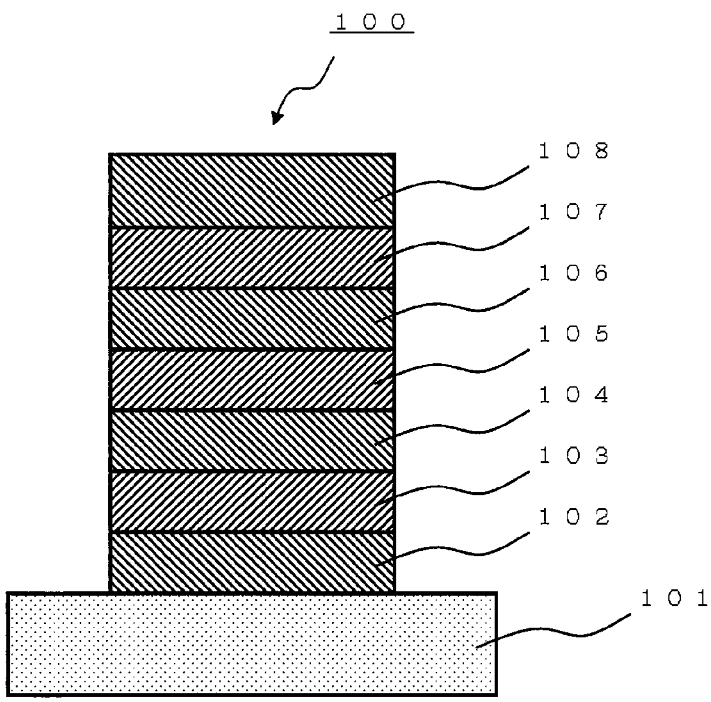
100
108
107
106
105
104
103
102
101

POLYCYCLIC AROMATIC COMPOUND, MATERIAL FOR AN ORGANIC DEVICE, ORGANIC ELECTROLUMINESCENT ELEMENT, DISPLAY APPARATUS AND LIGHTING APPARATUS

CROSS REFERENCE TO RELATED APPLICATIONS

The present invention claims the benefit of priority to Japanese Patent Applications No. JP2018-243976 filed on Dec. 27, 2018 and JP2019-229310 filed on Dec. 19, 2019 with the Japanese Patent Office, the entire contents of which are incorporated herein by reference in their entirety.

TECHNICAL FIELD

The present invention relates to a polycyclic aromatic compound, a material for an organic device, an organic electroluminescent element, as well as a display apparatus and a lighting apparatus.

BACKGROUND ART

Conventionally, a display apparatus employing a luminescent element that is electroluminescent can be subjected to reduction of power consumption and thickness reduction, and therefore various studies have been conducted thereon. Furthermore, an organic electroluminescent element (hereinafter, referred to as an organic EL element) formed from an organic material has been studied actively because weight reduction or size expansion can be easily achieved. Particularly, active studies have been hitherto conducted on development of an organic material having luminescence characteristics for blue light which is one of the primary colors of light, or the like, and a combination of a plurality of materials having optimum luminescence characteristics, irrespective of whether the organic material is a high molecular weight compound or a low molecular weight compound.

An organic EL element has a structure having a pair of electrodes composed of a positive electrode and a negative electrode, and a single layer or a plurality of layers which are disposed between the pair of electrodes and contain an organic compound. The layer containing an organic compound includes a light emitting layer, a charge transport/injection layer for transporting or injecting charges such as holes or electrons, and the like, and various organic materials suitable for these layers have been developed.

Regarding the materials for light emitting layers, for example, benzofluorene-based compounds and the like have been developed (WO 2004/061047 A). Furthermore, regarding hole transporting materials, for example, triphenylamine-based compounds and the like have been developed (JP 2001-172232 A). Regarding electron transport materials, for example, anthracene-based compounds and the like have been developed (JP 2005-170911 A).

Further, in recent years, a compound in which a plurality of aromatic rings are fused by using boron or the like as the central atom has been reported (WO 2015/102118 A). In WO 2015/102118 A, evaluation of an organic EL element is performed in a case where a compound in which a plurality of aromatic rings are fused is selected as a dopant material for a light emitting layer, and an anthracene-based compound (BH1 on page 442) or the like is particularly selected as a host material in a situation where extremely many materials for host materials have been described, however, a combination other than the above has not been specifically verified, and further, if the combination constituting the light emitting layer is different, the luminescence characteristics are different, and therefore, characteristics obtained from other combinations have not yet been known.

CITATION LIST

Patent Literature

Patent Literature 1: WO 2004/061047 A
Patent Literature 2: JP 2001-172232 A
Patent Literature 3: JP 2005-170911 A
Patent Literature 4: WO 2015/102118 A

SUMMARY OF INVENTION

Technical Problem

As described above, various materials have been developed as materials to be used for an organic EL element, however, in order to further improve the luminescence characteristics, or to increase the option of the material for a light emitting layer, development of a material combination that is different from the conventional material combination has been desired. In particular, it is not known about organic EL characteristics (particularly optimum luminescence characteristics) that is obtained from a combination other than the combination of the specific host and dopant reported in examples of Patent Literature 4.

Solution to Problem

As a result of intensive studies to solve the problems described above, the present inventors have succeeded in manufacturing a polycyclic aromatic compound in which a plurality of aromatic rings are connected by a boron atom, an oxygen atom, a sulfur atom or a selenium atom, have found that by constituting an organic EL element with the arrangement of a light emitting layer containing the compound between a pair of electrodes, an excellent organic EL element (in particular, an organic EL element improved in external quantum efficiency or the like) is obtained, and thus have completed the present invention.

In addition, in the present specification, a chemical structure and a substituent may be represented by the number of carbon atoms, the number of carbon atoms, for example, in a case where a substituent is substituted by a chemical structure, or in a case where a substituent is further substituted by a substituent means the number of carbon atoms of the chemical structure and each of the substituents, and does not mean the total number of carbon atoms of the chemical structure and the substituent, or the total number of carbon atoms of the substituent and the substituent. For example, the expression "a substituent B having Y carbon atoms substituted by a substituent A having X carbon atoms" means that "a substituent B having Y carbon atoms" is substituted by "a substituent A having X carbon atoms", and the number Y of carbon atoms is not the total number of carbon atoms of the substituent A and the substituent B. Further, for example, the expression "a substituent B having Y carbon atoms substituted by a substituent A" means that "a substituent B having Y carbon atoms" is substituted by "a substituent A (having not limited number of carbon atoms)", and the number Y of carbon atoms is not the total number of carbon atoms of the substituent A and the substituent B.

Item 1: A polycyclic aromatic compound represented by the following general formula (1).

(1)

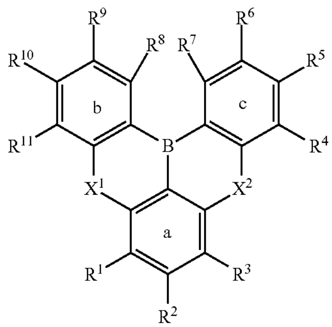

wherein in the above formula (1), $X^1$ and $X^2$ each independently represent >O, >S or >Se, $R^1$ to $R^{11}$ each independently represent a hydrogen atom, an alkyl, a cycloalkyl, or an aryl that may be substituted by an alkyl or a cycloalkyl, adjacent groups among $R^1$ to $R^{11}$ may be bonded to each other to form an aryl ring together with ring a, ring b, or ring c, at least one hydrogen atom in the formed aryl ring may be substituted by an alkyl, a cycloalkyl, or an aryl that may be substituted by an alkyl or a cycloalkyl, and at least one of $R^1$ to $R^{11}$ is independently a group represented by the following formula (Z-1), (Z-1)

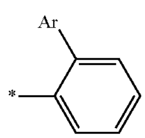

wherein the symbol * represents a bonding position, Ar is a tricyclic or higher fused aryl, at least one hydrogen atom in the fused aryl may be substituted by an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms, and at least one hydrogen atom in the compound represented by the above formula (1) may be substituted by a halogen atom, a cyano or a deuterium atom.

Item 2: The polycyclic aromatic compound described in item 1, wherein $R^1$ to $R^{11}$ each independently represent a hydrogen atom, an alkyl having 1 to 12 carbon atoms, a cycloalkyl having 3 to 16 carbon atoms, or an aryl having 6 to 18 carbon atoms that may be substituted by an alkyl having 1 to 12 carbon atoms or a cycloalkyl having 3 to 16 carbon atoms, adjacent groups among $R^1$ to $R^{11}$ may be bonded to each other to form an aryl ring having 10 to 20 carbon atoms together with ring a, ring b, or ring c, at least one hydrogen atom in the formed aryl ring may be substituted by an alkyl having 1 to 12 carbon atoms, a cycloalkyl having 3 to 16 carbon atoms, or an aryl having 6 to 18 carbon atoms that may be substituted by an alkyl having 1 to 12 carbon atoms or a cycloalkyl having 3 to 16 carbon atoms, and at least one of $R^1$ to $R^{11}$ is independently a group represented by the above formula (Z-1).

Item 3: The polycyclic aromatic compound described in item 1 or 2, wherein at least one of $R^4$ to $R^{11}$ is independently a group represented by the above formula (Z-1).

Item 4: The polycyclic aromatic compound described in any one of items 1 to 3, wherein Ar is independently a group represented by any one of the following formulas (Ar-1) to (Ar-12), (Ar-1)

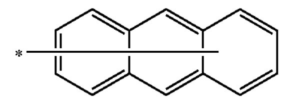

(Ar-2)

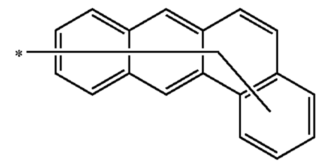

(Ar-3)

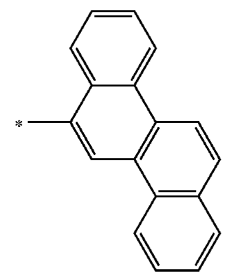

(Ar-4)

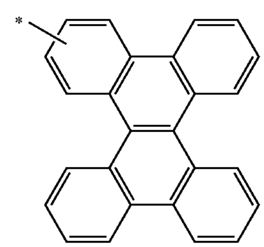

(Ar-5)

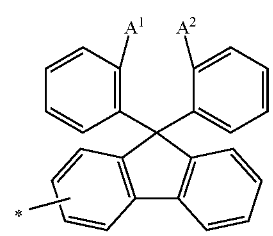

(Ar-6)

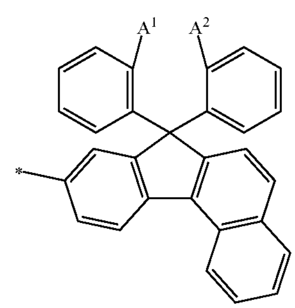

-continued (Ar-7)

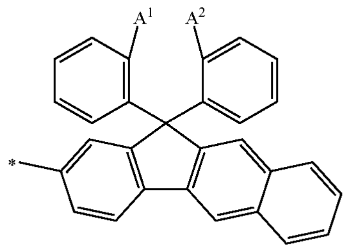

(Ar-8)

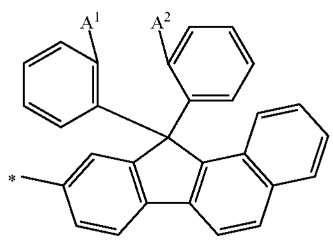

(Ar-9)

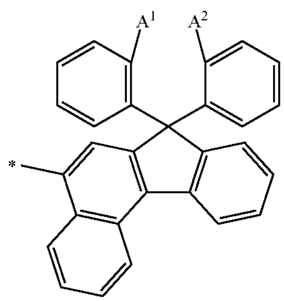

(Ar-10)

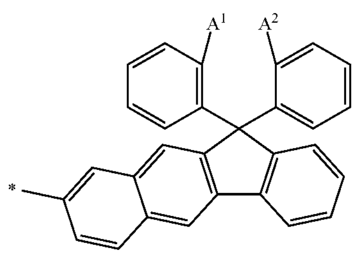

(Ar-11)

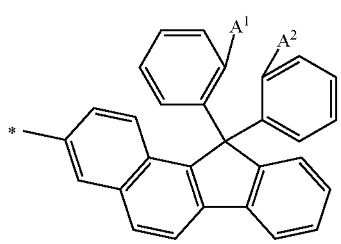

(Ar-12)

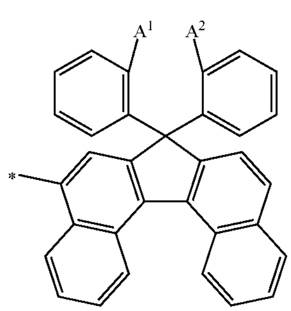

wherein the group represented by any one of the above formulas (Ar-1) to (Ar-12) is bonded to the group represented by the above formula (Z-1) at * in each formula, at least one hydrogen atom in the group represented by any one of the above formulas (Ar-1) to (Ar-12) may be substituted by an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms, and $A^1$ and $A^2$ both may be hydrogen atoms, respectively, or may be bonded to each other to form a spiro ring.

Item 5: The polycyclic aromatic compound described in any one of items 1 to 4, wherein Ar is independently a group represented by the following formula (Ar-1-1), (Ar-1-2), (Ar-2-1), (Ar-2-2), (Ar-2-3), (Ar-3-1), (Ar-4-1), (Ar-5-1), (Ar-5-2), (Ar-5-3), (Ar-6-1), (Ar-7-1), (Ar-8-1), (Ar-9-1), (Ar-10-1), (Ar-11-1), or (Ar-12-1), (Ar-1-1)

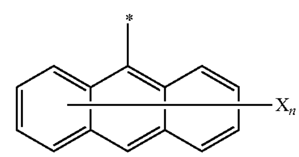

(Ar-1-2)

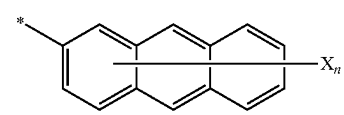

(Ar-3-1)

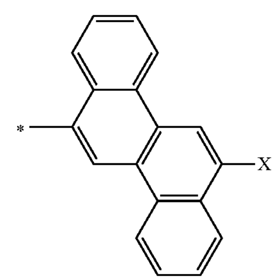

(Ar-2-1)

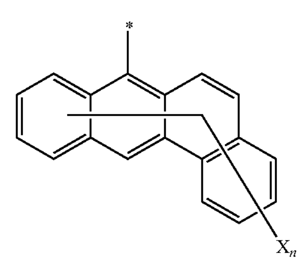

(Ar-2-2)

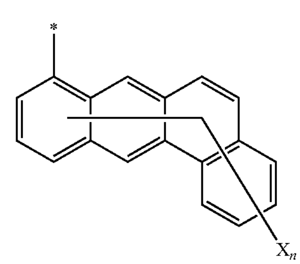

-continued
(Ar-2-3)
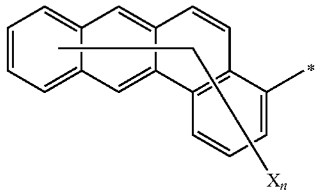
(Ar-4-1)
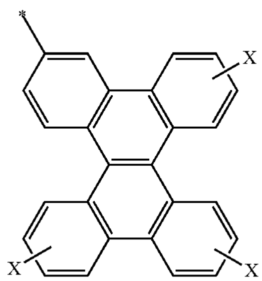
(Ar-5-1)
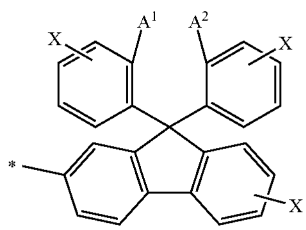
(Ar-5-2)
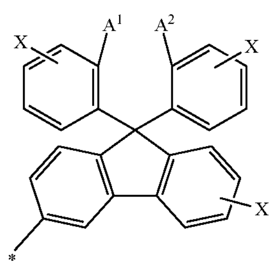
(Ar-5-3)
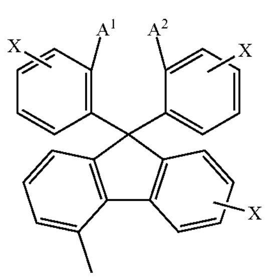
(Ar-6-1)
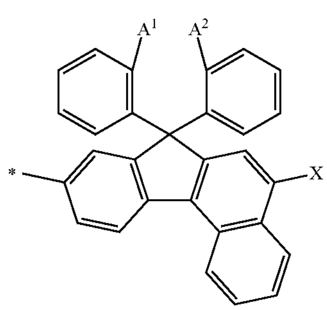
-continued
(Ar-7-1)
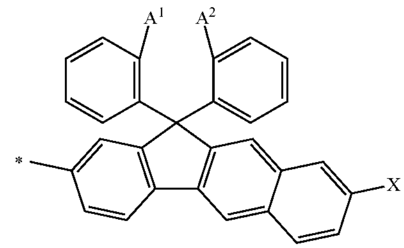
(Ar-8-1)
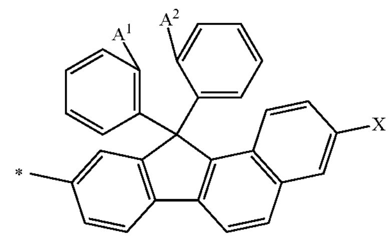
(Ar-9-1)
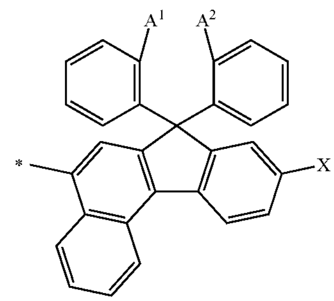
(Ar-10-1)
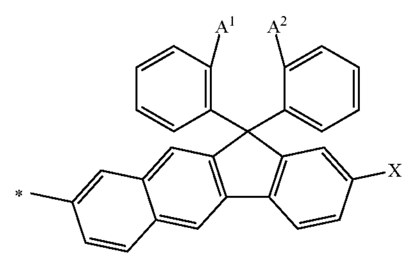
(Ar-11-1)
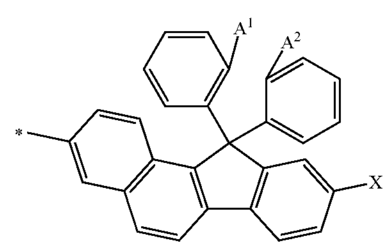
(Ar-12-1)
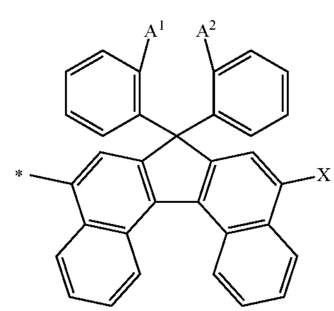
wherein in the above formulas (Ar-1-1) to (Ar-12-1), X independently represents a hydrogen atom, an alkyl having 1 to 5 carbon atoms, a cycloalkyl having 5 to 10 carbon atoms, or an aryl having 6 to 10 carbon atoms that may be substituted by an alkyl having 1 to 5 carbon atoms or a cycloalkyl having 5 to 10 carbon atoms, $A^1$ and $A^2$ both may be hydrogen atoms, respectively, or may be bonded to each other to form a spiro ring, "—Xn" in each of the formulas (Ar-1-1), (Ar-1-2), (Ar-2-1), (Ar-2-2) and (Ar-2-3) represents that n pieces of Xs are each independently bonded to any positions, and n is 1 or 2, and each of the formulas is bonded to the group represented by the above formula (Z-1) at *.

Item 6: The polycyclic aromatic compound described in any one of items 1 to 5, wherein Ar is independently a group represented by the following formula (Ar-1-1a) or (Ar-1-2a), (Ar-1-1a)

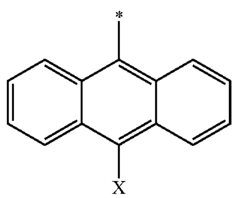

(Ar-1-2a)

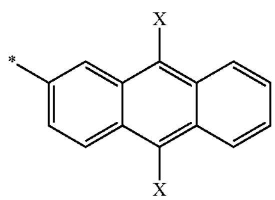

wherein in the above formulas (Ar-1-1a) and (Ar-1-2a), X independently represents a hydrogen atom, an alkyl having 1 to 5 carbon atoms, a cycloalkyl having 5 to 10 carbon atoms, or an aryl having 6 to 10 carbon atoms that may be substituted by an alkyl having 1 to 5 carbon atoms or a cycloalkyl having 5 to 10 carbon atoms, each of the formulas is bonded to the group represented by the above formula (Z-1) at *.

Item 7: The polycyclic aromatic compound described in any one of items 1 to 6, wherein $X^1$ and $X^2$ are each >O.

Item 8: The polycyclic aromatic compound described in item 1, represented by any one of the following formula.

(1-1)

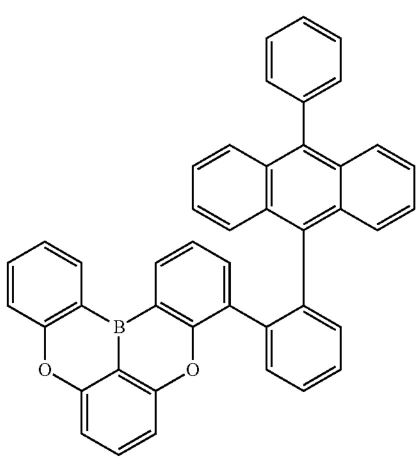

-continued (1-2)

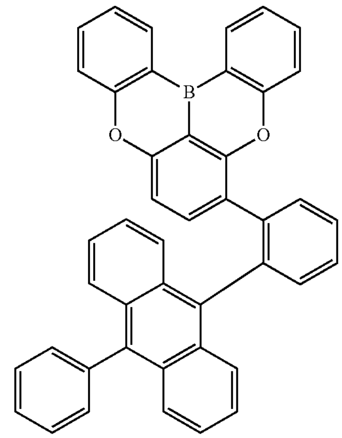

(1-3)

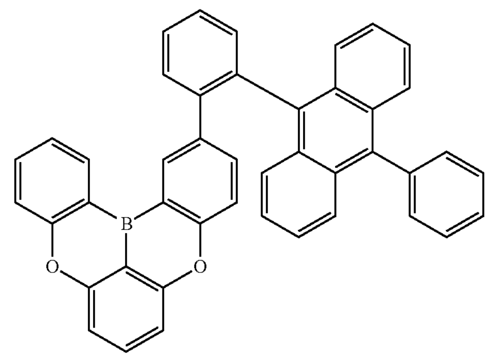

Item 9: A material for an organic device, comprising the polycyclic aromatic compound described in any one of items 1 to 8.

Item 10: The material for an organic device described in item 9, in which the material for an organic device is a material for an organic electroluminescent element, a material for an organic field effect transistor, or a material for an organic thin film solar cell.

Item 11: The material for an organic device described in item 10, in which the material for an organic electroluminescent element is a material for a light emitting layer.

Item 12: The material for an organic device described in item 11, further comprising at least one of a polycyclic aromatic compound represented by the following general formula (2) and a polycyclic aromatic compound multimer having a plurality of structures represented by the following general formula (2), (2)

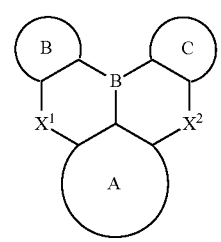

wherein in the above formula (2), ring A, ring B and ring C each independently represent an aryl ring or a heteroaryl ring, and at least one hydrogen atom in these rings may be substituted by a substituent, $X^1$ and $X^2$ each independently represent >O or >N—R, R of the >N—R represents an aryl that may be substituted by a substituent, or a heteroaryl that may be substituted by a substituent, an alkyl that may be substituted by a substituent, or a cycloalkyl that may be substituted by a substituent, and R of the >N—R may be bonded to at least one of the ring A, the ring B and ring C with a linking group or a single bond, and at least one hydrogen atom in a compound or structure represented by the formula (2) may be substituted by a halogen atom, a cyano or a deuterium atom.

Item 13: An organic electroluminescent element, comprising: a pair of electrodes composed of a positive electrode and a negative electrode; and a light emitting layer disposed between the pair of electrodes and comprising the material for an organic device described in item 11 or 12.

Item 14: The organic electroluminescent element described in item 13, further comprising at least one of an electron transport layer and an electron injection layer disposed between the negative electrode and the light emitting layer, in which at least one of the electron transport layer and the electron injection layer comprises at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex.

Item 15: The organic electroluminescent element described in item 14, in which at least one of the electron transport layer and the electron injection layer further comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

Item 16: A display apparatus or a lighting apparatus comprising the organic electroluminescent element described in any one of items 13 to 15.

Advantageous Effects of Invention

According to a preferable embodiment of the present invention, by producing an organic EL element with the use of a material for a light emitting layer containing a polycyclic aromatic compound represented by the formula (1), in particular, a material for a light emitting layer containing at least one of a polycyclic aromatic compound represented by the formula (2) and a polycyclic aromatic compound multimer having a plurality of structures represented by the formula (2), which gives optimum luminescence characteristics in combination of a polycyclic aromatic compound represented by the formula (1), an organic EL element in which one or more of the quantum efficiency and the element lifetime are excellent can be provided.

BRIEF DESCRIPTION OF DRAWINGS

FIG. 1 is a schematic cross-sectional view illustrating an organic EL element according to the present embodiment.

DESCRIPTION OF EMBODIMENTS

1. Polycyclic Aromatic Compound

The invention of the present application is a polycyclic aromatic compound represented by the general formula (1).

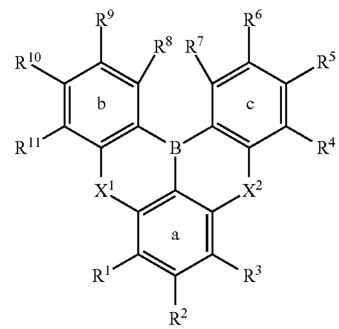

(1)

$X^1$ and $X^2$ in the general formula (1) each independently represent >O, >S or >Se, preferably at least one of $X^1$ and $X^2$ is >O, and more preferably both of $X^1$ and $X^2$ are >O.

$R^1$ to $R^{11}$ in the general formula (1) each independently represent a hydrogen atom, an alkyl, a cycloalkyl, or an aryl that may be substituted by an alkyl or a cycloalkyl. In this regard, as described below, at least one of $R^1$ to $R^{11}$ is independently a group represented by the above formula (Z-1).

The "alkyl" in $R^1$ to $R^{11}$ and the "alkyl" that may be substituted for an "aryl" may be either linear or branched, and examples of the "alkyl" include a linear alkyl having 1 to 24 carbon atoms and a branched alkyl having 3 to 24 carbon atoms. An alkyl having 1 to 20 carbon atoms (branched alkyl having 3 to 20 carbon atoms) is preferable, an alkyl having 1 to 18 carbon atoms (branched alkyl having 3 to 18 carbon atoms) is more preferable, an alkyl having 1 to 12 carbon atoms (branched alkyl having 3 to 12 carbon atoms) is still more preferable, an alkyl having 1 to 6 carbon atoms (branched alkyl having 3 to 6 carbon atoms) is furthermore preferable, and an alkyl having 1 to 5 carbon atoms (branched alkyl having 3 to 5 carbon atoms) is particularly preferable. Alternatively, the "alkyl" may be an alkyl having 1 to 4 carbon atoms (branched alkyl having 3 to 4 carbon atoms).

Specific examples of the "alkyl" include methyl, ethyl, n-propyl, isopropyl, n-butyl, isobutyl, s-butyl, t-butyl, n-pentyl, isopentyl, neopentyl, t-pentyl (t-amyl), n-hexyl, 1-methylpentyl, 4-methyl-2-pentyl, 3,3-dimethylbutyl, 2-ethylbutyl, n-heptyl, 1-methylhexyl, n-octyl, t-octyl (1,1,3,3-tetramethylbutyl), 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Further, as the "alkyl", for example, 1-ethyl-1-methylpropyl, 1,1-diethylpropyl, 1,1-dimethylbutyl, 1-ethyl-1-methylbutyl, 1,1,4-trimethylpentyl, 1,1,2-trimethylpropyl, 1,1-dimethyloctyl, 1,1-dimethylpentyl, 1,1-dimethylheptyl, 1,1,5-trimethylhexyl, 1-ethyl-1-methylhexyl, 1-ethyl-1,3-dimethylbutyl, 1,1,2,2-tetramethylpropyl, 1-butyl-1-methylpentyl, 1,1-diethylbutyl, 1-ethyl-1-methylpentyl, 1,1,3-trimethylbutyl, 1-propyl-1-methylpentyl, 1,1,2- trimethylpropyl, 1-ethyl-1,2,2-trimethylpropyl, 1-propyl-1-methylbutyl, 1,1-dimethylhexyl, or the like can also be mentioned.

Examples of the "cycloalkyl" in $R^1$ to $R^{11}$ and the "cycloalkyl" that may be substituted for an "aryl" include a cycloalkyl having 3 to 24 carbon atoms, a cycloalkyl having 3 to 20 carbon atoms, a cycloalkyl having 3 to 16 carbon atoms, a cycloalkyl having 3 to 14 carbon atoms, a cycloalkyl having 5 to 10 carbon atoms, a cycloalkyl having 5 to 8 carbon atoms, a cycloalkyl having 5 or 6 carbon atoms, and a cycloalkyl having 5 carbon atoms.

Specific examples of the "cycloalkyl" include cyclopropyl, cyclobutyl, cyclopentyl, cyclohexyl, cycloheptyl, cyclooctyl, cyclononyl, cyclodecyl, and alkyl having 1 to 5 carbon atoms (especially, methyl) substitutes thereof, bicyclo[1.0.1]butyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, diamantyl, decahydronaphthalenyl, and decahydroazulenyl.

Examples of the "aryl" in $R^1$ to $R^{11}$ include an aryl having 6 to 30 carbon atoms. An aryl having 6 to 24 carbon atoms is preferable, an aryl having 6 to 18 carbon atoms is more preferable, an aryl having 6 to 16 carbon atoms is still more preferable, an aryl having 6 to 12 carbon atoms is particularly preferable and an aryl having 6 to 10 carbon atoms is most preferable.

Specific examples of the "aryl" include phenyl which is a monocyclic system; biphenylyl which is a bicyclic system; naphthyl (1-naphthyl or 2-naphthyl) which is a fused bicyclic system; terphenylyl (m-terphenylyl, o-terphenylyl or p-terphenylyl) which is a tricyclic system; acenaphthylenyl, fluorenyl, phenalenyl, and phenanthrenyl which are fused tricyclic systems; triphenylenyl, pyrenyl, and naphthacenyl which are fused tetracyclic systems; and perylenyl and pentacenyl which are fused pentacyclic systems.

In this regard, the "aryl" in $R^1$ to $R^{11}$ may be substituted by an alkyl or a cycloalkyl. For the detailed description of the alkyl and the cycloalkyl, the above description of the "alkyl" and the "cycloalkyl" in the $R^1$ to $R^{11}$ can be cited.

In general formula (1), adjacent groups among the substituents $R^1$ to $R^{11}$ of the ring a, ring b, and ring c may be bonded to each other to form an aryl ring together with the ring a, ring b, or ring c. Therefore, in a polycyclic aromatic compound represented by general formula (1), a ring structure constituting the compound changes as represented by the following formulas (1A) and (1B) according to a mutual bonding form of substituents in the ring a, ring b or ring c. Note that each sign in the formulas (1A) and (1B) is defined in the same manner as those in formula (1).

(1A)

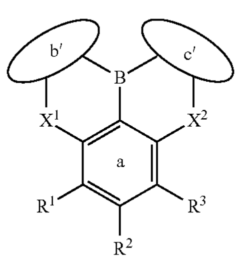

-continued (1B)

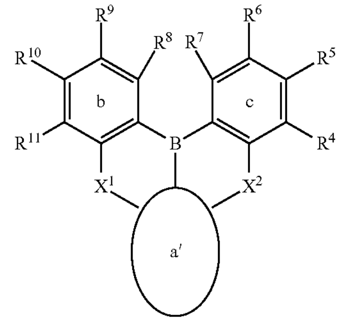

The ring a', ring b' and ring c' in the above formulas (1A) and (1B) each represent an aryl ring formed by bonding adjacent groups among the substituents $R^1$ to $R^{11}$ together with the ring a, ring b and ring c, respectively (may also be referred to as a fused ring obtained by fusing another ring structure to the ring a, ring b, or ring c). Incidentally, although not indicated in the formula, there is also a compound in which all of the ring a, ring b and ring c have been changed to the ring a', ring b' and ring c'. Furthermore, as apparent from the above formulas (1A) and (1B), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

As the formed "aryl ring", for example, an aryl ring having 10 to 20 carbon atoms can be mentioned, and preferably an aryl ring having 10 to 18 carbon atoms, more preferably an aryl having 10 to 16 carbon atoms, still more preferably an aryl having 10 to 14 carbon atoms, and particularly preferably an aryl having 10 to 12 carbon atoms can be mentioned. For the specific examples of the aryl, the above description of the "aryl" in the $R^1$ to $R^{11}$ can be cited.

At least one hydrogen atom in the formed aryl ring may be substituted by an alkyl, a cycloalkyl, or an aryl that may be substituted by an alkyl or a cycloalkyl. For the detailed description of the alkyl and cycloalkyl (including an alkyl and a cycloalkyl, each of which may be substituted for an aryl) and the aryl, the above description of the "alkyl", the "cycloalkyl" and "aryl" in the $R^1$ to $R^{11}$ can be cited.

A compound represented by the above formula (1A) or (1B) corresponds to, for example, a compound represented by any one of formulas (1-41) to (1-48) listed as specific compounds that are described below. That is, for example, the compound represented by the formula (1A) or (1B) is a compound having ring a' (or ring b' or ring c') that is formed by fusing a benzene ring and a phenanthrene ring to the benzene ring being ring a (or ring b or ring c), and the fused ring a' (or the fused ring b' or the fused ring c') that has been formed is a naphthalene ring, or a triphenylene ring.

At least one of $R^1$ to $R^{11}$, preferably one or two of $R^1$ to $R^{11}$, and more preferably one of $R^1$ to $R^{11}$ is independently a group represented by the following formula (Z-1). In this regard, the group represented by the formula (Z-1) is also referred to as an "intermediate group".

(Z-1)

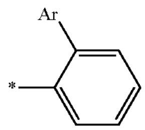

In the above formula (Z-1), the symbol * represents a bonding position.

Ar is a tricyclic or higher fused aryl.

As the "tricyclic or higher fused aryl" that is Ar in the above intermediate group, for example, a fused tricyclic aryl such as anthracenyl, fluorenyl, phenalenyl, phenanthrenyl, or acenaphthylenyl, a fused tetracyclic aryl such as benz[a]anthracenyl, benz[b]anthracenyl, chrysenyl, benzofluorenyl, triphenylenyl, pyrenyl, naphthacenyl, acephenanthrylenyl, or fluoranthenyl, a fused pentacyclic or higher fused aryl such as dibenzofluorenyl, perylenyl, or pentacenyl, or the like can be mentioned.

Further, at least one hydrogen atom in the fused aryl may be substituted by an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms (hereinafter, also referred to as a "primary substituent").

As the "alkyl having 1 to 5 carbon atoms" (including also an "alkyl" capable of being substituted for an "aryl" or a "heteroaryl") that is a primary substituent, for example, methyl, ethyl, n-propyl, isopropyl, n-butyl, isobutyl, s-butyl, t-butyl, n-pentyl, isopentyl, neopentyl, t-pentyl (t-amyl) or the like can be mentioned.

As the "cycloalkyl having 5 to 10 carbon atoms" (including also a "cycloalkyl" capable of being substituted for an "aryl" or a "heteroaryl") that is a primary substituent, for example, methylcyclobutyl, cyclopentyl, methylcyclopentyl, cyclohexyl, methylcyclohexyl, cycloheptyl, methylcycloheptyl, cyclooctyl, methylcyclooctyl, cyclononyl, methylcyclononyl, cyclodecyl, norbornenyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, decahydronaphthalenyl, decahydroazulenyl, or the like can be mentioned.

As the "aryl having 6 to 18 carbon atoms" that is a primary substituent, an aryl having 6 to 16 carbon atoms is preferable, an aryl having 6 to 12 carbon atoms is more preferable, and an aryl having 6 to 10 carbon atoms is still more preferable. Specific examples of the "aryl having 6 to 18 carbon atoms" include phenyl that is a monocyclic system; biphenylyl that is a bicyclic system; naphthyl (1-naphthyl or 2-naphthyl) that is a fused bicyclic system; terphenylyl (m-terphenylyl, o-terphenylyl or p-terphenylyl) that is a tricyclic system; acenaphthylenyl, fluorenyl, phenalenyl, and phenanthrenyl, which are fused tricyclic systems; and triphenylenyl, pyrenyl, and naphthacenyl, which are fused tetracyclic systems.

As the "heteroaryl having 2 to 18 carbon atoms" that is a primary substituent, a heteroaryl having 2 to 16 carbon atoms is preferable, a heteroaryl having 4 to 16 carbon atoms is more preferable, a heteroaryl having 4 to 14 carbon atoms is still more preferable, and a heteroaryl having 4 to 12 carbon atoms is particularly preferable. For example, as the heteroaryl, a heterocyclic ring containing 1 to 5 heteroatoms selected from an oxygen atom, a sulfur atom, and a nitrogen atom in addition to a carbon atom as a ring-constituting atom, or the like can be mentioned.

Specific examples of the "heteroaryl" include pyrrolyl, oxazolyl, isoxazolyl, thiazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, pteridinyl, carbazolyl, acridinyl, phenoxathiinyl, phenoxazinyl, phenothiazinyl, phenazinyl, phenazasilinyl, indolizinyl, furanyl, benzofuranyl, isobenzofuranyl, dibenzofuranyl, naphthobenzofuranyl, thiophenyl, benzothiophenyl, isobenzothiophenyl, dibenzothiophenyl, naphtobenzothiophenyl, benzophosphoryl, dibenzophosphoryl, a monovalent group represented by removing any one hydrogen atom from a benzophosphole oxide ring, a monovalent group represented by removing any one hydrogen atom from a dibenzophosphole oxide ring, furazanyl, oxadiazolyl, thianthrenyl, indolocarbazolyl, benzoindolocarbazolyl, and benzobenzoindolocarbazolyl.

In this regard, in the fused aryl, two hydrogen atoms bonded to one carbon atom may be substituted by the above-described groups. For example, if the fused aryl is fluorenyl, as shown in the following formula, the fluorenyl may have two substituents at the 9-position.

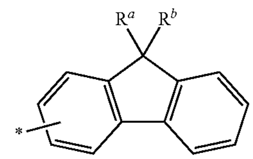

In the above formula, the symbol * represents a bonding position. $R^a$ and $R^b$ each independently represent an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms.

In this regard, these groups that can be selected as $R^a$ and $R^b$ are the same as the primary substituents described above, and specific examples of each of the groups are also as described above.

In addition, it is preferable that at least one of $R^4$ to $R^{11}$ is independently a group represented by the above formula (Z-1), it is more preferable that at least one of $R^4$, $R^6$, $R^9$ and $R^{11}$ is independently a group represented by the above formula (Z-1), and it is still more preferable that at least one of $R^1$ and $R^9$ is independently a group represented by the above formula (Z-1).

Ar in the above intermediate group is independently a group represented by any one of the following formulas (Ar-1) to (Ar-12). In addition, each of the groups represented by the formulas (Ar-1) to (Ar-12) is also referred to as a "terminal group".

(Ar-1)

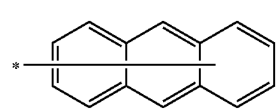

-continued (Ar-2)

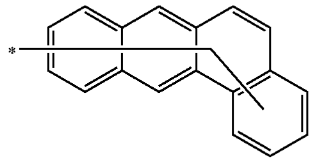

(Ar-3)

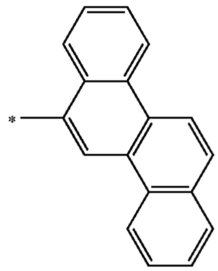

(Ar-4)

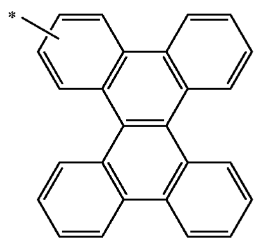

(Ar-5)

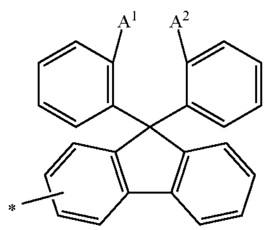

(Ar-6)

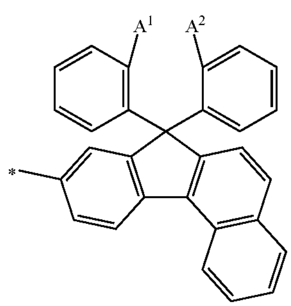

(Ar-7)

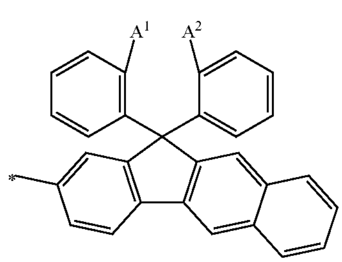

-continued (Ar-8)

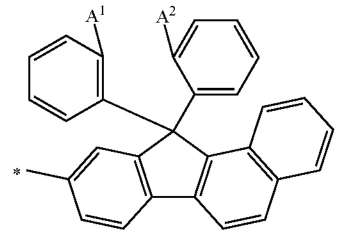

(Ar-9)

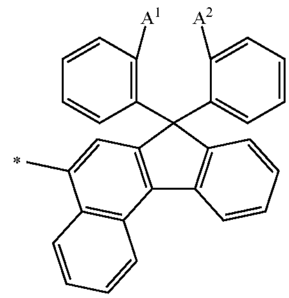

(Ar-10)

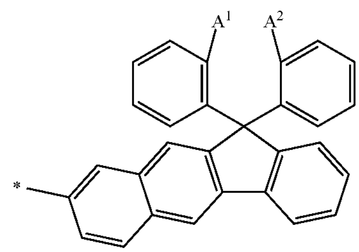

(Ar-11)

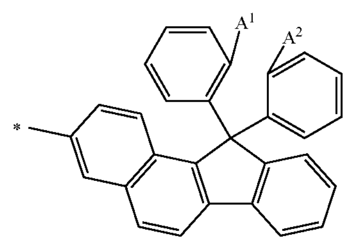

(Ar-12)

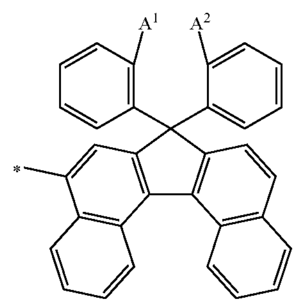

In this regard, each of the above terminal groups is bonded to an intermediate group that is a group represented by the above formula (Z-1) at * in each of the above formulas.

At least one hydrogen atom in each of the terminal groups represented by the formulas (Ar-1) to (Ar-12) may be substituted by an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms.

In this regard, the "alkyl" (including also an "alkyl" capable of being substituted for an "aryl" or a "heteroaryl"), the "cycloalkyl" (including also a "cycloalkyl" capable of being substituted for an "aryl" or a "heteroaryl"), an "aryl" and a "heteroaryl", each of which can be substituted for a terminal group, are the same as the primary substituents described above, and specific examples of each of the groups are also as described above.

Further, $A^1$ and $A^2$ both may be hydrogen atoms, respectively, or may be bonded to each other to form a spiro ring. For example, the group represented by the formula (Ar-5) may be a group represented by the following formula (Ar-5a), and the same also applies to the groups represented by other formulas (Ar-6) to (Ar-12).

(Ar-5a)

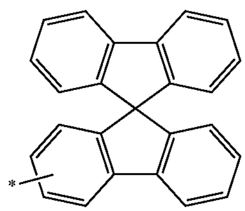

It is preferable that Ar being a terminal group is independently a group represented by the following formula (Ar-1-1), (Ar-1-2), (Ar-2-1), (Ar-2-2), (Ar-2-3), (Ar-3-1), (Ar-4-1), (Ar-5-1), (Ar-5-2), (Ar-5-3), (Ar-6-1), (Ar-7-1), (Ar-8-1), (Ar-9-1), (Ar-10-1), (Ar-11-1), or (Ar-12-1).

(Ar-1-1)

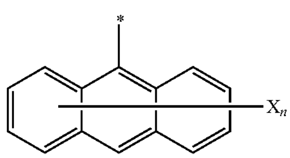

(Ar-1-2)

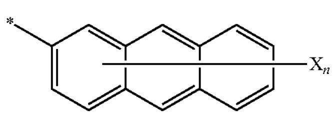

(Ar-3-1)

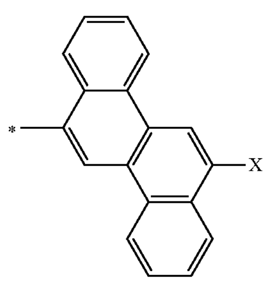

(Ar-2-1)

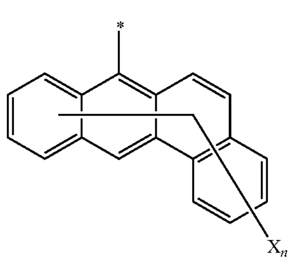

-continued (Ar-2-2)

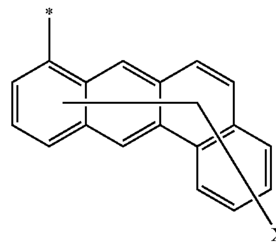

(Ar-2-3)

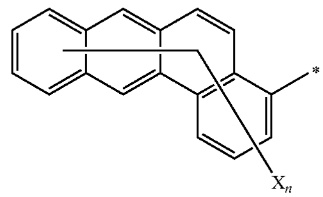

(Ar-4-1)

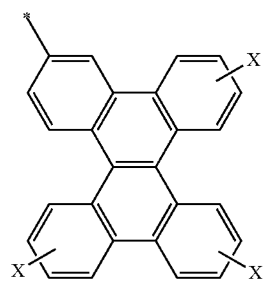

(Ar-5-1)

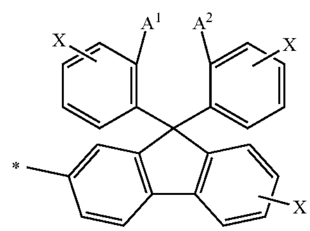

(Ar-5-2)

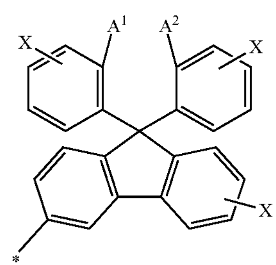

(Ar-5-3)

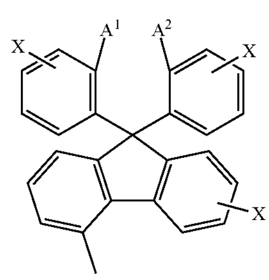

-continued (Ar-6-1)

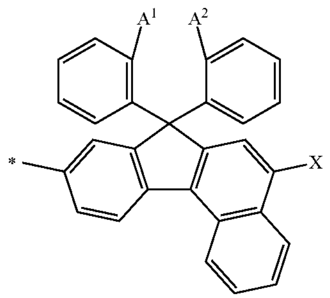

(Ar-7-1)

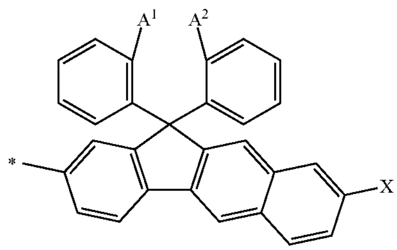

(Ar-8-1)

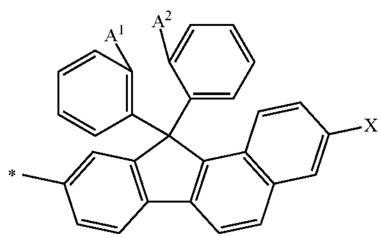

(Ar-9-1)

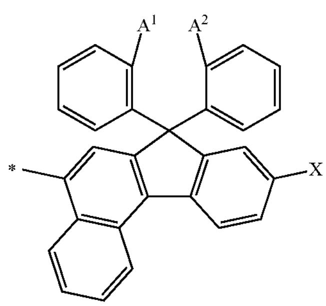

(Ar-10-1)

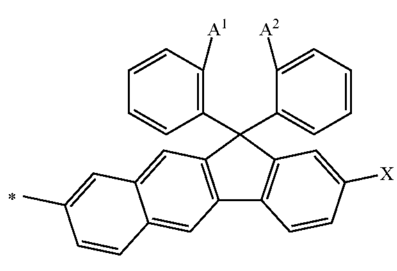

(Ar-11-1)

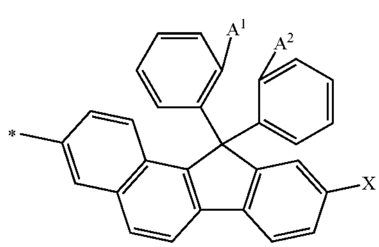

-continued (Ar-12-1)

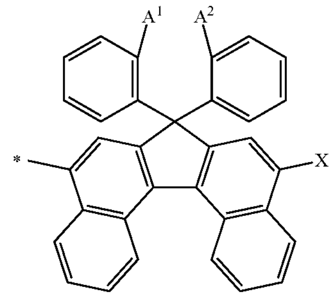

Each of the above terminal groups is bonded to a group represented by the above formula (Z-1) at * in each of the above formulas.

In each of the terminal groups, X is independently a hydrogen atom, an alkyl having 1 to 5 carbon atoms, a cycloalkyl having 5 to 10 carbon atoms, or an aryl having 6 to 10 carbon atoms that may be substituted by an alkyl having 1 to 5 carbon atoms or a cycloalkyl having 5 to 10 carbon atoms.

In this regard, "—Xn" in each of the formulas (Ar-1-1), (Ar-1-2), (Ar-2-1), (Ar-2-2) and (Ar-2-3) represents that n pieces of Xs are each independently bonded to any positions, and n is 1 or 2, and preferably 1.

The "alkyl", "cycloalkyl" and "aryl" in X in each of the terminal groups are the same as the primary substituents described above, and specific examples of each of the groups are also as described above.

In addition, $A^1$ and $A^2$ in the terminal group both may be hydrogen atoms, respectively, or may be bonded to each other to form a spiro ring. For example, each of the compounds of the formulas (1-151) to (1-160) described below is a compound in which $A^1$ and $A^2$ in a group of the formula (Ar-5-1) both are hydrogen atoms, respectively, and each of the compounds of the formulas (1-161) to (1-170) is a compound in which $A^1$ and $A^2$ in a group of any one of the formulas (Ar-6) to (Ar-12) are bonded to each other to form a spiro ring.

It is more preferable that Ar being a terminal group is independently a group represented by the following formula (Ar-1-1a) or (Ar-1-2a).

(Ar-1-1a)

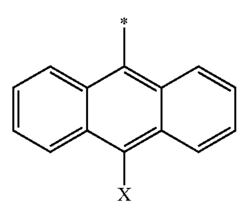

(Ar-1-2a)

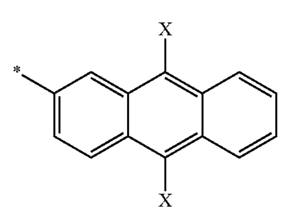

Each of the above terminal groups is bonded to a group represented by the above formula (Z-1) at * in each of the above formulas.

In the above formulas (Ar-1-1a) and (Ar-1-2a), X is independently a hydrogen atom, an alkyl having 1 to 5 carbon atoms, a cycloalkyl having 5 to 10 carbon atoms, or an aryl having 6 to 10 carbon atoms that may be substituted by an alkyl having 1 to 5 carbon atoms or a cycloalkyl having 5 to 10 carbon atoms.

In addition, the "alkyl", "cycloalkyl" and "aryl" in X in each of the terminal groups are the same as the primary substituents described above, and specific examples of each of the groups are also as described above.

At least one hydrogen in a polycyclic aromatic compound represented by the general formula (1) may be substituted by a halogen atom, a cyano or a deuterium atom.

Specific examples of the polycyclic aromatic compound represented by the formula (1) include the following compounds. Incidentally, in the each structural formula, "Me" represents a methyl group, and "tBu" represents a tertiary butyl group.

(1-1)

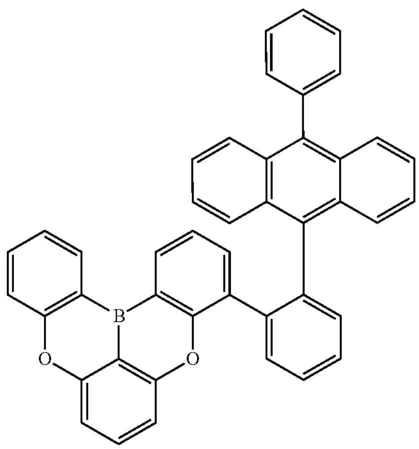

(1-2)

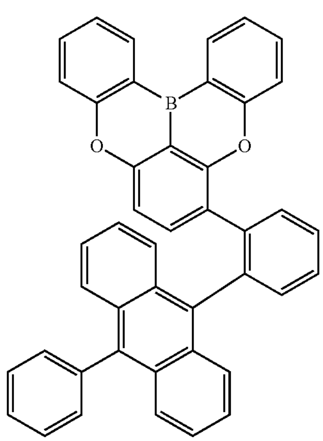

-continued (1-3)

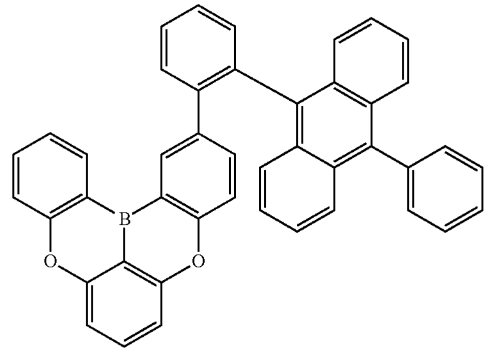

(1-4)

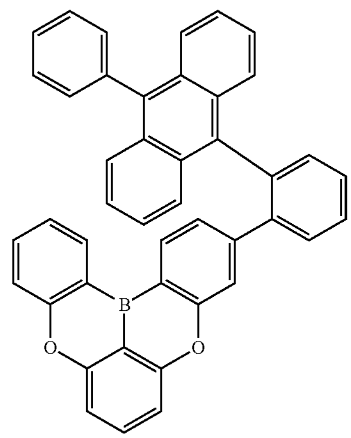

(1-5)

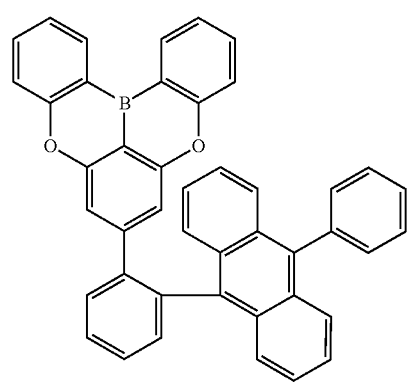

-continued
(1-6)
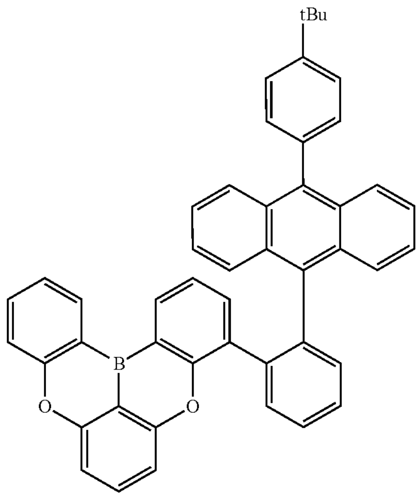
(1-7)
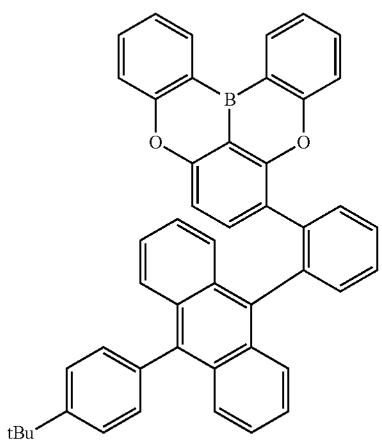
(1-8)
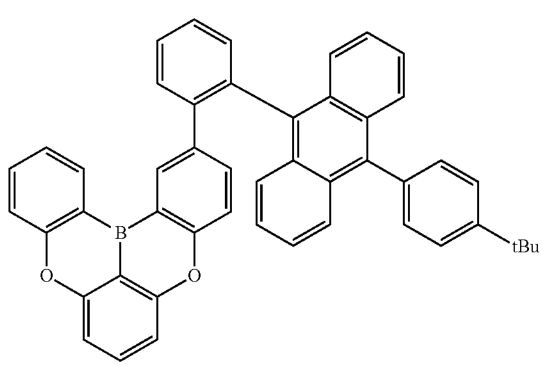
-continued
(1-9)
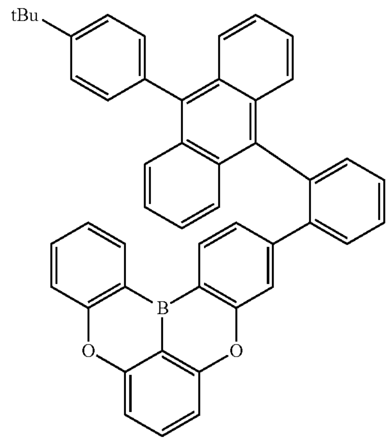
(1-10)
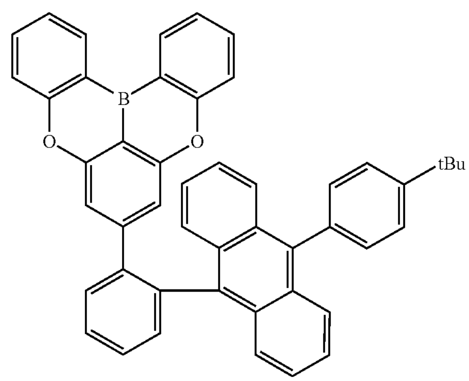
(1-11)
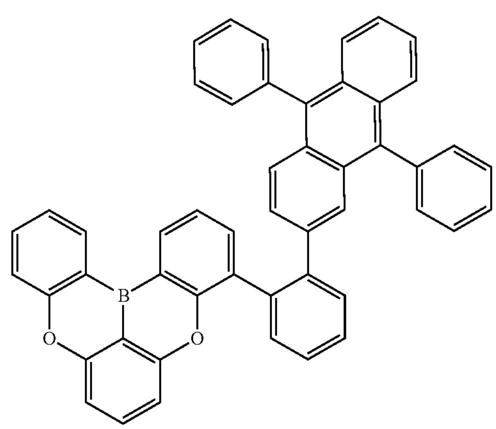

-continued
(1-12)
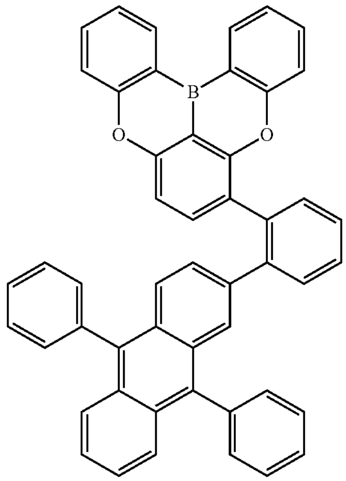
(1-13)
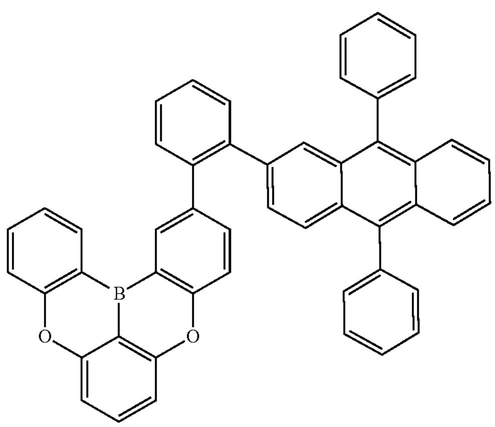
(1-14)
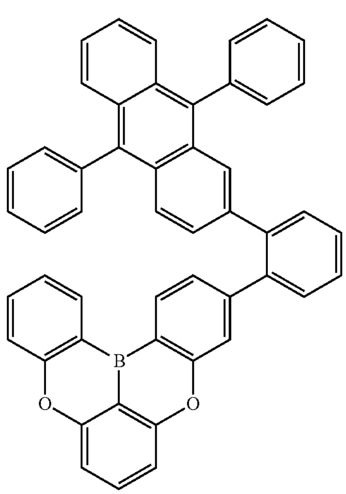
-continued
(1-15)
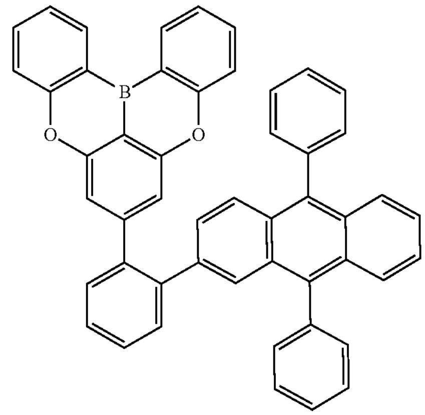
(1-21)
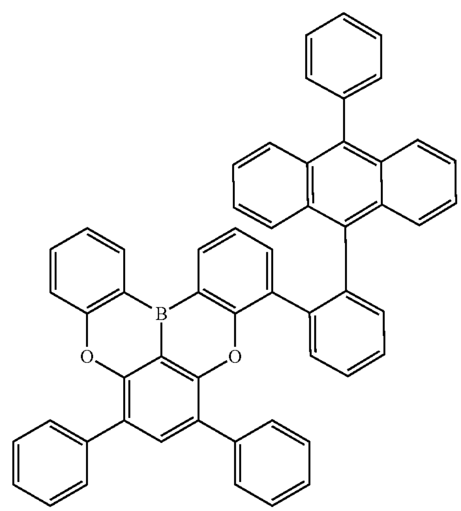
(1-22)
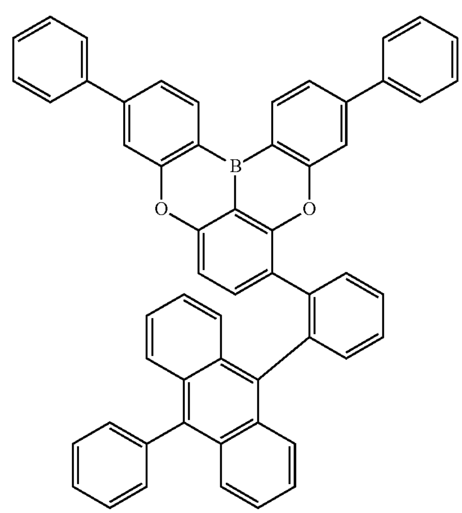

-continued
(1-23)
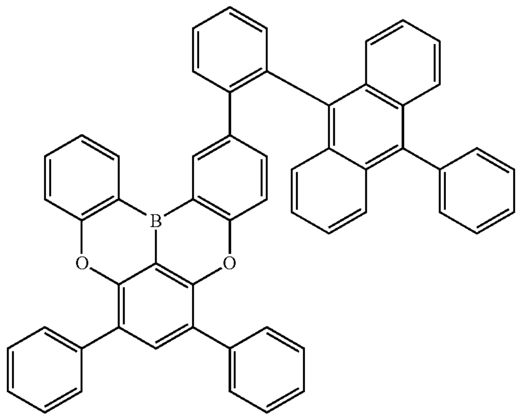
(1-24)
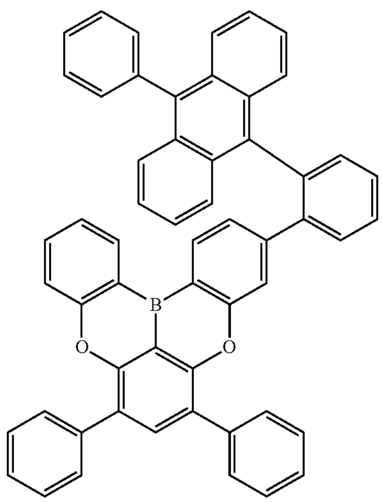
(1-25)
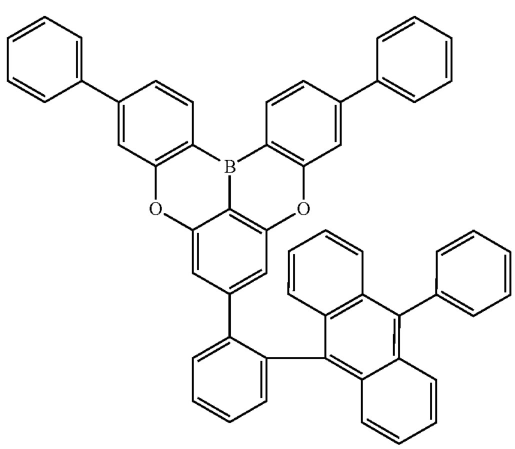
-continued
(1-26)
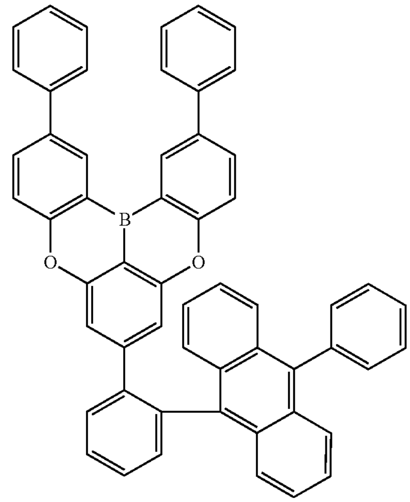
(1-27)
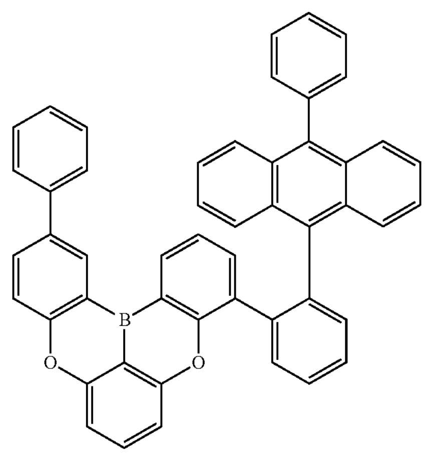
(1-28)
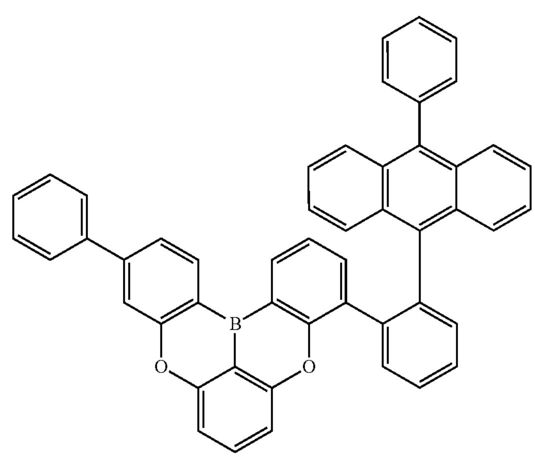

(1-29)
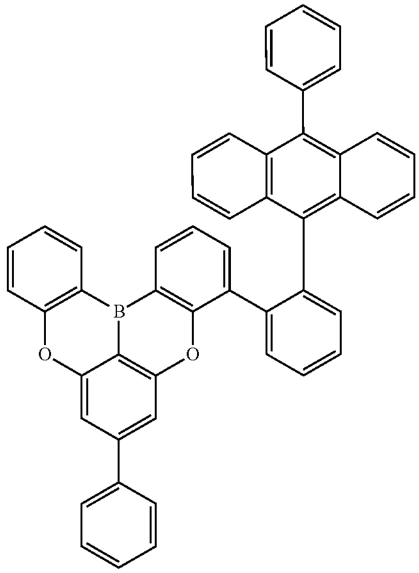
(1-30)
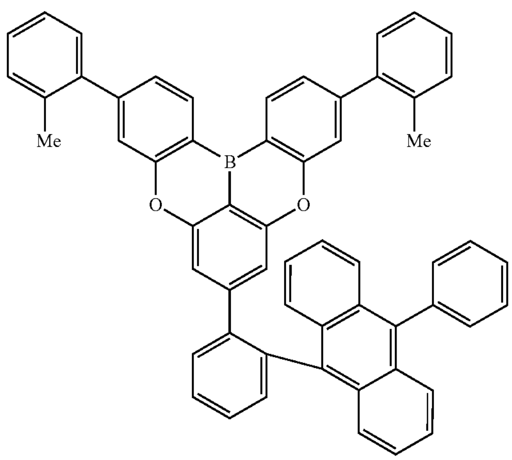
(1-31)
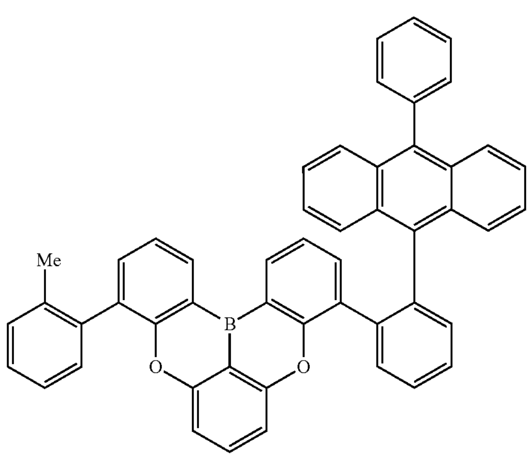
(1-32)
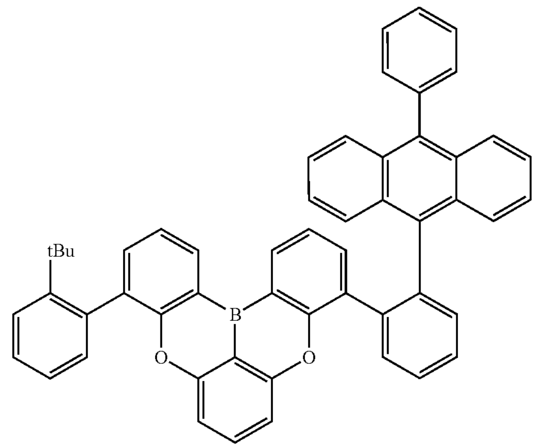
(1-33)
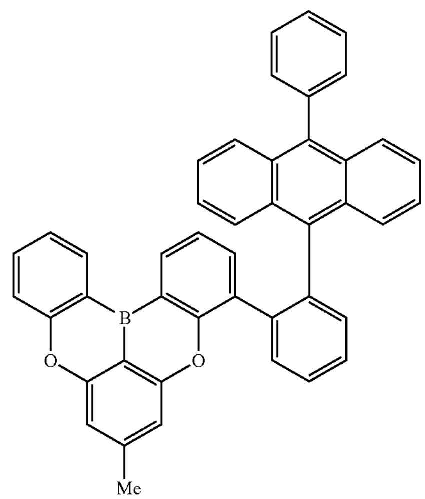
(1-34)
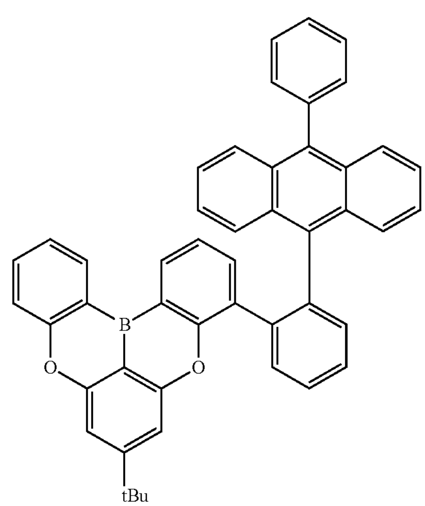

-continued
(1-35)
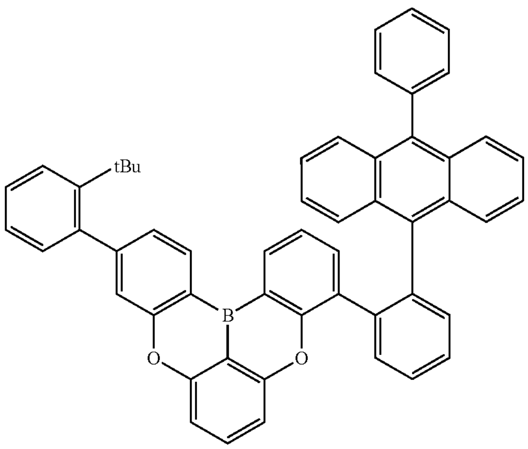
(1-41)
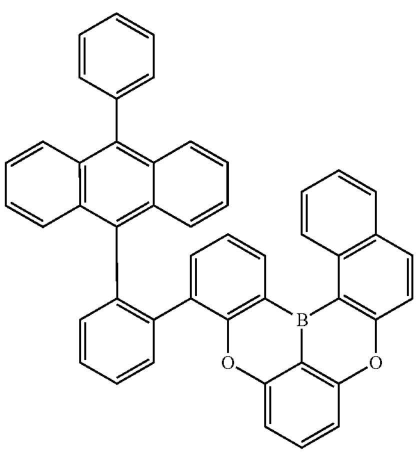
(1-42)
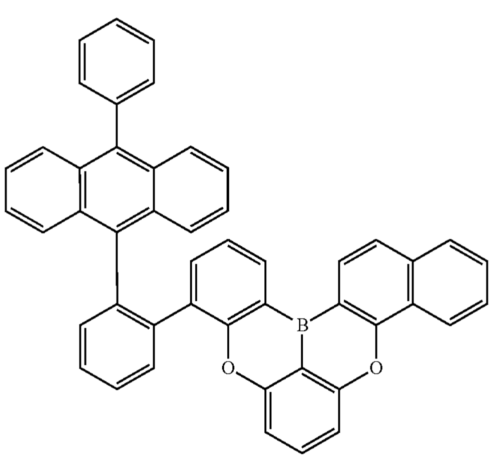
-continued
(1-43)
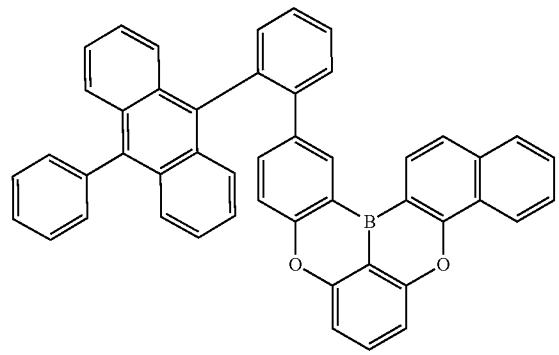
(1-44)
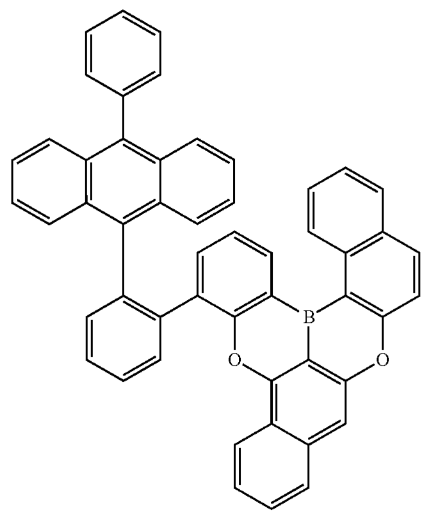
(1-45)
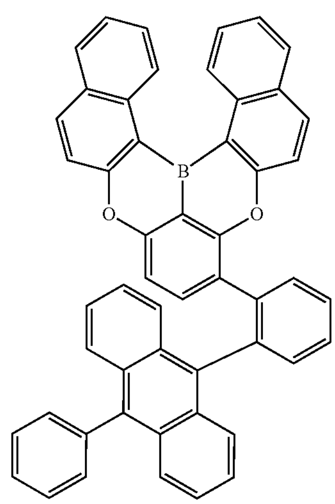

-continued
(1-46)
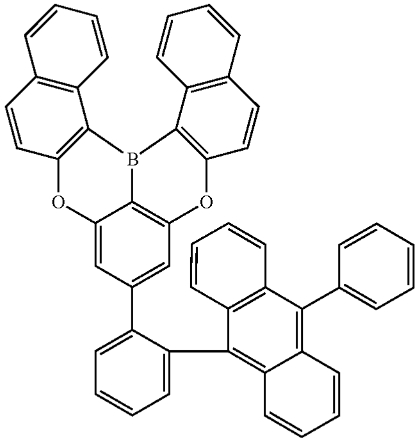
(1-47)
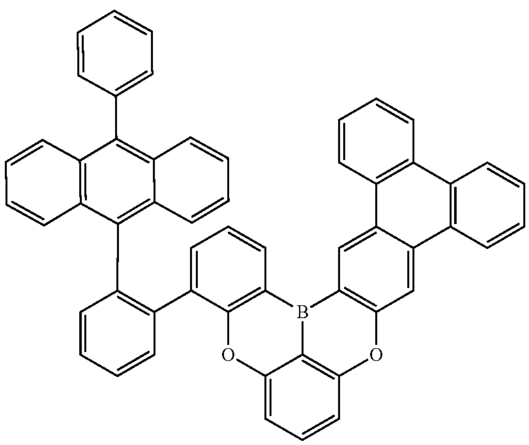
(1-48)
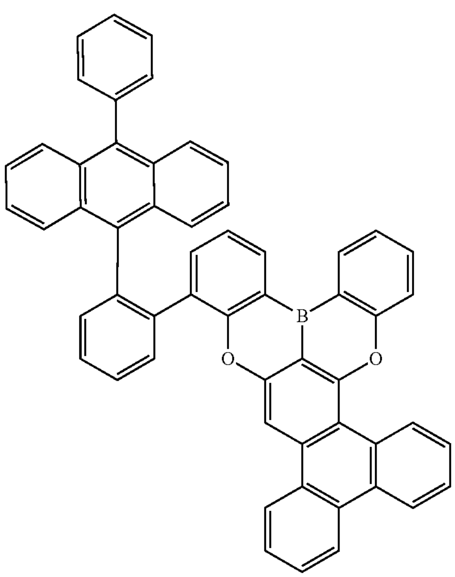
-continued
(1-51)
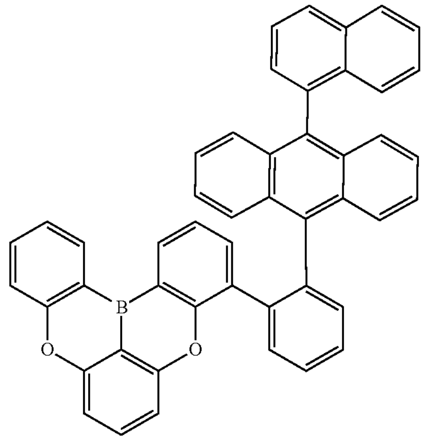
(1-52)
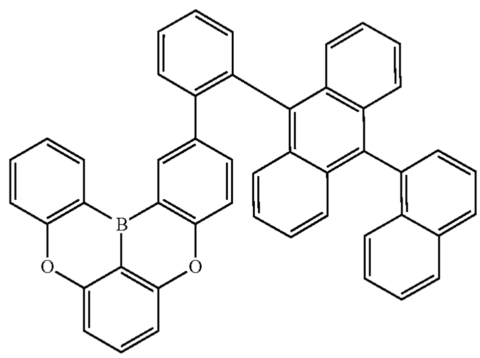
(1-53)
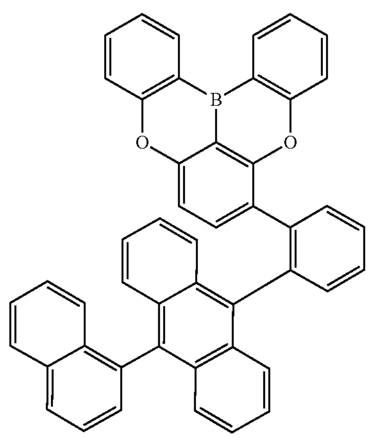

-continued
(1-54)
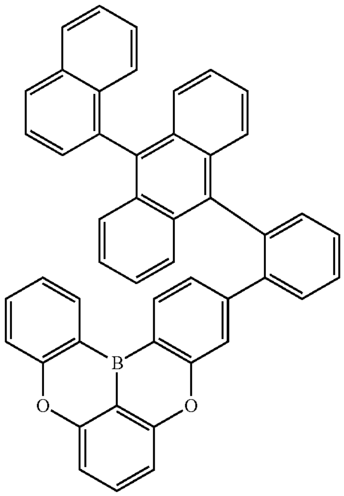
(1-55)
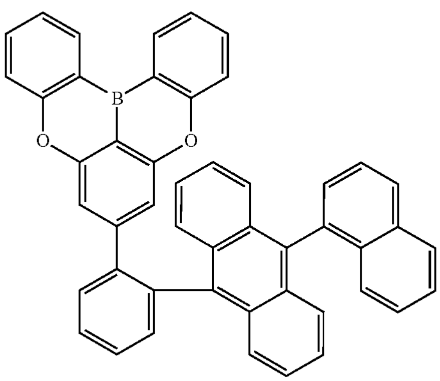
(1-56)
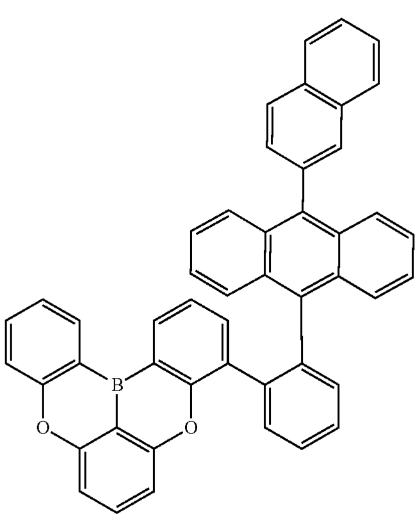
-continued
(1-57)
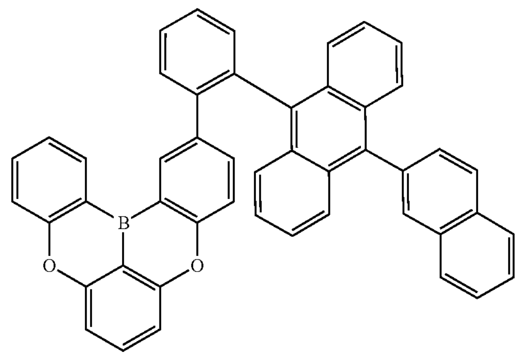
(1-58)
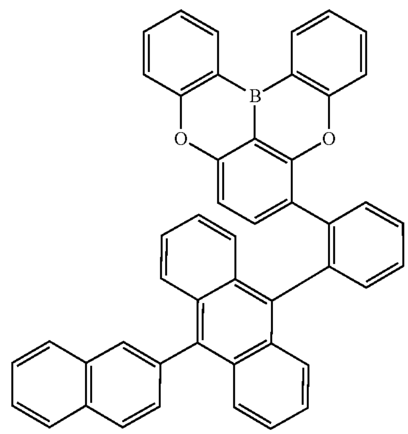
(1-59)
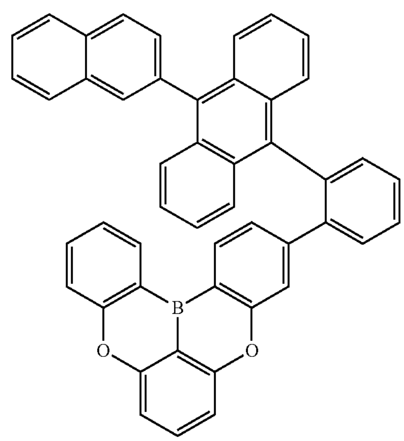
(1-60)
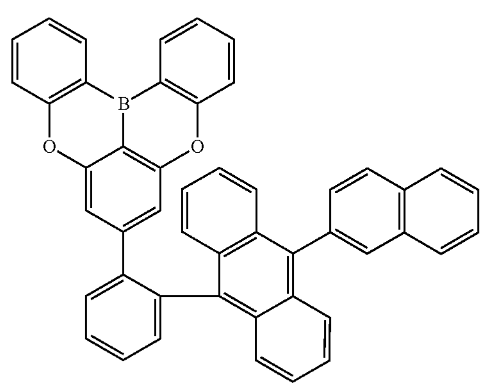

-continued
(1-71)
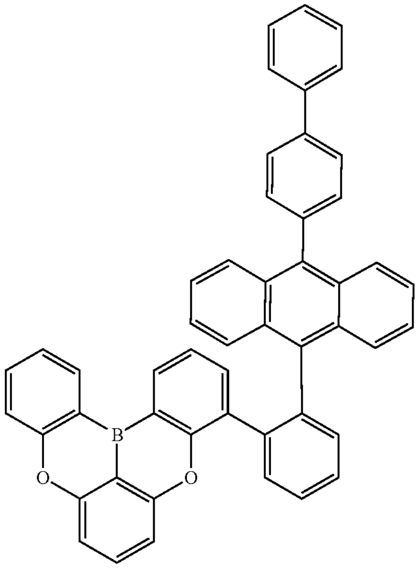
(1-72)
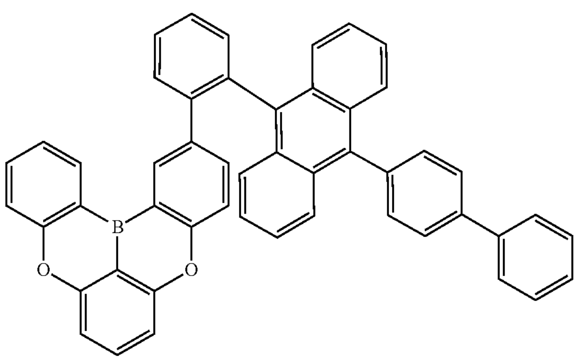
(1-73)
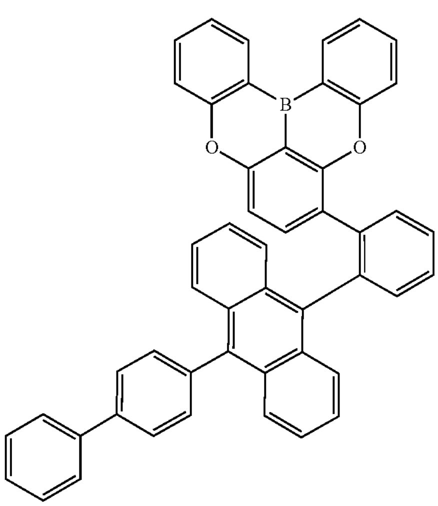
-continued
(1-74)
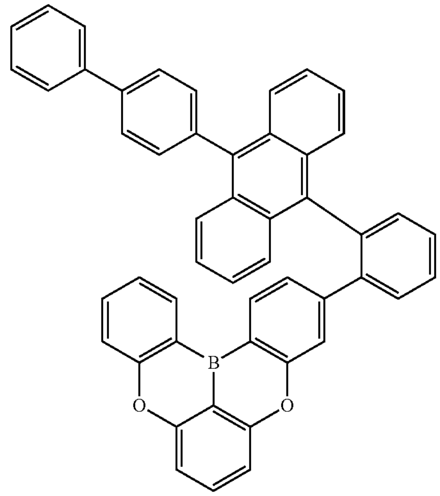
(1-75)
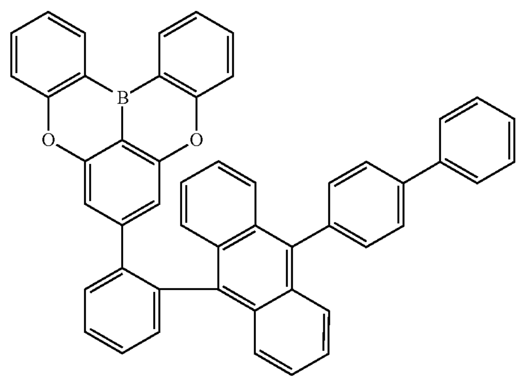
(1-76)
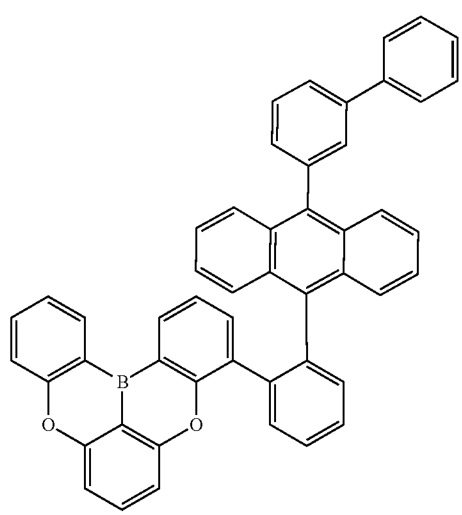

-continued
(1-77)
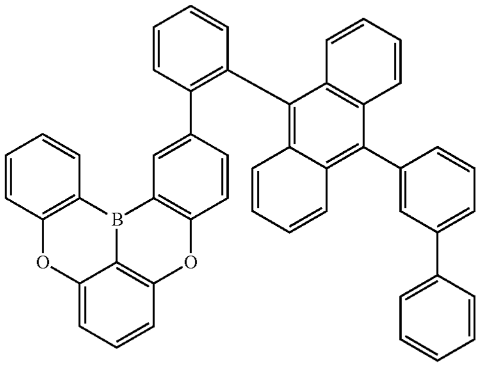
(1-78)
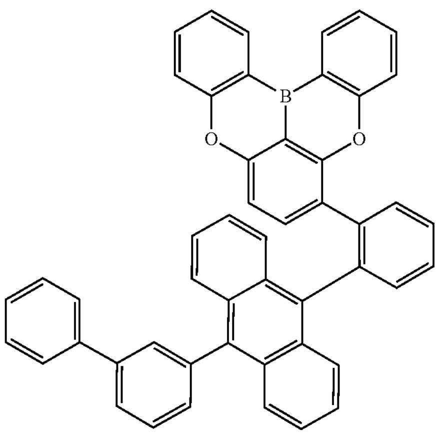
(1-79)
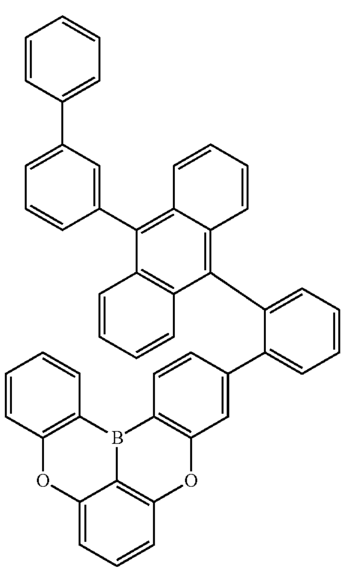
-continued
(1-80)
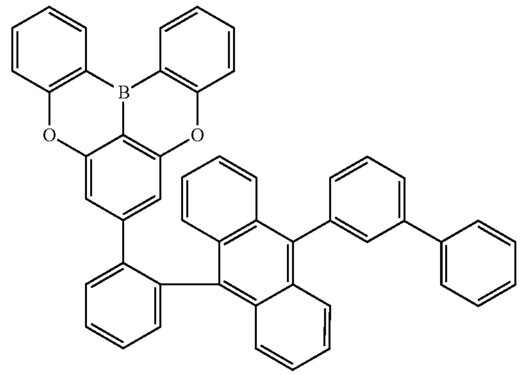
(1-81)
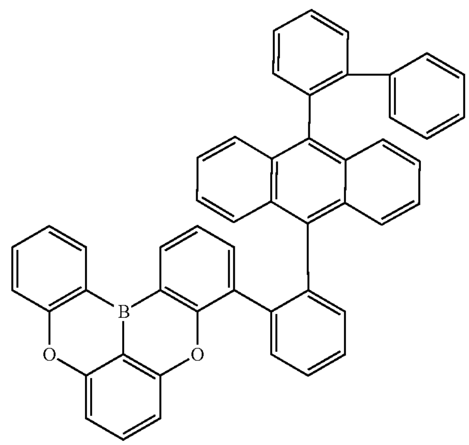
(1-82)
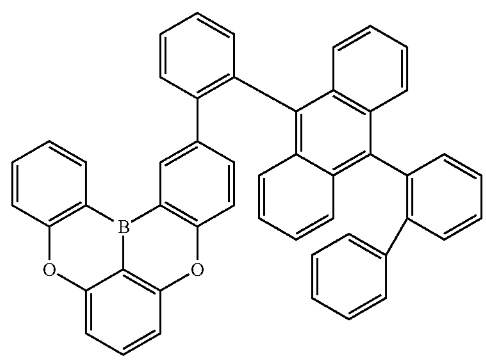
(1-83)
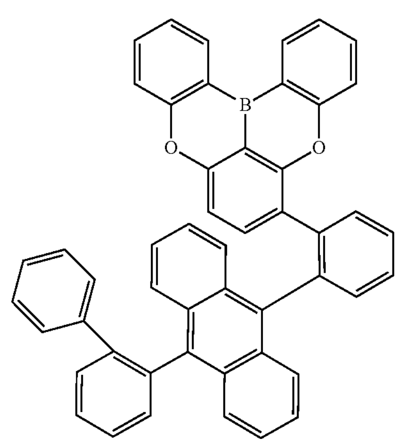

-continued
(1-84)
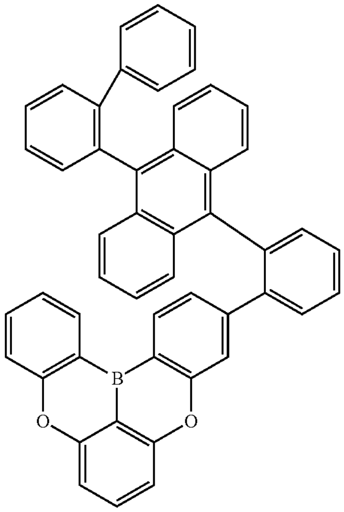
(1-85)
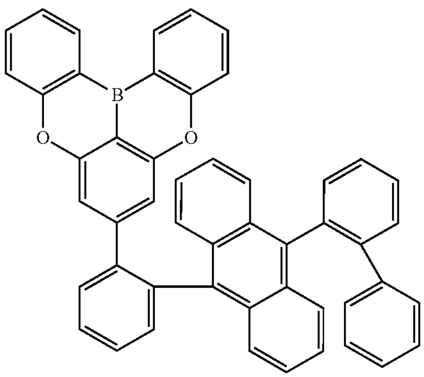
(1-91)
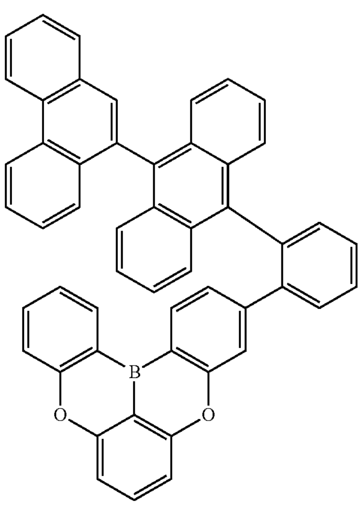
-continued
(1-92)
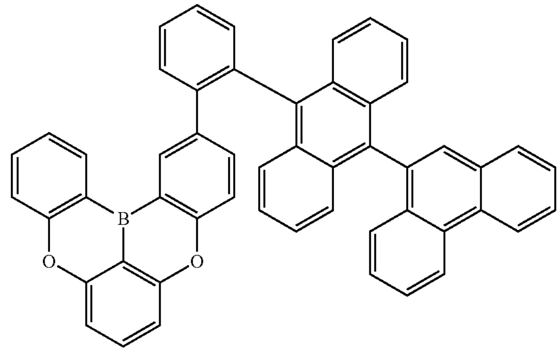
(1-93)
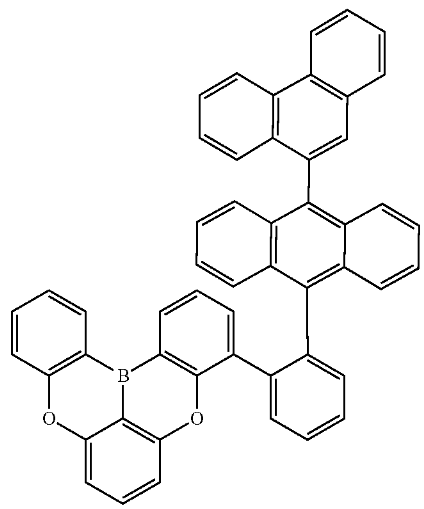
(1-94)
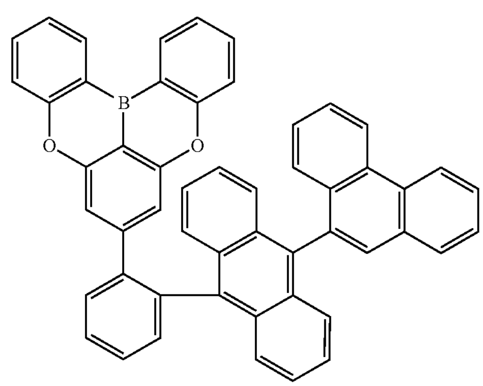

-continued
(1-95)
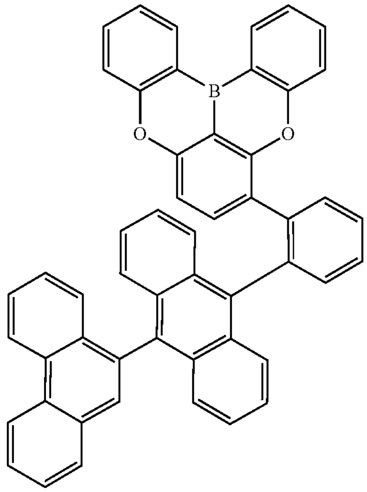
(1-101)
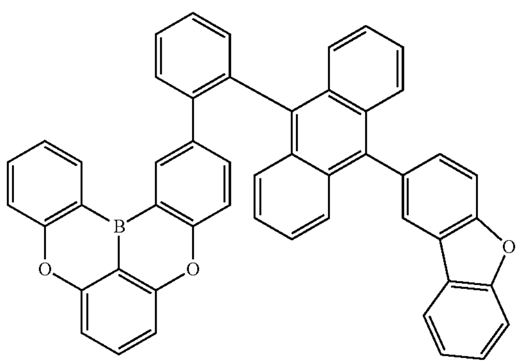
(1-102)
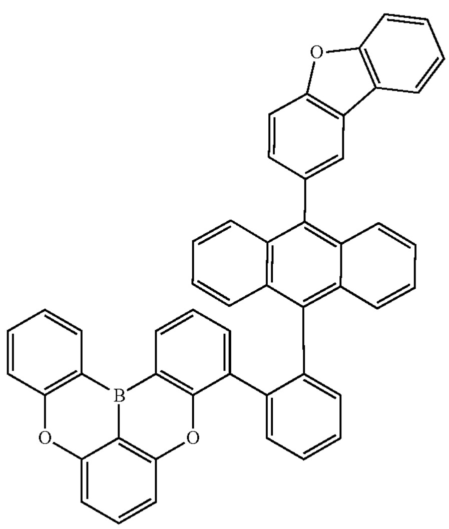
-continued
(1-103)
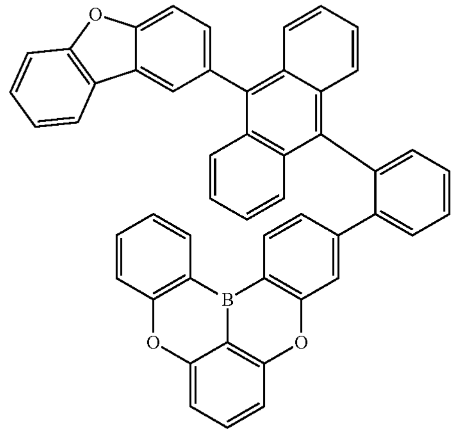
(1-104)
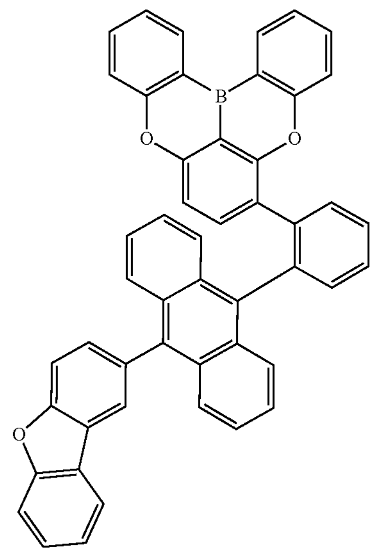
(1-105)
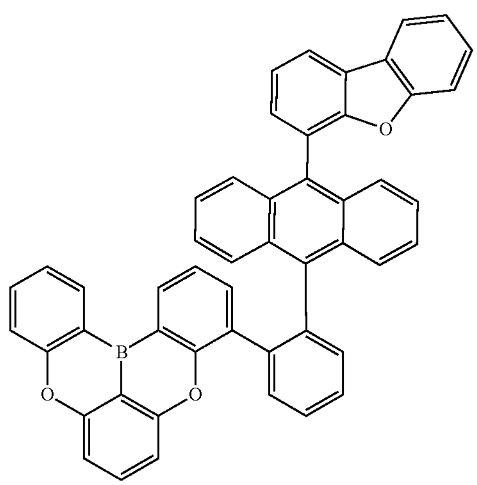

-continued
(1-106)
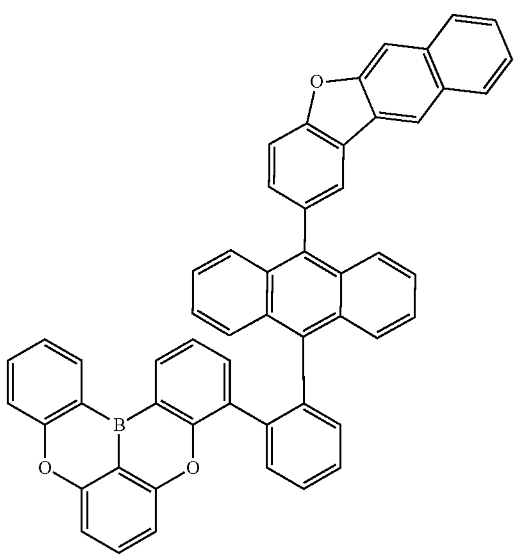
(1-107)
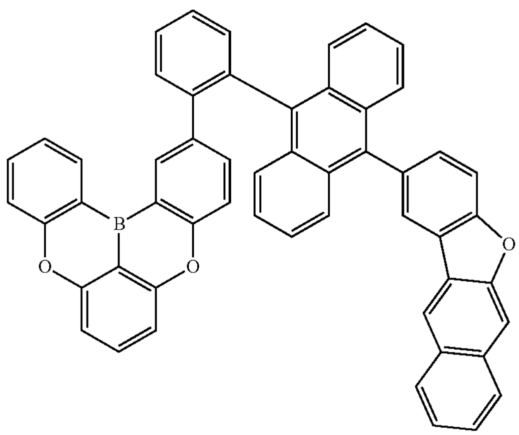
(1-108)
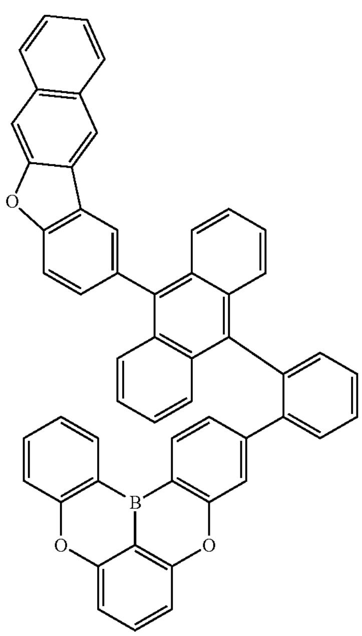
-continued
(1-109)
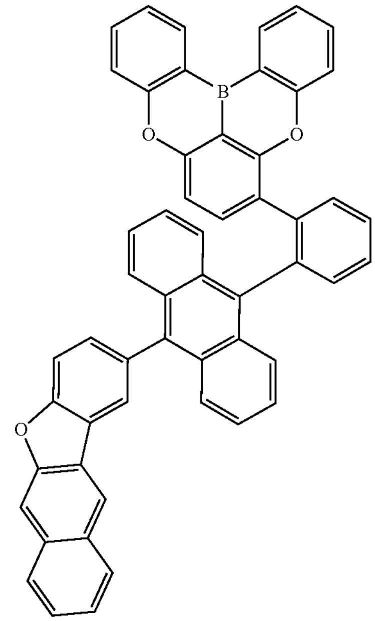
(1-111)
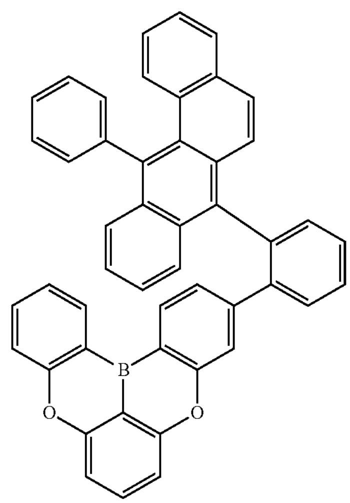
(1-112)
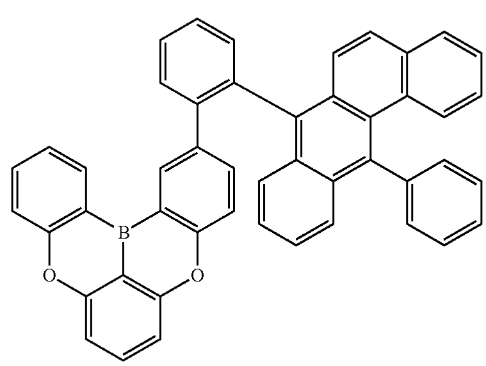

-continued
(1-113)
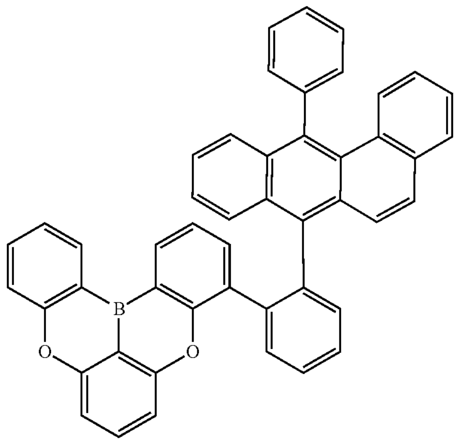
(1-114)
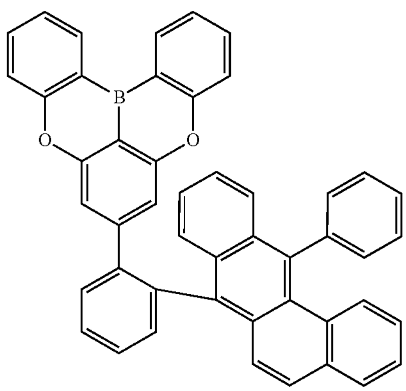
(1-115)
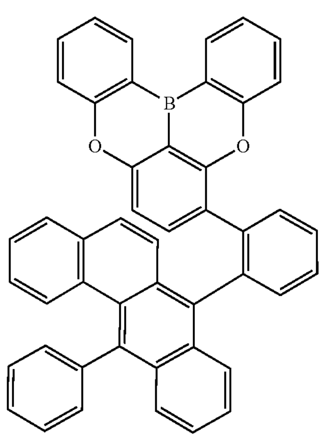
-continued
(1-116)
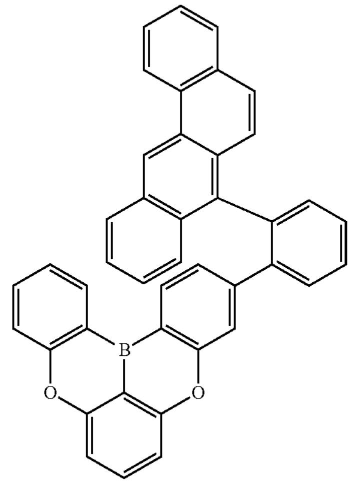
(1-117)
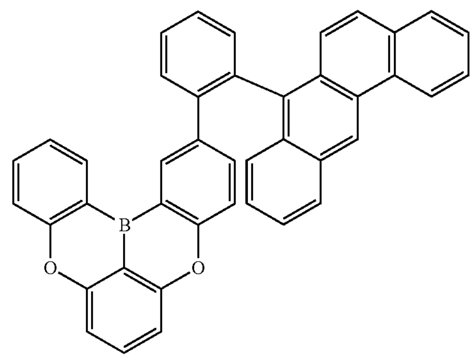
(1-118)
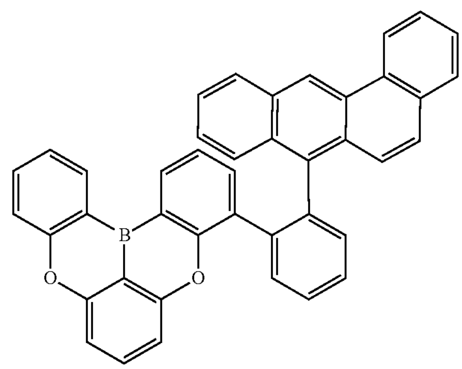
(1-119)
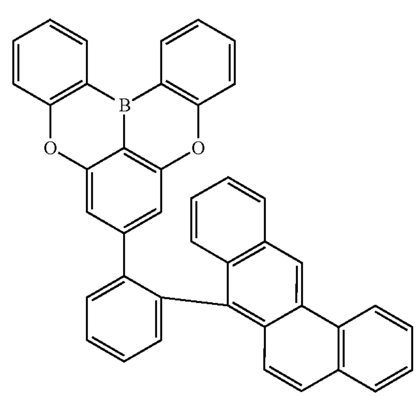

(1-120)
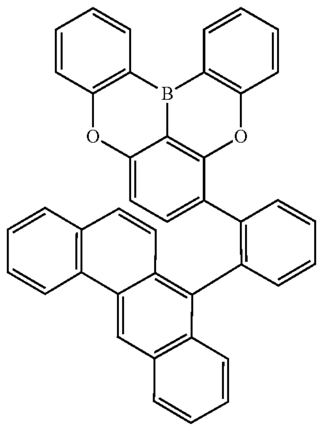
(1-121)
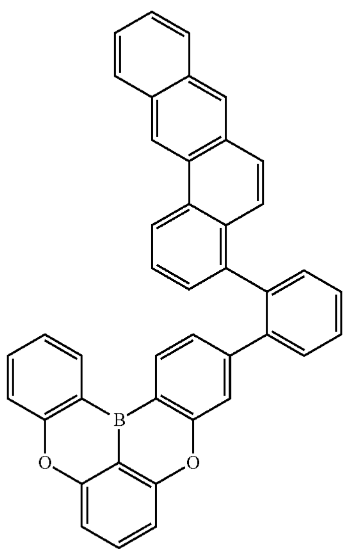
(1-122)
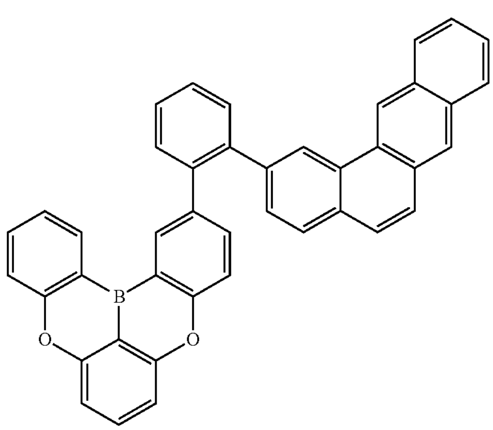
(1-123)
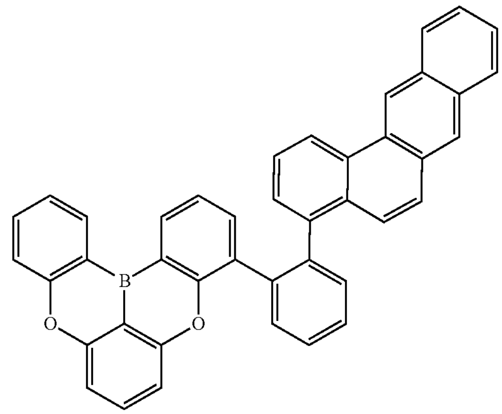
(1-124)
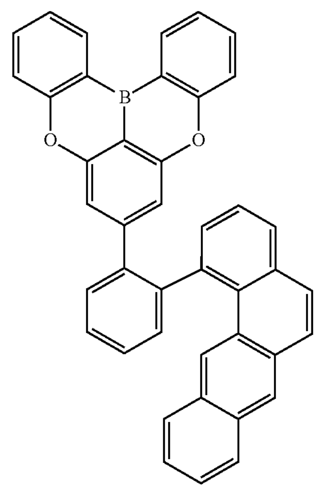
(1-125)
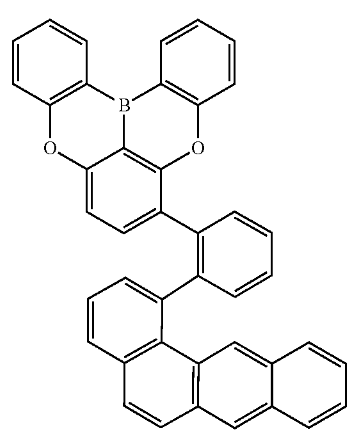

(1-131)
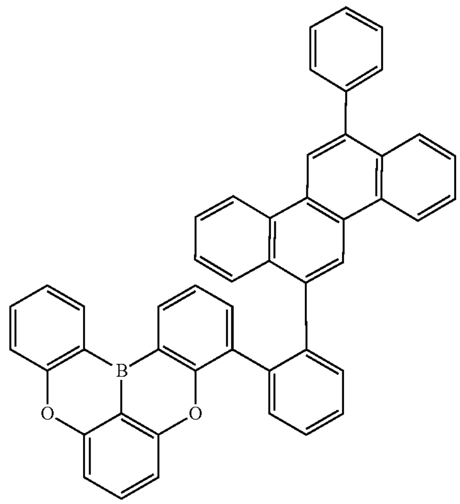
(1-132)
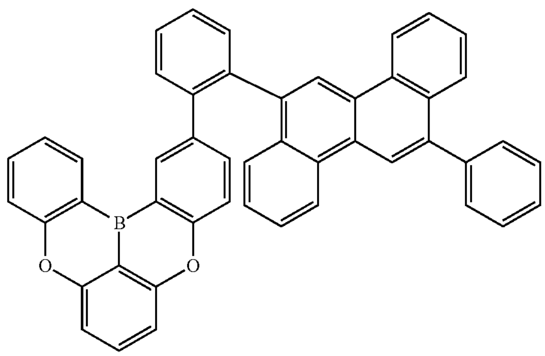
(1-133)
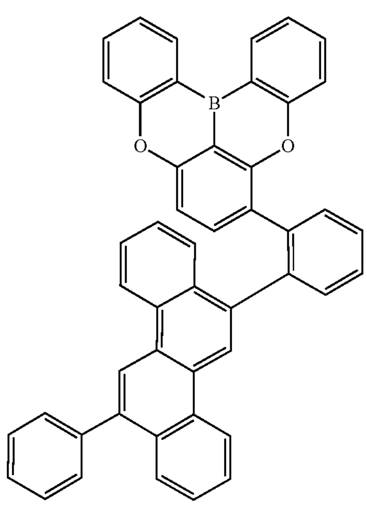
(1-134)
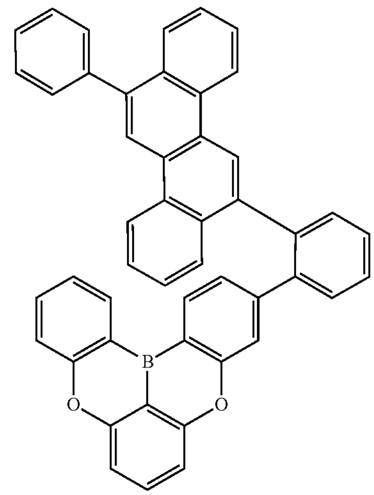
(1-135)
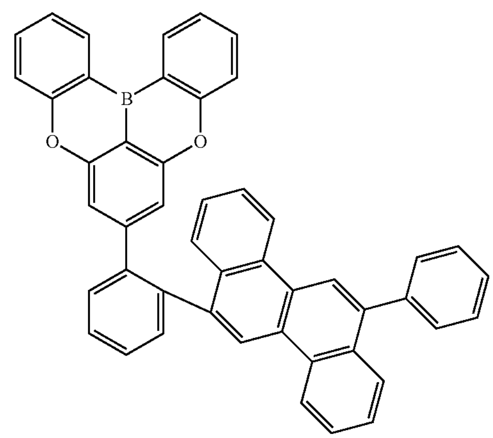
(1-136)
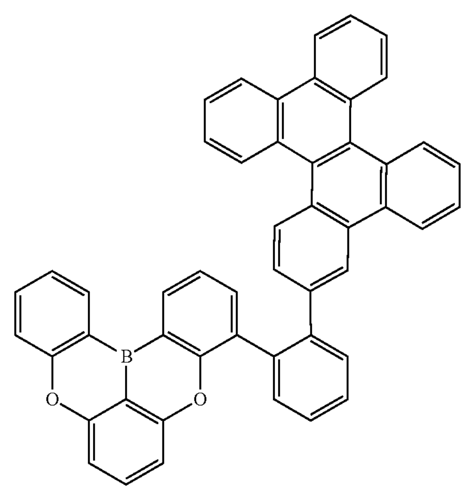

(1-137)
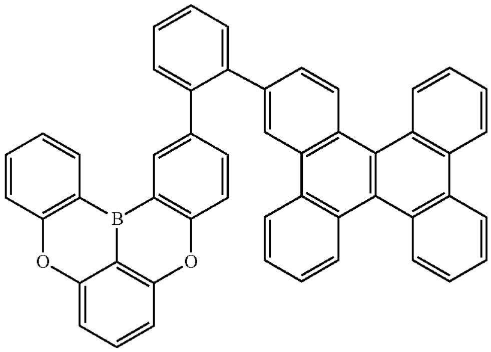
(1-138)
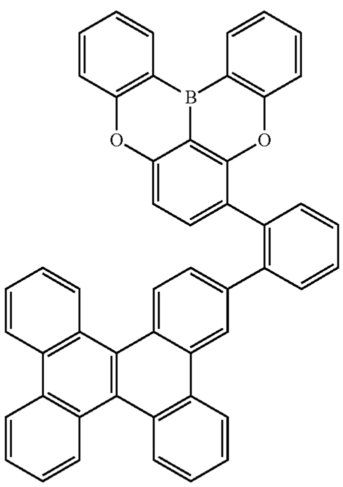
(1-139)
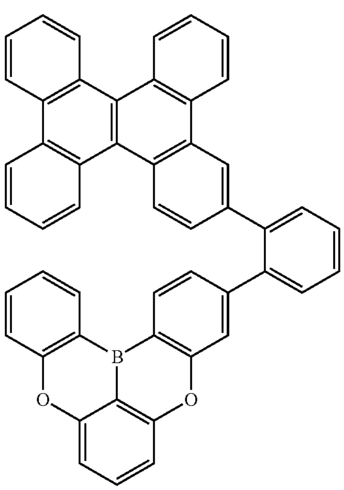
(1-140)
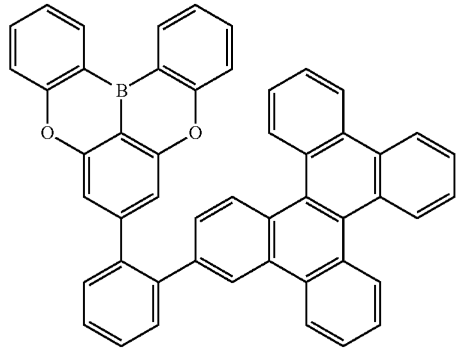
(1-151)
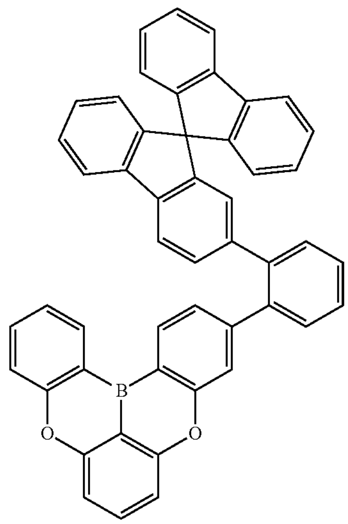
(1-152)
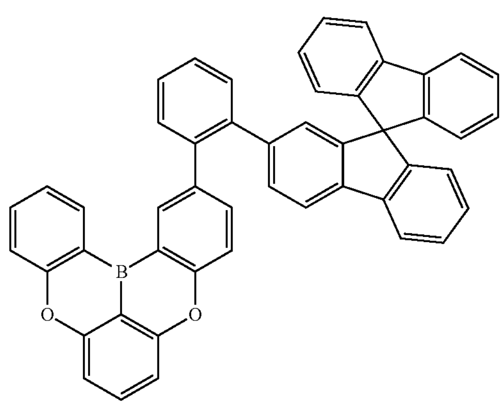

(1-153)
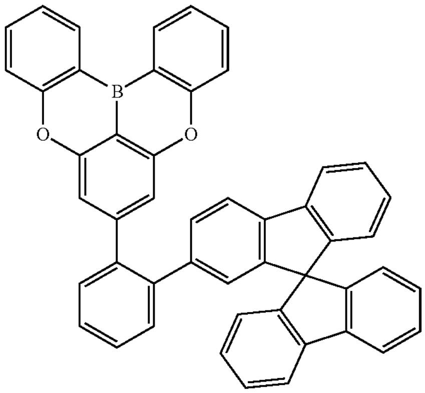
(1-154)
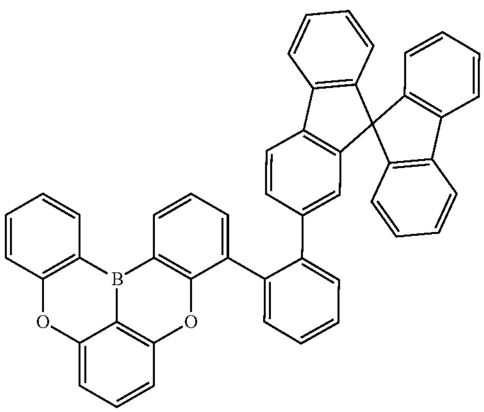
(1-155)
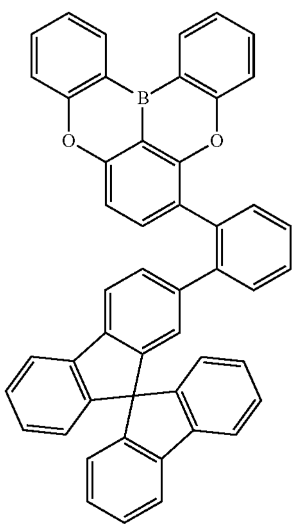
(1-156)
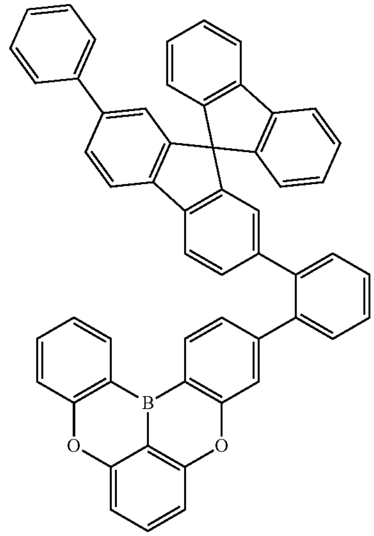
(1-157)
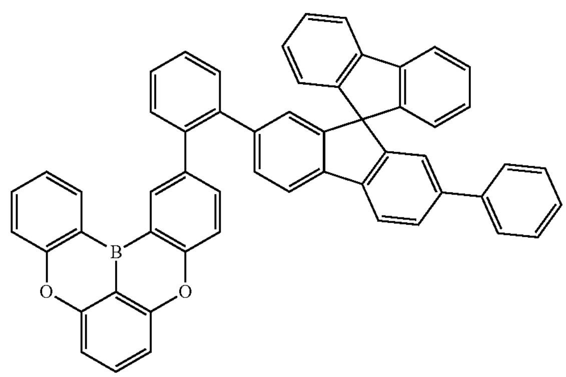
(1-158)
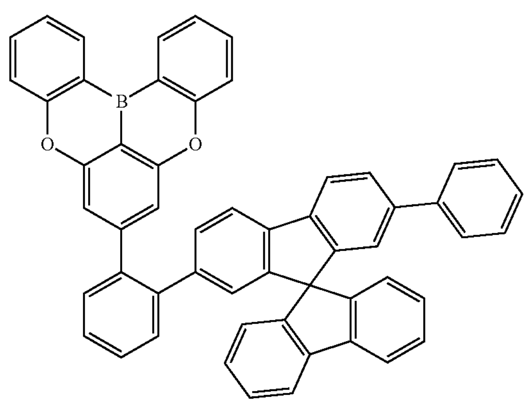

-continued
(1-159)
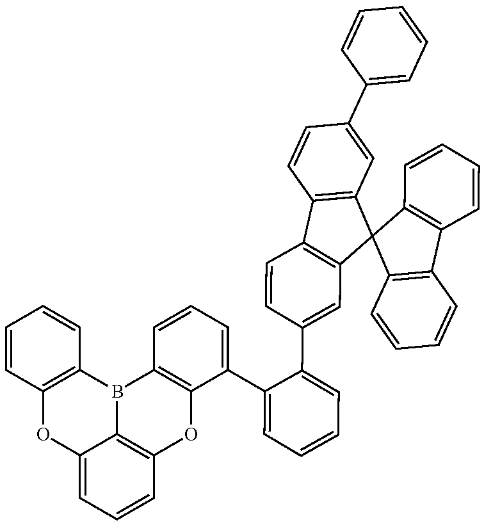
(1-160)
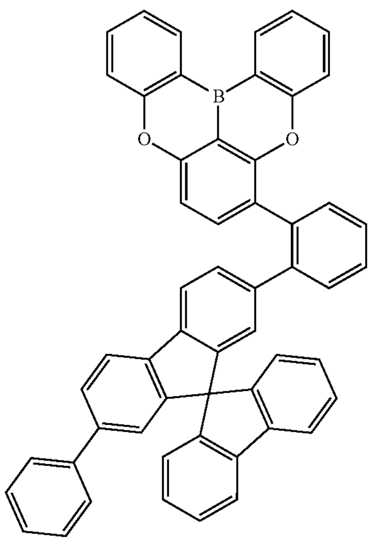
(1-161)
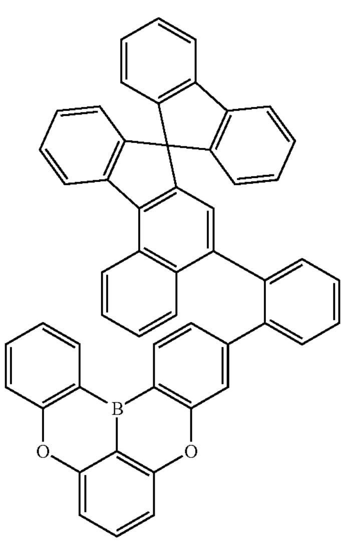
-continued
(1-162)
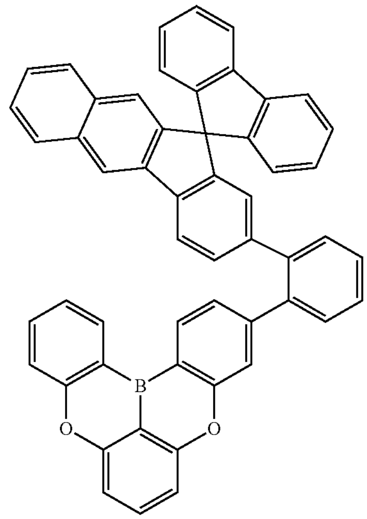
(1-163)
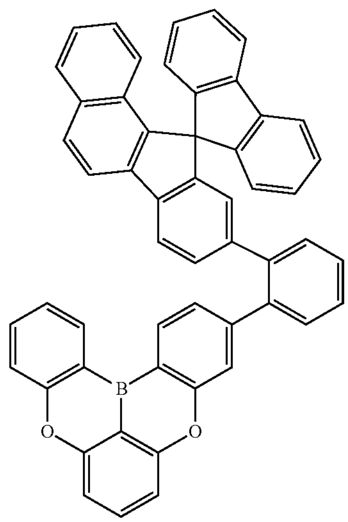
(1-164)
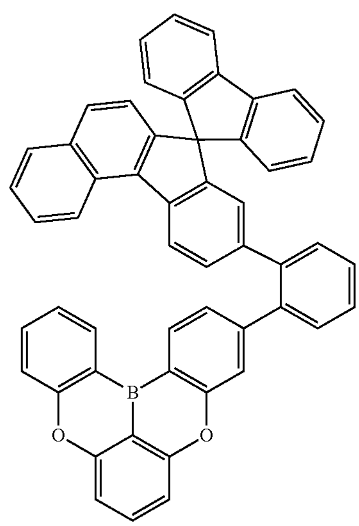

-continued
(1-165)
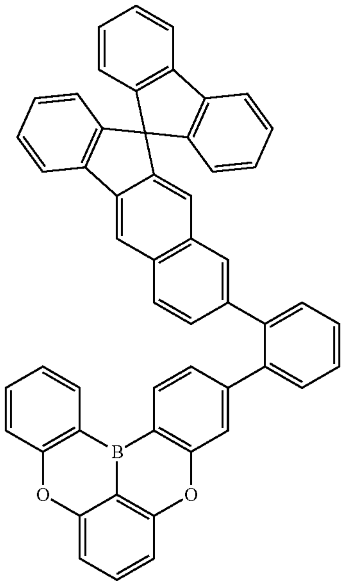
(1-166)
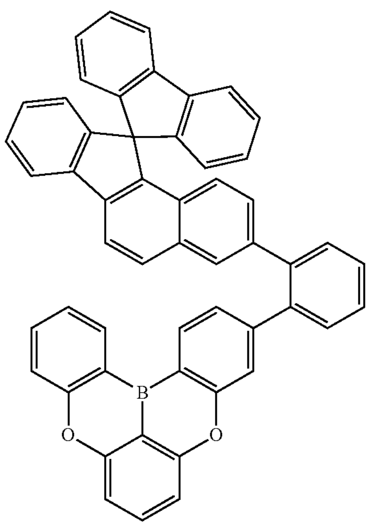
(1-167)
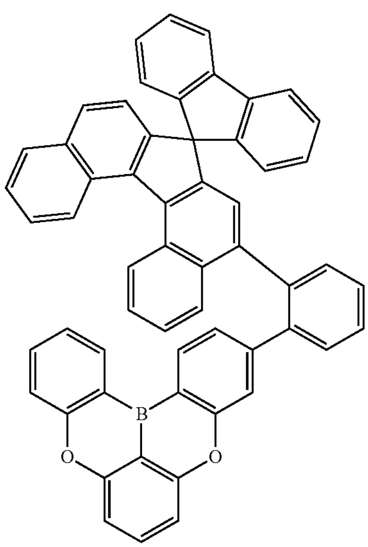
-continued
(1-168)
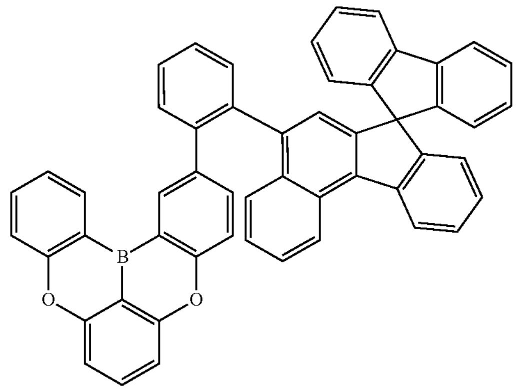
(1-169)
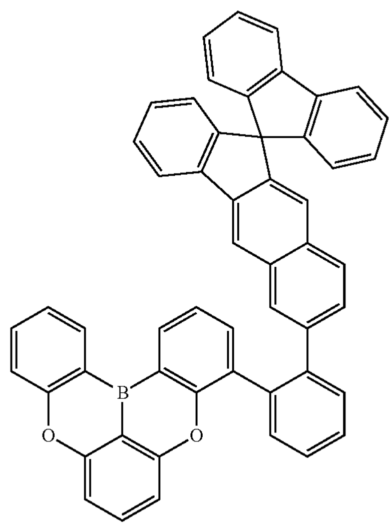
(1-170)
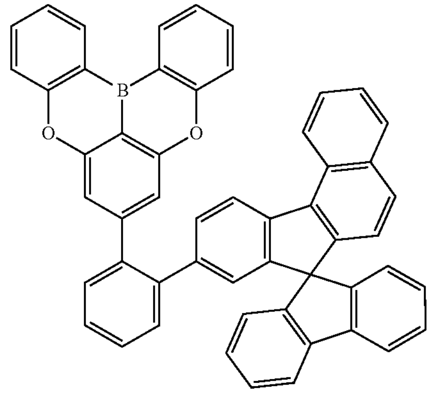

-continued
(1-171)
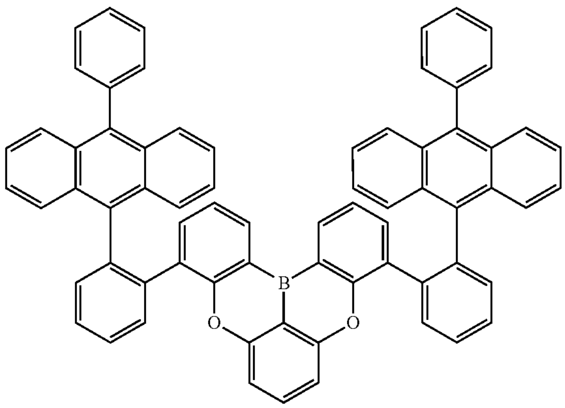
(1-172)
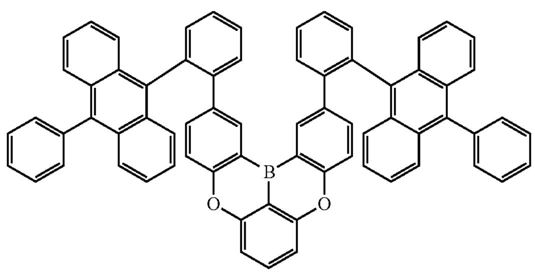
(1-173)
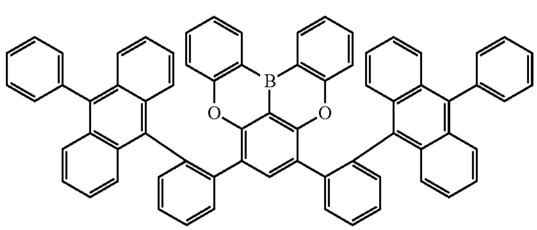
(1-174)
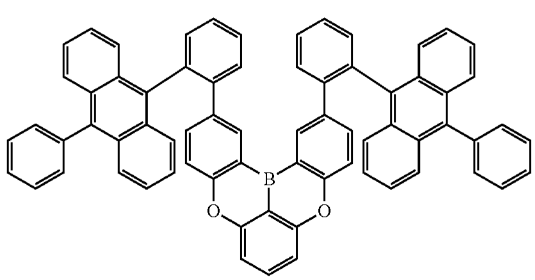
-continued
(1-175)
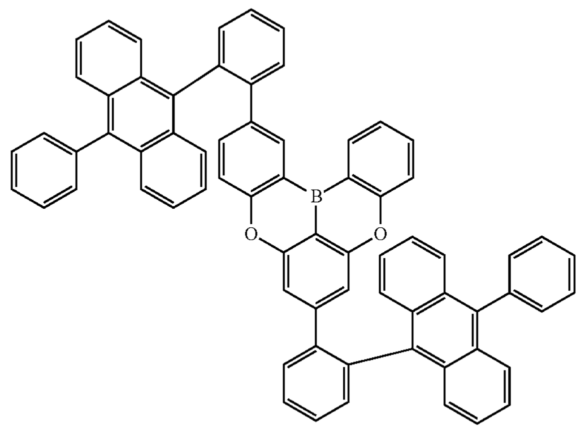
(1-176)
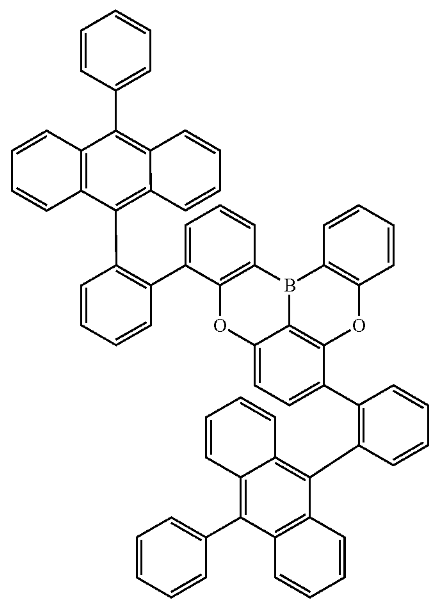
(1-177)
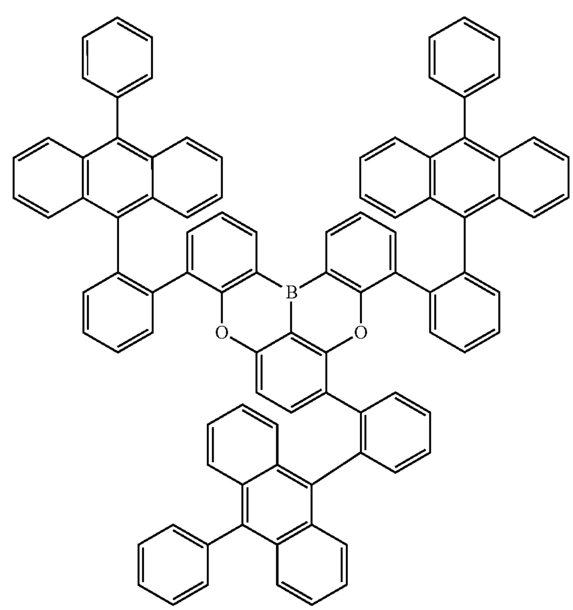

-continued
(1-178)
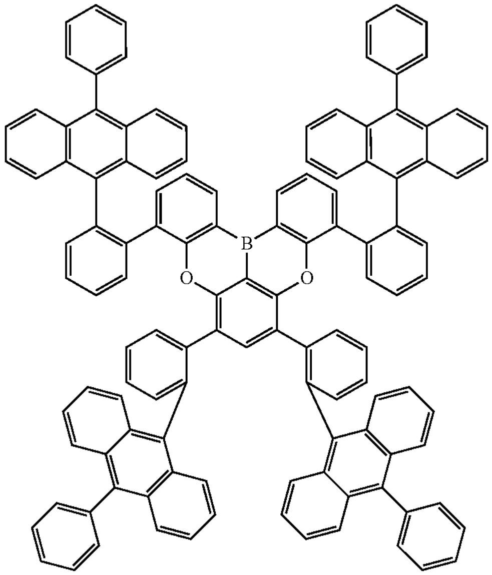
(1-179)
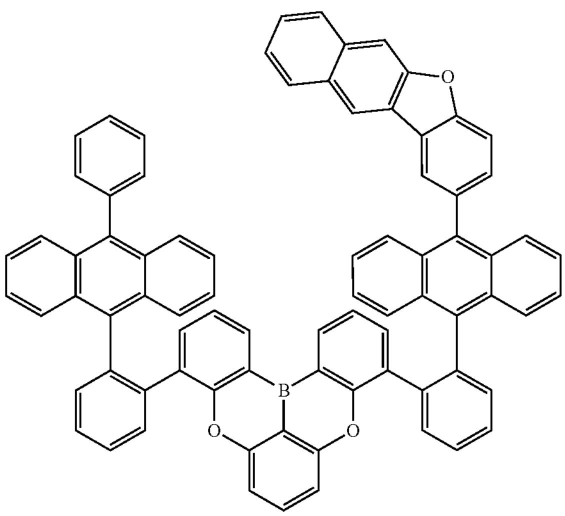
(1-180)
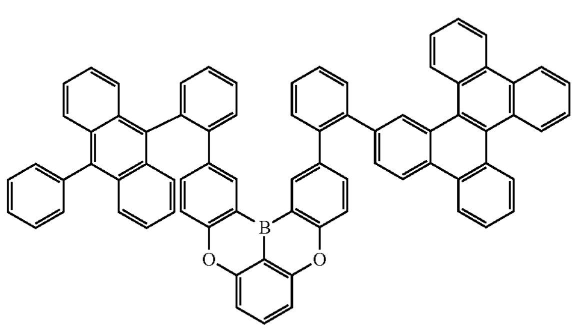
-continued
(1-191)
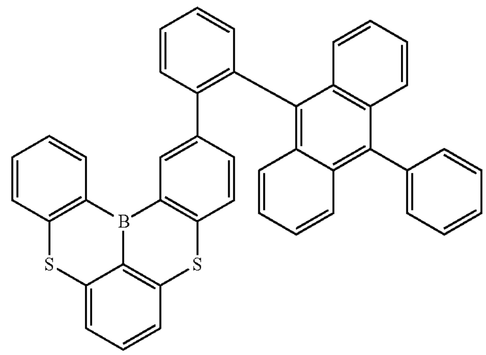
(1-192)
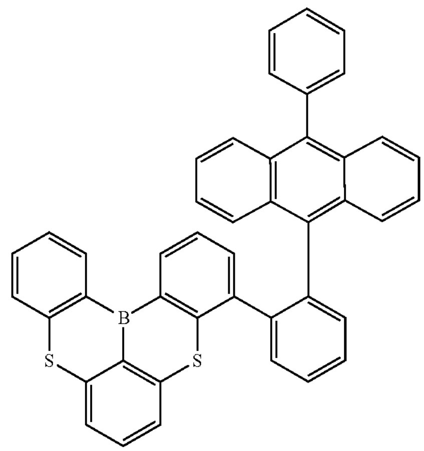
(1-193)
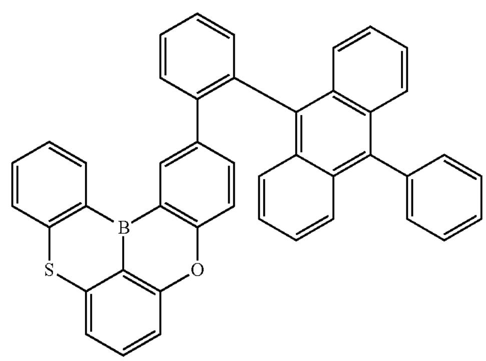
(1-194)
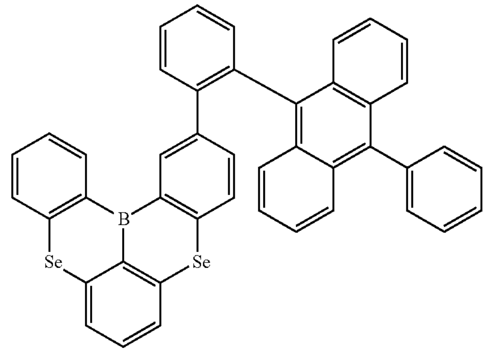

-continued (1-195)

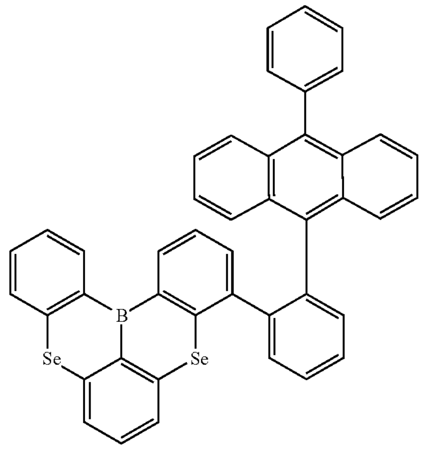

(1-196)

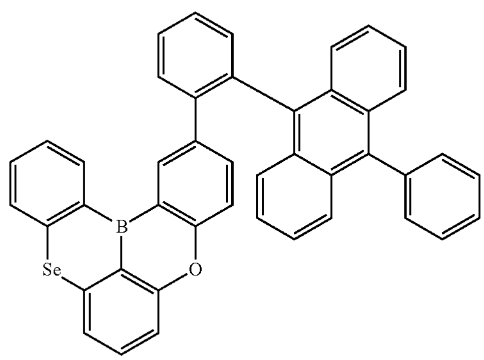

2. Method for Manufacturing Polycyclic Aromatic Compound Represented by the General Formula (1)

A polycyclic aromatic compound represented by the general formula (1) can be basically manufactured as follows: a first intermediate is manufactured by bonding ring a to ring b and ring c with bonding groups ($X^1$ and $X^2$) (first reaction); after that, a boronic acid ester is introduced to the ring a (second intermediate); further, by optionally hydrolyzing the resultant product, the boronic acid (second intermediate) is manufactured (second reaction); and the second intermediate (boronic acid or boronic acid ester) is reacted with a Lewis acid such as aluminum chloride (third reaction).

In this regard, as a method for introducing a group formed of an intermediate group represented by the formula (Z-1) and a terminal group being Ar in the formula (Z-1) into a polycyclic aromatic compound, a method of using a material in which a "group formed of an intermediate group and a terminal group" has already been substituted by at least one of ring a, ring b and ring c, as a raw material to be used in a first reaction, a method in which a material obtained by introducing an active group such as a halogen or boronic acid (or a derivative thereof) into at least one of ring a, ring b and ring c is used as a raw material to be used in a first reaction, and in the subsequent appropriate step, the active group is substituted by a "group formed of an intermediate group and a terminal group" having boronic acid (or a derivative thereof) or a halogen, or the like can be mentioned. As a substitution method, for example, a cross-coupling reaction such as Suzuki coupling reaction can be used. Further, a skeleton part of the polycyclic aromatic compound of the general formula (1) can be manufactured also by a method for manufacturing a polycyclic aromatic compound of the general formula (2) that is described below, and therefore, a "group formed of an intermediate group and a terminal group" may be introduced in the middle of or after the manufacture of the skeleton part by the method. As a method for the introduction, a cross-coupling reaction can be used in the same manner as described above after the introduction of an active group such as a halogen or boronic acid (or a derivative thereof). Examples of the halogen include chlorine, bromine, and iodine. Herein, as a halogenation method, a general method can be used, and for example, halogenation using chlorine, bromine, iodine, N-chloro succinic acid imide, N-bromo succinic acid imide, or the like can be mentioned.

In the first reaction, for example, if the reaction is an etherification reaction in a case where at least one of $X^1$ and $X^2$ is >O, a general reaction such as nucleophilic substitution reaction, or Ullmann reaction can be used to manufacture the first intermediate. As shown in the following scheme (1-1), the second reaction is a reaction in which a boronic acid ester such as Bpin is introduced into the first intermediate obtained in the first reaction. In this regard, the Bpin in the following scheme is a group in which —$B(OH)_2$ is pinacol esterified. In addition, signs in a structural formula in each of the following schemes are the same as those defined above.

Scheme (1-1)

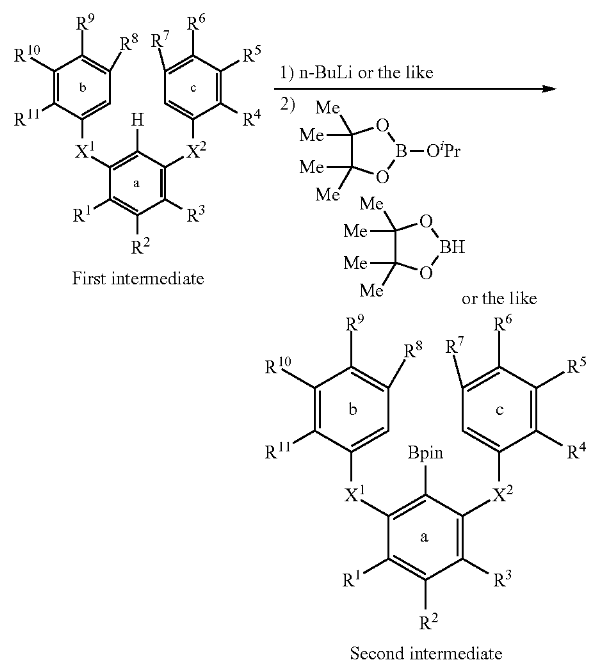

In the above scheme (1-1), at first, a hydrogen atom is lithiated by the ortho-metalation with n-butyllithium, sec-butyllithium, t-butyllithium or the like. Here, a method of using n-butyllithium, sec-butyllithium, t-butyllithium or the like alone has been described, however, in the method, in order to improve the reactivity, N,N,N',N'-tetramethylethylenediamine or the like may be added. Further, by adding a boronic acid esterification reagent such as 2-isopropoxy-4,4,5,5-tetramethyl-1,3,2-dioxaborolane to the obtained lithiated compound, a pinacol ester of boronic acid can be manufactured. Here, a method of using 2-isopropoxy-4,4,5,5-tetramethyl-1,3,2-dioxaborolane has been described, however, in addition, trimethoxyborane, triisopropoxyborane, or the like can also be used. Further, by applying a method described in WO 2013/016185 A, 4,4,5,5-tetramethyl-1,3,2-dioxaborolane or the like can also be used similarly. Isopropyl Borate In addition, as shown in the following scheme (1-2), by hydrolyzing the boronic acid ester manufactured by the method of the above scheme (1-1), boronic acid can be manufactured.

Scheme (1-2)

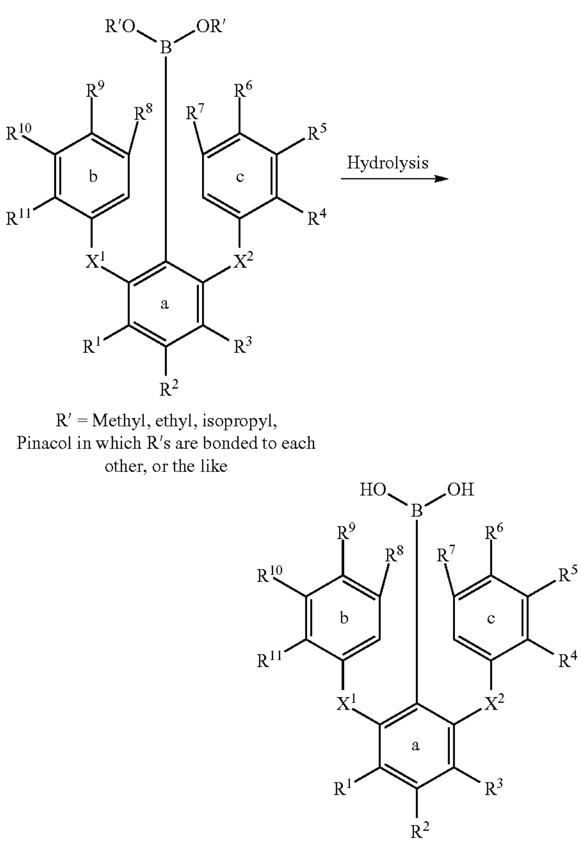

R′ = Methyl, ethyl, isopropyl, Pinacol in which R′s are bonded to each other, or the like Second intermediate Further, by reacting the boronic acid ester or boronic acid obtained by the above schemes (1-1) to (1-2) with an appropriate alcohol, a different boronic acid ester can be manufactured via transesterification or re-esterification.

By appropriately selecting the manufacturing method described above and appropriately selecting also the raw material to be used, a second intermediate (boronic acid or boronic acid ester) having a substituent at a desired position can be manufactured.

In the above schemes (1-1) to (1-2), lithium is introduced into a desired position by ortho-metalation. However, as shown in the following scheme (1-3), lithium can also be introduced at a desired position by introducing a halogen such as a bromine atom at a position where lithium is to be introduced and by performing halogen-metal exchange. Subsequently, a second intermediate such as a boronic acid ester can be manufactured from the obtained lithiated compound.

Scheme (1-3)

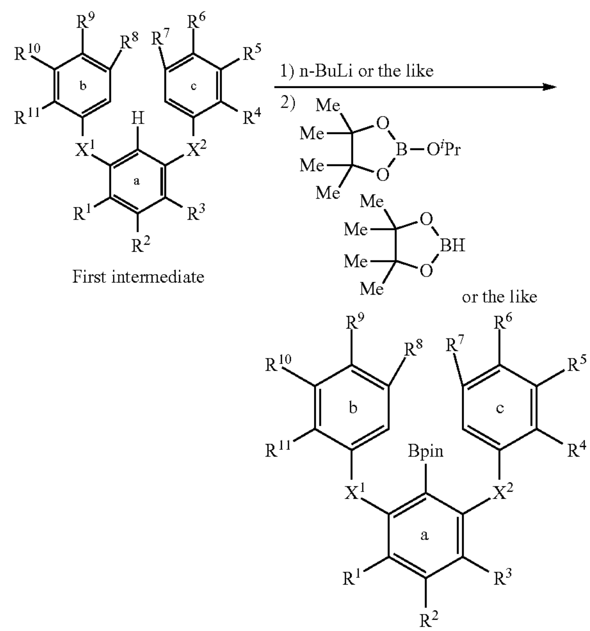

First intermediate

Second intermediate

In the above scheme (1-3), at first, a halogen atom is lithiated by performing halogen-lithium exchange reaction with n-butyllithium, sec-butyllithium, t-butyllithium or the like. Here, a method of using n-butyllithium, sec-butyllithium, t-butyllithium or the like alone has been described, however, in the method, in order to improve the reactivity, N,N,N',N'-tetramethylethylenediamine or the like may be added. Further, by adding a boronic acid esterification reagent such as 2-isopropoxy-4,4,5,5-tetramethyl-1,3,2-dioxaborolane to the obtained lithiated compound, a pinacol ester of boronic acid can be manufactured. Here, a method of using 2-isopropoxy-4,4,5,5-tetramethyl-1,3,2-dioxaborolane has been described, however, in the method, in addition, trimethoxyborane, triisopropoxyborane, or the like can be used. Further, by applying a method described in WO 2013/016185 A, 4,4,5,5-tetramethyl-1,3,2-dioxaborolane or the like can also be used similarly.

In addition, as shown in the following scheme (1-4), a second intermediate such as a boronic acid ester can be similarly manufactured also by subjecting a brominated compound and bis(pinacolato)diboron, 4,4,5,5-tetramethyl-1,3,2-dioxaborolane or the like to coupling reaction with the use of a palladium catalyst and a base.

Scheme (1-4)

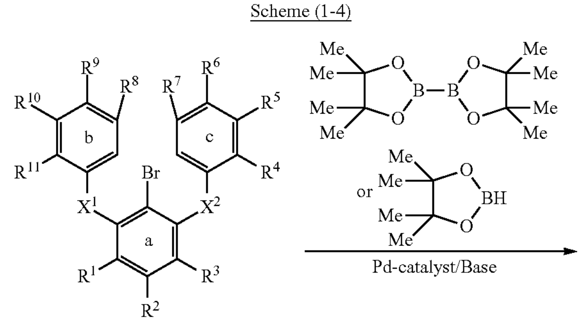

First intermediate

-continued

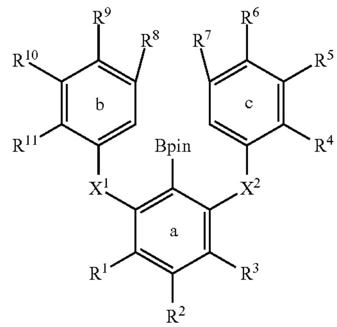

Second intermediate

-continued

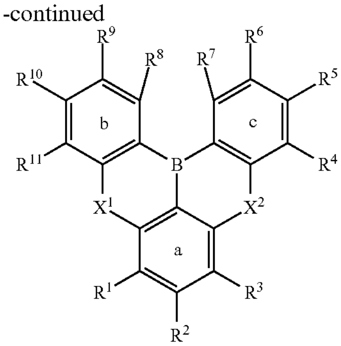

Polycyclic aromatic compound represented by the general formula (1)

As a metalation reagent to be used in halogen-metal exchange reaction in the schemes described so far, an alkyl lithium such as methyllithium, n-butyllithium, sec-butyllithium, or t-butyllithium, isopropylmagnesium chloride, isopropylmagnesium bromide, phenylmagnesium chloride, phenylmagnesium bromide, a lithium chloride complex of isopropylmagnesium chloride, which is known as a Turbo Grignard reagent, or the like can be mentioned.

Further, as a metalation reagent to be used in ortho-metal exchange reaction in the schemes described so far, in addition to the above reagents, an organic alkaline compound such as lithium diisopropylamide, lithium tetramethylpiperidide, lithium hexamethyldisilazide, potassium hexamethyldisilazide, a lithium tetramethylpiperidinylmagnesium chloride-lithium chloride complex, or tri-n-butyl lithium magnesate, can be mentioned.

In addition, as an additive agent that promotes a reaction in a case of using an alkyl lithium as the metalation reagent, N,N,N',N'-tetramethylethylenediamine, 1,4-diazabicyclo[2.2.2]octane, N,N-dimethylpropyleneurea, or the like can be mentioned.

As shown in the following scheme (1-5), in a third reaction, by reacting a second intermediate such as a boronic acid ester with a Lewis acid such as aluminum chloride, a polycyclic aromatic compound represented by the general formula (1) can be manufactured.

Scheme (1-5)

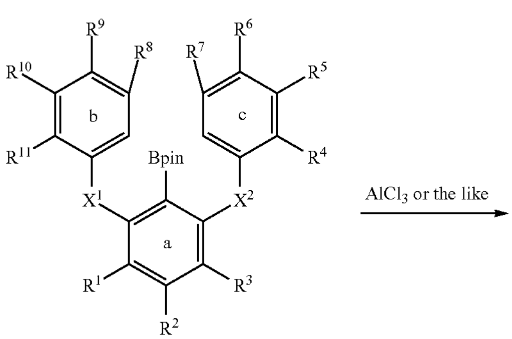

Second intermediate

Further, a Brønsted acid such as p-toluenesulfonic acid can also be used. In particular, in a case where the reaction is performed by using a Lewis acid, a base such as diisopropylethylamine may be added in order to improve the selectivity or the yield.

Examples of a Lewis acid used for the above scheme (1-5) include $AlCl_3$, $AlBr_3$, $AlF_3$, $BF_3.OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, $CoBr_3$.

Further, such a Lewis acid can be used also by being supported on a solid.

As the Brønsted acid to be used in the above scheme (1-5), p-toluenesulfonic acid, methanesulfonic acid, trifluoromethanesulfonic acid, fluorosulfonic acid, carborane acid, trifluoroacetic acid, (trifluoromethanesulfonyl)imide, tris(trifluoromethanesulfonyl)methane, hydrogen chloride, hydrogen bromide, hydrogen fluoride, or the like can be mentioned. In addition, as the solid Brønsted acid, Amberlyst (trade name, manufactured by The Dow Chemical Company), Nafion (trade name, manufactured by E. I. du Pont de Nemours and Company), zeolite, TAYCACURE (trade name, manufactured by Tayca Corporation), or the like can be mentioned.

As the amine that may be added in the above scheme (1-5), diisopropylethylamine, triethylamine, tributylamine, 1,4-diazabicyclo[2.2.2]octane, N,N-dimethyl-p-toluidine, N,N-dimethylaniline, pyridine, 2,6-lutidine, 2,6-di-t-butylamine, or the like can be mentioned.

Further, as the solvent to be used in the above scheme (1-5), o-dichlorobenzene, chlorobenzene, toluene, benzene, methylene chloride, chloroform, dichloroethylene, benzotrifluoride, decalin, cyclohexane, hexane, heptane, 1,2,4-trimethylbenzene, xylene, diphenyl ether, anisole, cyclopentyl methyl ether, tetrahydrofuran, dioxane, methyl-t-butyl ether, or the like can be mentioned.

In addition, the polycyclic aromatic compound represented by the general formula (1) includes a compound in which at least some of hydrogen atoms are substituted by deuterium atoms. Such a compound or the like can be synthesized in a similar manner to the above using a raw material having a desired site deuterated.

3. Polycyclic Aromatic Compound Represented by the General Formula (2) and Multimer Thereof A polycyclic aromatic compound represented by the general formula (2) and a polycyclic aromatic compound multimer having a plurality of structures represented by the general formula (2) can be used as a material for a light emitting layer by the combination of a polycyclic aromatic compound represented by the general formula (1), and basically functions as a dopant. The polycyclic aromatic compound and a multimer thereof are preferably a polycyclic aromatic compound represented by the following general formula (2') or a polycyclic aromatic compound multimer having a plurality of structures represented by the following general formula (2').

In this regard, a compound of the general formula (2) or (2') and a multimer thereof are compounds each different from the polycyclic aromatic compound represented by the general formula (1), and the polycyclic aromatic compound represented by the general formula (1) is excluded from the definitions of the general formulas (2) and (2').

(2)

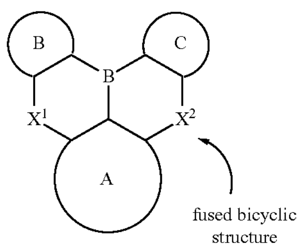

(2')

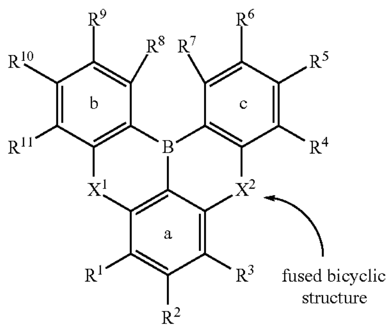

In the above formula (2), ring A, ring B and ring C each independently represent an aryl ring or a heteroaryl ring, and at least one hydrogen atom in these rings may be substituted by a substituent, $X^1$ and $X^2$ each independently represent >O or >N—R, R of the >N—R represents an aryl that may be substituted by a substituent, or a heteroaryl that may be substituted by a substituent, an alkyl that may be substituted by a substituent, or a cycloalkyl that may be substituted by a substituent, and R of the >N—R may be bonded to at least one of the ring A, the ring B and ring C with a linking group or a single bond, and at least one hydrogen atom in a compound or structure represented by the formula (2) may be substituted by a halogen atom, a cyano or a deuterium atom.

In the above formula (2'), $R^1$ to $R^{11}$ each independently represent a hydrogen atom, an aryl, a heteroaryl, a diarylamino, a diheteroarylamino, an arylheteroarylamino, a diarylboryl (two aryls may be linked via a single bond or a linking group), an alkyl, a cycloalkyl, an alkoxy or an aryloxy, at least one hydrogen atom in these groups may be substituted by an aryl, a heteroaryl, an alkyl, or a cycloalkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, a diarylboryl (two aryls may be linked via a single bond or a linking group), an alkyl, a cycloalkyl, an alkoxy, or an aryloxy, and at least one hydrogen atom in these groups may be substituted by an aryl, a heteroaryl, an alkyl, or a cycloalkyl, $X^1$ and $X^2$ each independently represent >N—R, R of the >N—R represents an aryl having 6 to 12 carbon atoms, a heteroaryl having 2 to 15 carbon atoms, an alkyl having 1 to 6 carbon atoms, or a cycloalkyl having 3 to 14 carbon atoms, R of the >N—R may be bonded to at least one of the ring a, ring b and ring c with —O—, —S—, $—C(—R)_2—$, or a single bond, R of the $—C(—R)_2—$ represents an alkyl having 1 to 6 carbon atoms, or a cycloalkyl having 3 to 14 carbon atoms, and at least one hydrogen atom in a compound represented by formula (2') may be substituted by a halogen atom, a cyano or a deuterium atom.

The ring A, ring B and ring C in general formula (2) each independently represent an aryl ring or a heteroaryl ring, and at least one hydrogen atom in these rings may be substituted by a substituent. This substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (an amino group having an aryl and a heteroaryl), a substituted or unsubstituted diarylboryl (two aryls may be linked via a single bond or a linking group), a substituted or unsubstituted alkyl, a substituted or unsubstituted cycloalkyl, a substituted or unsubstituted alkoxy, or a substituted or unsubstituted aryloxy. In a case where these groups have substituents, examples of the substituents include an aryl, a heteroaryl, an alkyl, and a cycloalkyl. Furthermore, the aryl ring or heteroaryl ring preferably has a 5-membered ring or 6-membered ring sharing a bond with a fused bicyclic structure (hereinafter, this structure is also referred to as "structure D") at the center of general formula (2) constituted by "B", "$X^1$", and "$X^2$".

Here, the "fused bicyclic structure (structure D)" means a structure in which two saturated hydrocarbon rings that are configured to include "B", "$X^1$", and "$X^2$" and indicated at the center of general formula (2) are fused. Furthermore, a "6-membered ring sharing a bond with the fused bicyclic structure" means, for example, ring a (benzene ring (6-membered ring)) fused to the structure D as represented by the above general formula (2'). Furthermore, the phrase "aryl ring or heteroaryl ring (which is ring A) has this 6-membered ring" means that the ring A is formed only from this 6-membered ring, or the ring A is formed such that other rings are further fused to this 6-membered ring so as to include this 6-membered ring. In other words, the "aryl ring or heteroaryl ring (which is ring A) having a 6-membered ring" as used herein means that the 6-membered ring that constitutes the entirety or a portion of the ring A is fused to the structure D. The same description applies to the "ring B (ring b)", "ring C (ring c)", and the "5-membered ring".

The ring A (or ring B or ring C) in general formula (2) corresponds to ring a and its substituents $R^1$ to $R^3$ in general formula (2') (or ring b and its substituents $R^4$ to $R^7$, or ring c and its substituents $R^8$ to $R^{11}$). That is, general formula (2') corresponds to a structure in which "rings A to C having 6-membered rings" have been selected as the rings A to C of general formula (2). For this meaning, the rings of general formula (2') are represented by small letters a to c.

In general formula (2'), adjacent groups among the substituents R1 to R11 of the ring a, ring b, and ring c may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, a substituted or unsubstituted diarylboryl (two aryls may be linked via a single bond or a linking group), an alkyl, a cycloalkyl, an alkoxy or an aryloxy, while at least one hydrogen atom in these may be substituted by an aryl, a heteroaryl, an alkyl, or a cycloalkyl. Therefore, in a compound represented by general formula (2'), a ring structure constituting the compound changes as represented by the following formulas (2'-1) and (2'-2) according to a mutual bonding form of substituents in the ring a, ring b or ring c. Ring A', ring B' and ring C' in each formula correspond to the ring A, ring B and ring C in general formula (2), respectively. Note that $R^1$ to $R^{11}$, a, b, c, $X^1$, and $X^2$ in each formulas are defined in the same manner as those in formula (2').

(2'-1)

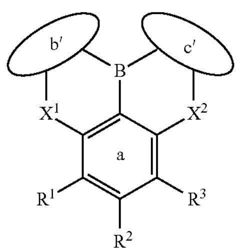

(2'-2)

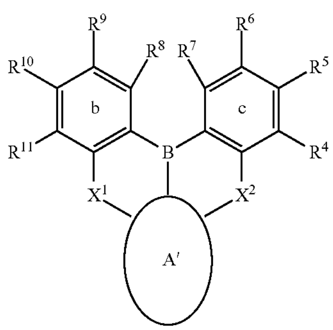

The ring A', ring B' and, ring C' in the above formulas (2'-1) and (2'-2) each represent, to be described in connection with general formula (2'), an aryl ring or a heteroaryl ring formed by bonding adjacent groups among the substituents R1 to R11 together with the ring a, ring b, and ring c, respectively (may also be referred to as a fused ring obtained by fusing another ring structure to the ring a, ring b, or ring c). Incidentally, although not indicated in the formula, there is also a compound in which all of the ring a, ring b, and ring c have been changed to the ring A', ring B' and ring C'. Furthermore, as apparent from the above formulas (2'-1) and (2'-2), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

A compound represented by the above formula (2'-1) or (2'-2) corresponds to, for example, a compound represented by any one of formulas (2-402) to (2-409) and (2-412) to (2-419) listed as specific compounds that are described below. That is, for example, the compound represented by formula (2'-1) or (2'-2) is a compound having ring A' (or ring B' or ring C' that is formed by fusing a benzene ring, an indole ring, a pyrrole ring, a benzofuran ring, a benzothiophene ring or the like to a benzene ring which is ring a (or ring b or ring c), and the fused ring A' (or fused ring B' or fused ring C') that has been formed is a naphthalene ring, a carbazole ring, an indole ring, a dibenzofuran ring, a dibenzothiophene ring or the like.

$X^1$ and $X^2$ in general formula (2) each independently represent >O or >N—R, while R of the >N—R represents an optionally substituted aryl, or an optionally substituted heteroaryl, an optionally substituted alkyl, or an optionally substituted cycloalkyl, and R of the >N—R may be bonded to at least one of the ring B and ring C with a linking group or a single bond. The linking group is preferably —O—, —S— or —C(—R)$_2$—. Incidentally, R of the "—C(—R)$_2$—" represents a hydrogen atom, an alkyl, or a cycloalkyl. This description also applies to $X^1$ and $X^2$ in general formula (2').

Here, the provision that "R of the >N—R is bonded to at least one of the ring A, ring B and ring C with a linking group or a single bond" for general formula (2) corresponds to the provision that "R of the >N—R is bonded to at least one of the ring a, ring b and ring c with —O—, —S—, —C(—R)$_2$— or a single bond" for general formula (2').

This provision can be expressed by a compound having a ring structure represented by the following formula (2'-3-1), in which $X^1$ or $X^2$ is incorporated into the fused ring B' or C'. That is, for example, the compound is a compound having ring B' (or ring C') formed by fusing another ring to a benzene ring which is ring b (or ring c) in general formula (2') so as to incorporate $X^1$ (or $X^2$). This compound corresponds to, for example, a compound represented by any one of formulas (2-451) to (2-462) and a compound represented by any one of formulas (2-1401) to (2-1460), listed as specific examples that are described below, and the fused ring B' (or fused ring C') that has been formed is, for example, a phenoxazine ring, a phenothiazine ring, or an acridine ring.

The above provision can be expressed by a compound having a ring structure in which at least one of $X^1$ and $X^2$ is incorporated into the fused ring A', represented by the following formula (2'-3-2) or (2'-3-3). That is, for example, the compound is a compound having ring A' formed by fusing another ring to a benzene ring which is ring a in general formula (2') so as to incorporate $X^1$ (at least one of $X^1$ and $X^2$). This compound corresponds to, for example, a compound represented by any one of formulas (2-471) to (2-479) and the like listed as specific examples that are described below, and the fused ring A' that has been formed is, for example, a phenoxazine ring, a phenothiazine ring, or an acridine ring. Note that $R^1$ to $R^{11}$, a, b, c, $X^1$, and $X^2$ in formulas (2'-3-1), (2'-3-2) and (2'-3-3) are defined in the same manner as those in formula (2').

(2'-3-1)

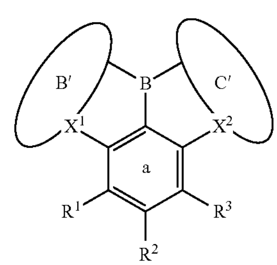

-continued (2'-3-2)

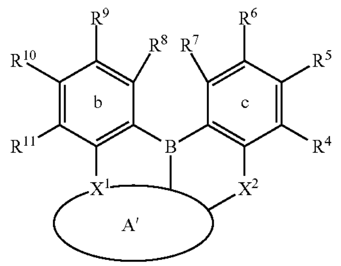

(2'-3-3)

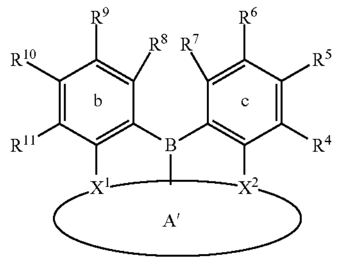

The "aryl ring" as the ring A, ring B or ring C of the general formula (2) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with the ring a, ring b, or ring c" defined by general formula (2'). Ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the "aryl ring" include a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring and a phenanthrene ring which are fused tricyclic systems; a triphenylene ring, a pyrene ring and a naphthacene ring which are fused tetracyclic systems; and a perylene ring and a pentacene ring which are fused pentacyclic systems.

The "heteroaryl ring" as the ring A, ring B or ring C of general formula (2) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among the $R^1$ to $R^{11}$ together with the ring a, ring b, or ring c" defined by general formula (2'). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, a phenazacillin ring, an indolizine ring, a furan ring, a benzofuran ring, an isobenzofuran ring, a dibenzofuran ring, a naphtbenzofuran ring, a thiophene ring, a benzothiophene ring, a dibenzothiophene ring, a naphthobenzothiophene ring, a benzophosphole ring, a dibenzophosphole ring, a benzophosphole oxide ring, a dibenzophosphole oxide ring, a furazane ring, a thianthrene ring, an indolocarbazole ring, a benzoindolocarbazole ring and a benzobenzoindolocarbazole ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "diarylboryl", a substituted or unsubstituted "alkyl", a substituted or unsubstituted "cycloalkyl", a substituted or unsubstituted "alkoxy", or a substituted or unsubstituted "aryloxy", which is a primary substituent. Examples of the "aryl", the "heteroaryl", the aryl of the "diarylamino", the heteroaryl of the "diheteroarylamino", the aryl and the heteroaryl of the "arylheteroarylamino", the aryl of the "diarylboryl", and the aryl of the "aryloxy" as these primary substituents include a monovalent group represented by removing any one hydrogen atom from the "aryl ring" or the "heteroaryl ring" described above.

Furthermore, the "alkyl" as the primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 5 carbon atoms (branched alkyl having 3 to 5 carbon atoms) is particularly preferable. Alternatively, it may be an alkyl having 1 to 4 carbon atoms (branched alkyl having 3 to 4 carbon atoms).

Specific examples of the alkyl include methyl, ethyl, n-propyl, isopropyl, n-butyl, isobutyl, s-butyl, t-butyl, n-pentyl, isopentyl, neopentyl, t-pentyl (t-amyl), n-hexyl, 1-methylpentyl, 4-methyl-2-pentyl, 3,3-dimethylbutyl, 2-ethylbutyl, n-heptyl, 1-methylhexyl, n-octyl, t-octyl (1,1,3,3-tetramethylbutyl), 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Further, as the "alkyl", for example, 1-ethyl-1-methylpropyl, 1,1-diethylpropyl, 1,1-dimethylbutyl, 1-ethyl-1-methylbutyl, 1,1,4-trimethylpentyl, 1,1,2-trimethylpropyl, 1,1-dimethyloctyl, 1,1-dimethylpentyl, 1,1-dimethylheptyl, 1,1,5- trimethylhexyl, 1-ethyl-1-methylhexyl, 1-ethyl-1,3-dimethylbutyl, 1,1,2,2-tetramethylpropyl, 1-butyl-1-methylpentyl, 1,1-diethylbutyl, 1-ethyl-1-methylpentyl, 1,1,3-trimethylbutyl, 1-propyl-1-methylpentyl, 1,1,2-trimethylpropyl, 1-ethyl-1,2,2-trimethylpropyl, 1-propyl-1-methylbutyl, 1,1-dimethylhexyl, or the like can also be mentioned.

Furthermore, the "cycloalkyl" as the primary substituent include a cycloalkyl having 3 to 24 carbon atoms, a cycloalkyl having 3 to 20 carbon atoms, a cycloalkyl having 3 to 16 carbon atoms, a cycloalkyl having 3 to 14 carbon atoms, a cycloalkyl having 3 to 12 carbon atoms, a cycloalkyl having 5 to 10 carbon atoms, a cycloalkyl having 5 to 8 carbon atoms, a cycloalkyl having 5 or 6 carbon atoms, and a cycloalkyl having 5 carbon atoms.

Specific examples of the "cycloalkyl" include cyclopropyl, cyclobutyl, cyclopentyl, cyclohexyl, cycloheptyl, cyclooctyl, cyclononyl, cyclodecyl, and alkyl having 1 to 5 carbon atoms (especially, methyl) substitutes thereof, norbornenyl, bicyclo[1.0.1]butyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, diamantyl, decahydronaphthalenyl, and decahydroazulenyl.

Furthermore, the "alkoxy" as a primary substituent may be, for example, a linear alkoxy having 1 to 24 carbon atoms or a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 5 carbon atoms (branched alkoxy having 3 to 5 carbon atoms). Alternatively, it may be an alkoxy having 1 to 4 carbon atoms (branched alkoxy having 3 to 4 carbon atoms).

Specific examples of the alkoxy include methoxy, ethoxy, propoxy, isopropoxy, n-butoxy, isobutoxy, s-butoxy, t-butoxy, t-amyloxy, n-pentyloxy, isopentyloxy, neopentyloxy, t-pentyloxy, n-hexyloxy, 1-methylpentyloxy, 4-methyl-2-pentyloxy, 3,3-dimethylbutoxy, 2-ethylbutoxy, n-heptyloxy, 1-methylhexyloxy, n-octyloxy, t-octyloxy, 1-methylheptyloxy, 2-ethylhexyloxy, 2-propylpentyloxy, n-nonyloxy, 2,2-dimethylheptyloxy, 2,6-dimethyl-4-heptyloxy, 3,5,5-trimethylhexyloxy, n-decyloxy, n-undecyloxy, 1-methyldecyloxy, n-dodecyloxy, n-tridecyloxy, 1-hexylheptyloxy, n-tetradecyloxy, n-pentadecyloxy, n-hexadecyloxy, n-heptadecyloxy, n-octadecyloxy, and n-eicosyloxy.

In addition, as the "aryl" in "diarylboryl" of a primary substituent, the above description of the aryl can be cited. Further, the two aryls may be linked via a single bond or a linking group (for example, $>C(—R)_2$, >O, >S or >N—R). In this regard, R of each of the $>C(—R)_2$ and >N—R is a hydrogen atom (limited to R of the $>C(—R)_2$), an aryl, a heteroaryl, a diarylamino, an alkyl, a cycloalkyl, an alkoxy or an aryloxy (each of which is a primary substituent), and the primary substituent may be further substituted by an aryl, a heteroaryl, an alkyl or a cycloalkyl (each of which is a secondary substituent). For the specific examples of the groups, the above description of the aryl, heteroaryl, diarylamino, alkyl, cycloalkyl, alkoxy or aryloxy as the primary substituent can be cited.

In the substituted or unsubstituted "aryl", substituted or unsubstituted "heteroaryl", substituted or unsubstituted "diarylamino", substituted or unsubstituted "diheteroarylamino", substituted or unsubstituted "arylheteroarylamino", substituted or unsubstituted "diarylboryl (two aryls may be linked via a single bond or a linking group)", substituted or unsubstituted "alkyl", substituted or unsubstituted "cycloalkyl", substituted or unsubstituted "alkoxy", or substituted or unsubstituted "aryloxy", which is the primary substituent, at least one hydrogen atom may be substituted by a secondary substituent, as described to be substituted or unsubstituted. Examples of this secondary substituent include an aryl, a heteroaryl, an alkyl, and a cycloalkyl, and for the details thereof, reference can be made to the above description on the monovalent group represented by removing any one hydrogen atom from the "aryl ring" or the "heteroaryl ring" and the "alkyl" or the "cycloalkyl" as the primary substituent. Furthermore, regarding the aryl or heteroaryl as the secondary substituent, an aryl or heteroaryl in which at least one hydrogen atom is substituted by an aryl such as phenyl (specific examples are described above), an alkyl such as methyl (specific examples are described above), or a cycloalkyl such as cyclohexyl (specific examples are described above), is also included in the aryl or heteroaryl as the secondary substituent. For instance, when the secondary substituent is a carbazolyl group, a carbazolyl group in which at least one hydrogen atom at the 9-position is substituted by an aryl such as phenyl, an alkyl such as methyl, or a cycloalkyl such as cyclohexyl is also included in the heteroaryl as the secondary substituent.

Examples of the aryl, the heteroaryl, the aryl of the diarylamino, the heteroaryl of the diheteroarylamino, the aryl and the heteroaryl of the arylheteroarylamino, the aryl of the diarylboryl, and the aryl of the aryloxy for $R^1$ to $R^{11}$ of general formula (2') include the monovalent groups represented by removing any one hydrogen atom from the "aryl ring" or "heteroaryl ring" described in general formula (2). Furthermore, regarding the alkyl, cycloalkyl or alkoxy for $R^1$ to $R^{11}$, reference can be made to the description on the "alkyl", "cycloalkyl" or "alkoxy" as the primary substituent in the above description of general formula (2). In addition, the same also applies to the aryl, heteroaryl, alkyl or cycloalkyl as the substituents for these groups. Furthermore, the same also applies to the heteroaryl, diarylamino, diheteroarylamino, arylheteroarylamino, diarylboryl (two aryls may be linked via a single bond or a linking group), alkyl, cycloalkyl, alkoxy, or aryloxy in a case of forming an aryl ring or a heteroaryl ring by bonding adjacent groups among $R^1$ to $R^{11}$ together with the ring a, ring b or ring c, and the aryl, heteroaryl, alkyl, or cycloalkyl as a further substituent.

Specifically, the emission wavelength can be adjusted by the steric hindrance, electron donating property, and electron withdrawing property of the structure of the primary substituent. The primary substituent is preferably a group represented by the following structural formula, more preferably methyl, t-butyl, t-amyl, t-octyl, phenyl, o-tolyl, p-tolyl, 2,4-xylyl, 2,5-xylyl, 2,6-xylyl, 2,4,6-mesityl, diphenylamino, di-p-tolylamino, bis(p-(t-butyl)phenyl)amino, carbazolyl, 3,6-dimethylcarbazolyl, 3,6-di-t-butylcarbazolyl, or phenoxy, and still more preferably methyl, t-butyl, t-amyl, t-octyl, phenyl, o-tolyl, 2,6-xylyl, 2,4,6-mesityl, diphenylamino, di-p-tolylamino, bis(p-(t-butyl)phenyl)amino, carbazolyl, 3,6-dimethylcarbazolyl, or 3,6-di-t-butylcarbazolyl. From the viewpoint of the ease of synthesis, a larger steric hindrance is preferable for the selective synthesis. Specifically, as the primary substituent, t-butyl, t-amyl, t-octyl, o-tolyl, p-tolyl, 2,4-xylyl, 2,5-xylyl, 2,6-xylyl, 2,4,6-mesityl, di-p-tolylamino, bis(p-(t-butyl)phenyl)amino, 3,6-dimethylcarbazolyl, or 3,6-di-t-butylcarbazolyl is preferable.

In the following structural formulas, "Me" represents a methyl, "tBu" represents a t-butyl, "tAm" represents a t-amyl, and "tOct" represents a t-octyl.
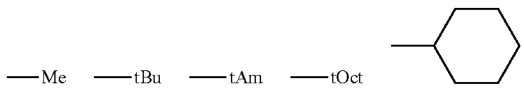
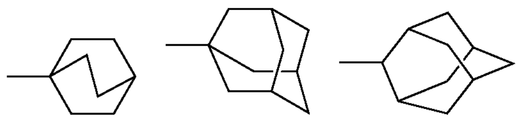
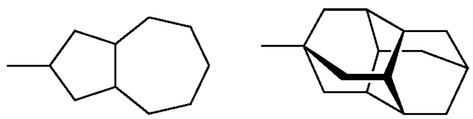
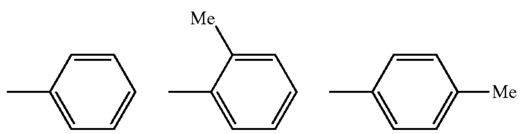
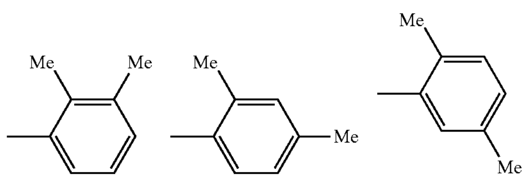
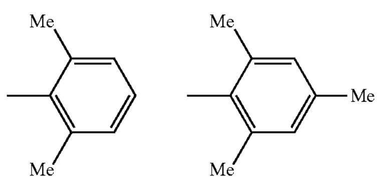
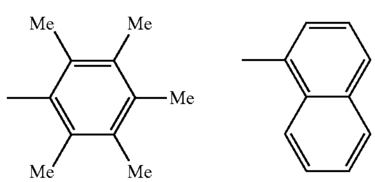
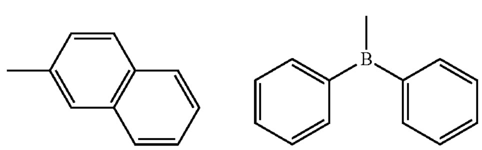
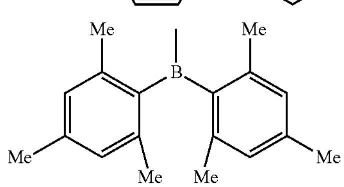
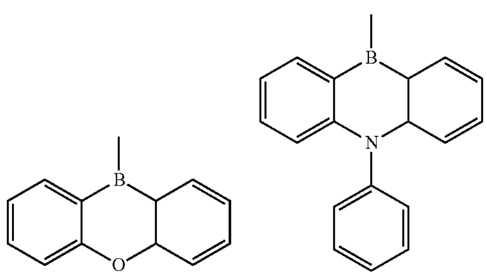
-continued
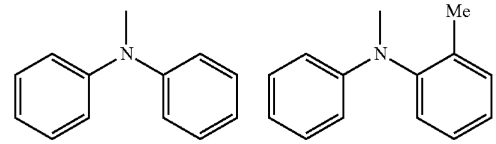
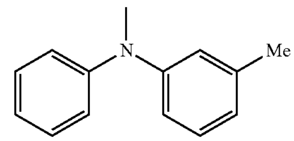
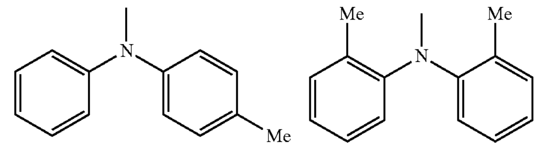
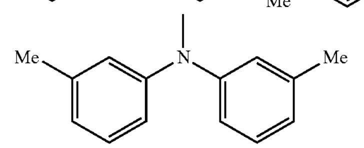
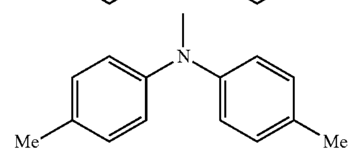
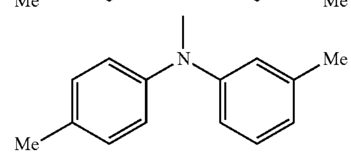
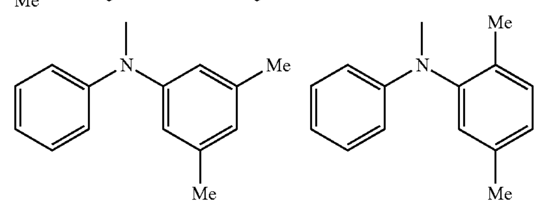
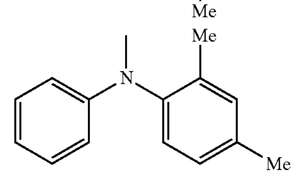
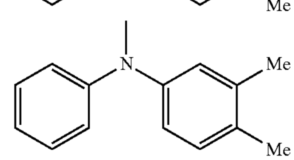
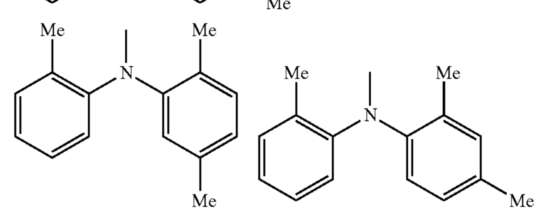
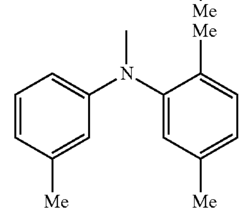

-continued
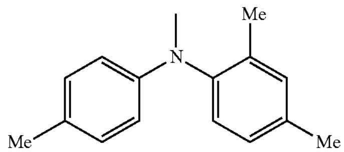
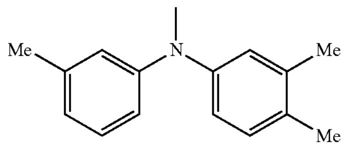
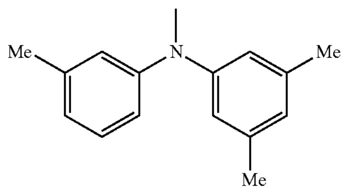
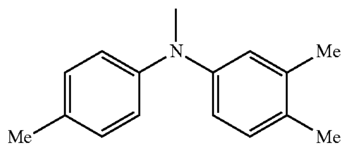
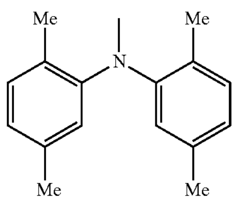
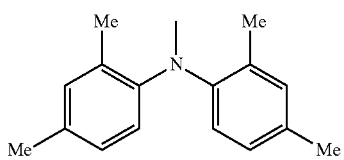
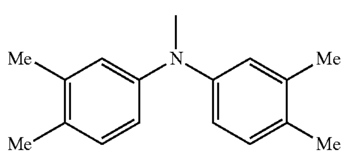
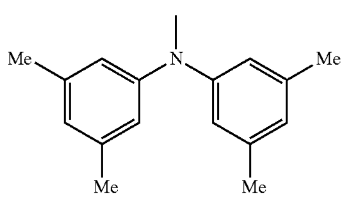
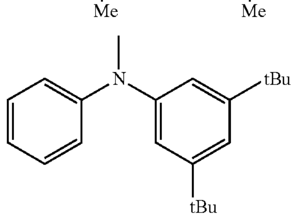
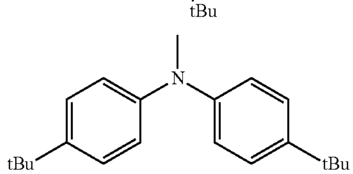
-continued
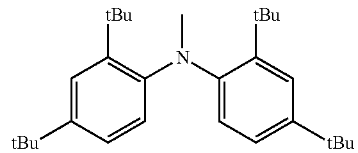
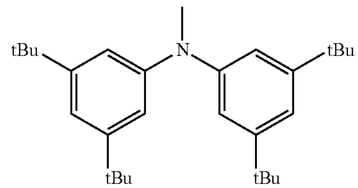
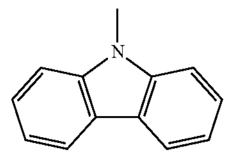
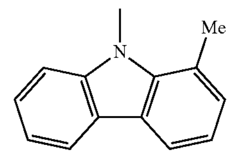
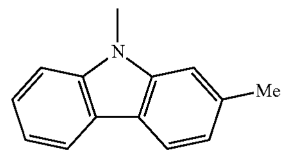
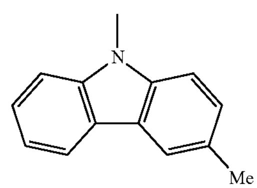
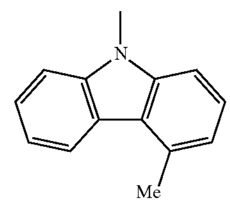
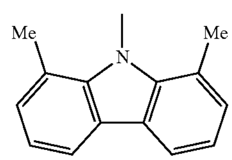
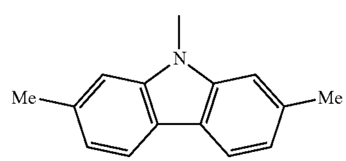
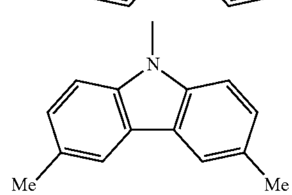
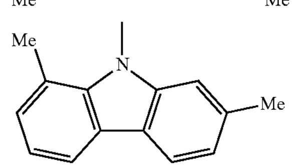
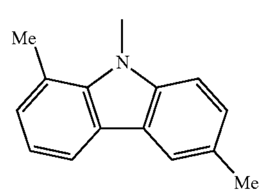
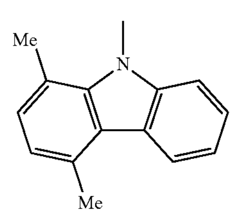

-continued
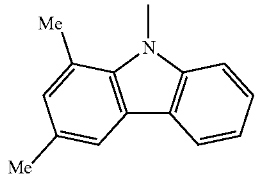
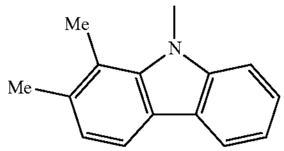
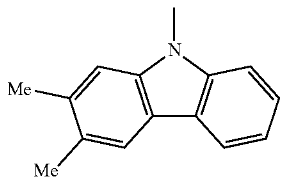
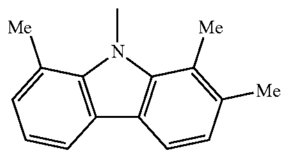
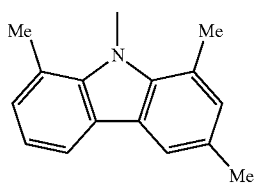
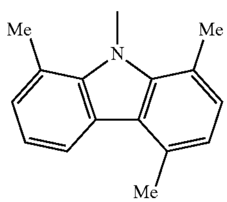
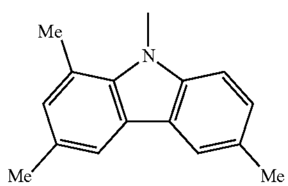
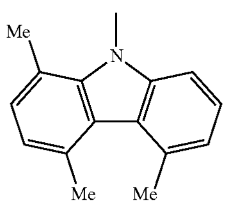
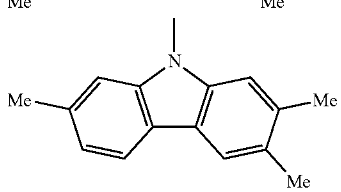
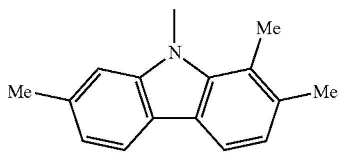
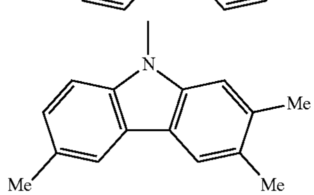
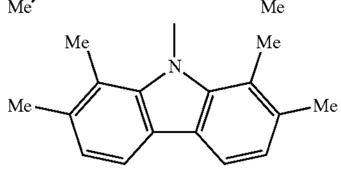
-continued
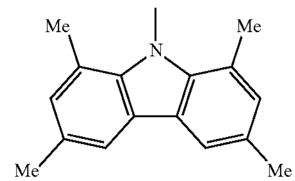
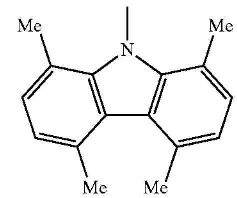
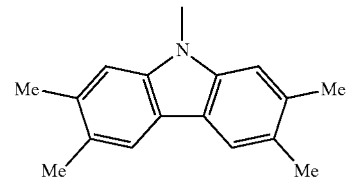
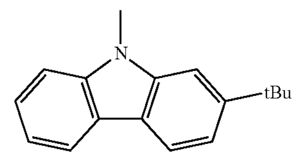
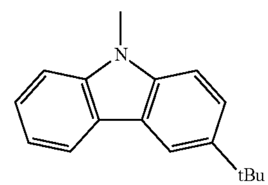
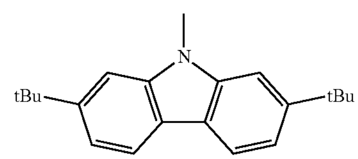
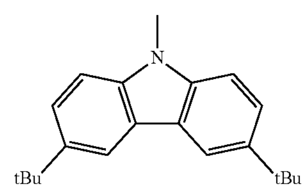
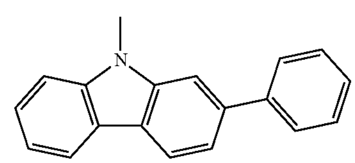
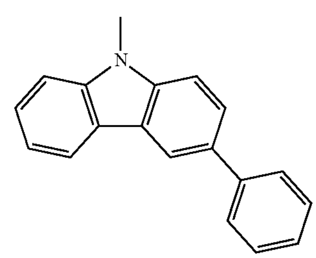
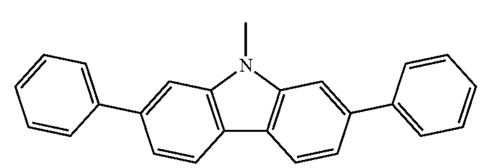

-continued

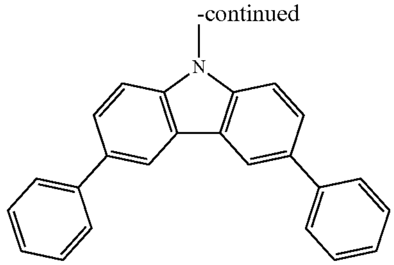

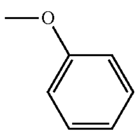

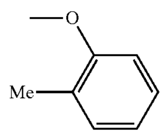

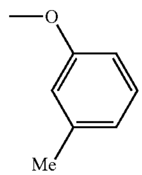

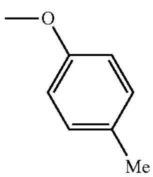

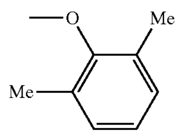

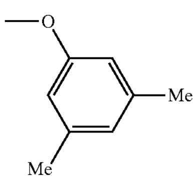

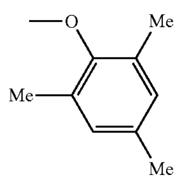

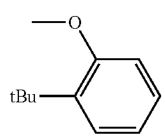

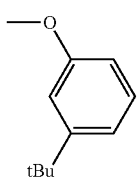

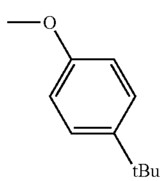

R of the >N—R for $X^1$ and $X^2$ of general formula (2) represents an aryl, a heteroaryl, an alkyl, or a cycloalkyl which may be substituted by the secondary substituent described above, and at least one hydrogen atom in the aryl, heteroaryl, alkyl, or cycloalkyl may be substituted by, for example, an alkyl or a cycloalkyl. Examples of this aryl, heteroaryl or alkyl include those described above. Particularly, an aryl having 6 to 10 carbon atoms (for example, a phenyl or a naphthyl), a heteroaryl having 2 to 15 carbon atoms (for example, carbazolyl), an alkyl having 1 to 5 carbon atoms (for example, methyl or ethyl), and a cycloalkyl having 3 to 16 carbon atoms (for example, bicyclooctyl or adamantyl) are preferable. This description also applies to $X^1$ and $X^2$ in general formula (2').

R of the "—C(—R)$_2$—" as a linking group for general formula (2) represents a hydrogen atom, an alkyl or a cycloalkyl, and examples of this alkyl or cycloalkyl include those described above. Particularly, an alkyl having 1 to 5 carbon atoms (for example, methyl or ethyl) is preferable. This description also applies to "—C(—R)$_2$—" as a linking group for general formula (2').

Furthermore, the light emitting layer may contain a multimer having a plurality of unit structures each represented by general formula (2), and preferably a multimer having a plurality of unit structures each represented by general formula (2'). The multimer is preferably a dimer to a hexamer, more preferably a dimer to a trimer, and a particularly preferably a dimer. The multimer may be in a form having a plurality of unit structures described above in one compound, and for example, the multimer may be in a form in which a plurality of unit structures are bonded with a linking group such as a single bond, an alkylene group having 1 to 3 carbon atoms, a phenylene group, or a naphthylene group. (Linked type multimer) In addition, the multimer may be in a form in which a plurality of unit structures are bonded such that any ring contained in the unit structure (ring A, ring B or ring C, or ring a, ring b or ring c) is shared by the plurality of unit structures. (Ring-shared type multimer) The multimer may be in a form in which the unit structures are bonded such that any rings contained in the unit structures (ring A, ring B or ring C, or ring a, ring b or ring c) are fused. (Ring-fused type multimer) The ring-shared type multimer and the ring-fused type multimer are preferred, and the ring-shared type multimer is more preferred.

Examples of such a multimer include multimer compounds represented by the following formula (2'-4), (2'-4-1), (2'-4-2), (2'-5-1) to (2'-5-4), and (2'-6). A multimer compound represented by the following formula (2'-4) corresponds to, for example, a compound represented by formula (2-423) described below. That is, to be described in connection with general formula (2'), the multimer compound (Ring-shared type multimer) includes a plurality of unit structures each represented by general formula (2') in one compound so as to share a benzene ring as ring a. Furthermore, a multimer compound represented by the following formula (2'-4-1) corresponds to, for example, a compound represented by the following formula (2-2665). That is, to be described in connection with general formula (2'), the multimer compound (Ring-shared type multimer) includes two unit structures each represented by general formula (2') in one compound so as to share a benzene ring as ring a. Furthermore, a multimer compound represented by the following formula (2'-4-2) corresponds to, for example, a compound represented by the following formula (2-2666). That is, to be described in connection with general formula (2'), the multimer compound (Ring-shared type multimer) includes two unit structures each represented by general formula (2') in one compound so as to share a benzene ring as ring a. Furthermore, multimer compounds represented by the following formulas (2'-5-1) to (2'-5-4) correspond to, for example, compounds represented by the following formulas (2-421), (2-422), (2-424), or (2-425). That is, to be described in connection with general formula (2'), the multimer compound (Ring-shared type multimer) includes a plurality of unit structures each represented by general formula (2') in one compound so as to share a benzene ring as ring b (or ring c). Furthermore, a multimer compound represented by the following formula (2'-6) corresponds to, for example, a compound represented by any one of the following formulas (2-431) to (2-435). That is, to be described in connection with general formula (2'), for example, the multimer compound (Ring-fused type multimer) includes a plurality of unit structures each represented by general formula (2') in one compound such that a benzene ring as ring b (or ring a or ring c) of a certain unit structure and a benzene ring as ring b (or ring a or ring c) of a certain unit structure are fused. Note that each signs in the following formulas are defined in the same manner as those in formula (2').

(2′-4)
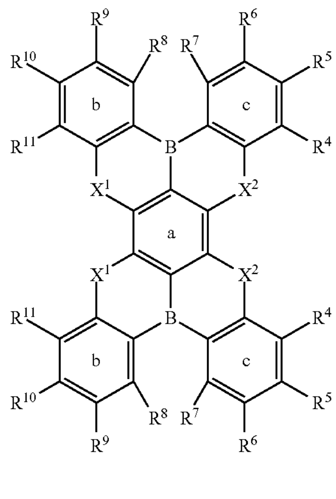
(2′-4-1)
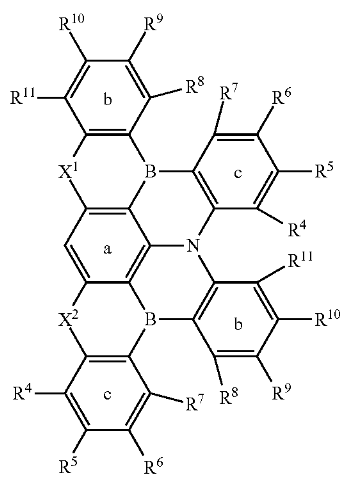
(2′-4-2)
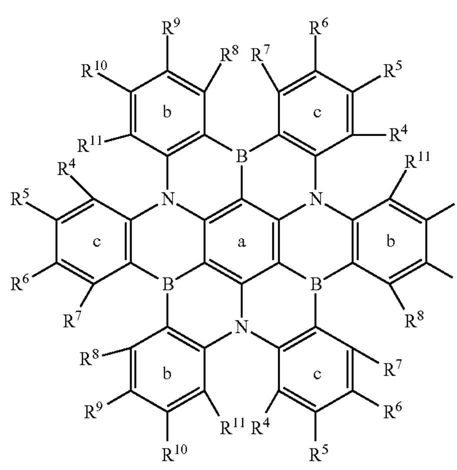
-continued
(2′-5-1)
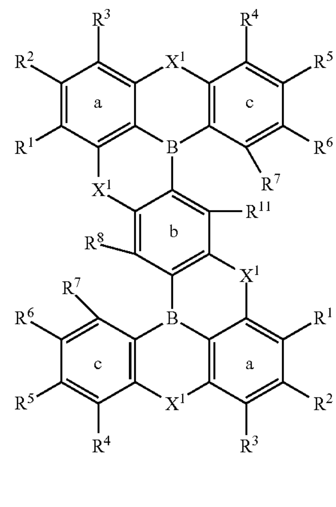
(2′-5-2)
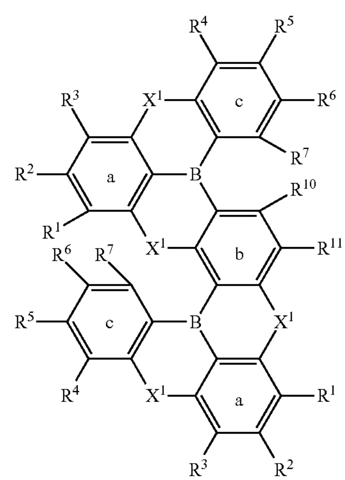
(2′-5-3)
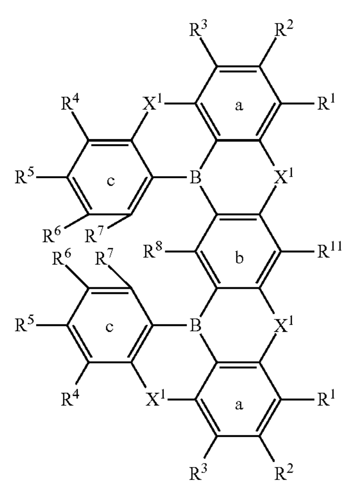

-continued (2'-5-4)

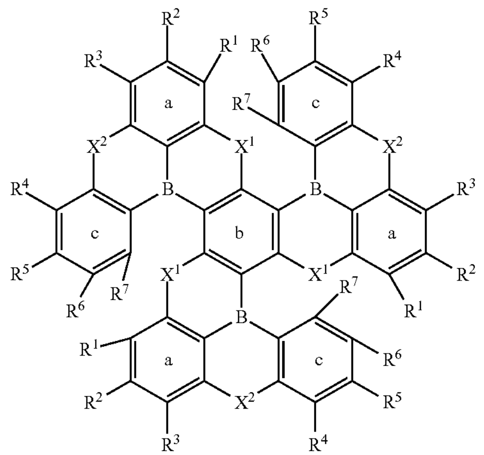

(2'-6)

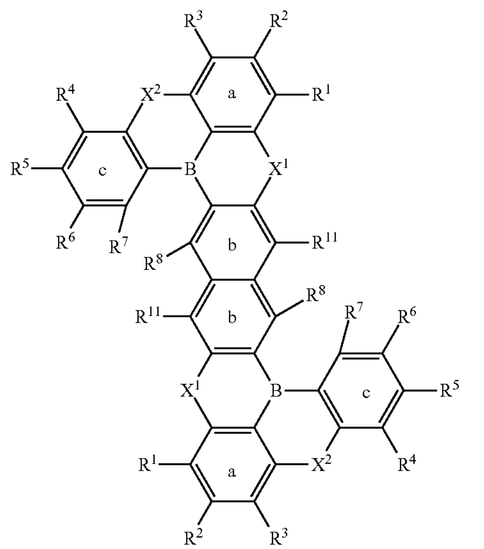

The multimer compound may be a multimer in which a multimer form represented by formula (2'-4), (2'-4-1) or (2'-4-2) and a multimer form represented by any one of formula (2'-5-1) to (2'-5-4) or (2'-6) are combined, may be a multimer in which a multimer form represented by any one of formula (2'-5-1) to (2'-5-4) and a multimer form represented by formula (2'-6) are combined, or may be a multimer in which a multimer form represented by formula (2'-4), (2'-4-1) or (2'-4-2), a multimer form represented by any one of formulas (2'-5-1) to (2'-5-4), and a multimer form represented by formula (2'-6) are combined.

Furthermore, at least one of the hydrogen atoms in the chemical structures of the compound represented by general formula (2) or (2') and multimer thereof may be substituted by halogen atoms, cyanos or deuterium atoms. For example, in regard to formula (2), the hydrogen atoms in the ring A, ring B, ring C (ring A to ring C are aryl rings or heteroaryl rings), substituents on the ring A to ring C, and R (=aryl, heteroaryl, alkyl or cycloalkyl) when $X^1$ and $X^2$ each represent >N—R, may be substituted by halogen atoms, cyanos or deuterium atoms, and among these, a form in which at least one of the hydrogen atoms in the aryl or heteroaryl is substituted by halogen atoms, cyanos or deuterium atoms may be mentioned. The halogen atom is fluorine, chlorine, bromine, or iodine, preferably fluorine, chlorine, or bromine, and more preferably chlorine.

More specific example of the compound represented by general formula (2') includes a compound represented by the following general formula (2").

(2")

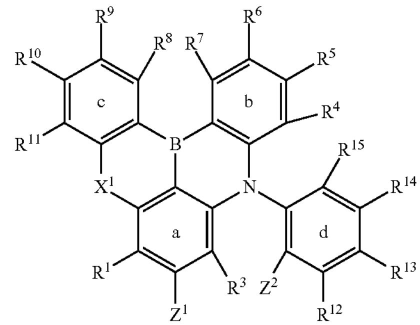

In the above formula (2"), $R^1$, $R^3$, $R^4$ to $R^7$, $R^8$ to $R^{11}$, and $R^{12}$ to $R^{15}$ each independently represent a hydrogen atom, an aryl, a heteroaryl, a diarylamino, a diheteroarylamino, an arylheteroarylamino, a diarylboryl (two aryls may be linked via a single bond or a linking group), an alkyl, a cycloalkyl, an alkoxy, or an aryloxy, at least one hydrogen atom in these groups may be substituted by an aryl, a heteroaryl, an alkyl, or a cycloalkyl, $X^1$ is —O— or >N—R, R of the >N—R is an aryl having 6 to 12 carbon atoms, a heteroaryl having 2 to 15 carbon atoms, an alkyl having 1 to 6 carbon atoms, or a cycloalkyl having 3 to 14 carbon atoms, at least one hydrogen atom in these groups may be substituted by an aryl having 6 to 12 carbon atoms, a heteroaryl having 2 to 15 carbon atoms, an alkyl having 1 to 6 carbon atoms, or a cycloalkyl having 3 to 14 carbon atoms, $Z^1$ and $Z^2$ each independently represent an aryl, a heteroaryl, a diarylamino, a diarylboryl (two aryls may be linked via a single bond or a linking group), an aryloxy, an aryl-substituted alkyl, a hydrogen atom, an alkyl, a cycloalkyl or an alkoxy, at least one hydrogen atom in these groups may be substituted by an aryl, an alkyl, or a cycloalkyl, in a case where $Z^1$ is a phenyl that may be substituted by an alkyl or a cycloalkyl, a m-biphenylyl that may be substituted by an alkyl or a cycloalkyl, a p-biphenylyl that may be substituted by an alkyl or a cycloalkyl, a monocyclic heteroaryl that may be substituted by an alkyl or a cycloalkyl, a diphenylamino that may be substituted by an alkyl or a cycloalkyl, a diarylboryl (two aryls may be linked via a single bond or a linking group) that may be substituted by an alkyl or a cycloalkyl, a hydrogen atom, an alkyl, a cycloalkyl having 3 to 8 carbon atoms, an adamantyl, or an alkoxy, $Z^2$ is not a hydrogen atom, an alkyl, or an alkoxy, and at least one hydrogen atom in a compound represented by the formula (2") may be substituted by a halogen atom, cyano or a deuterium atom.

For the description of each group such as aryl in the above formula (2"), the description of each group in the general formula (2) or (2') can be cited.

$Z^1$ and $Z^2$ each preferably independently represent an aryl having 6 to 10 carbon atoms, a diarylamino (provided that the aryl is an aryl having 6 to 12 carbon atoms), a diarylboryl (provided that the aryl is an aryl having 6 to 12 carbon atoms, and two aryls may be linked via a single bond or a linking group), an aryloxy having 6 to 10 carbon atoms, an alkyl having 1 to 5 carbon atoms in which 1 to 3 aryls each having 6 to 10 carbon atoms are substituted, a hydrogen atom, an alkyl having 1 to 5 carbon atoms, or a cycloalkyl having 3 to 14 carbon atoms, and at least one hydrogen atom in these groups may be substituted by an alkyl having 1 to 5 carbon atoms, or a cycloalkyl having 3 to 14 carbon atoms.

The $Z^1$ more preferably represents a diarylamino, a diarylboryl (two aryls may be linked via a single bond or a linking group), an aryloxy, a triaryl-substituted alkyl having 1 to 5 carbon atoms, a hydrogen atom, an alkyl having 1 to 5 carbon atoms, or a cycloalkyl having 3 to 14 carbon atoms, and the aryls in these groups are each independently phenyl, biphenylyl or naphthyl, which may be substituted by an alkyl having 1 to 5 carbon atoms or a cycloalkyl having 3 to 14 carbon atoms. The $Z^1$ still more preferably represents a diarylamino, a diarylboryl (two aryls may be linked via a single bond or a linking group), a hydrogen atom, an alkyl having 1 to 5 carbon atoms, or a cycloalkyl having 3 to 14 carbon atoms, and the aryl in each of the diarylamino and the diarylboryl is phenyl, biphenylyl or naphthyl, which may be substituted by an alkyl having 1 to 5 carbon atoms or a cycloalkyl having 3 to 14 carbon atoms.

The $Z^2$ more preferably represents phenyl, biphenylyl or naphthyl, which may be substituted by an alkyl having 1 to 5 carbon atoms or a cycloalkyl having 3 to 14 carbon atoms, or a hydrogen atom, an alkyl having 1 to 5 carbon atoms, or a cycloalkyl having 3 to 14 carbon atoms.

In this regard, even if phenyl is selected at the position of $Z^1$, the substituent does not become a bulky substituent, however, the position of $Z^2$ is an ortho position in >N-phenyl, which has a limited surrounding space, and therefore, even if phenyl does not make the substituent to be a bulky substituent as the $Z^1$, the phenyl has a role of a bulky substituent at the position of $Z^2$.

As described above, as the group having a different bulky effect depending on the position (group not having a function as a bulky substituent at the position of Z), in addition to a phenyl, a m-biphenylyl, a p-biphenylyl, a monocyclic heteroaryl (heteroaryl constituted by one ring such as pyridyl), a diphenylamino, a diarylboryl (two aryls may be linked via a single bond or a linking group), or a specific cycloalkyl (for example, a cycloalkyl having 3 to 8 carbon atoms or an adamantyl) can be mentioned. Further, a hydrogen atom, an alkyl and an alkoxy do not become bulky substituents as the $Z^1$ and even as the $Z^2$.

That is, as the $Z^1$, a phenyl, a m-biphenylyl and a p-biphenylyl among aryls, a monocyclic heteroaryl (heteroaryl constituted by one ring such as pyridyl) among heteroaryls, a diphenylamino among diarylaminos, a diphenylboryl (two phenyls may be linked via a single bond or a linking group) among diarylboryls, a specific cycloalkyl group (for example, a cycloalkyl having 3 to 8 carbon atoms or an adamantyl) among cycloalkyls, a hydrogen atom, an alkyl group and an alkoxy group, and a group in which at least one hydrogen atom in these groups is substituted by an alkyl, each alone do not have a role of a bulky substituent in the present application, and therefore, the substituent $Z^2$ is required to be made bulky. As the $Z^2$, a hydrogen atom, an alkyl and an alkoxy, and a group in which at least one hydrogen atom in these groups is substituted by an alkyl, are not bulky, and therefore, such a combination of $Z^1$ and $Z^2$ is excluded from the present application.

The $Z^1$ preferably represents an o-biphenylyl, an o-naphthylphenyl (group in which 1-naphthyl or 2-naphthyl is substituted at the ortho position of phenyl), a phenylnaphthylamino, a dinaphthylamino, a phenylnaphthylboryl (phenyl and naphthyl may be linked via a single bond or a linking group), a dinaphthylamino (two naphthyls may be linked via a single bond or a linking group), a phenyloxy, or a triphenylmethyl (trityl), or a group in which at least one of these groups is substituted by an alkyl (for example, a methyl, an ethyl, an i-propyl, a t-butyl or a t-amyl, preferably a methyl, a t-butyl or a t-amyl, and more preferably a t-butyl or a t-amyl), or a cycloalkyl (for example, a cyclohexyl or an adamantyl).

The $Z^2$ preferably represents a phenyl, a 1-naphthyl or a 2-naphthyl, or a group in which at least one of these groups is substituted by an alkyl (for example, a methyl, an ethyl, an i-propyl, a t-butyl or a t-amyl, preferably a methyl, a t-butyl or a t-amyl, and more preferably a t-butyl or a t-amyl), or a cycloalkyl (for example, a cyclohexyl or an adamantyl).

More specific examples of the compound represented by the formula (2) and multimer thereof include compounds represented by the following formulas. In the each structural formula, "Me" represents a methyl, "iPr" represents an isopropyl, "tBu" represents a tertiary butyl, "Ph" represents a phenyl, and "D" represents a deuterium atom.

(2-50)

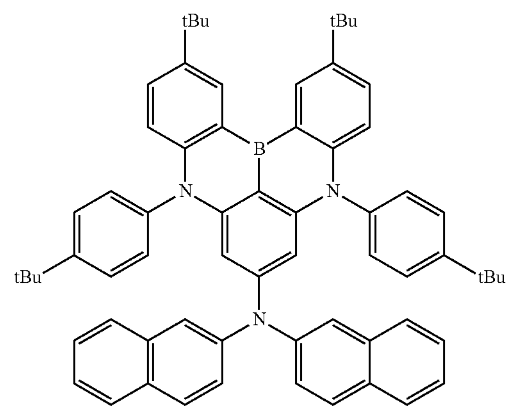

(2-51)

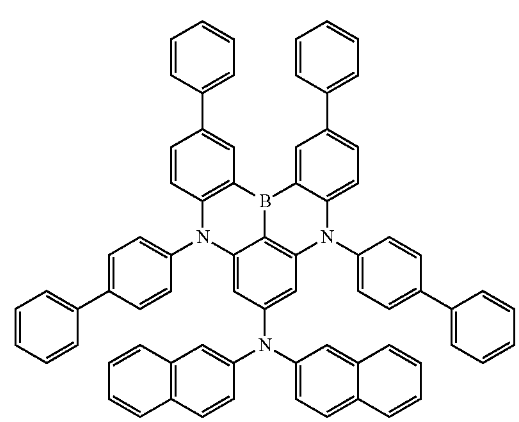

-continued
(2-52)
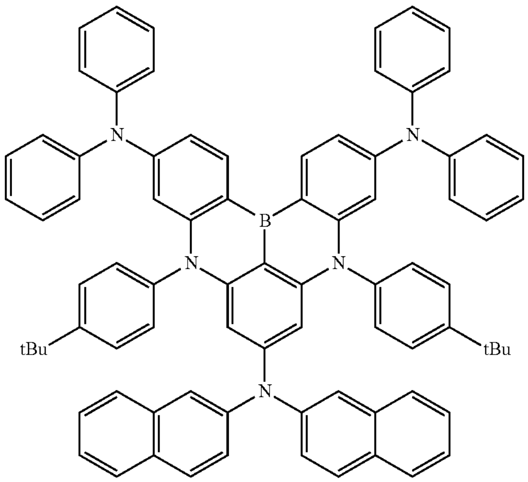
(2-53)
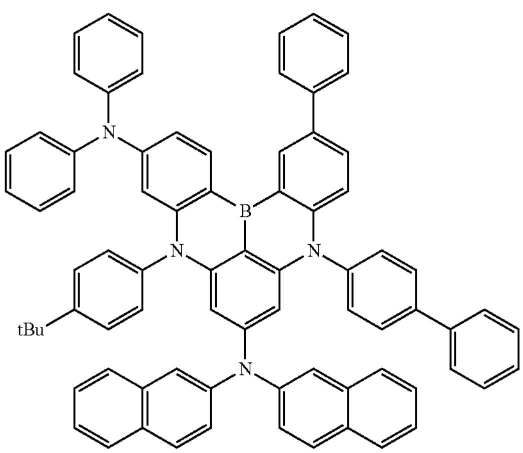
(2-54)
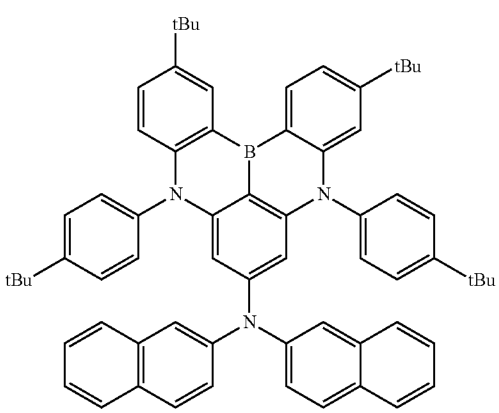
-continued
(2-55)
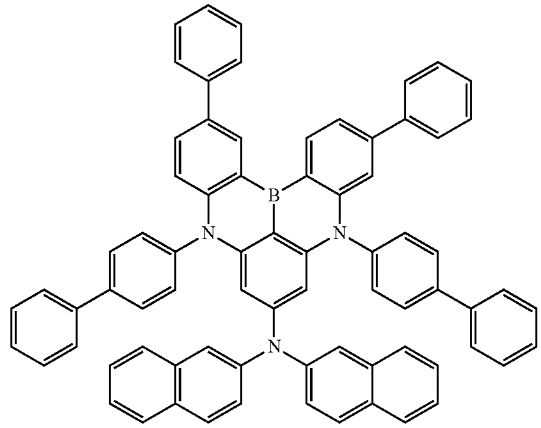
(2-56)
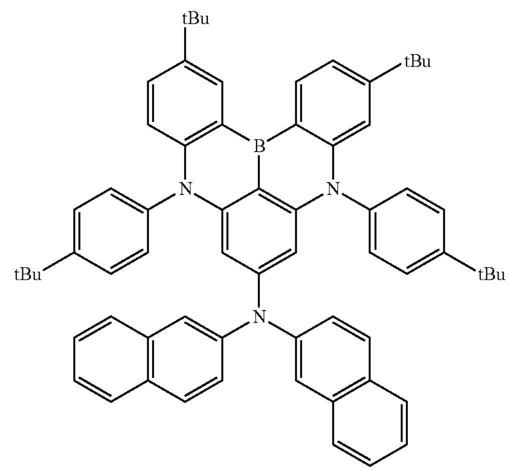
(2-57)
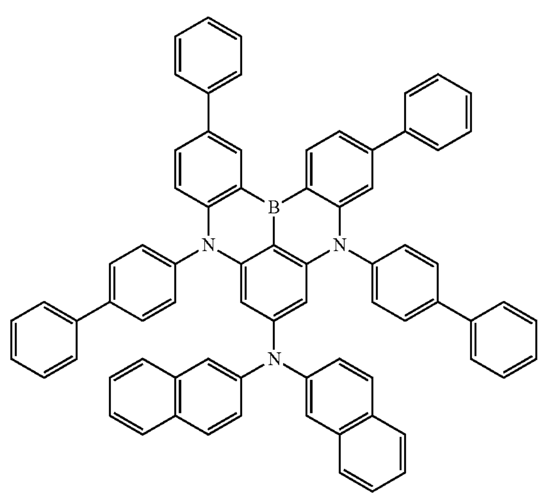

-continued
(2-58)
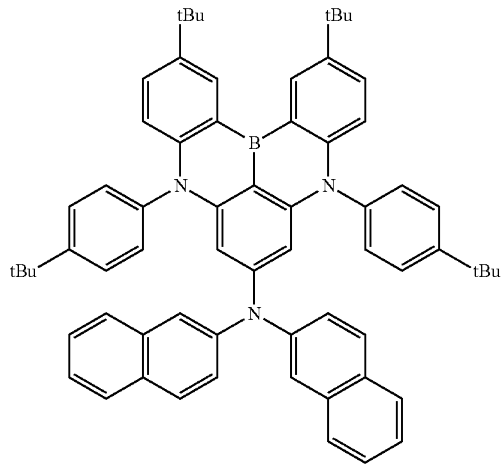
(2-59)
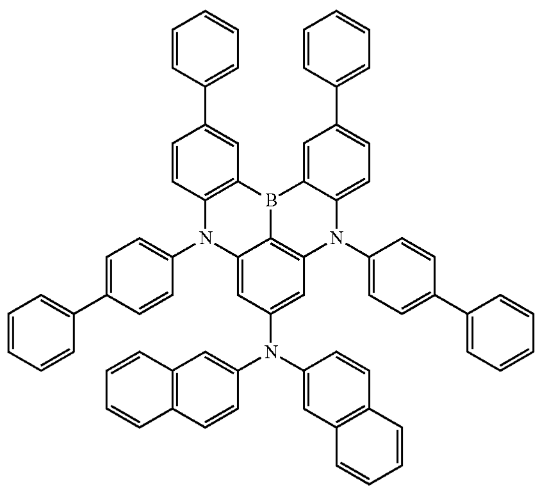
(2-60)
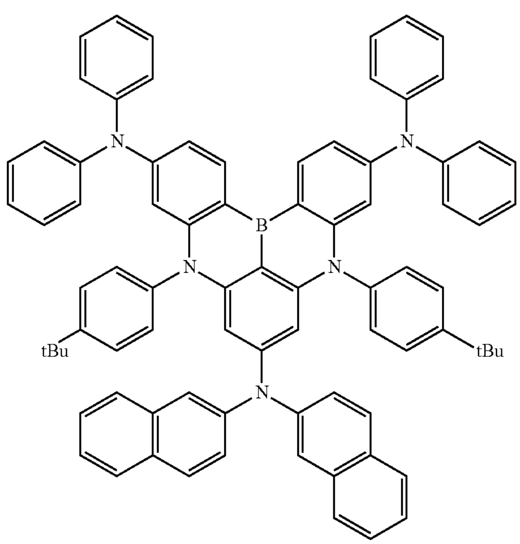
-continued
(2-61)
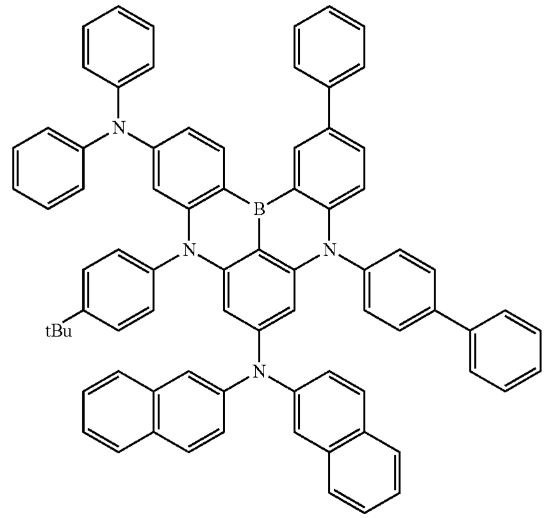
(2-62)
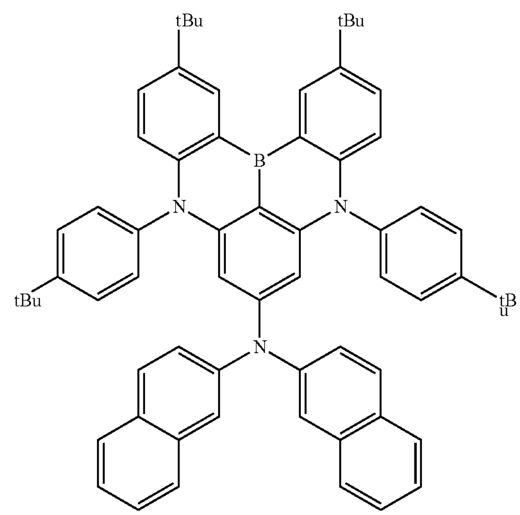
(2-63)
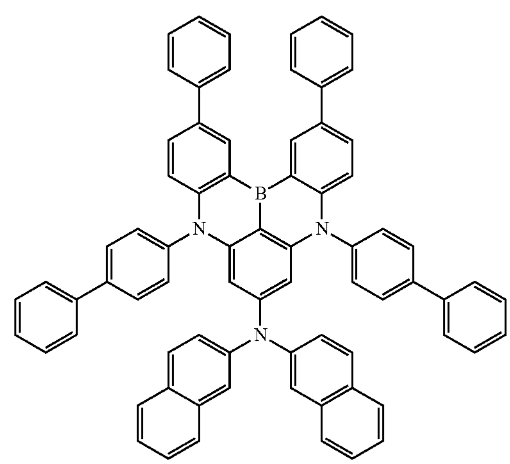

-continued
(2-64)
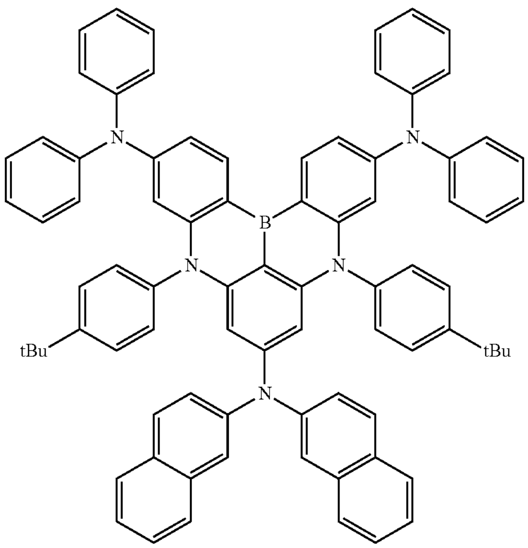
(2-65)
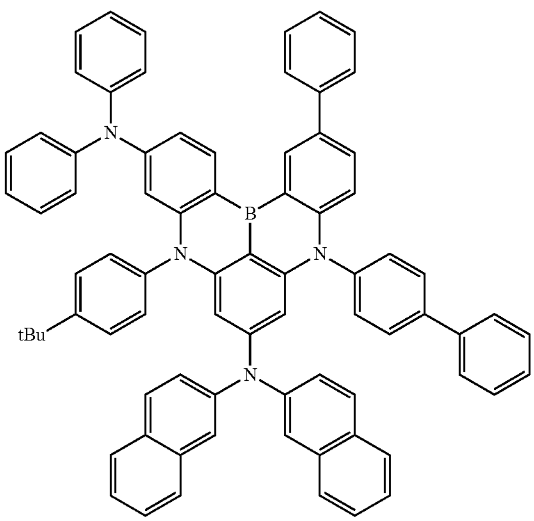
(2-66)
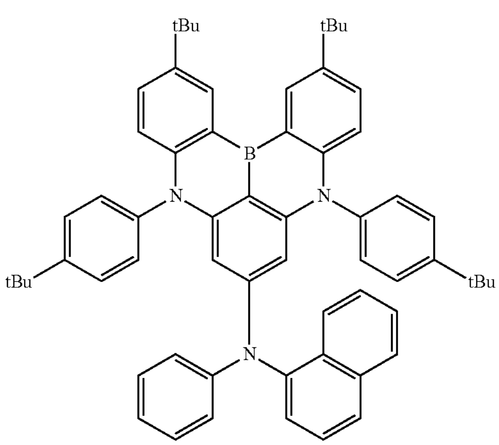
-continued
(2-67)
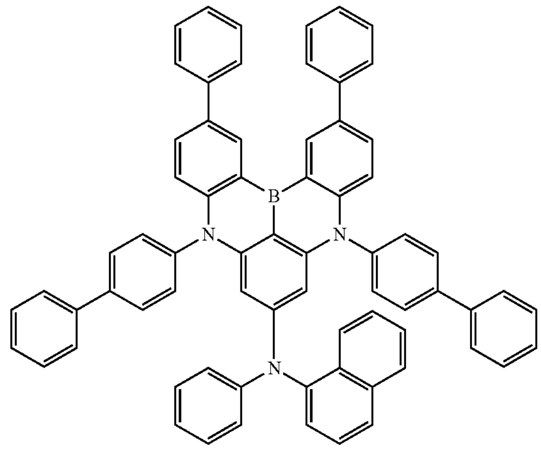
(2-68)
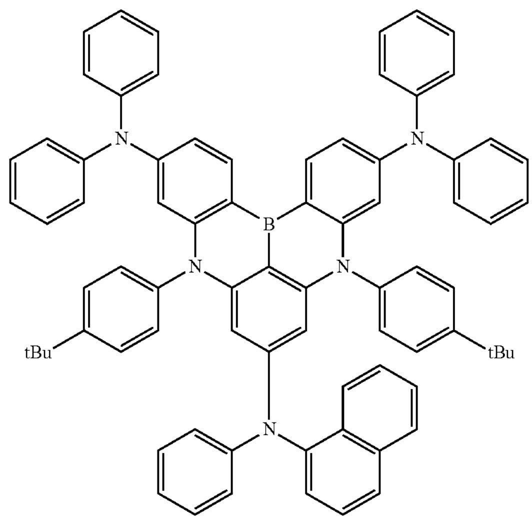
(2-69)
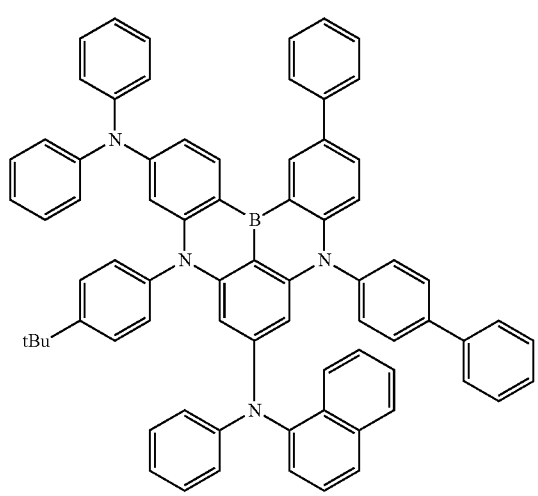

-continued
(2-120)
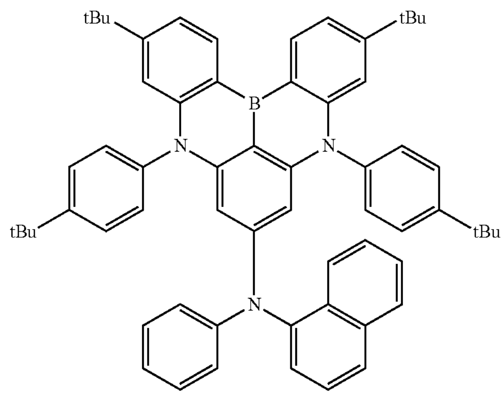
(2-121)
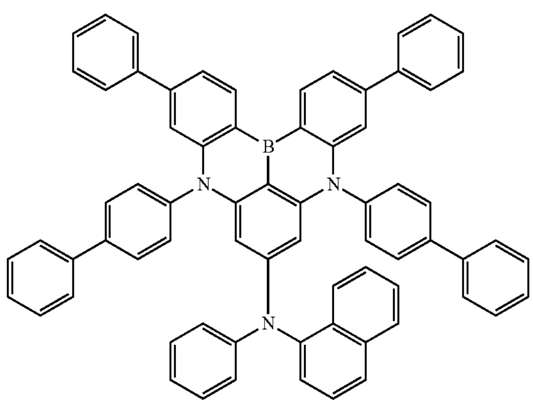
(2-122)
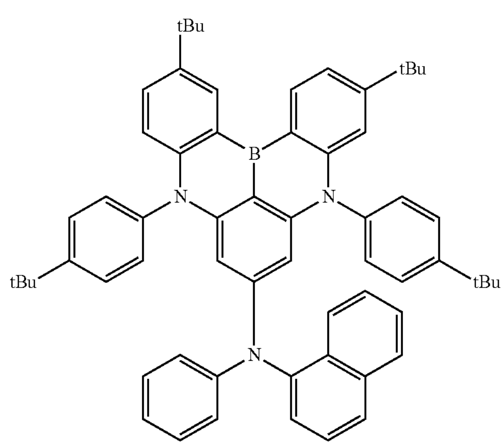
-continued
(2-123)
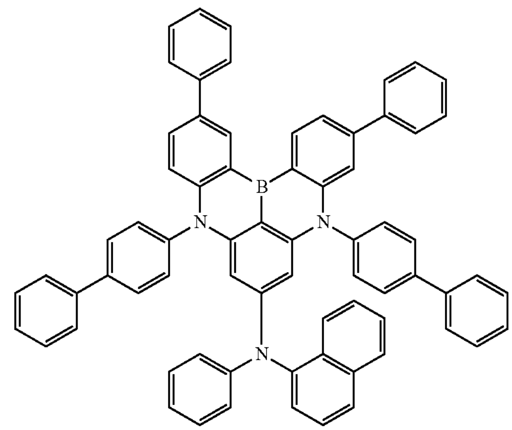
(2-124)
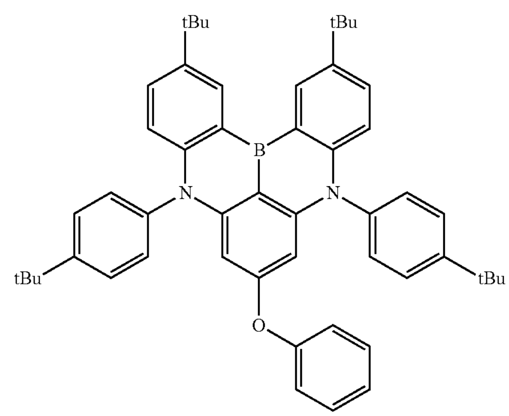
(2-125)
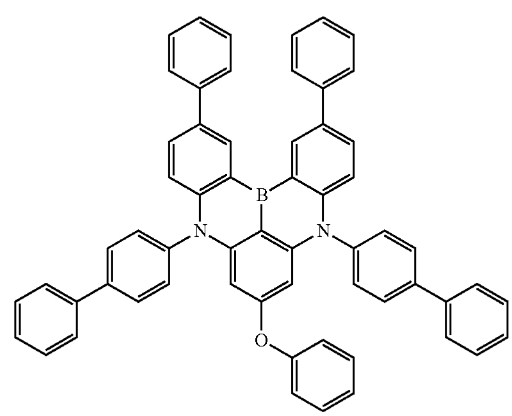

-continued
(2-126)
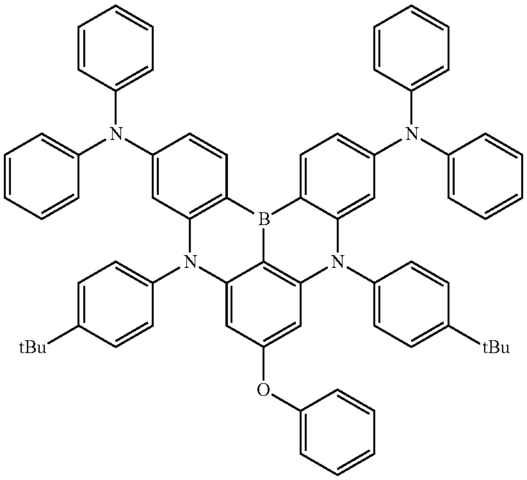
(2-127)
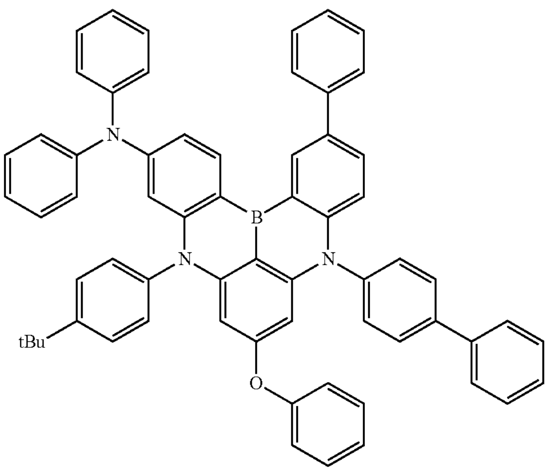
(2-128)
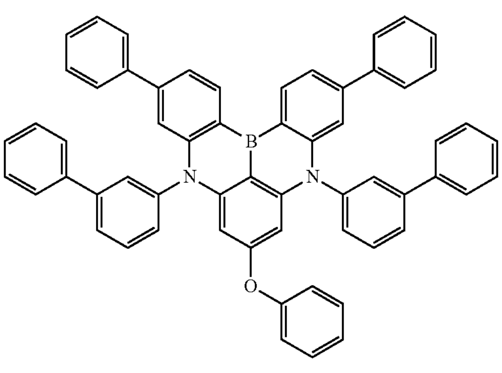
-continued
(2-129)
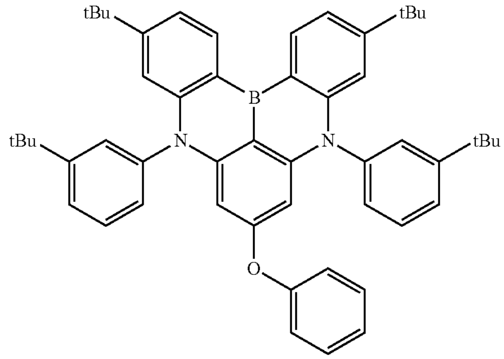
(2-130)
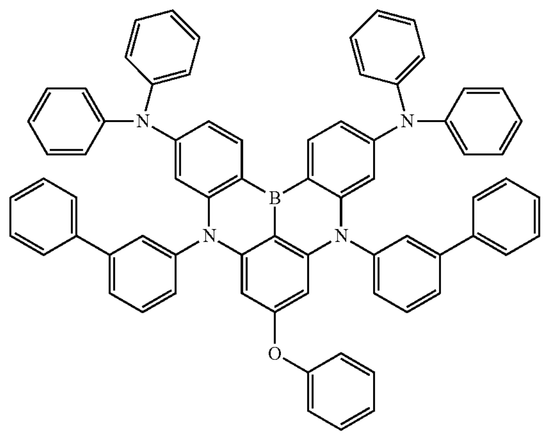
(2-131)
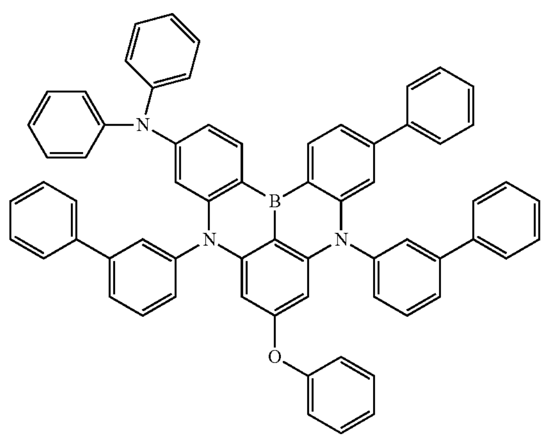

-continued
(2-132)
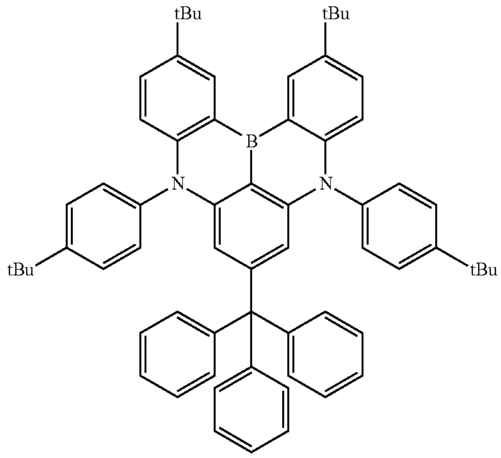
(2-133)
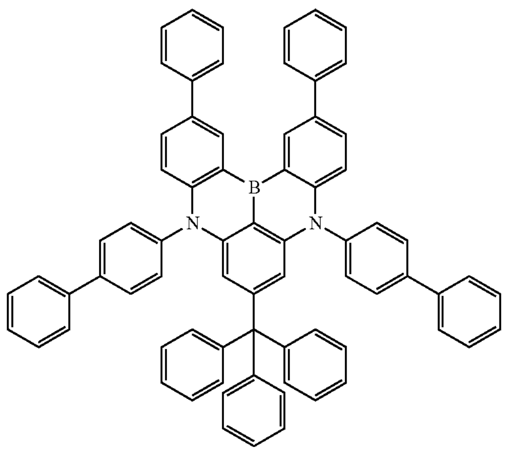
(2-134)
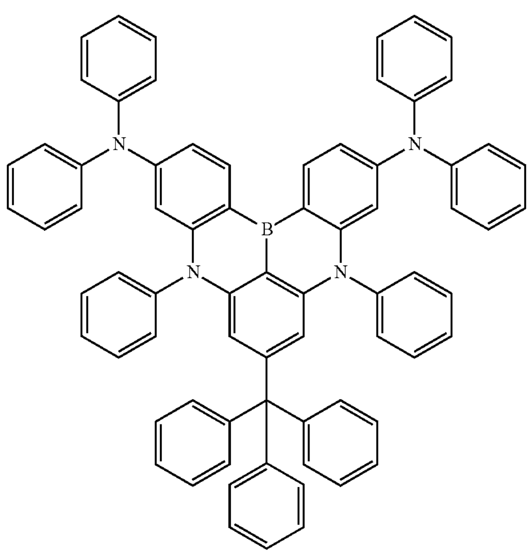
-continued
(2-135)
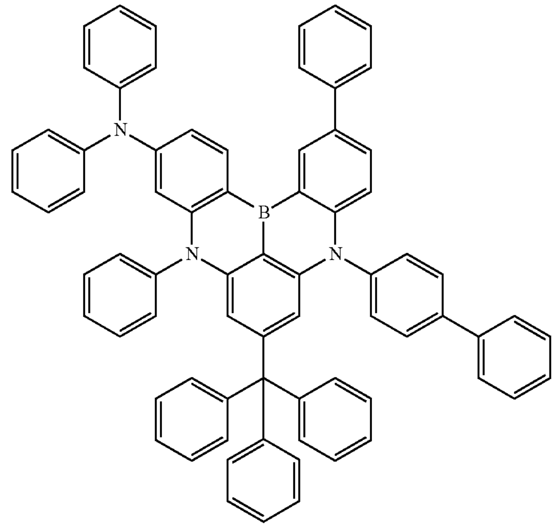
(2-136)
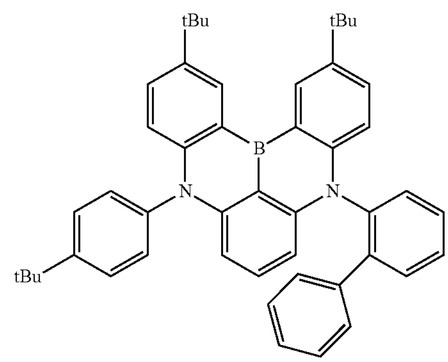
(2-137)
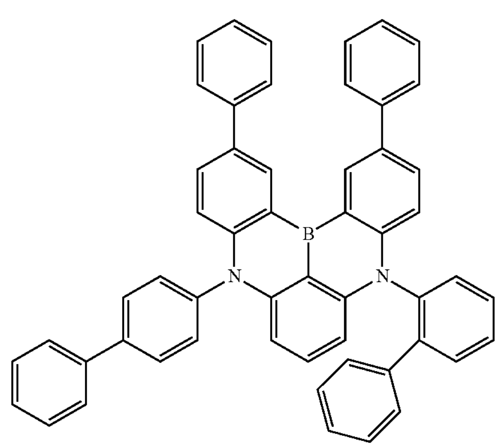

-continued
(2-138)
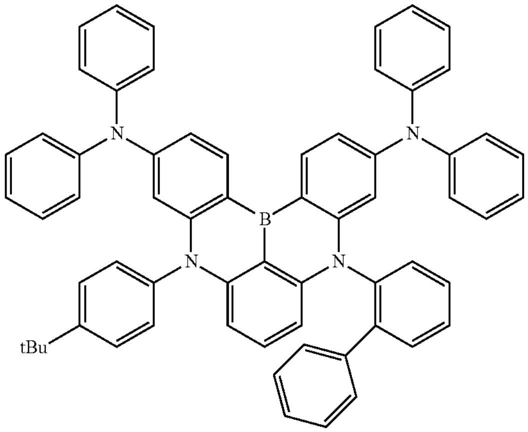
(2-139)
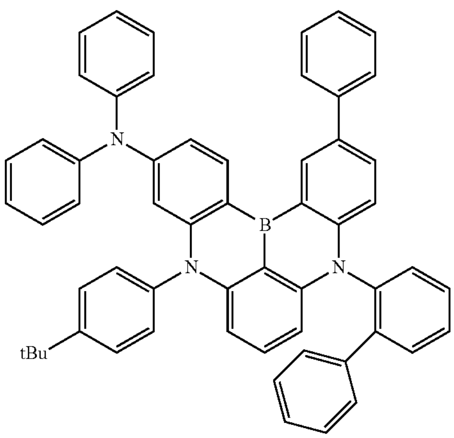
(2-140)
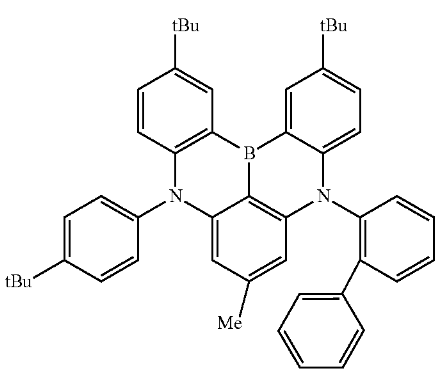
-continued
(2-141)
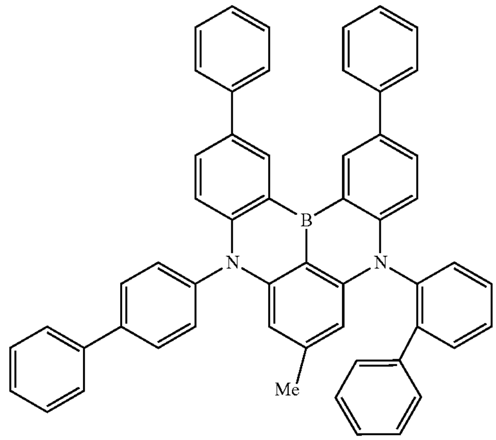
(2-142)
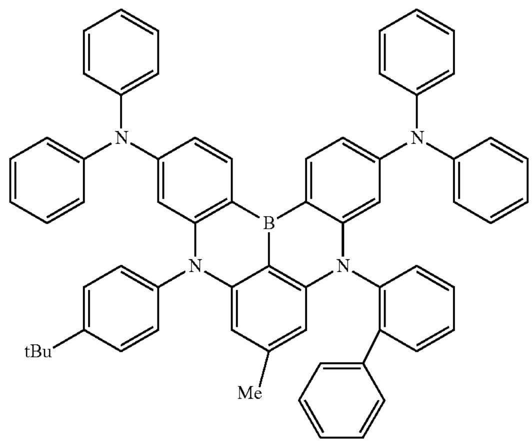
(2-143)
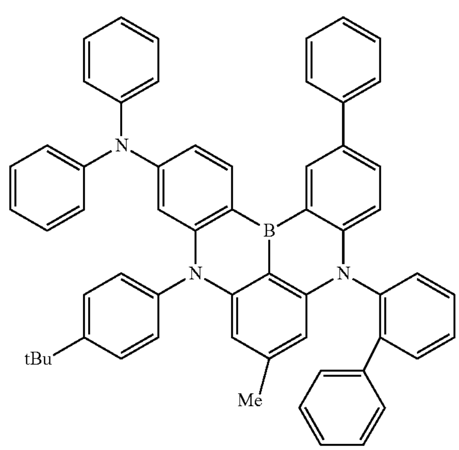

-continued
(2-160)
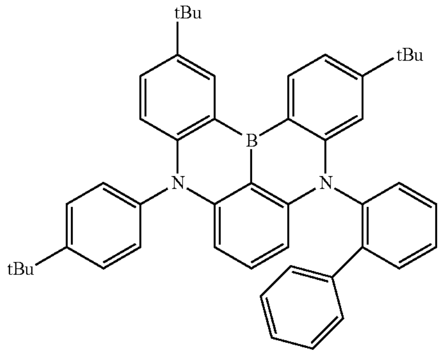
(2-161)
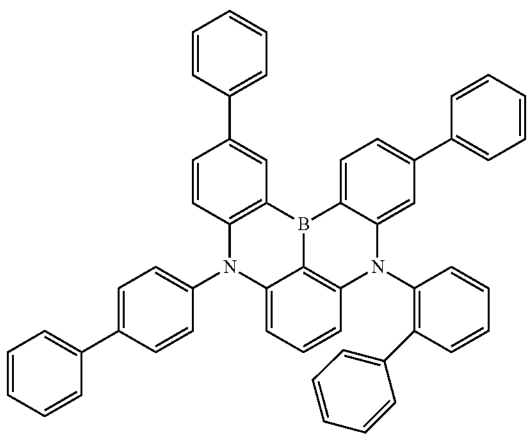
(2-162)
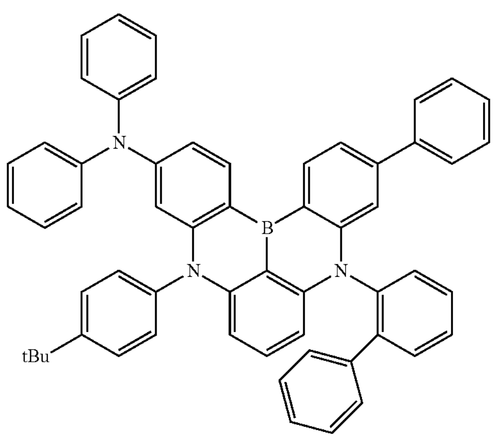
(2-163)
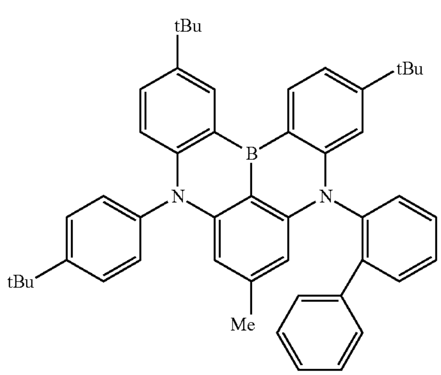
-continued
(2-164)
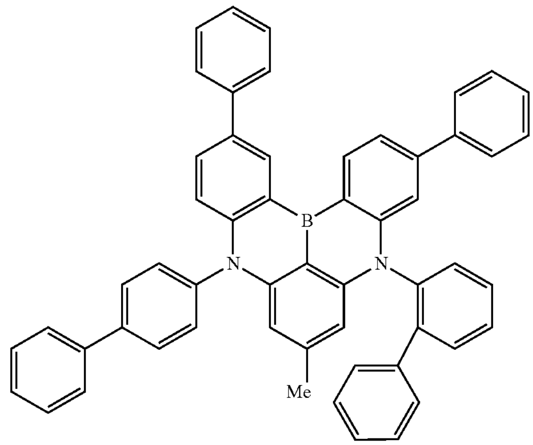
(2-165)
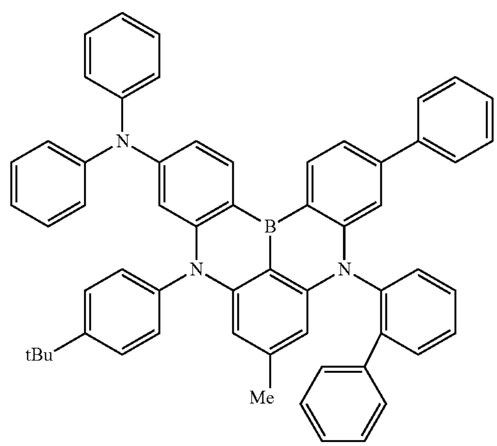
(2-166)
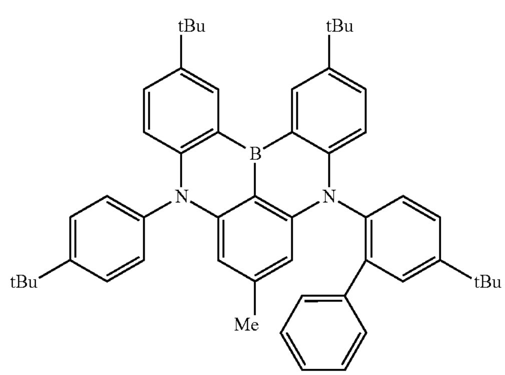

-continued
(2-167)
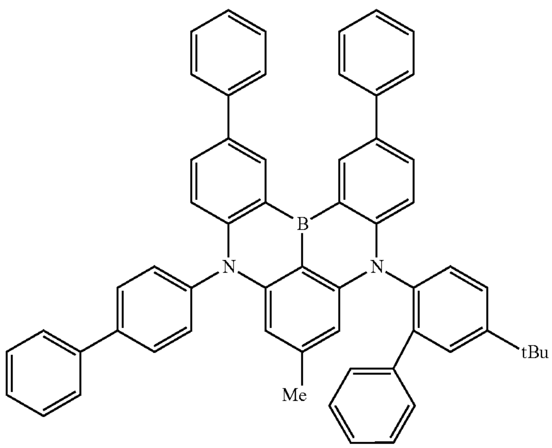
(2-168)
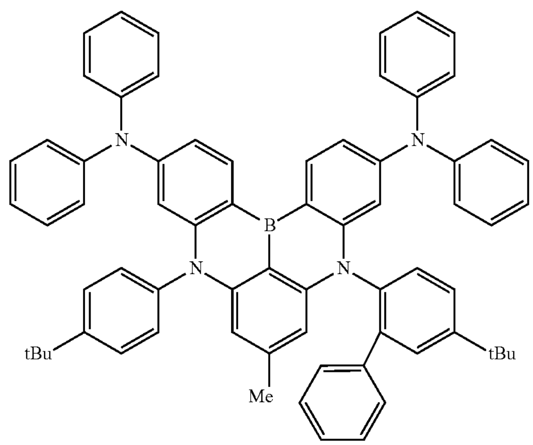
(2-169)
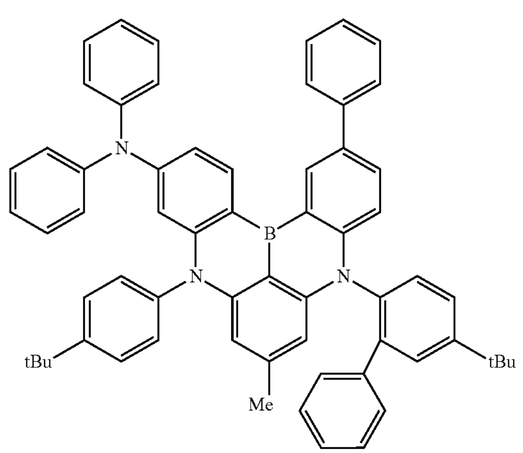
-continued
(2-170)
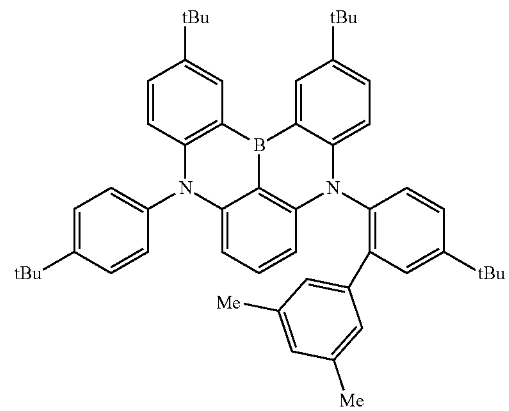
(2-171)
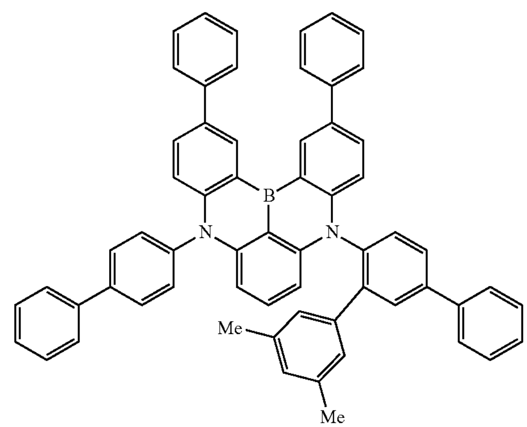
(2-172)
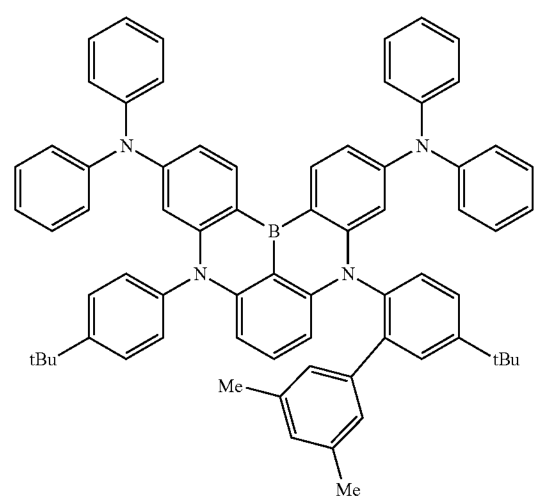

-continued
(2-173)
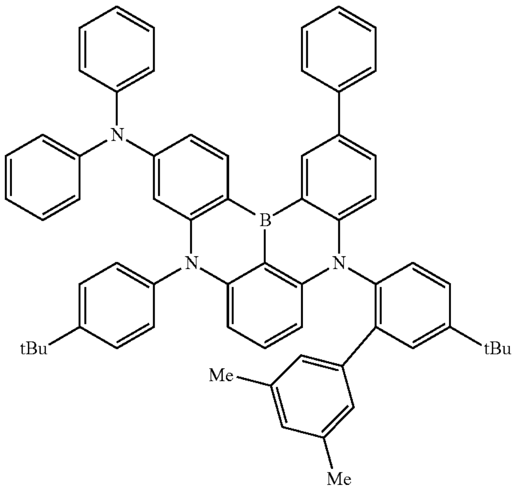
(2-174)
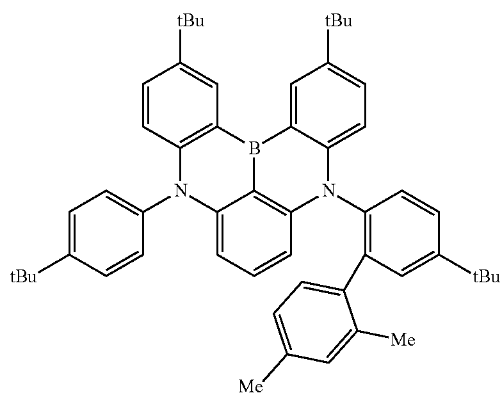
(2-175)
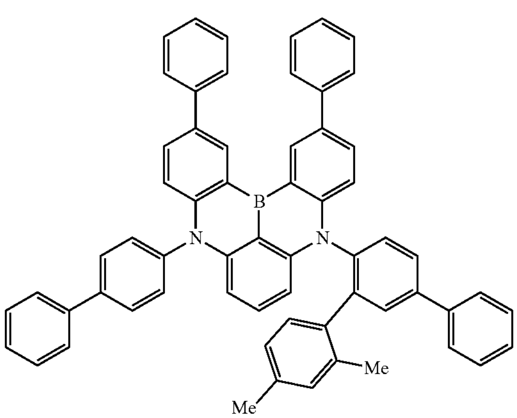
-continued
(2-176)
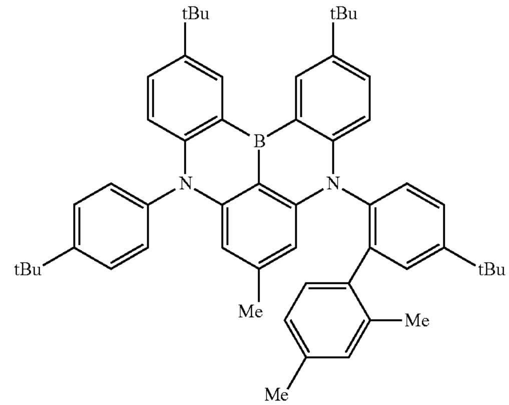
(2-177)
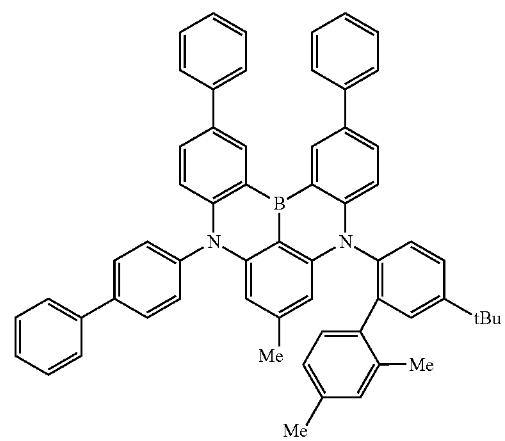
(2-178)
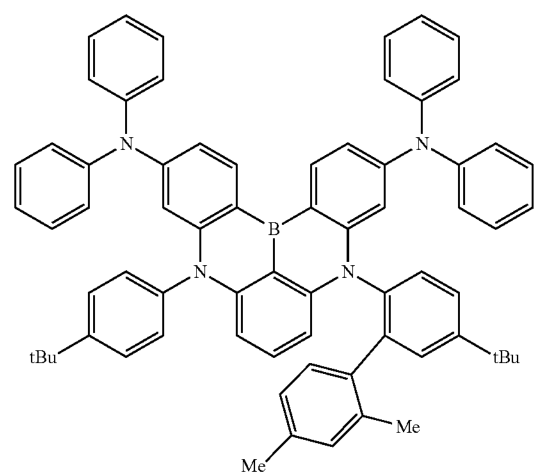

-continued
(2-179)
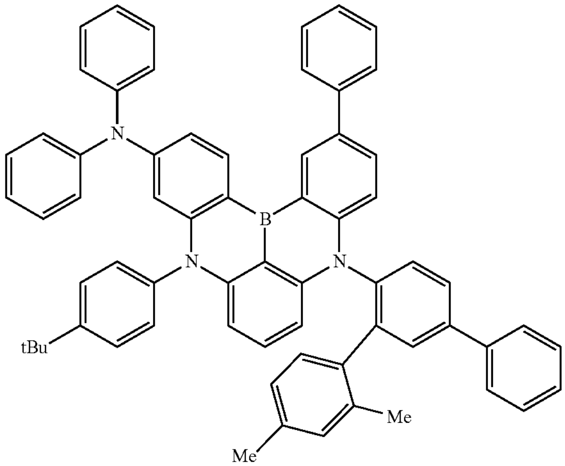
(2-180)
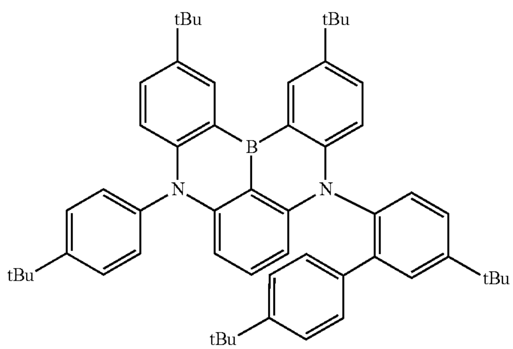
(2-181)
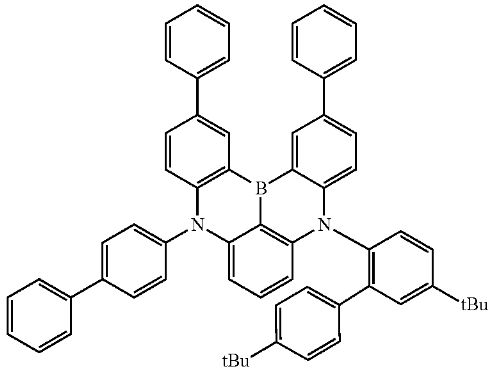
-continued
(2-182)
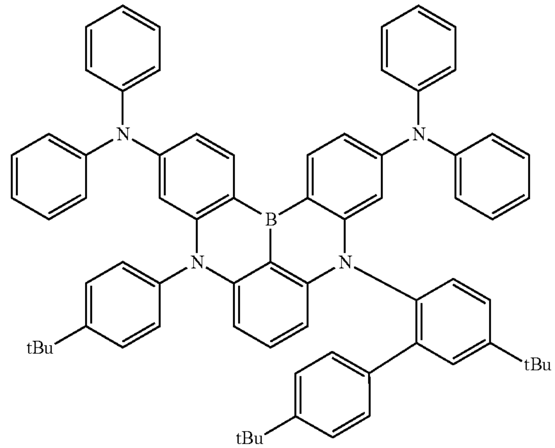
(2-183)
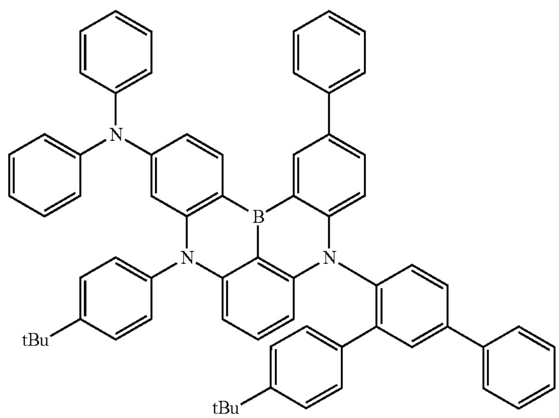
(2-200)
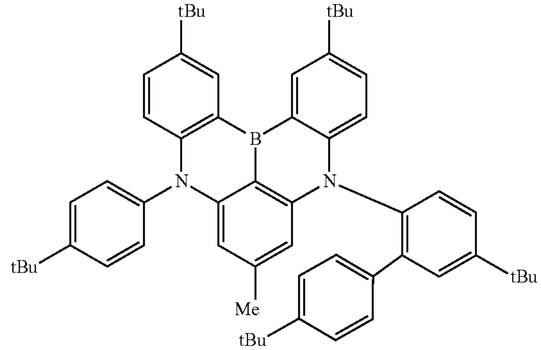

-continued
(2-201)
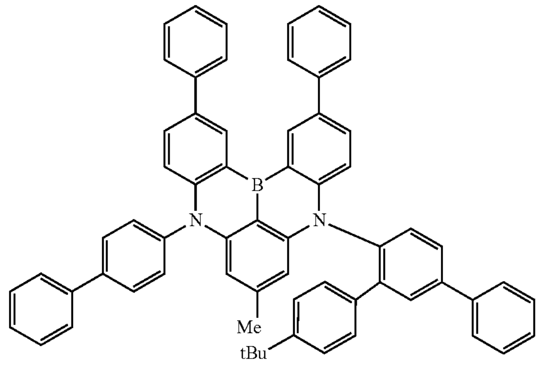
(2-202)
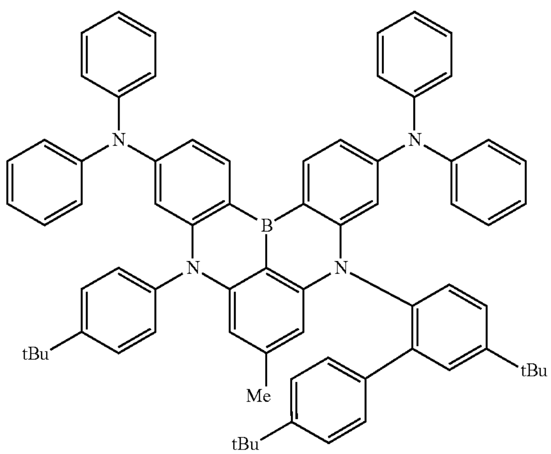
(2-203)
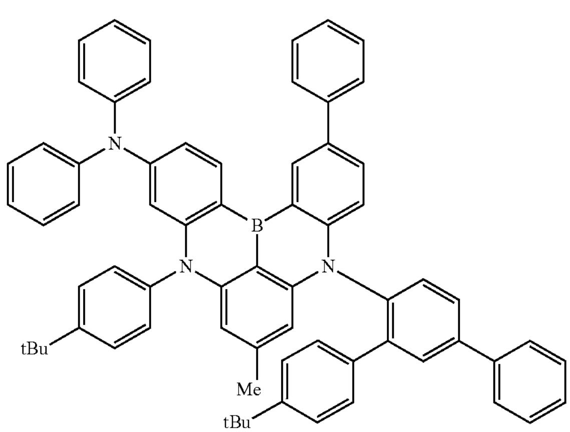
-continued
(2-204)
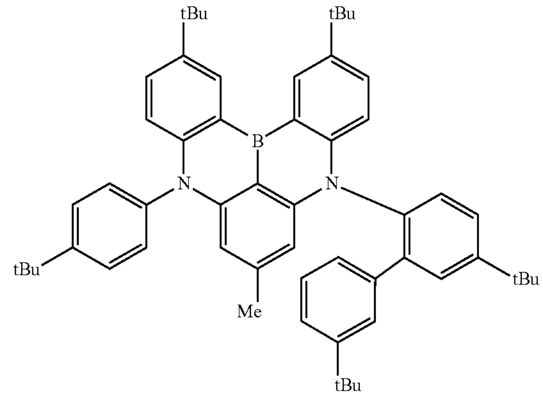
(2-205)
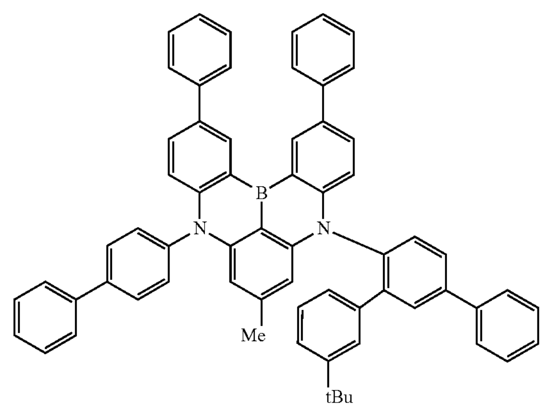
(2-206)
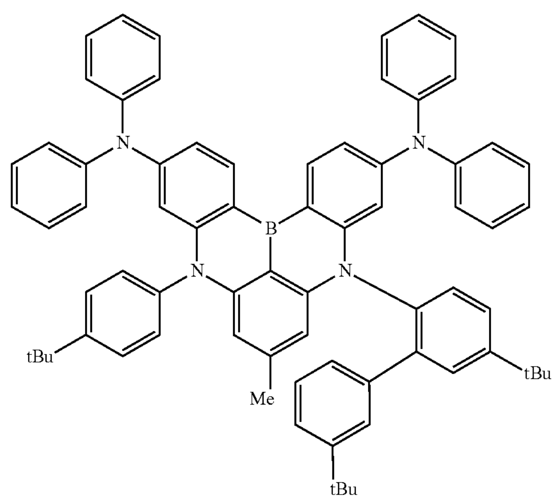

-continued
(2-207)
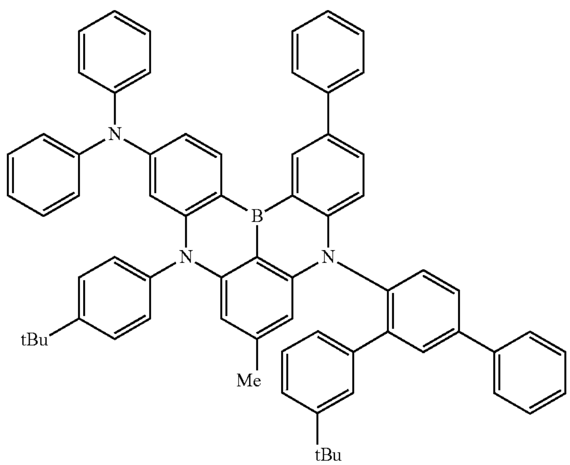
(2-208)
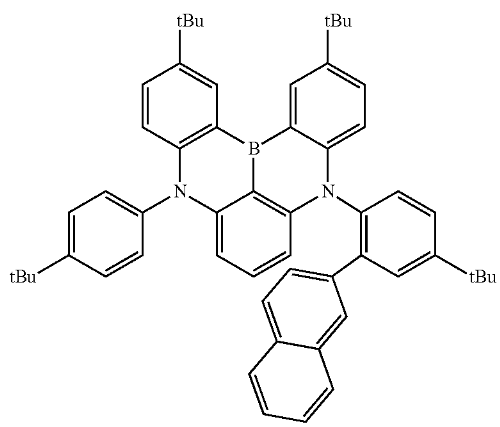
(2-209)
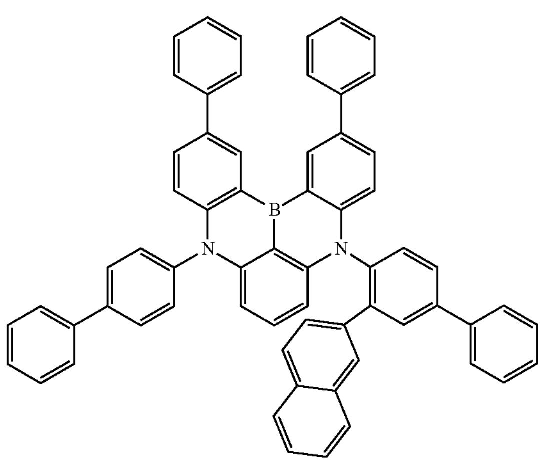
-continued
(2-210)
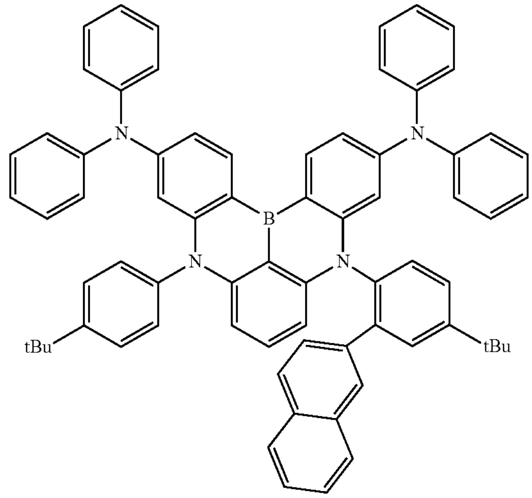
(2-211)
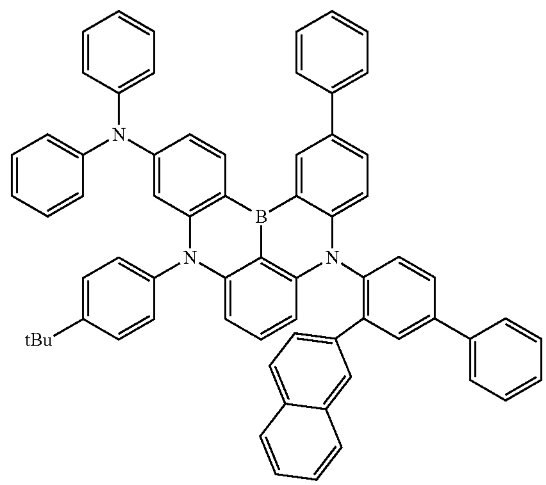
(2-212)
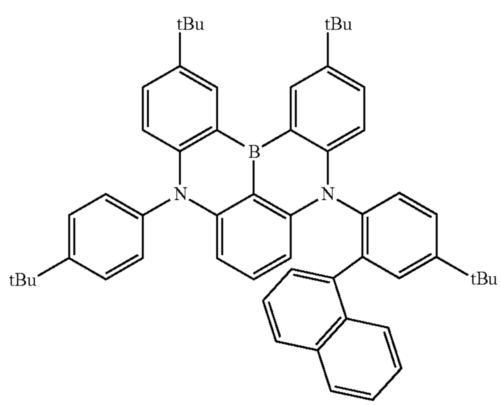

-continued
(2-213)
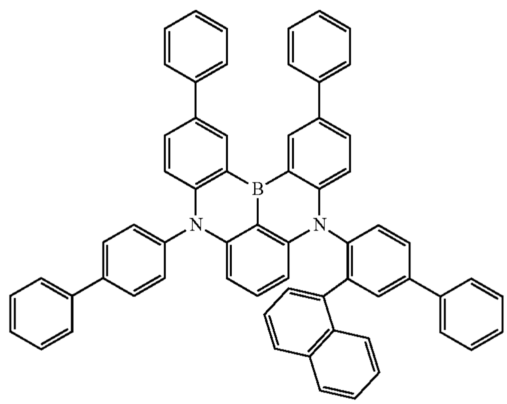
(2-214)
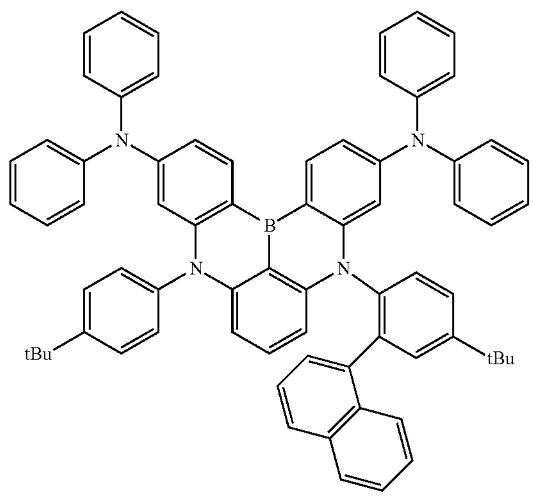
(2-215)
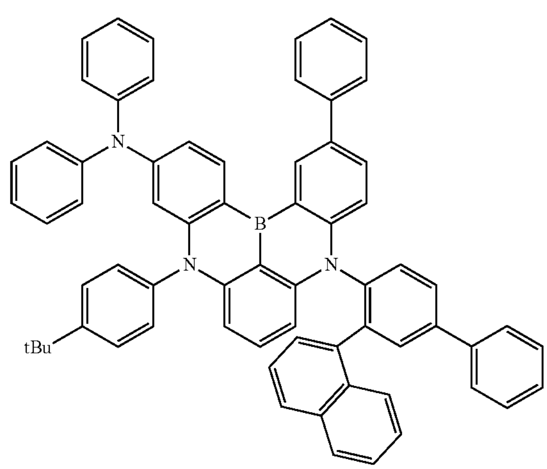
-continued
(2-216)
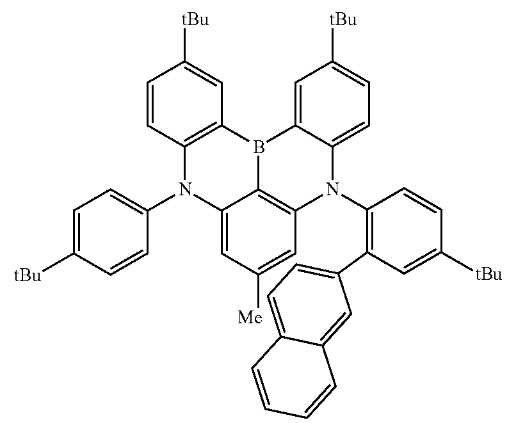
(2-217)
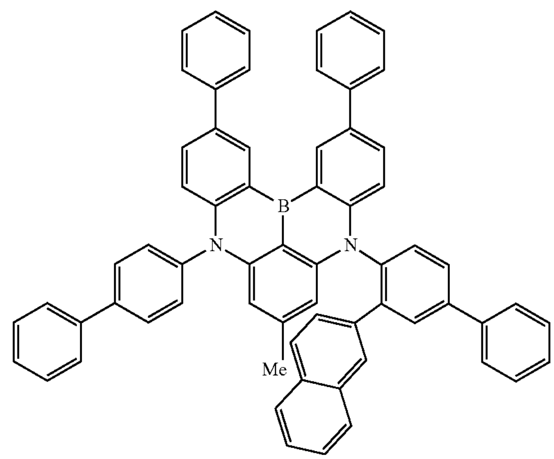
(2-218)
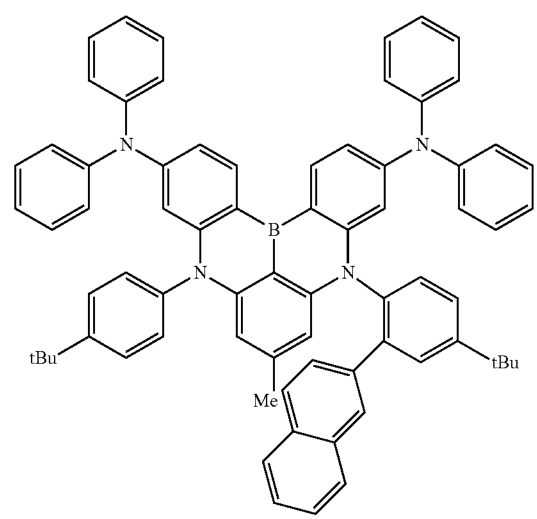

-continued
(2-219)
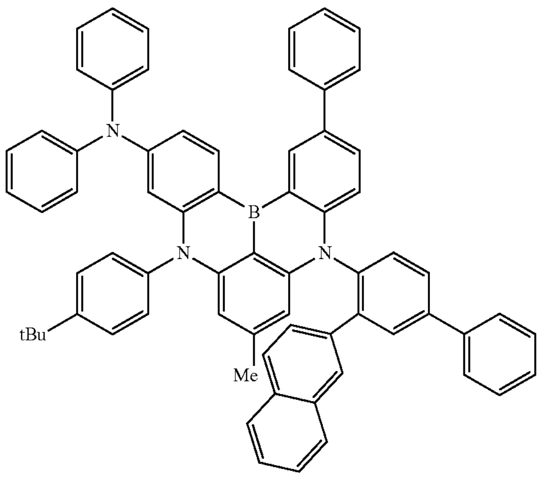
(2-220)
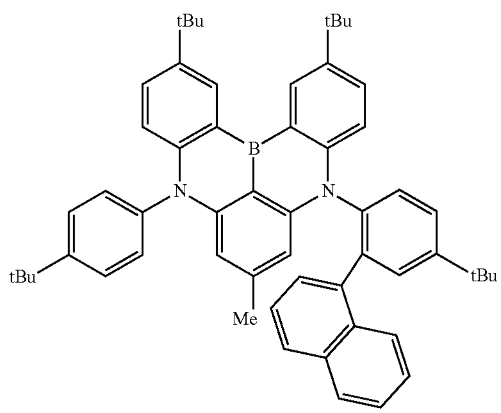
(2-221)
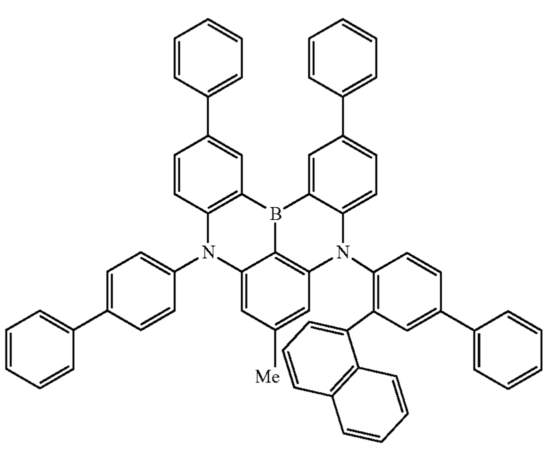
-continued
(2-222)
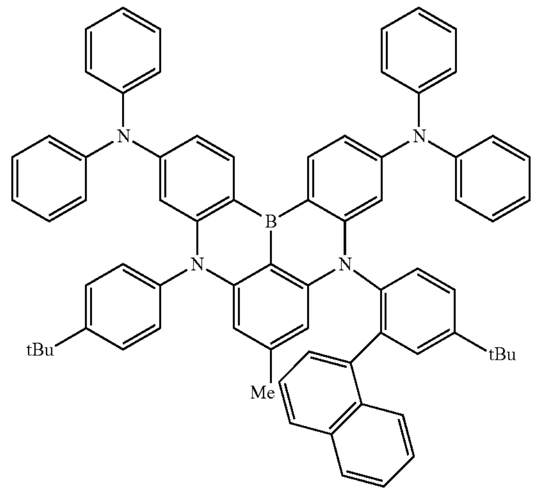
(2-223)
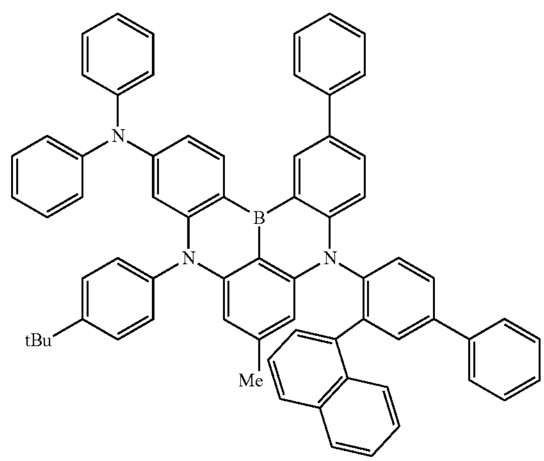
(2-240)
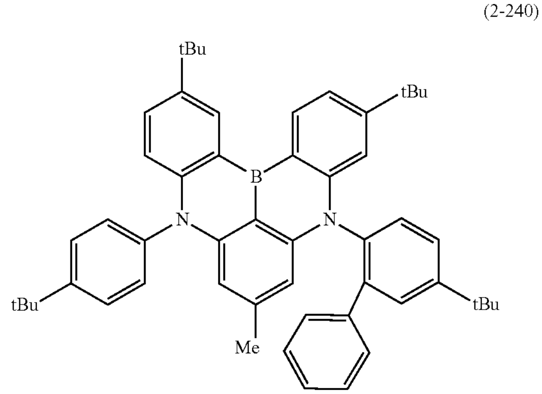

-continued
(2-241)
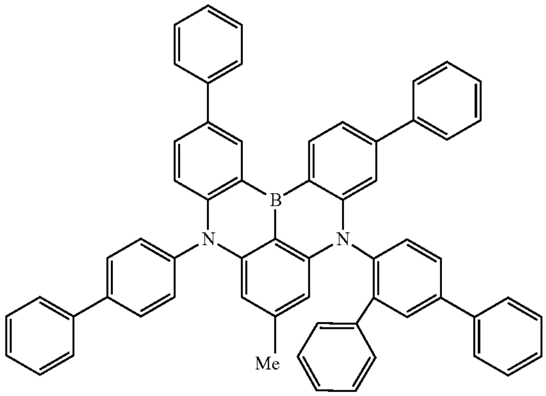
(2-242)
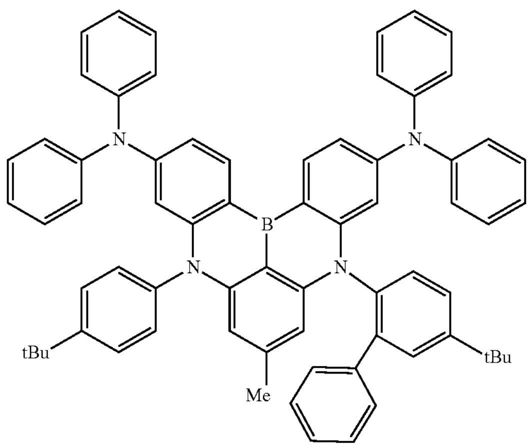
(2-243)
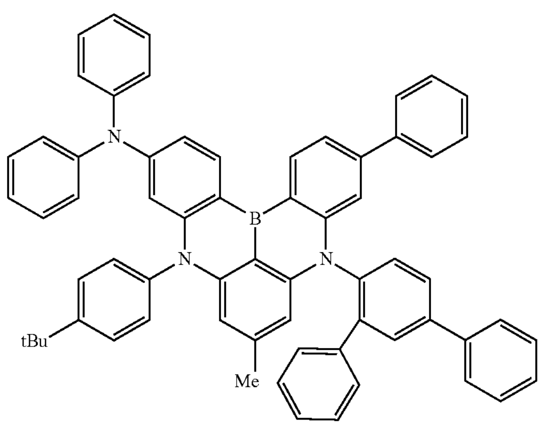
-continued
(2-244)
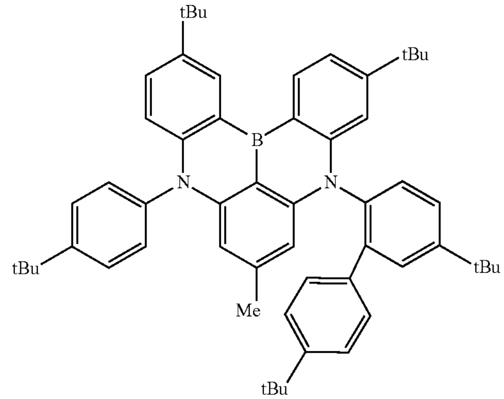
(2-245)
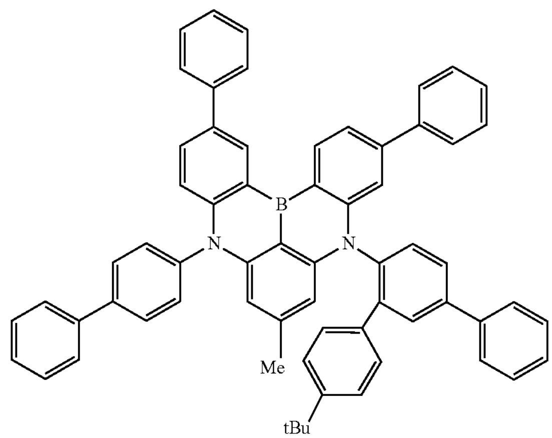
(2-246)
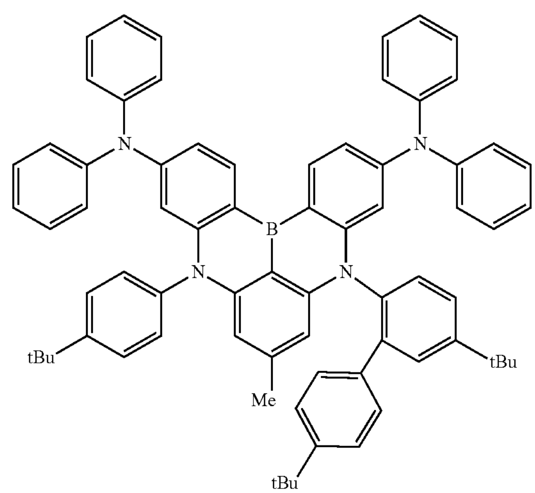

-continued
(2-247)
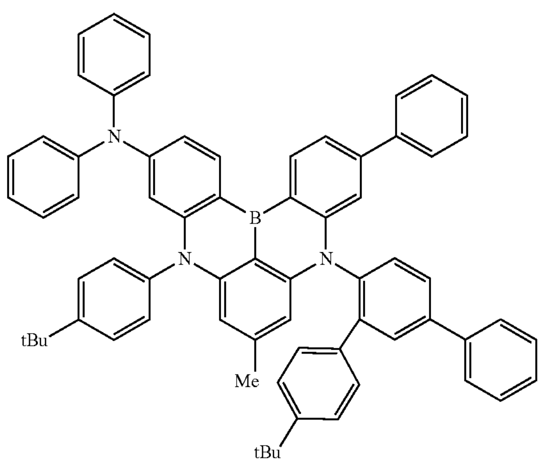
(2-248)
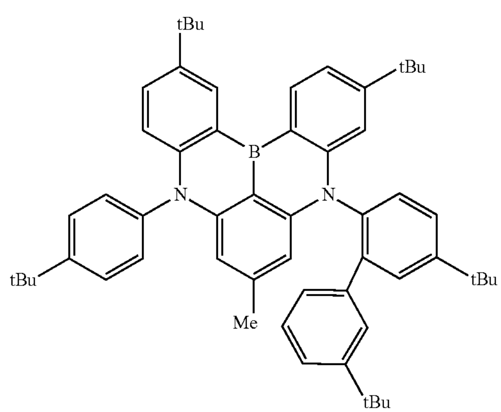
(2-249)
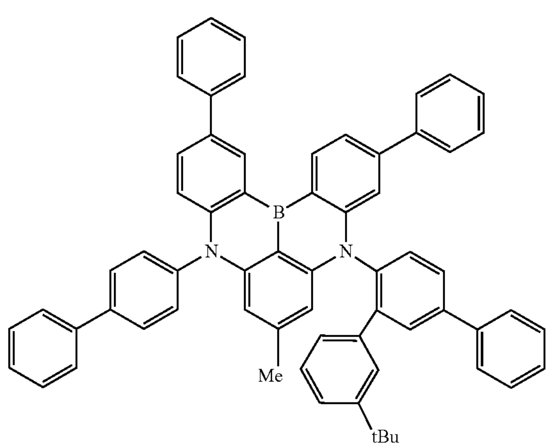
-continued
(2-250)
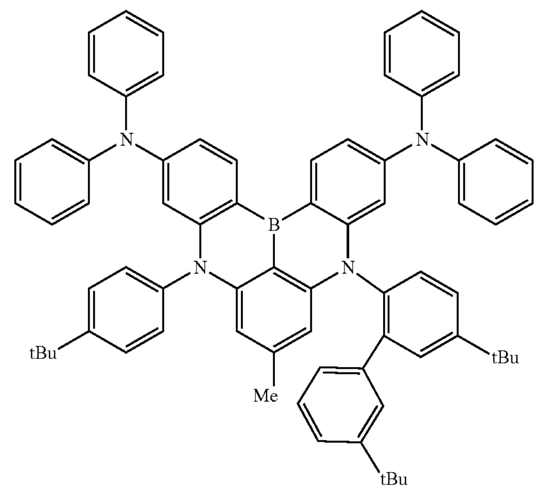
(2-251)
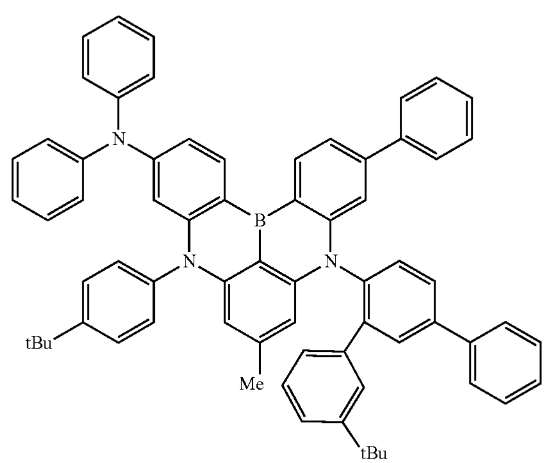
(2-252)
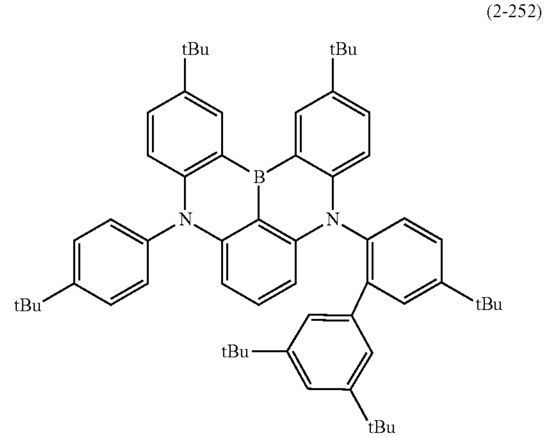

-continued
(2-253)
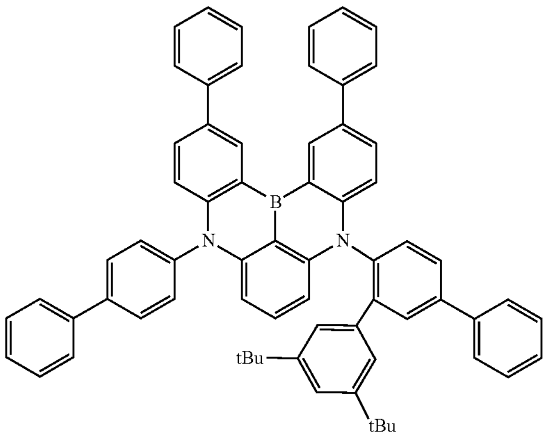
(2-254)
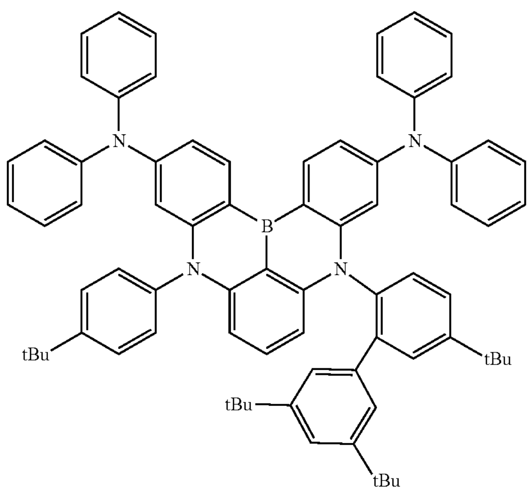
(2-255)
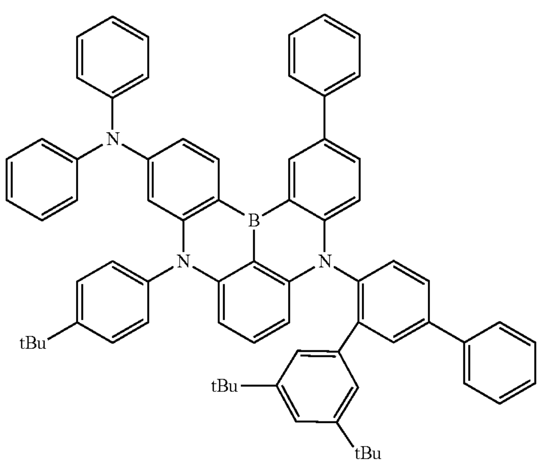
-continued
(2-256)
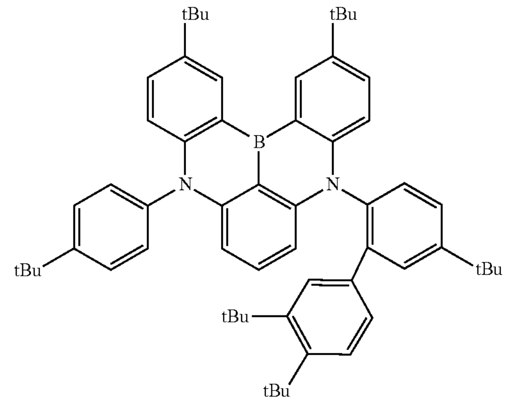
(2-257)
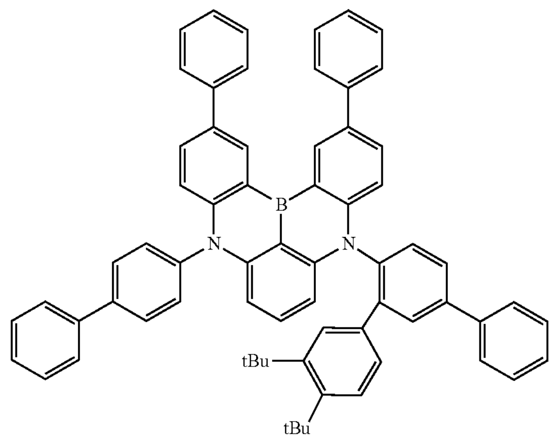
(2-258)
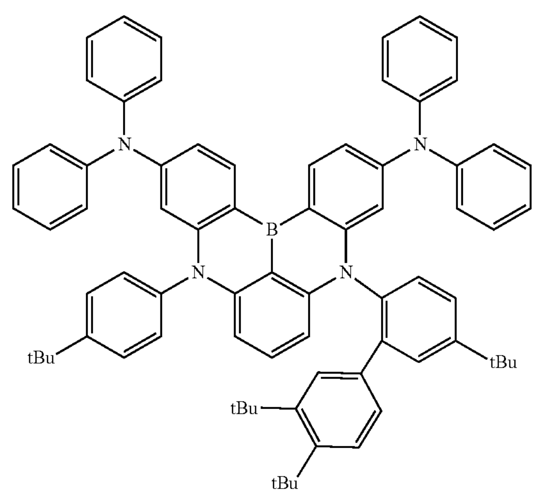

-continued
(2-259)
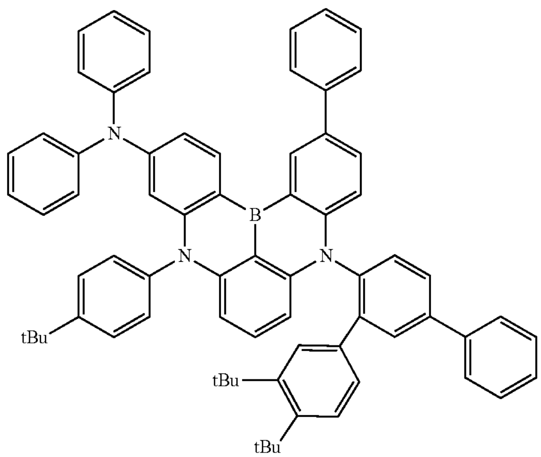
(2-260)
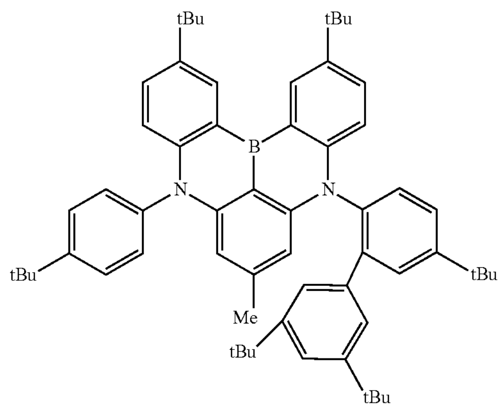
(2-261)
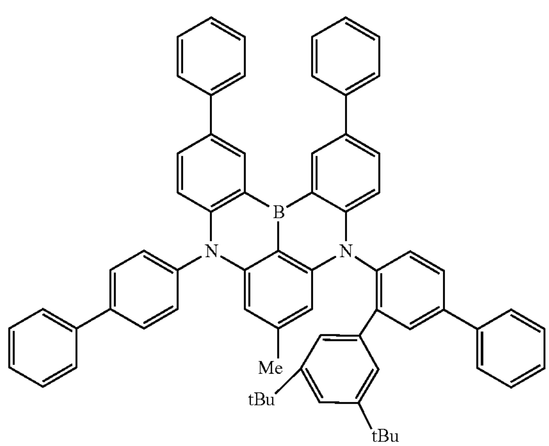
-continued
(2-262)
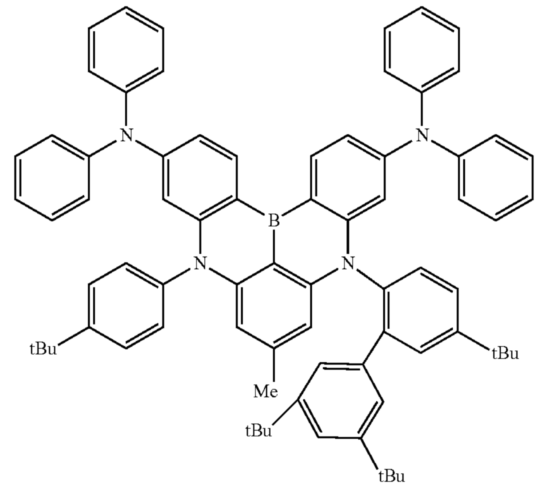
(2-263)
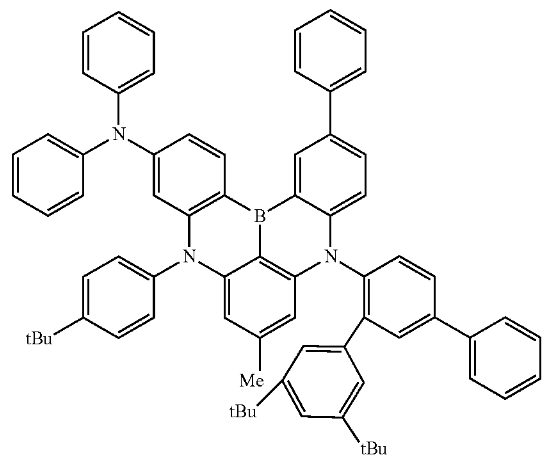
(2-280)
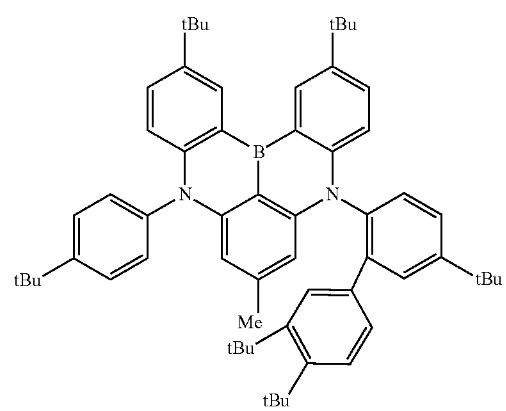

(2-281)
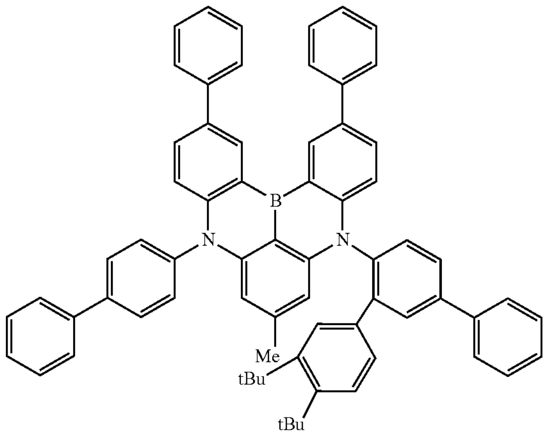
(2-282)
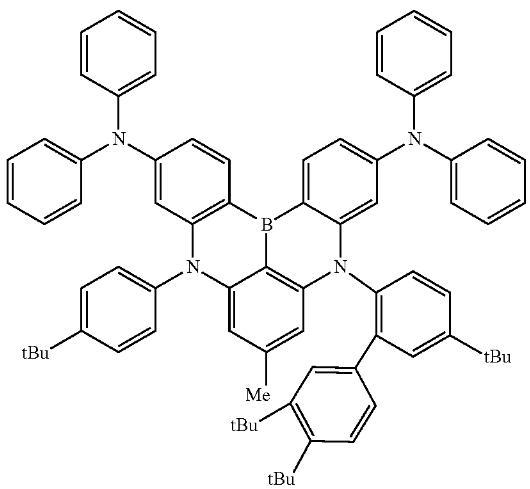
(2-283)
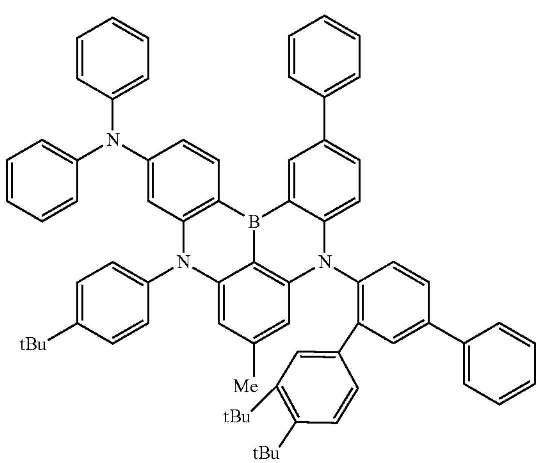
(2-284)
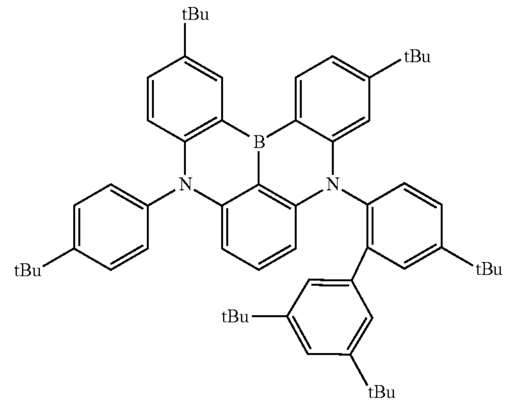
(2-285)
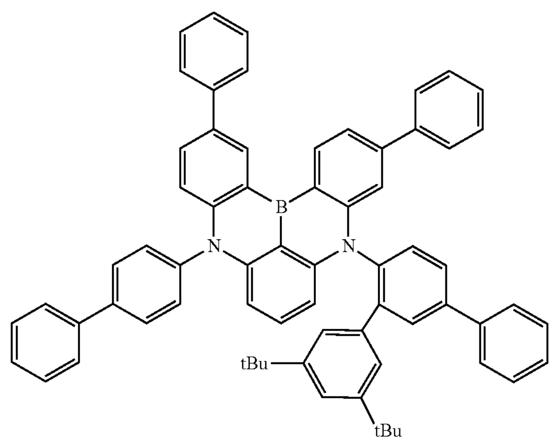
(2-286)
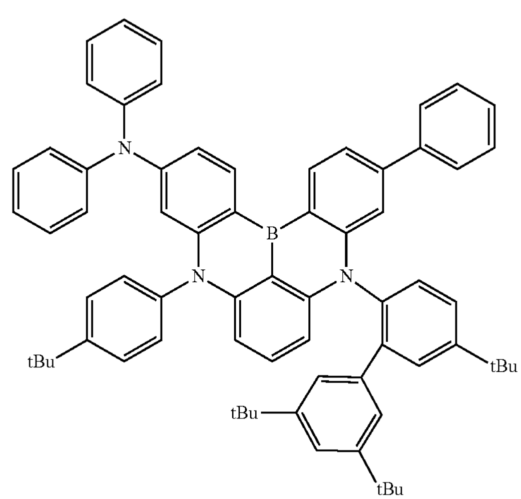

-continued
(2-287)
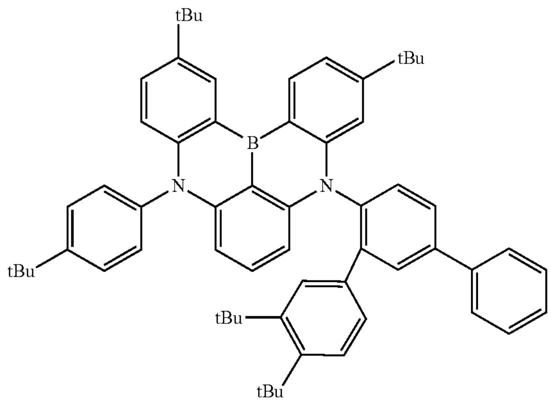
(2-288)
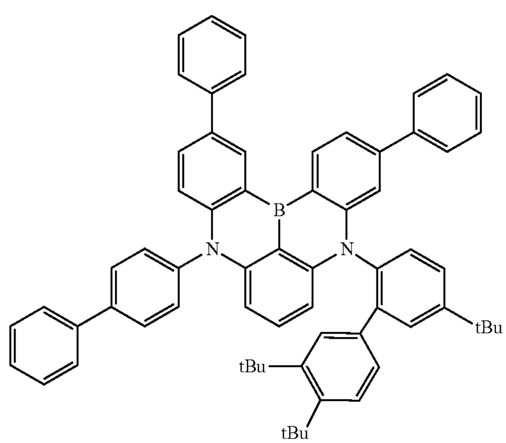
(2-289)
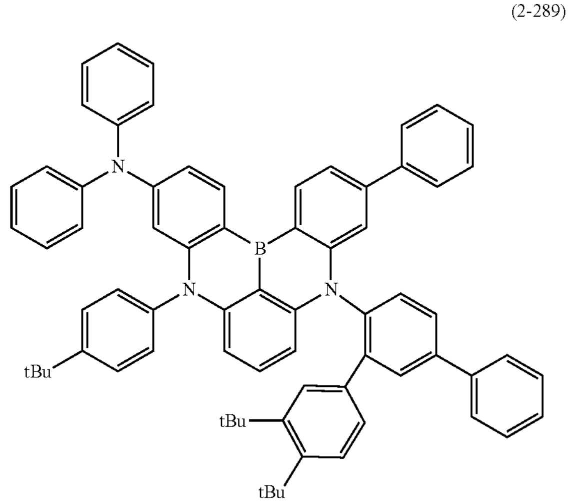
-continued
(2-290)
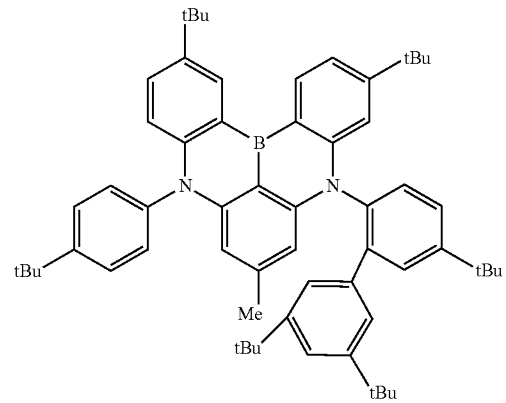
(2-291)
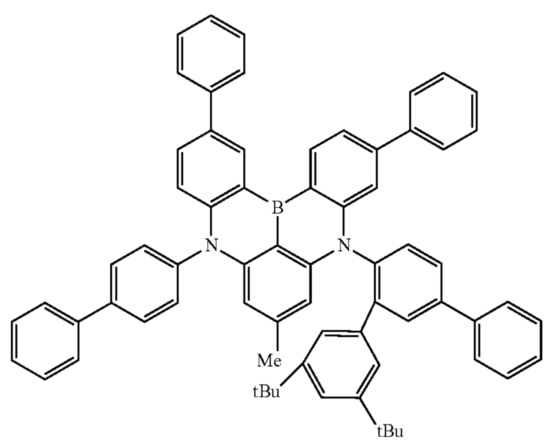
(2-292)
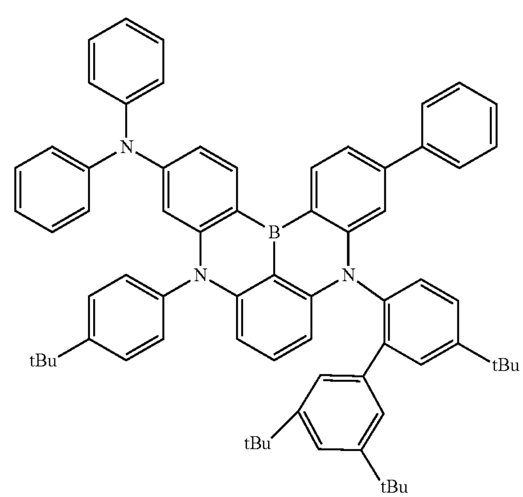

-continued
(2-293)
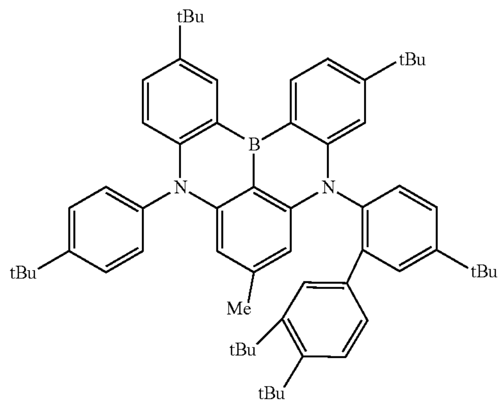
(2-294)
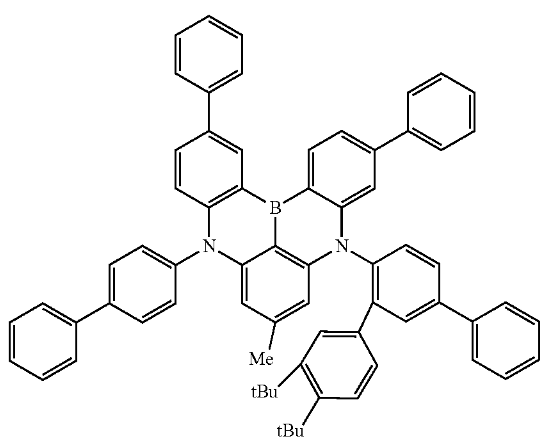
(2-295)
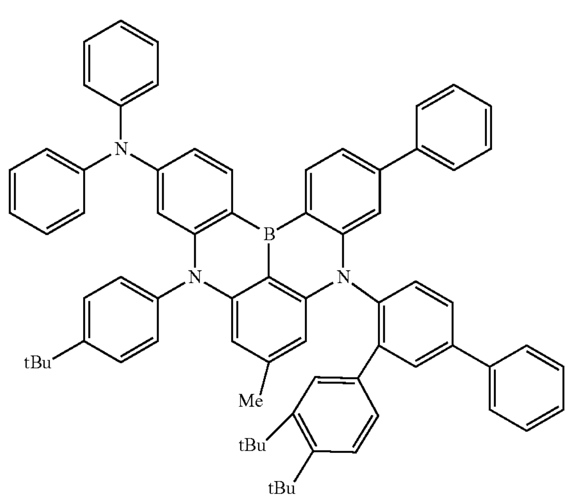
-continued
(2-296)
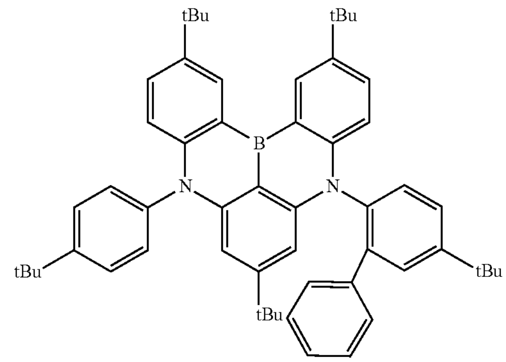
(2-297)
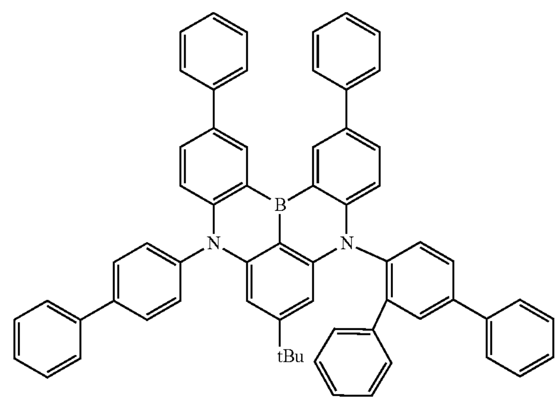
(2-298)
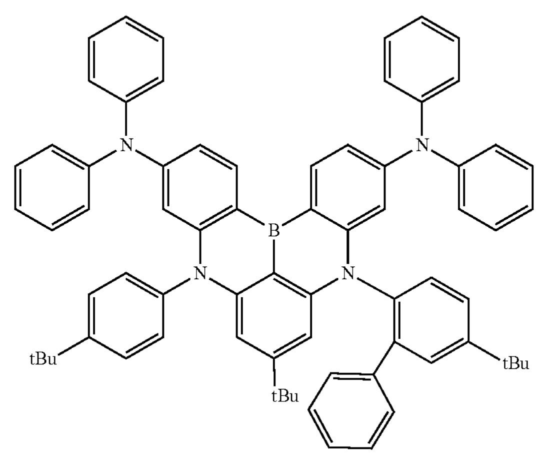

-continued
(2-299)
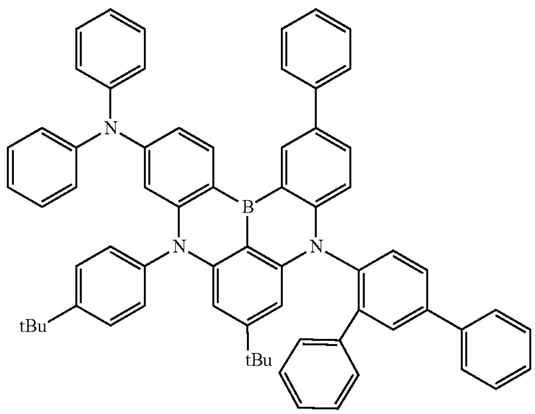
(2-300)
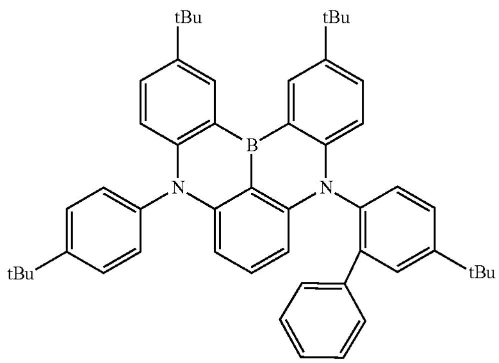
(2-301)
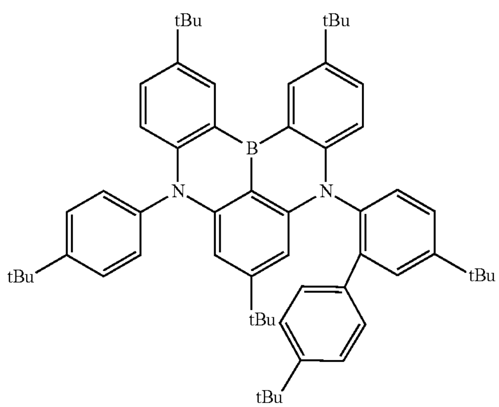
(2-302)
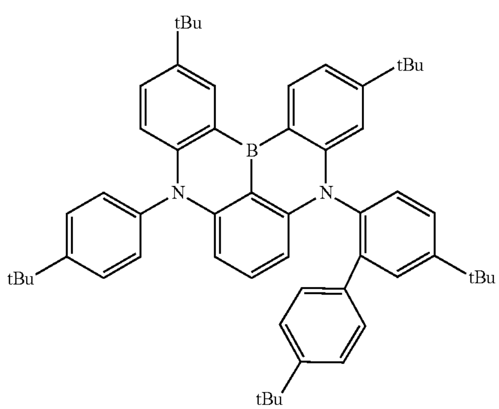
-continued
(2-303)
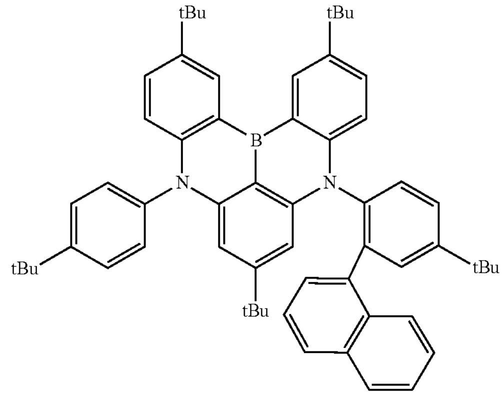
(2-304)
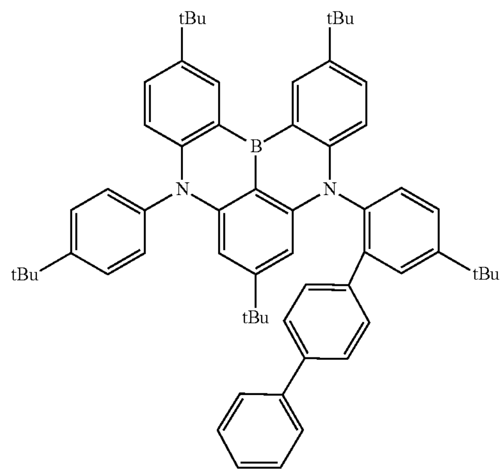
(2-401)
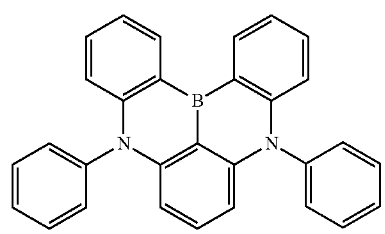
(2-402)
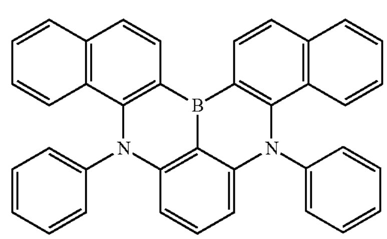

-continued
(2-403)
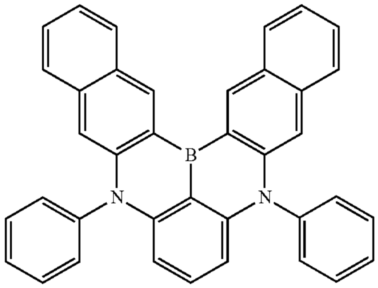
(2-404)
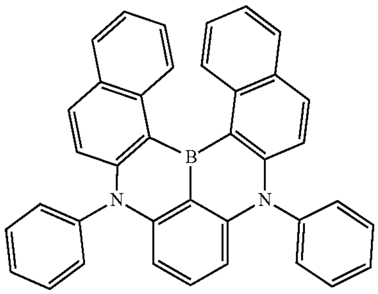
(2-405)
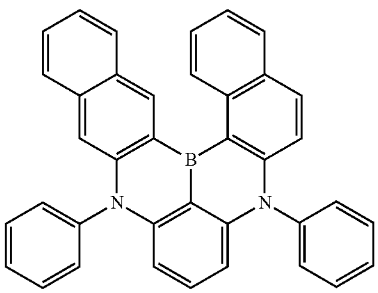
(2-406)
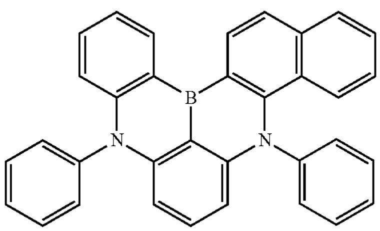
(2-407)
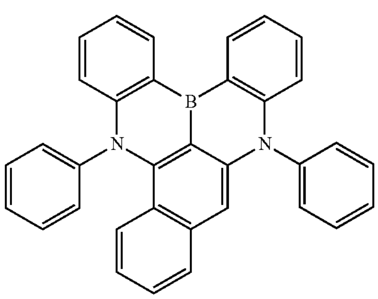
-continued
(2-408)
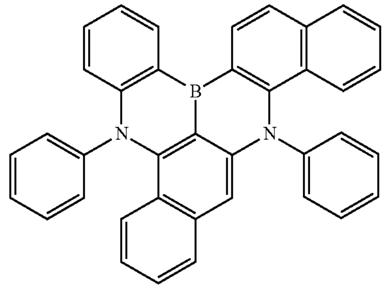
(2-409)
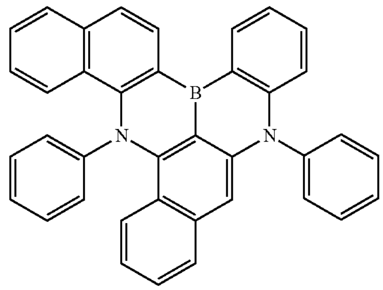
(2-411)
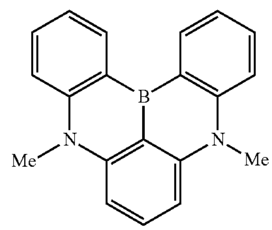
(2-412)
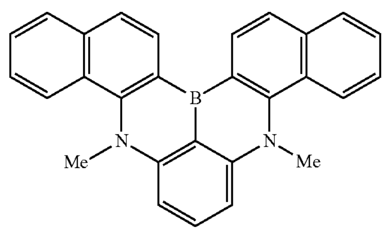
(2-413)
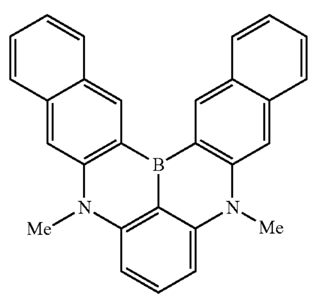
(2-414)
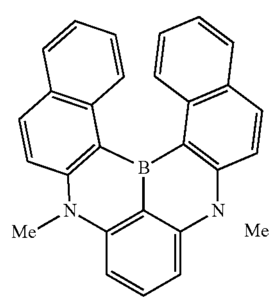

-continued
(2-415)
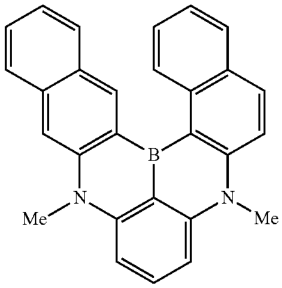
(2-416)
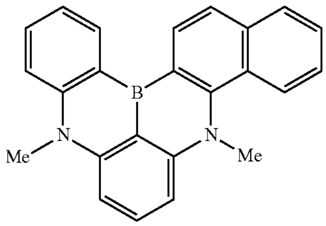
(2-417)
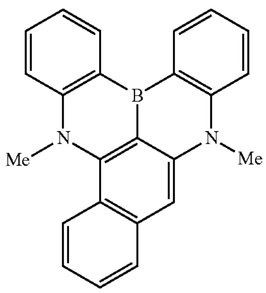
(2-418)
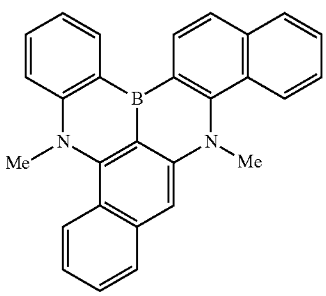
(2-419)
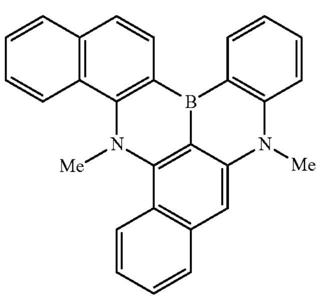
-continued
(2-421)
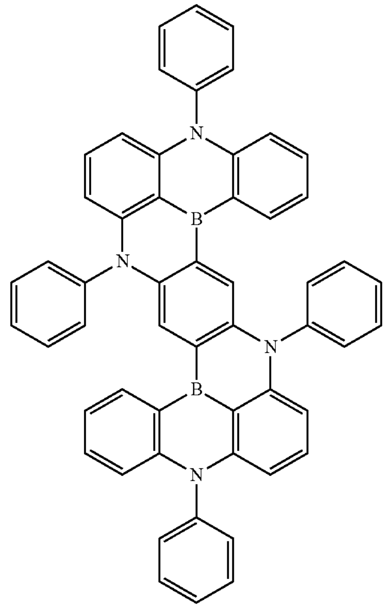
(2-422)
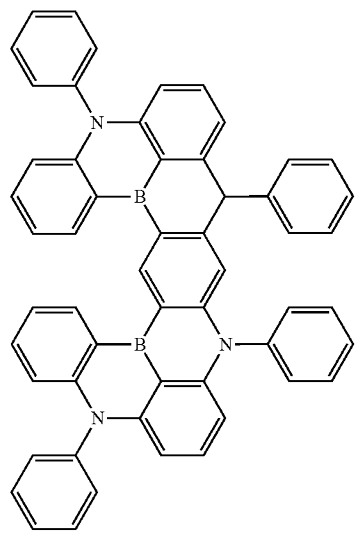
(2-423)
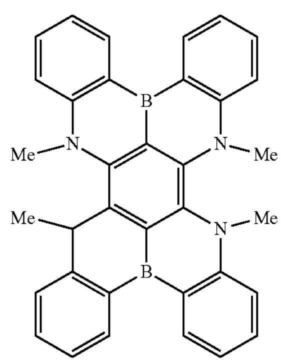

-continued
(2-424)
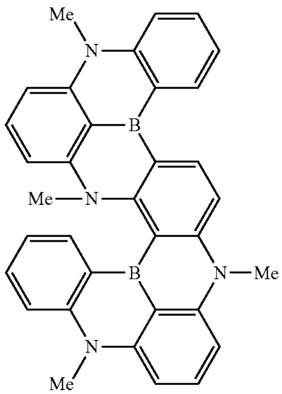
(2-425)
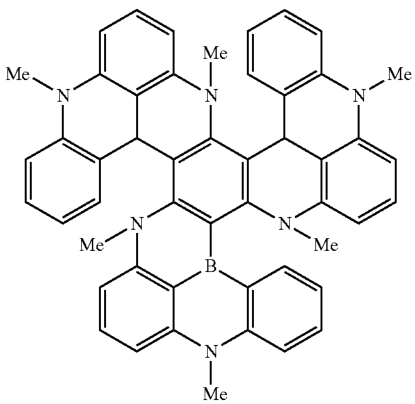
(2-431)
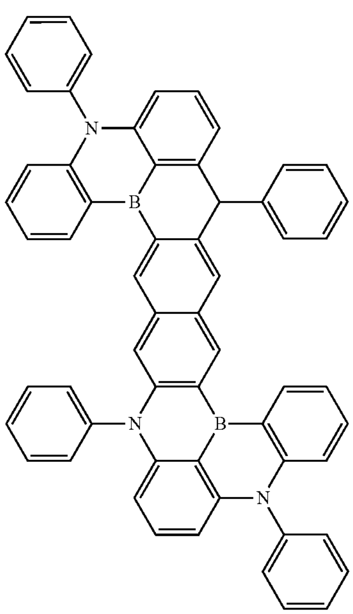
-continued
(2-432)
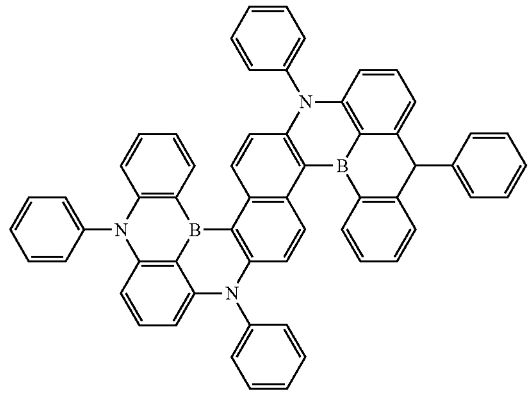
(2-433)
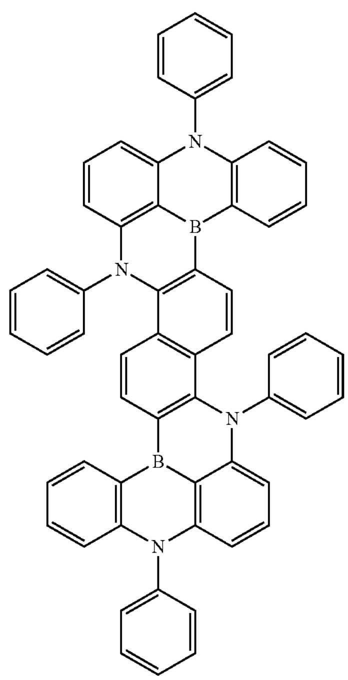

-continued
(2-434)
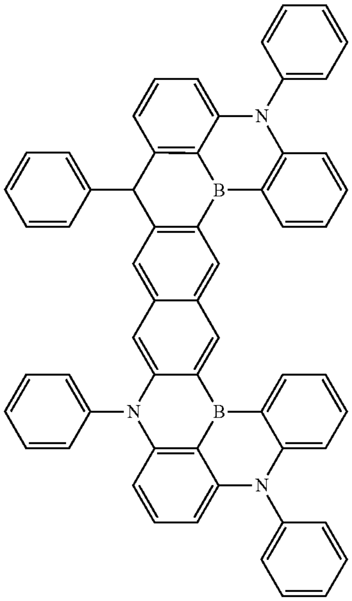
(2-435)
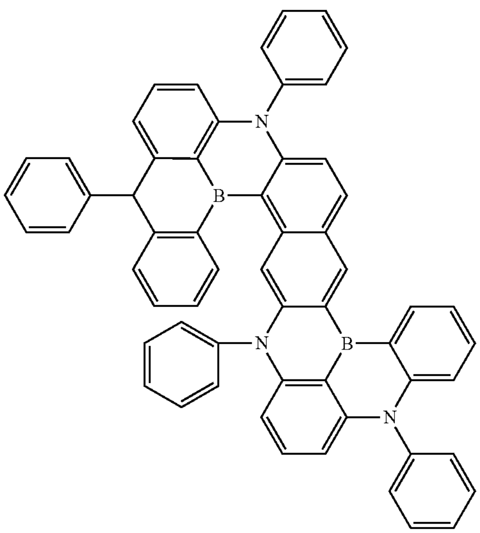
(2-441)
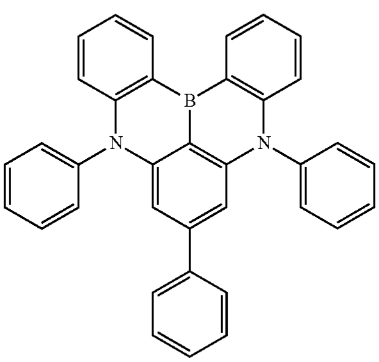
-continued
(2-442)
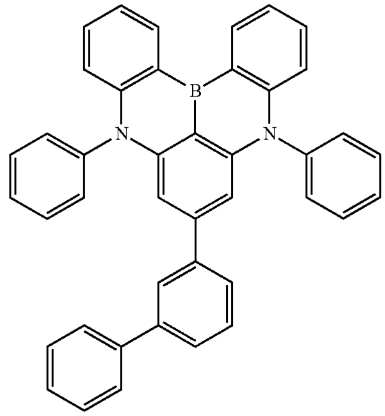
(2-443)
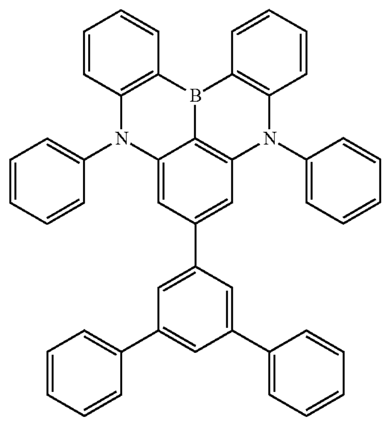
(2-444)
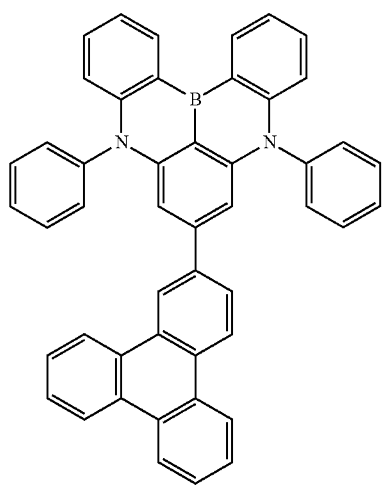

-continued
(2-445)
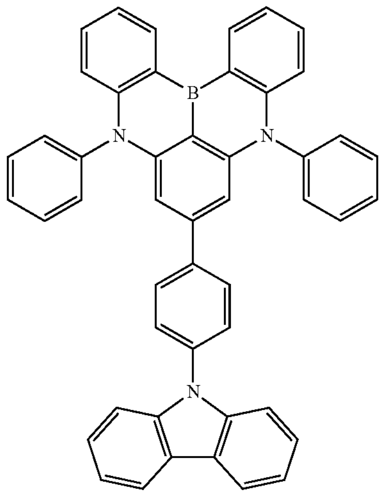
(2-446)
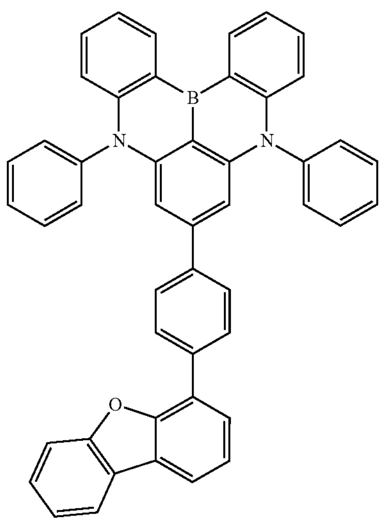
(2-447)
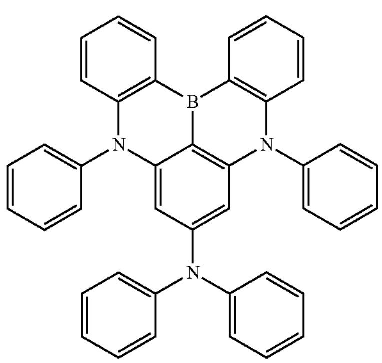
(2-451)
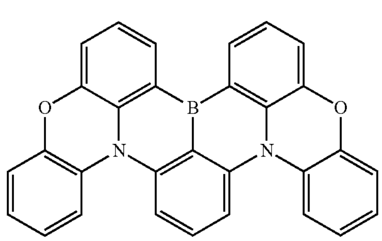
-continued
(2-452)
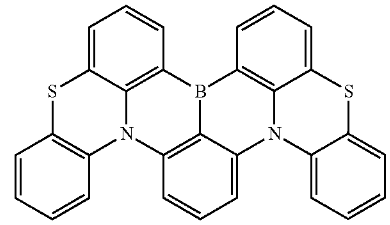
(2-453)
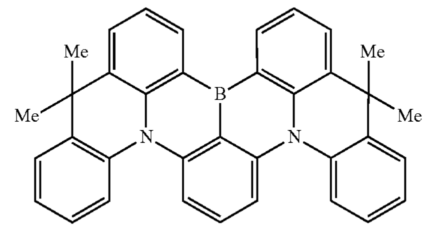
(2-454)
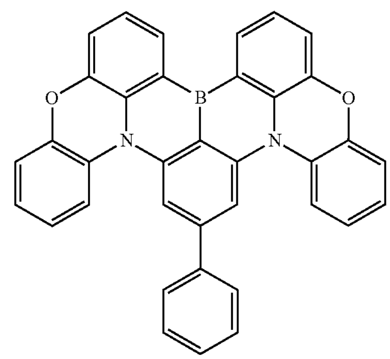
(2-455)
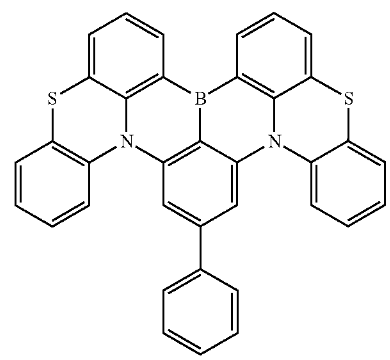
(2-456)
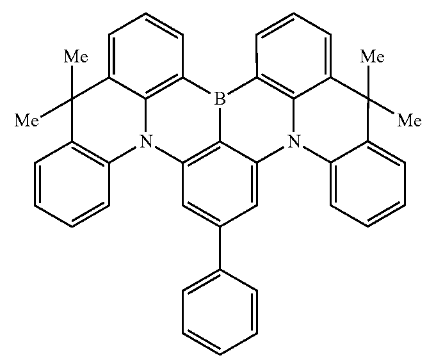

-continued
(2-457)
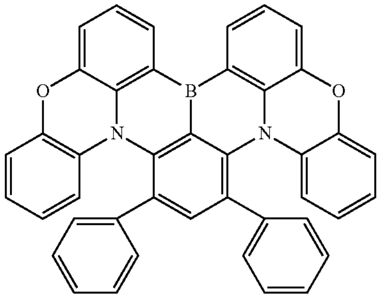
(2-458)
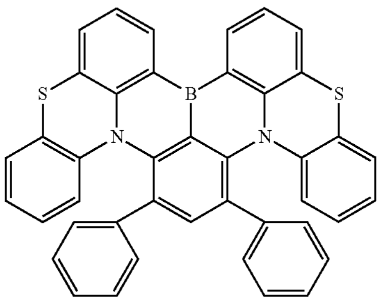
(2-459)
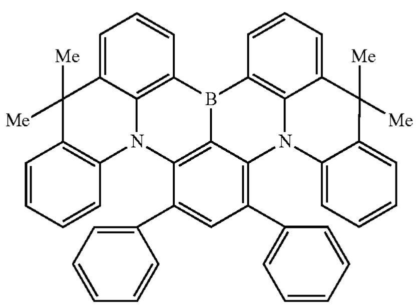
(2-460)
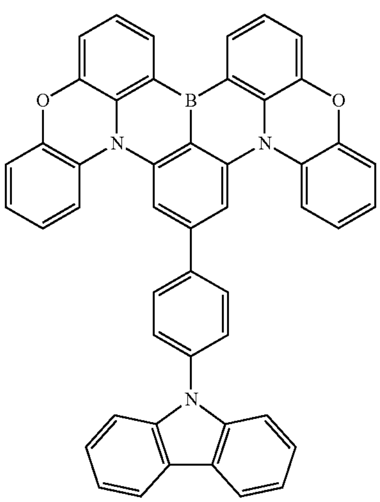
-continued
(2-461)
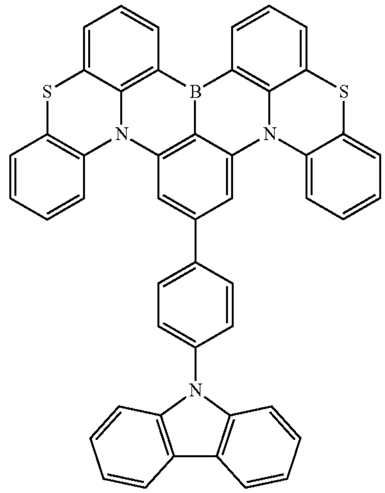
(2-462)
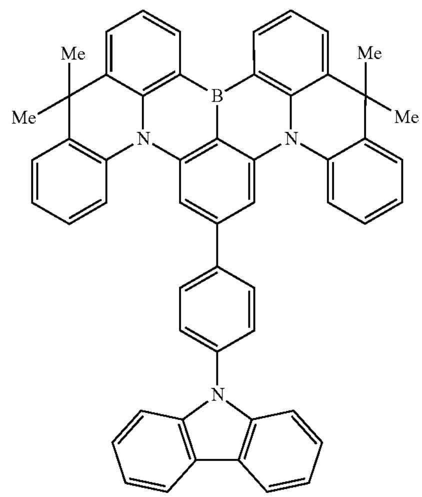
(2-1401)
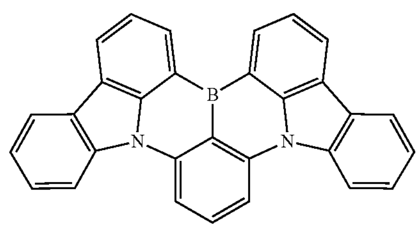
(2-1402)
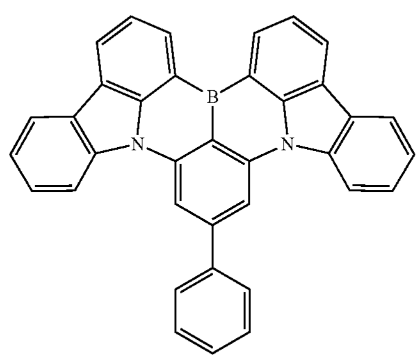

-continued
(2-1403)
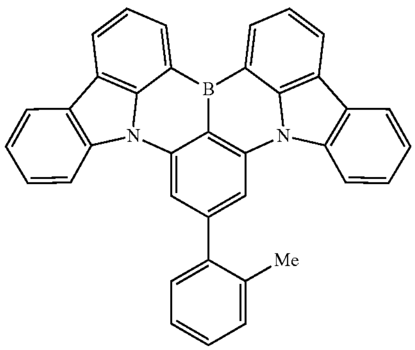
(2-1404)
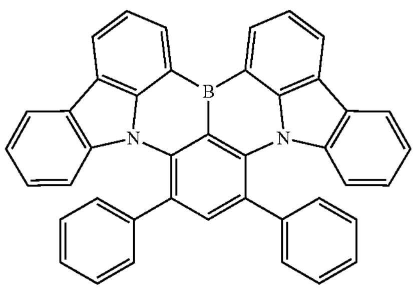
(2-1405)
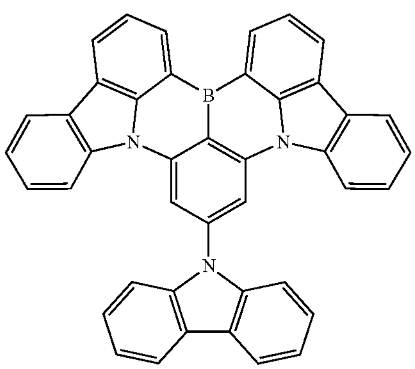
(2-1406)
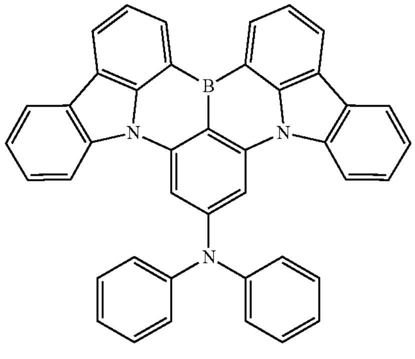
-continued
(2-1407)
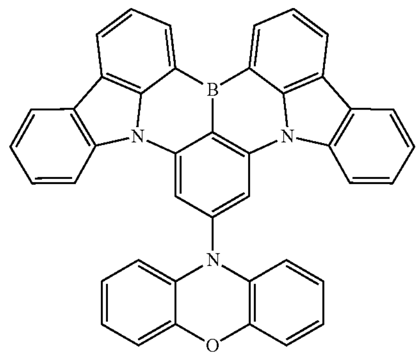
(2-1408)
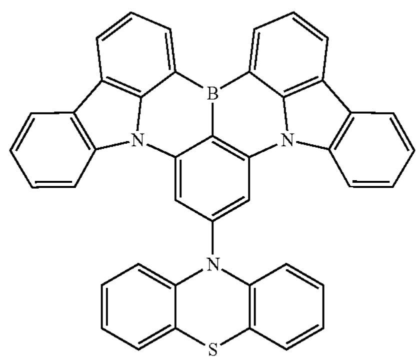
(2-1409)
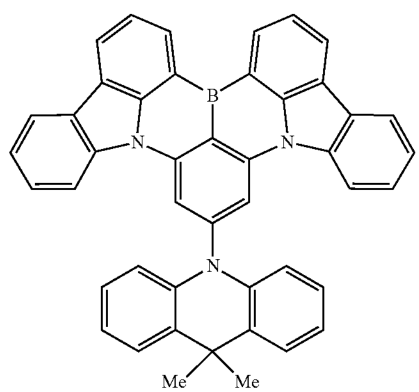
(2-1410)
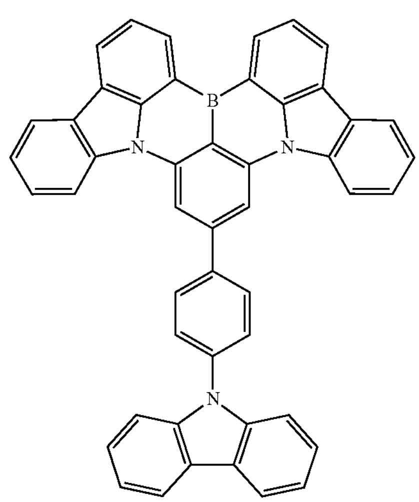

(2-1411)
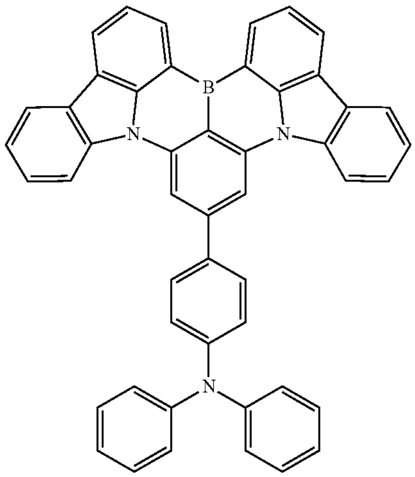
(2-1412)
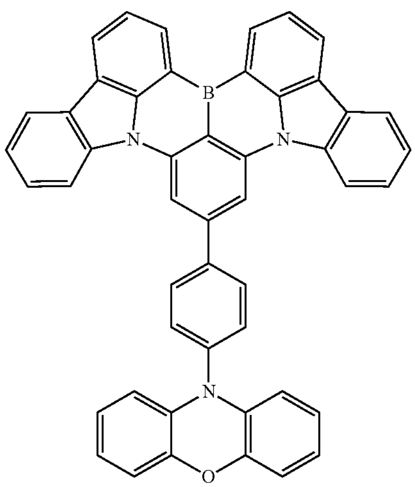
(2-1413)
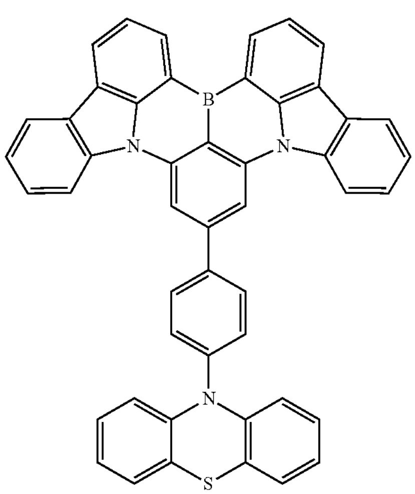
(2-1414)
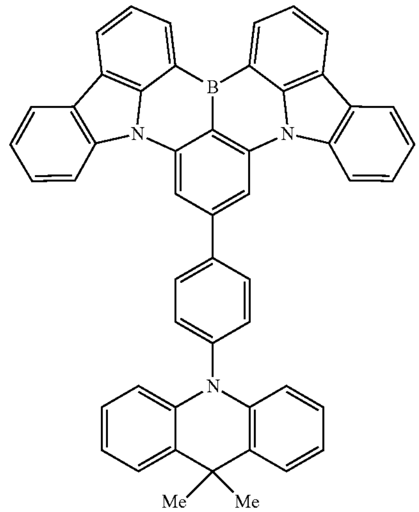
(2-1421)
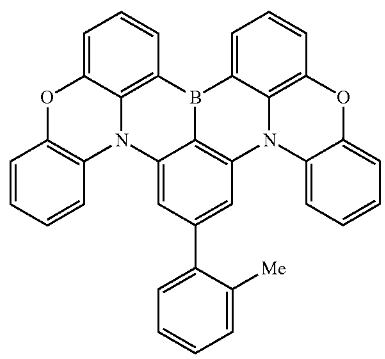
(2-1422)
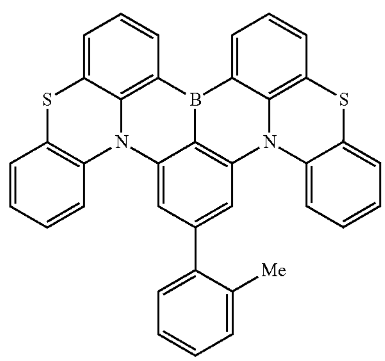
(2-1423)
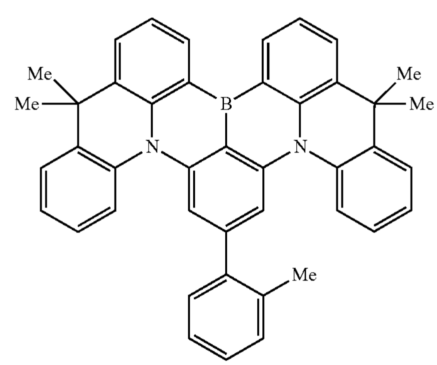

-continued
(2-1424)
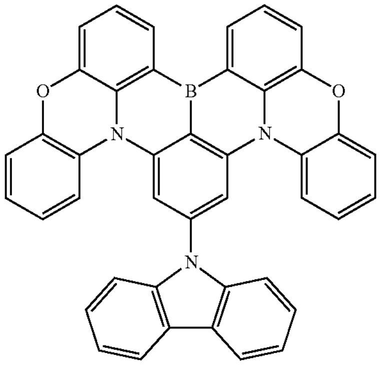
(2-1425)
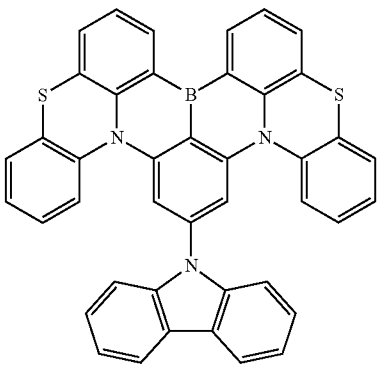
(2-1426)
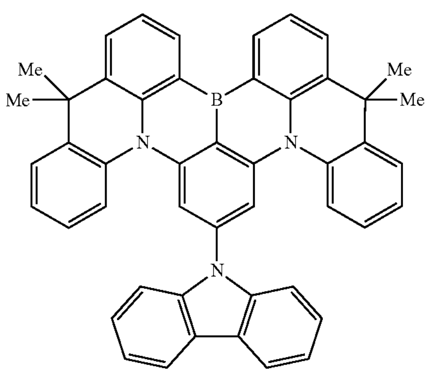
(2-1427)
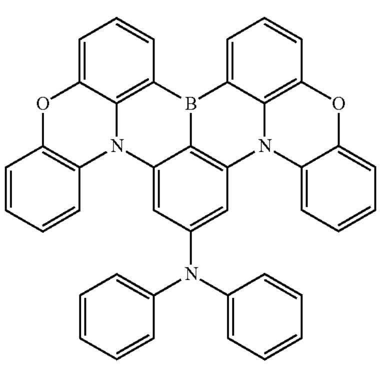
-continued
(2-1428)
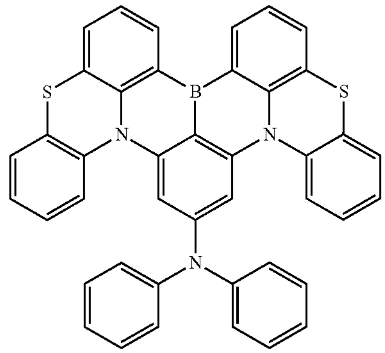
(2-1429)
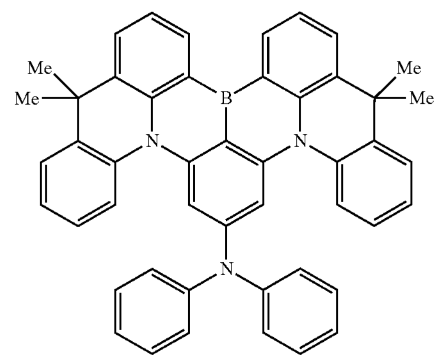
(2-1430)
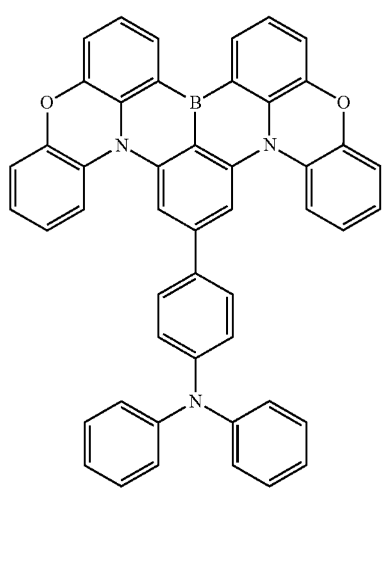

-continued
(2-1431)
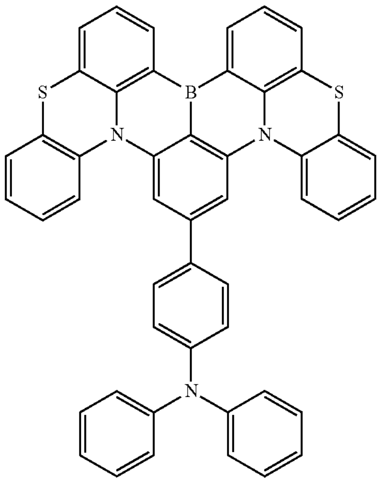
(2-1432)
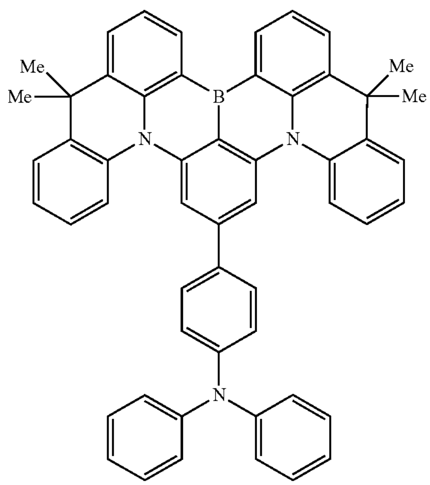
(2-1433)
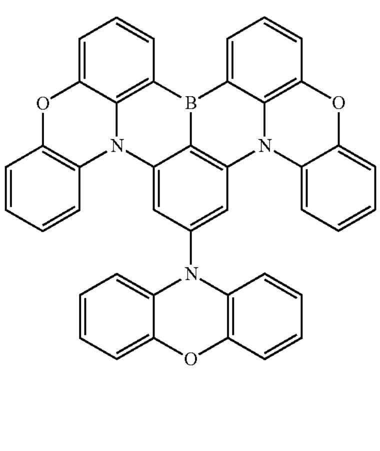
-continued
(2-1434)
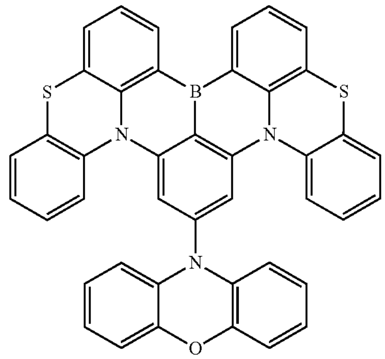
(2-1435)
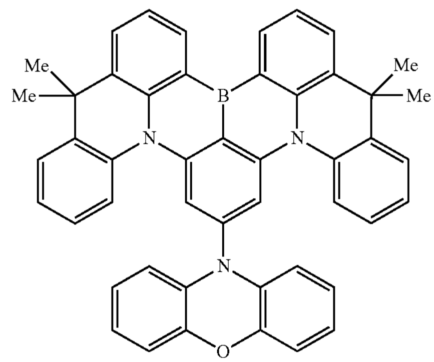
(2-1436)
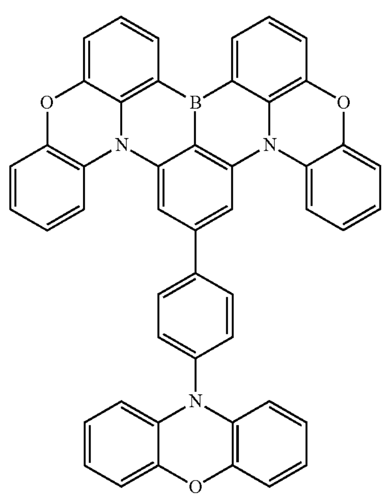

-continued
(2-1437)
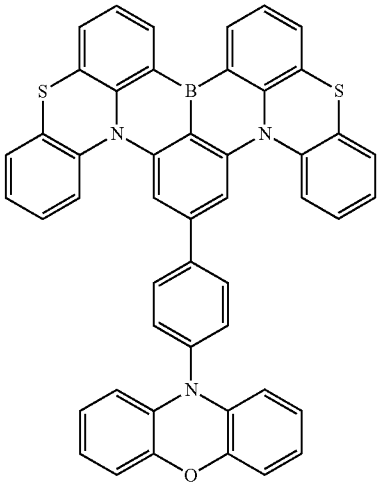
(2-1438)
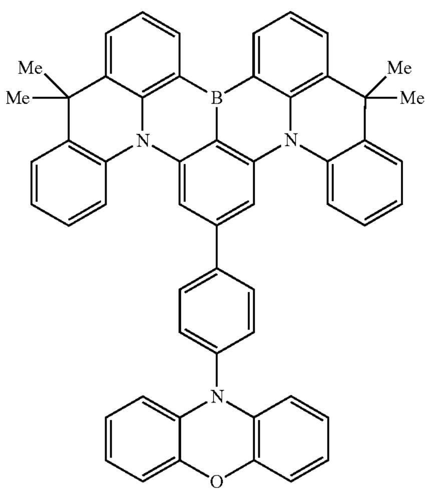
(2-1439)
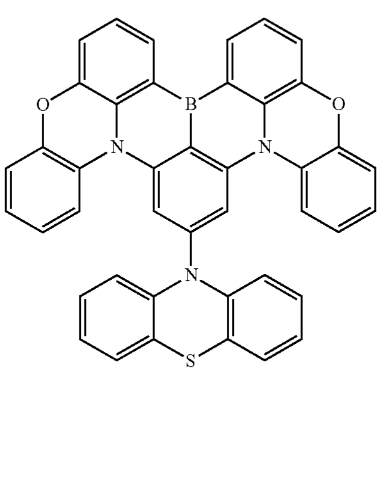
-continued
(2-1450)
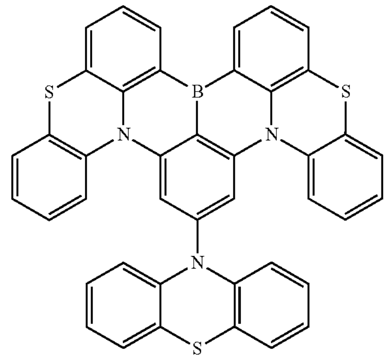
(2-1451)
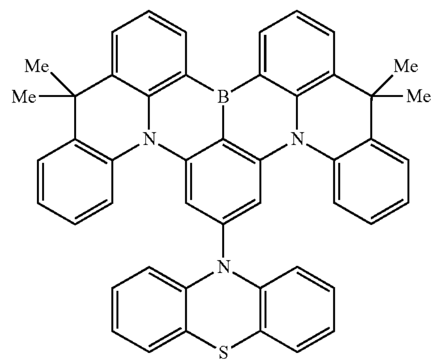
(2-1452)
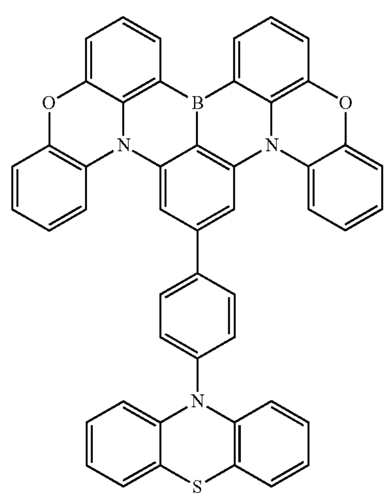

-continued
(2-1453)
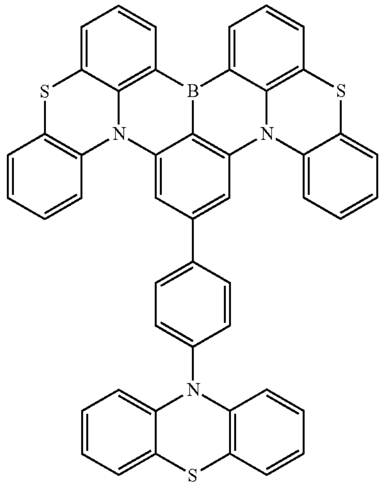
(2-1454)
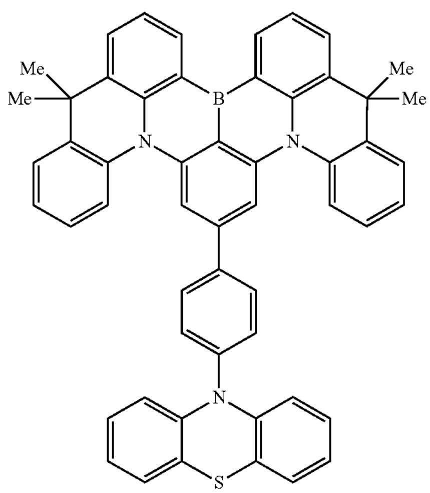
(2-1455)
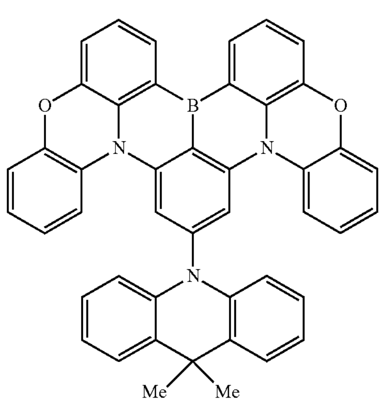
-continued
(2-1456)
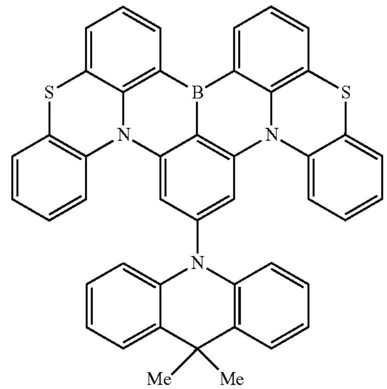
(2-1457)
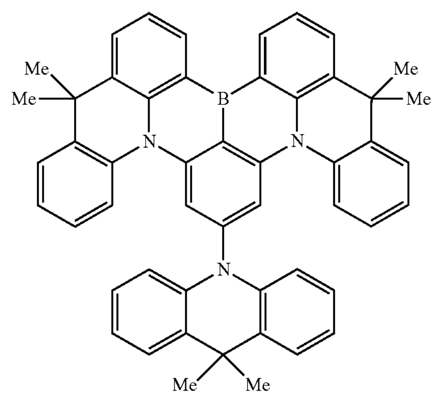
(2-1458)
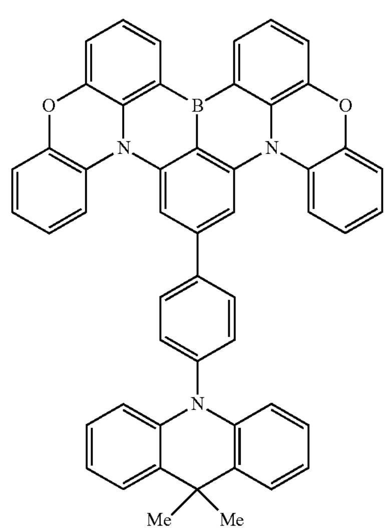

-continued
(2-1459)
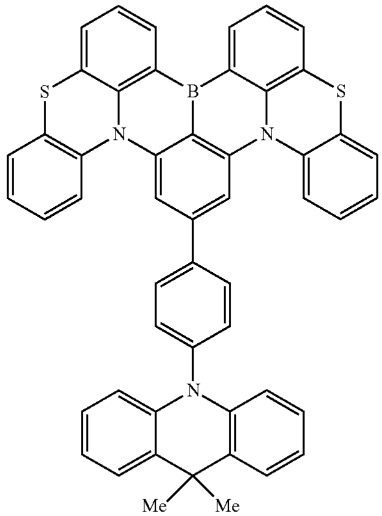
(2-1460)
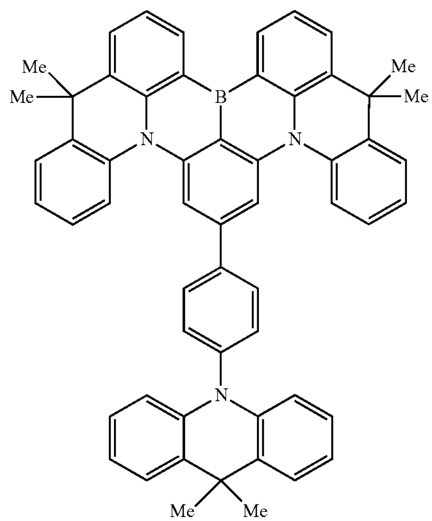
(2-471)
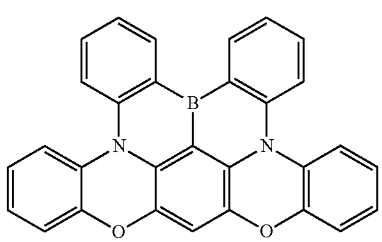
(2-472)
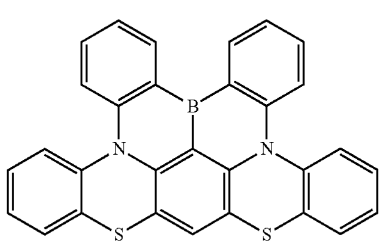
-continued
(2-473)
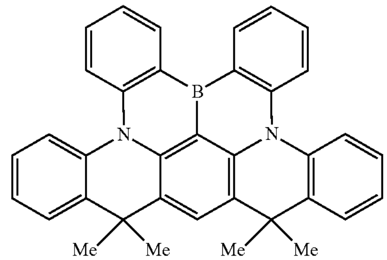
(2-474)
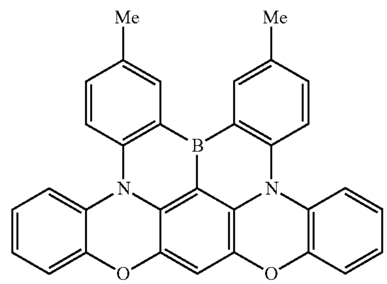
(2-475)
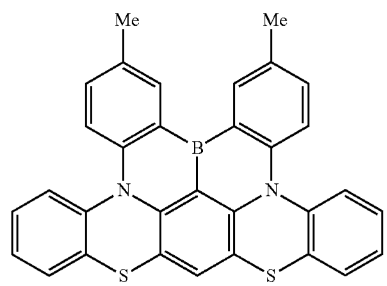
(2-476)
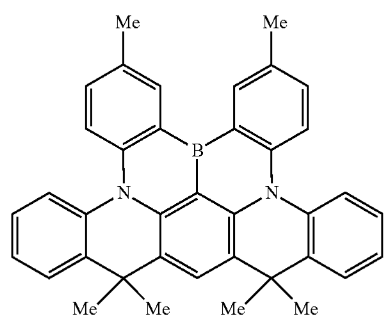
(2-477)
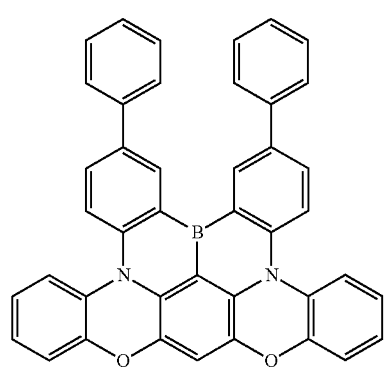

-continued
(2-478)
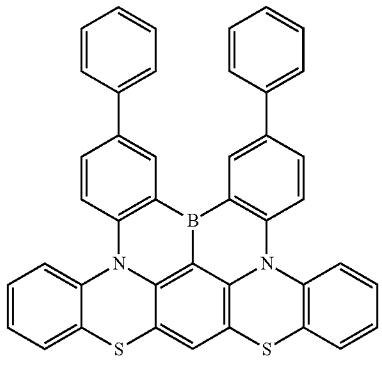
(2-479)
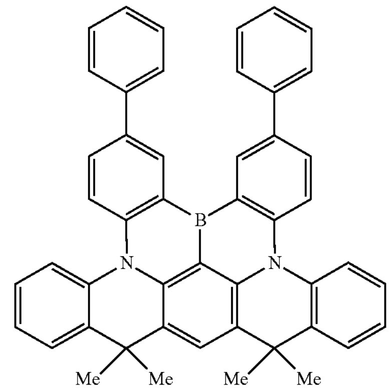
(2-1151)
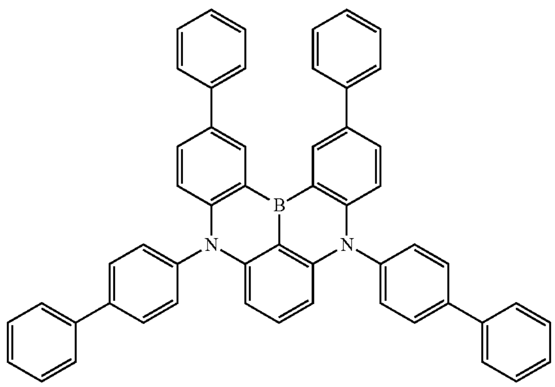
(2-1152)
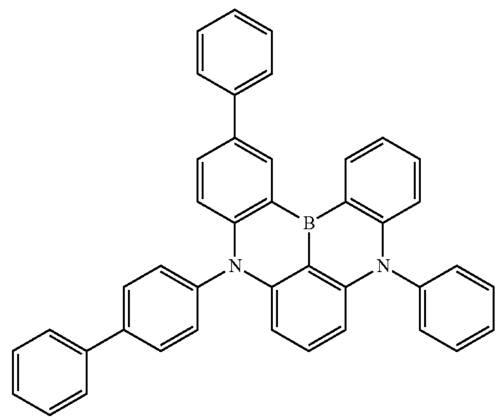
(2-1153)
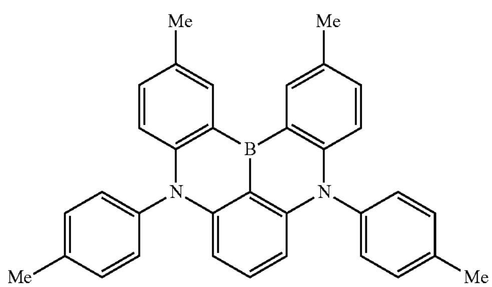
(2-1154)
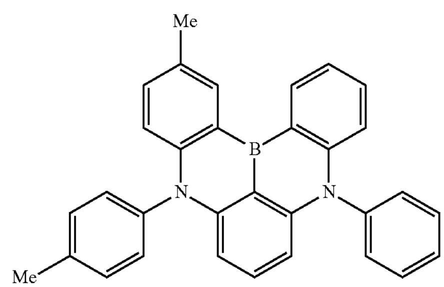
(2-1155)
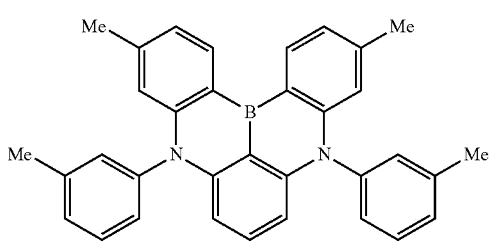
(2-1156)
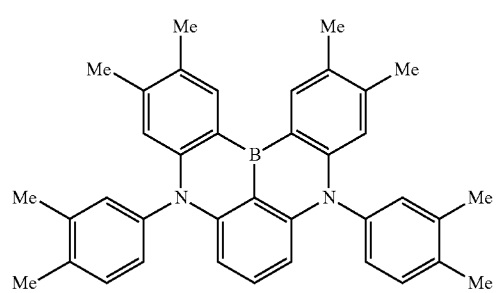

-continued
(2-1157)
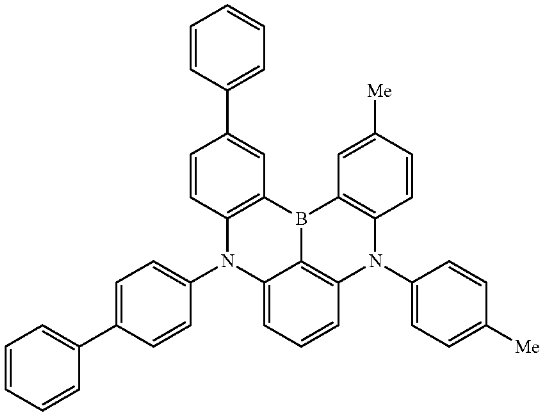
(2-1158)
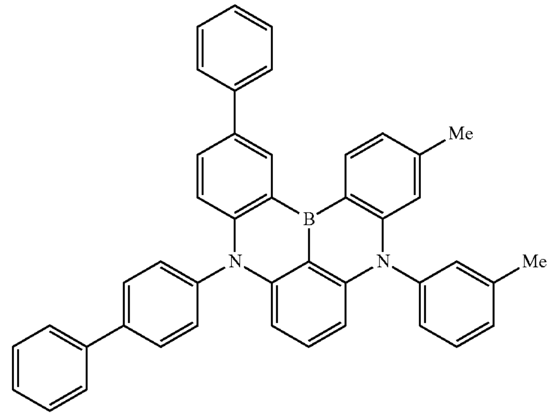
(2-1159)
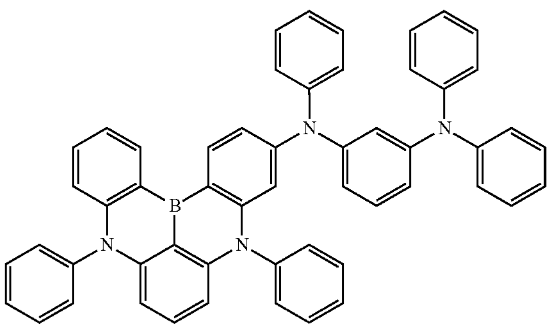
(2-2619)
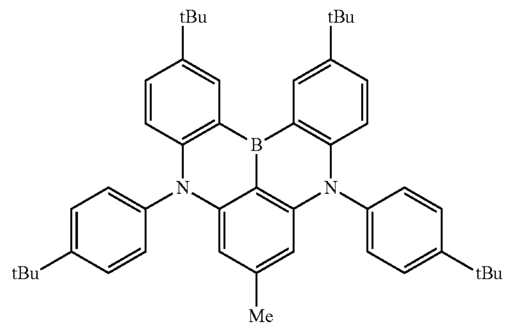
(2-2620)
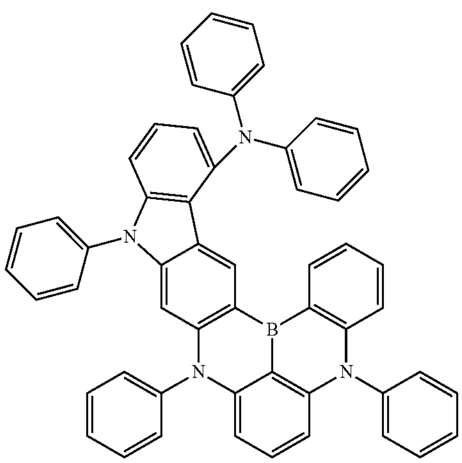
(2-2621)
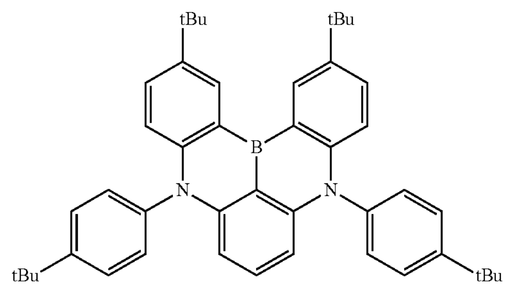
(2-2622)
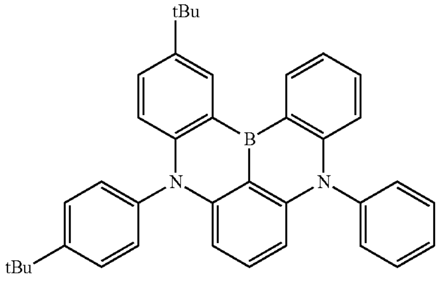
(2-2623)
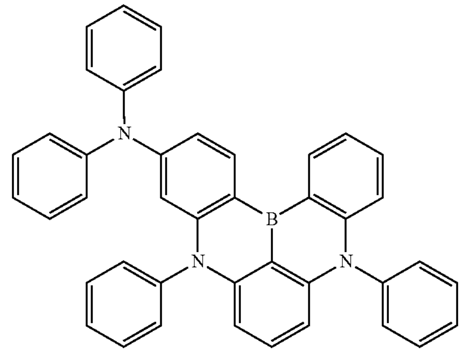

-continued
(2-2624)
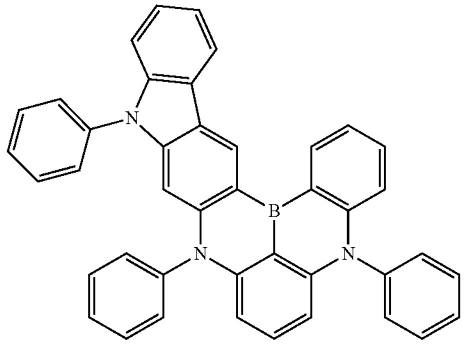
(2-2625)
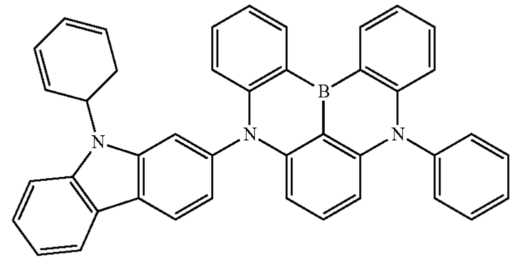
(2-2626)
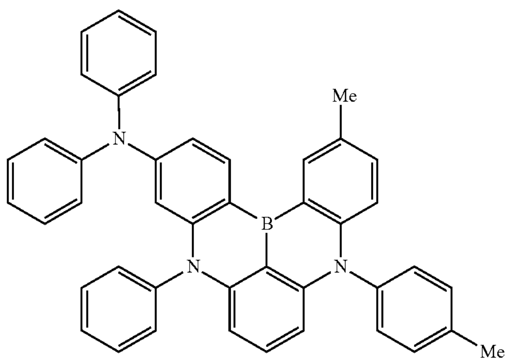
(2-2627)
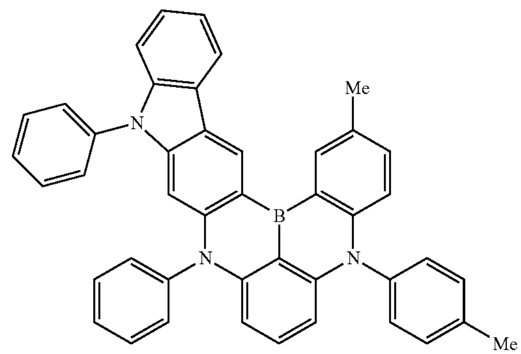
(2-2628)
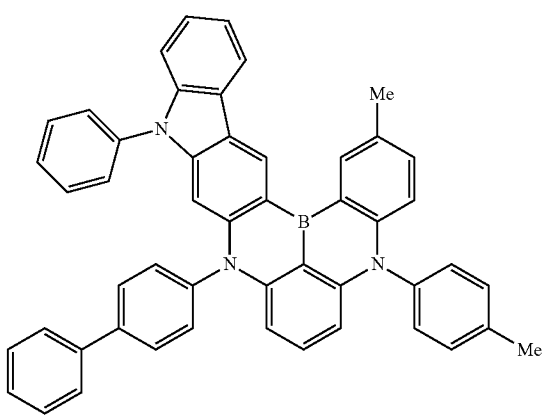
(2-2629)
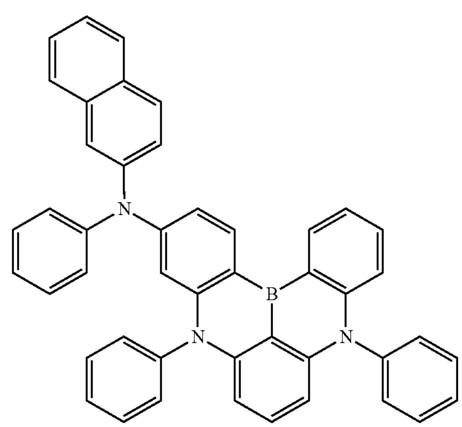
(2-2630)
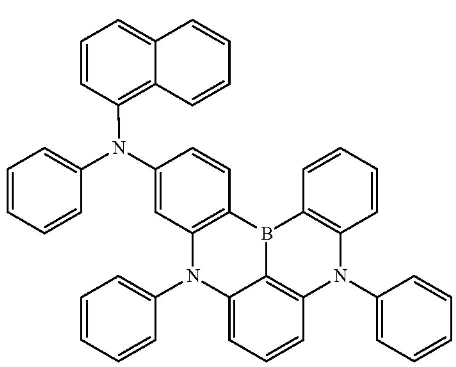
(2-2631)
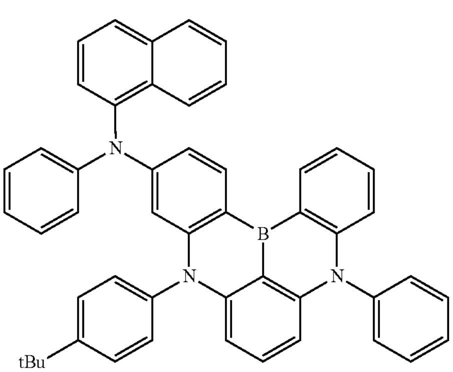

-continued
(2-2632)
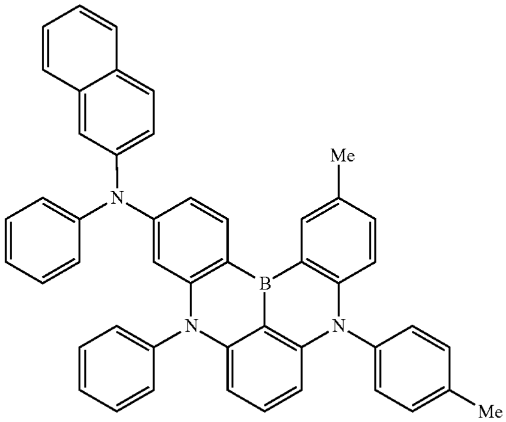
(2-2633)
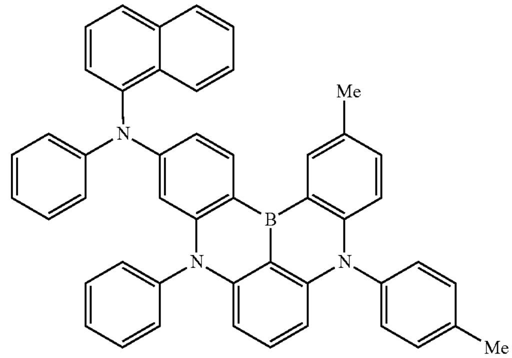
(2-2634)
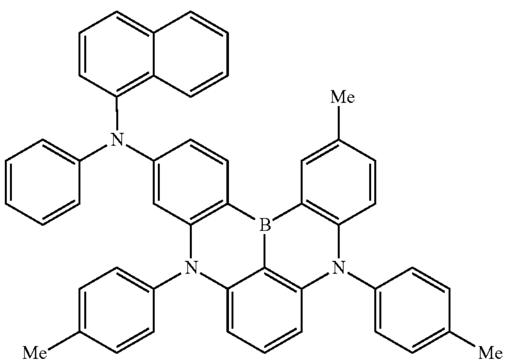
(2-2635)
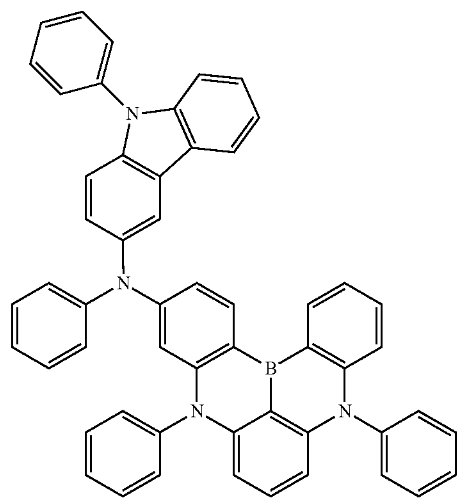
(2-2636)
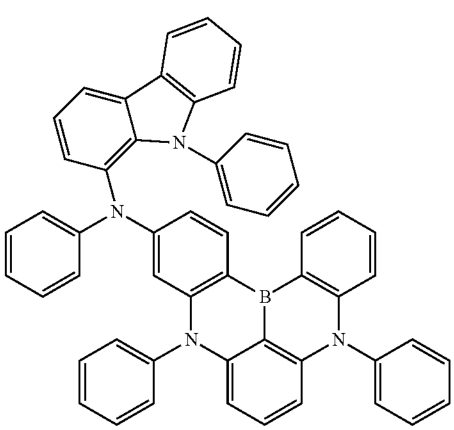
(2-2637)
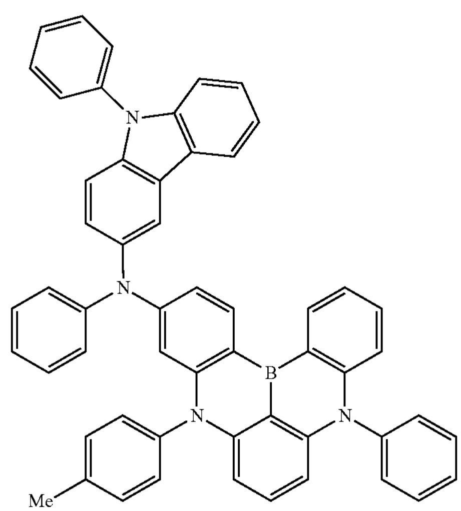

-continued
(2-2638)
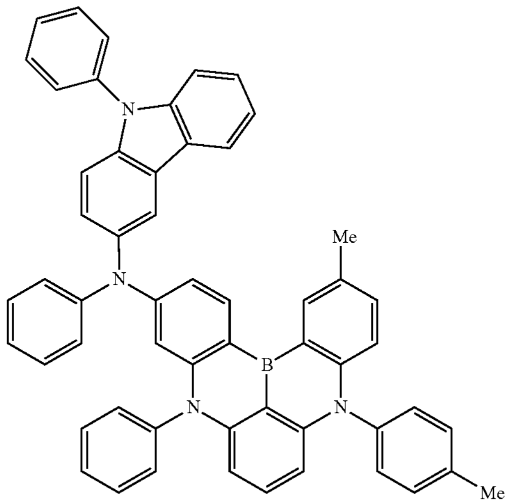
(2-2639)
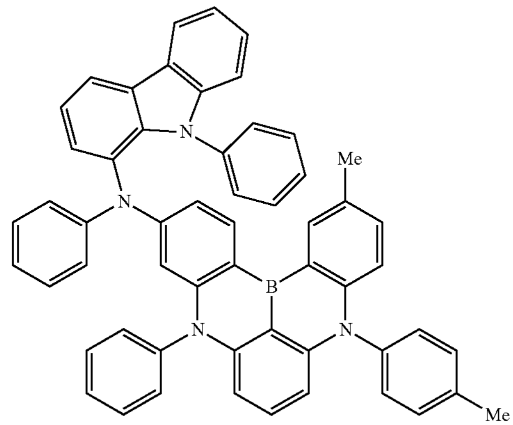
(2-2640)
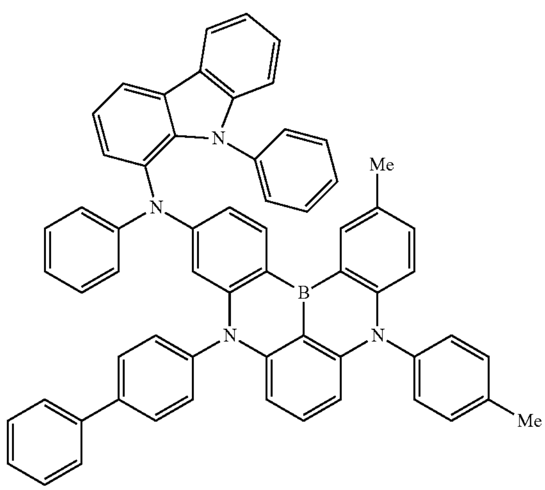
(2-2641)
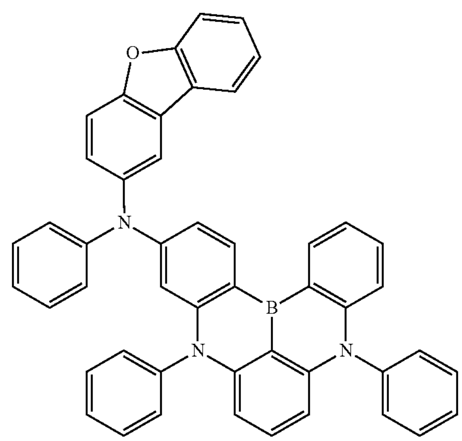
(2-2642)
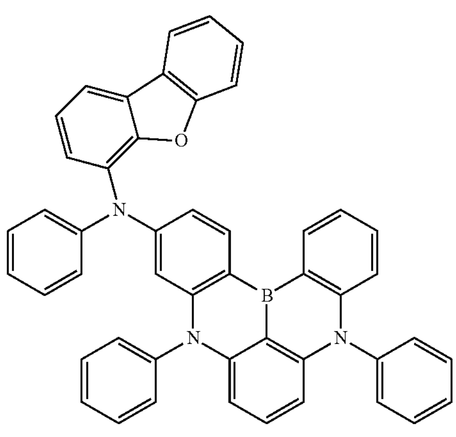
(2-2643)
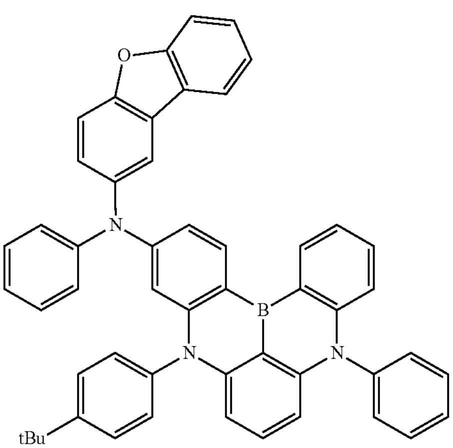

-continued
(2-2644)
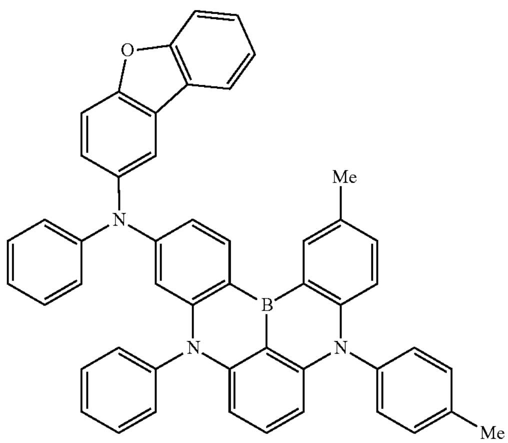
(2-2645)
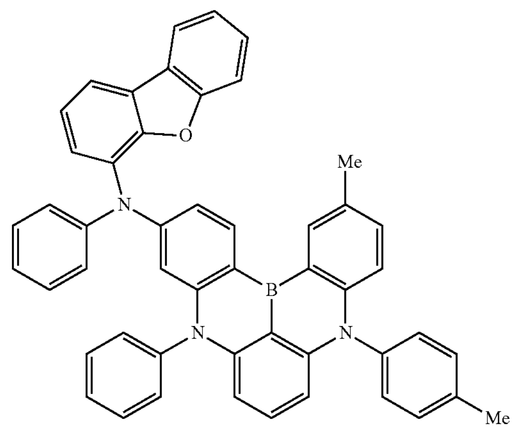
(2-2646)
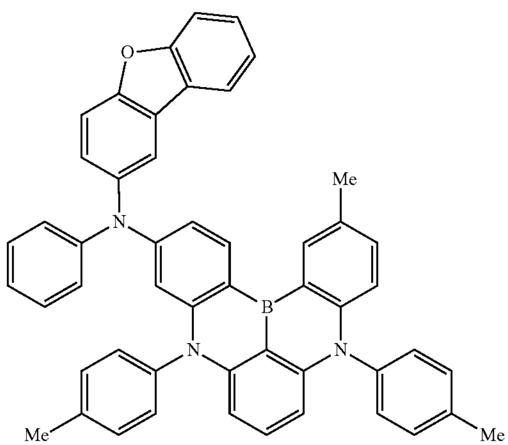
(2-2647)
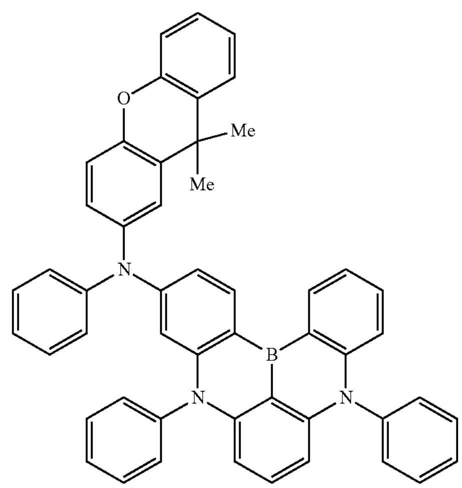
(2-2648)
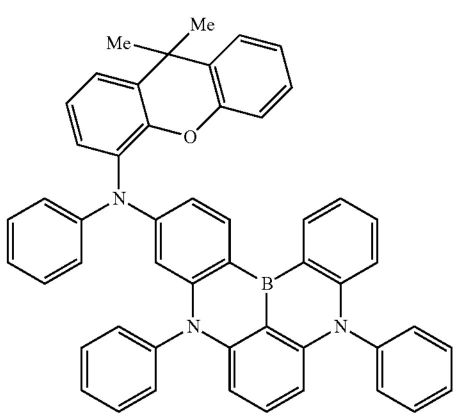
(2-2649)
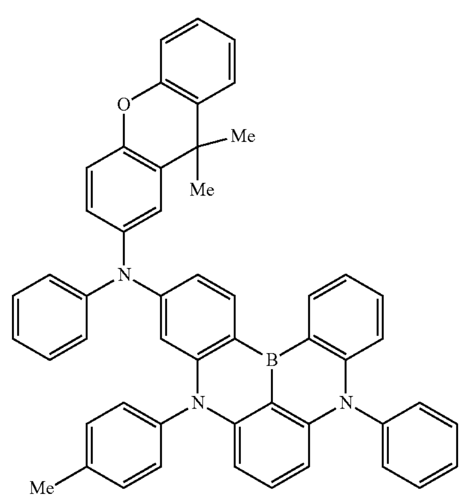

-continued
(2-2650)
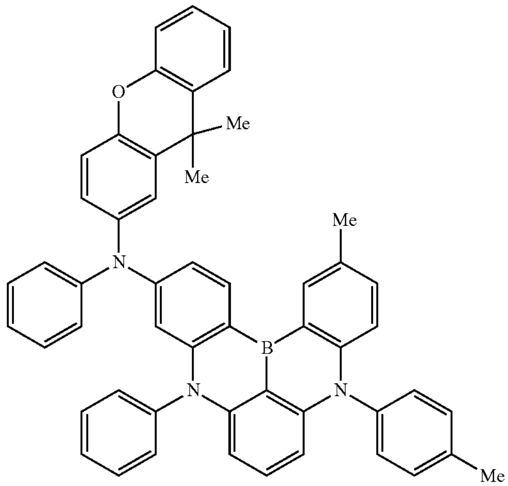
(2-2651)
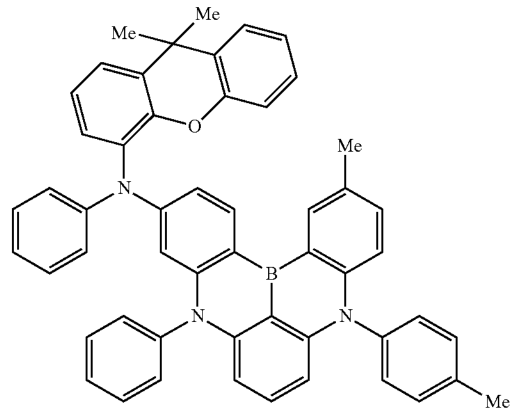
(2-2652)
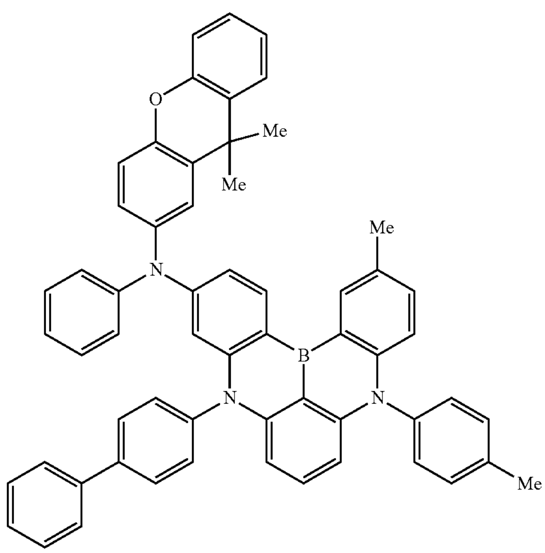
(2-2653)
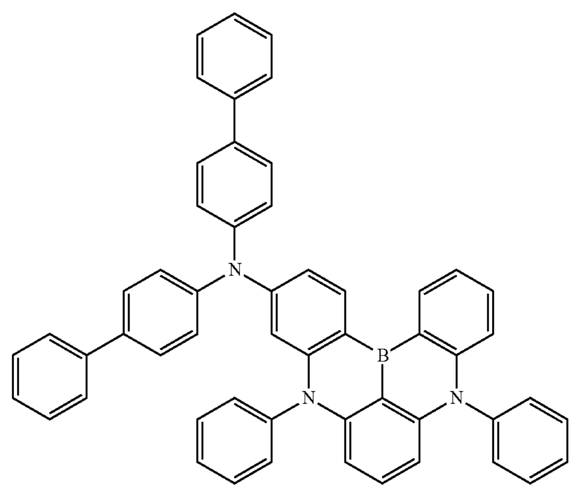
(2-2654)
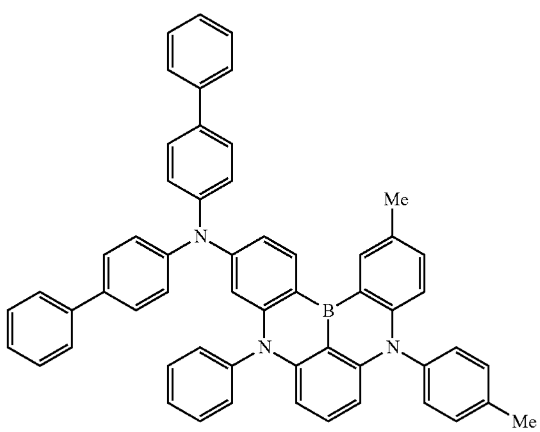
(2-2655)
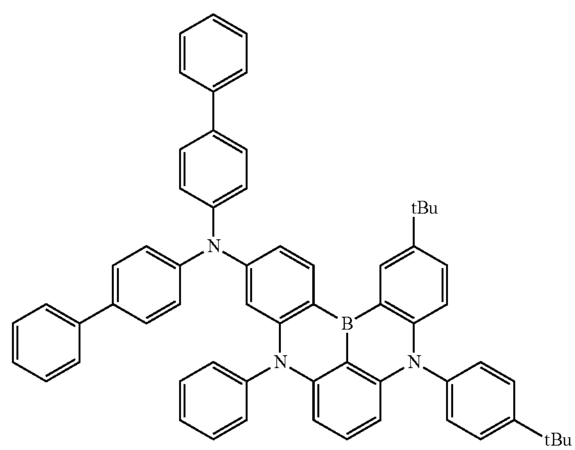

-continued
(2-2656)
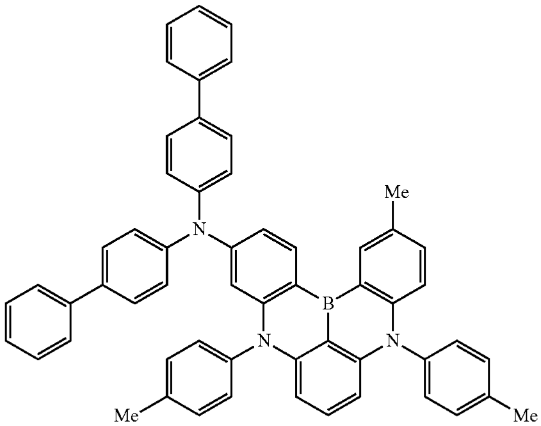
(2-2657)
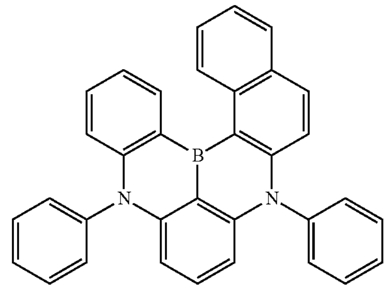
(2-2658)
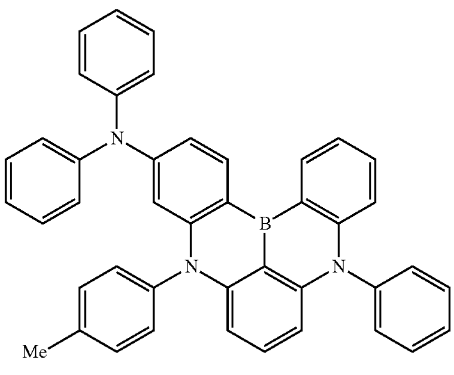
(2-2659)
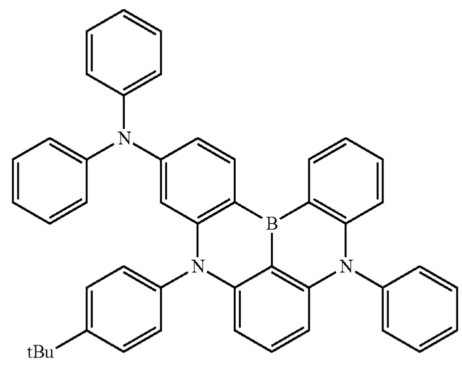
(2-2660)
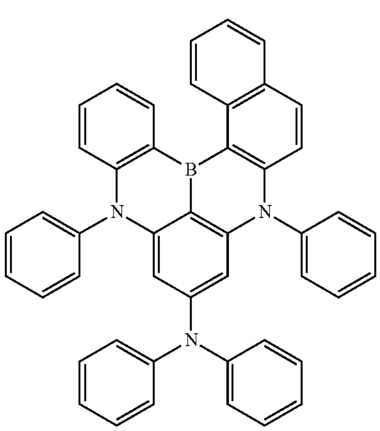
(2-2661)
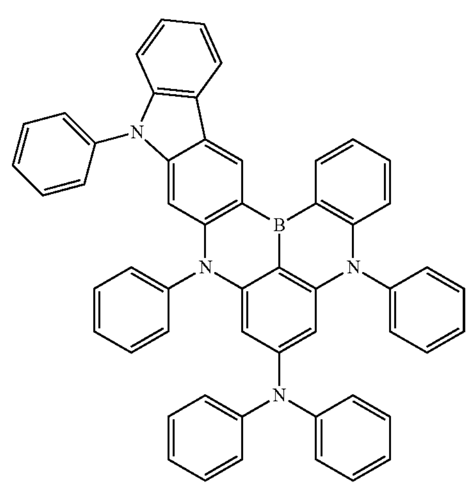

-continued
(2-2662)
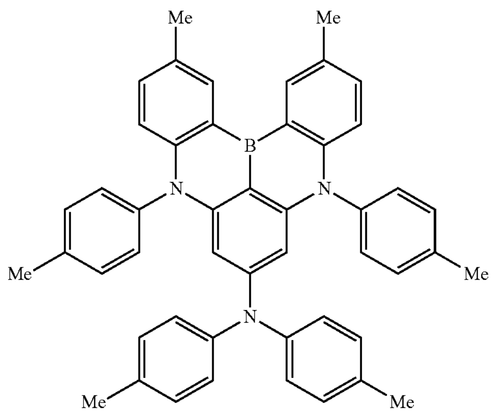
(2-2663)
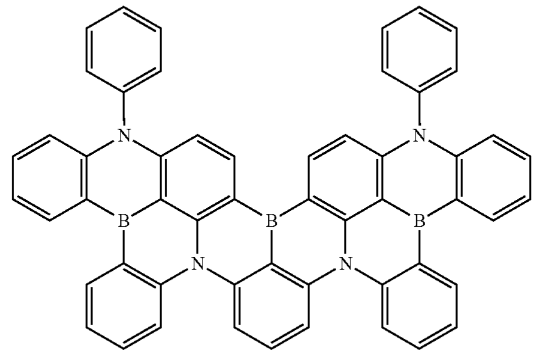
(2-2664)
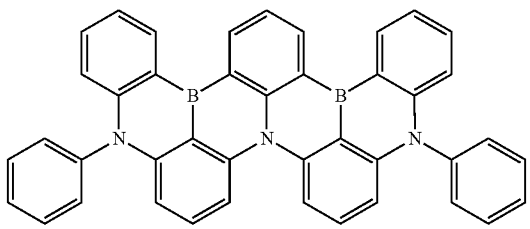
(2-2665)
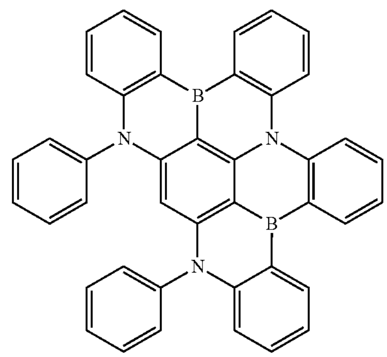
(2-2666)
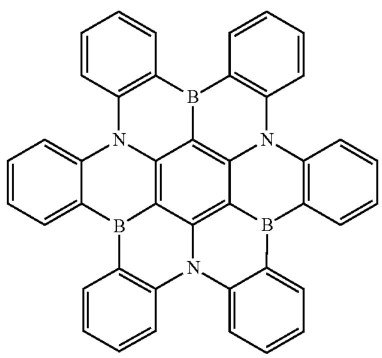
(2-2667)
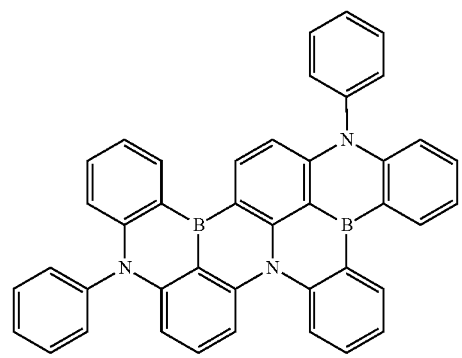
(2-2668)
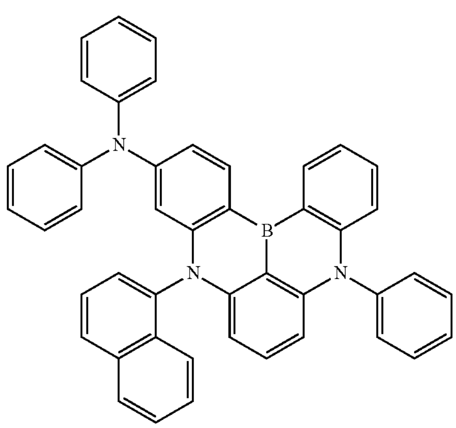
(2-2669)
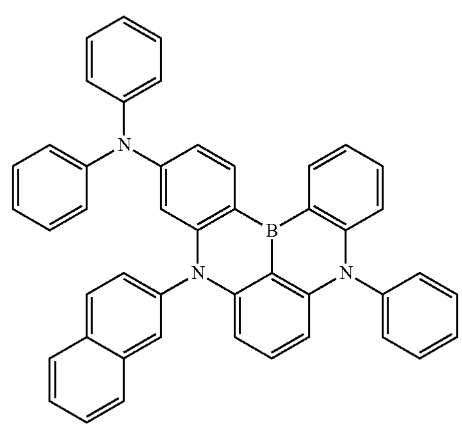

-continued
(2-2670)
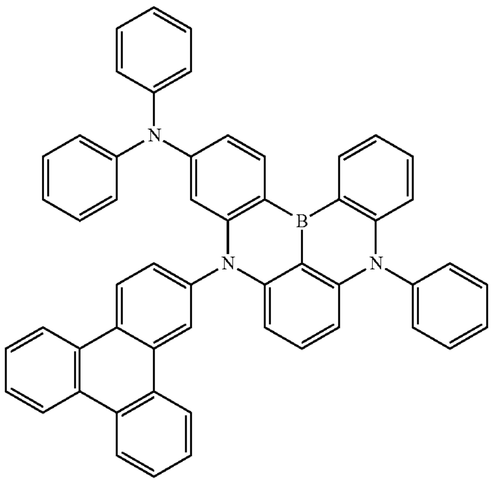
(2-2671)
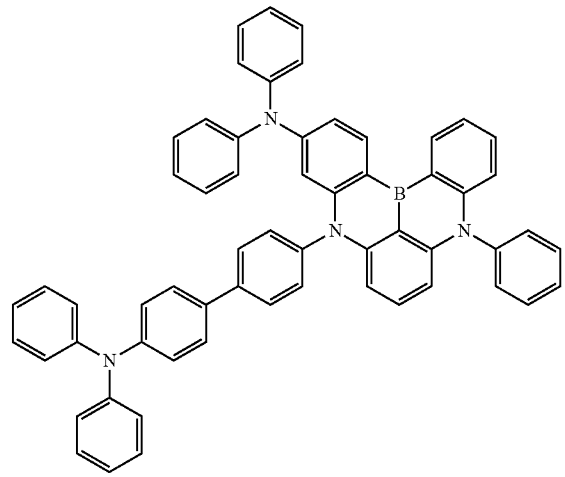
(2-2672)
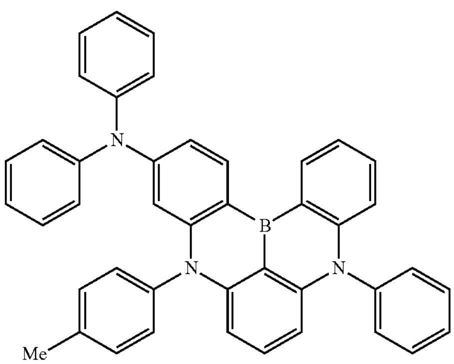
(2-2673)
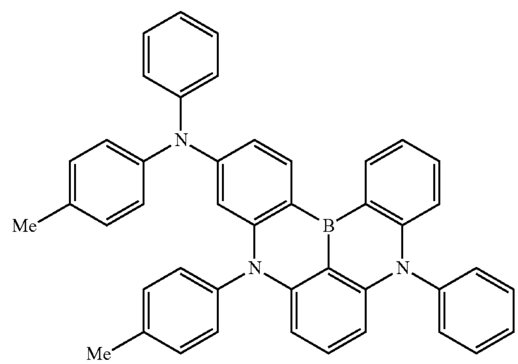
(2-2674)
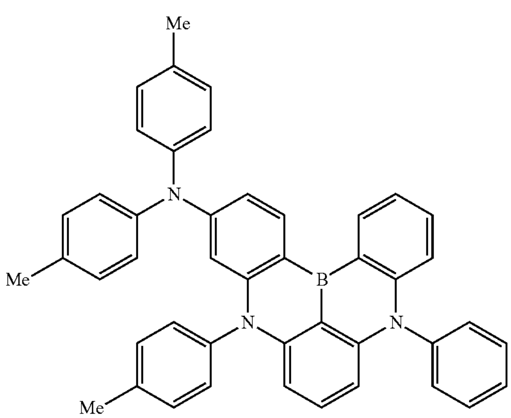
(2-2675)
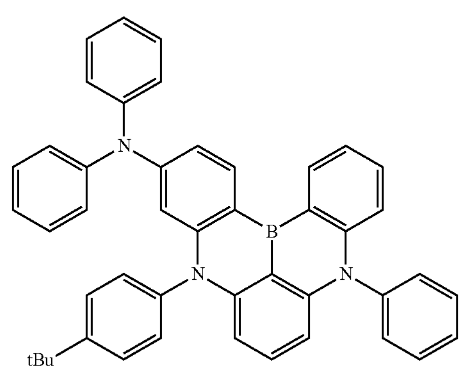

-continued
(2-2676)
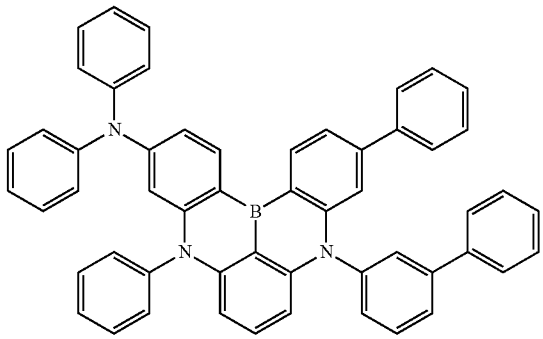
(2-2677)
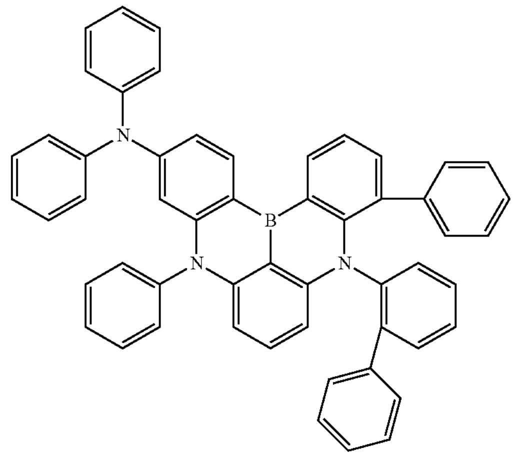
(2-2678)
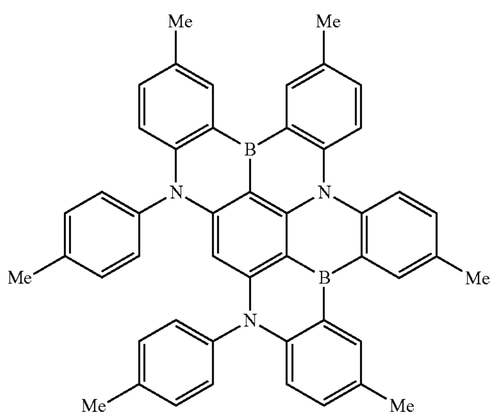
(2-2679)
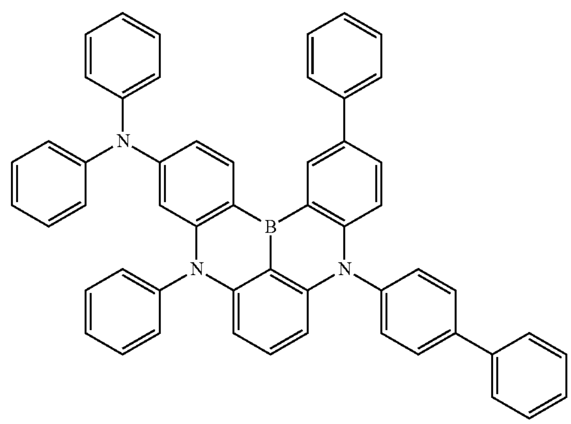
(2-2680)
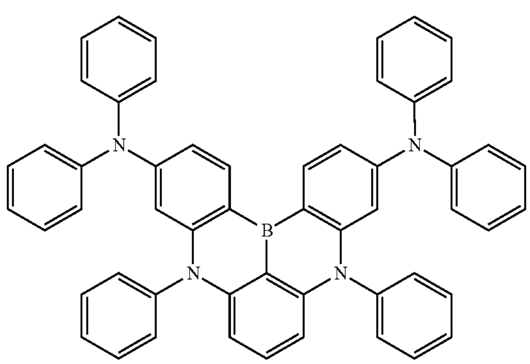
(2-2681)
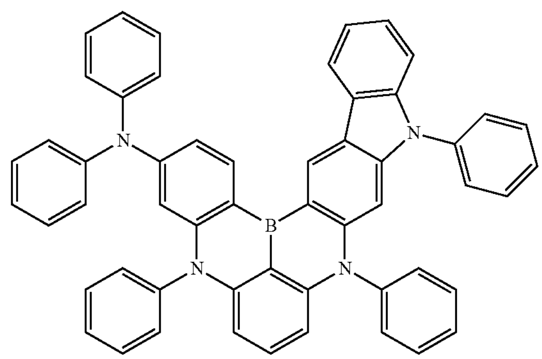

-continued
(2-2682)
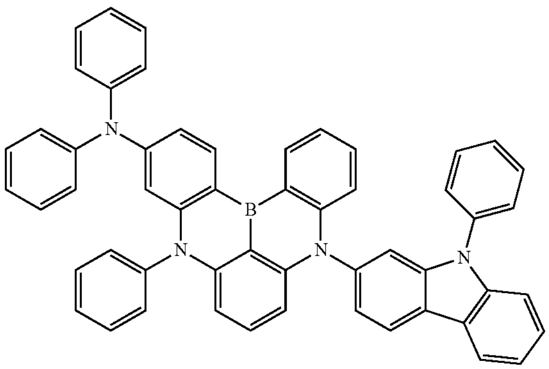
(2-2683)
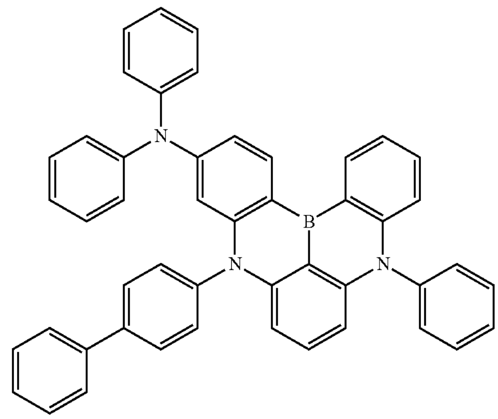
(2-2684)
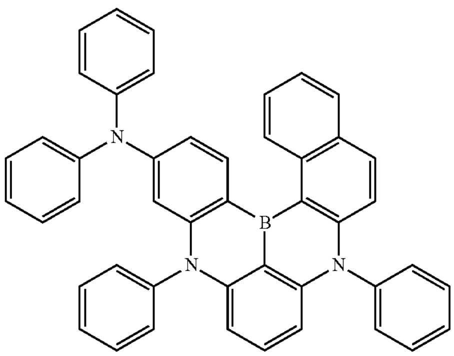
(2-2685)
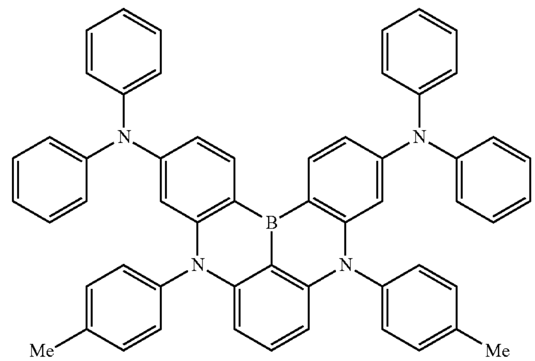
(2-2686)
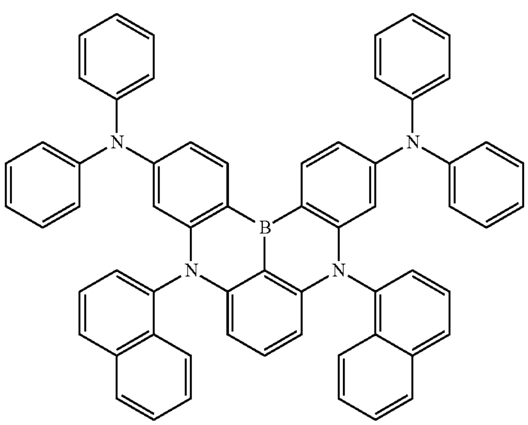
(2-2687)
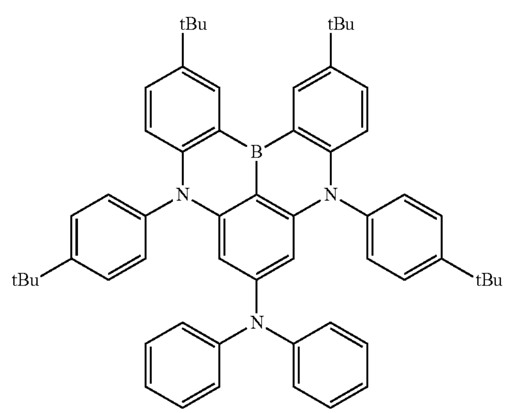
(2-2688)
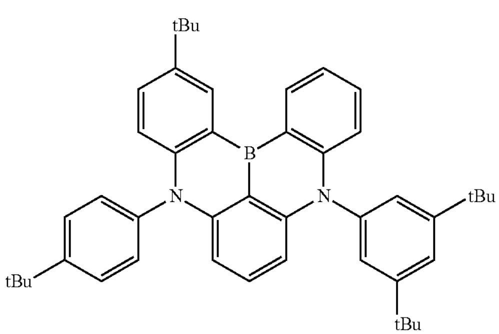
(2-2689)
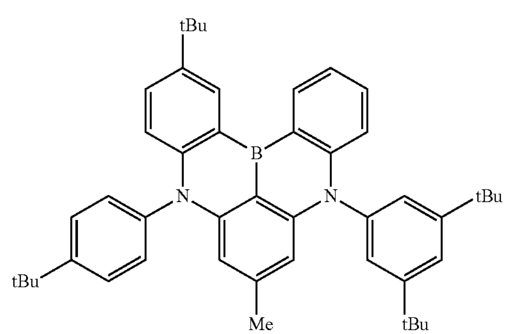

-continued
(2-2691)
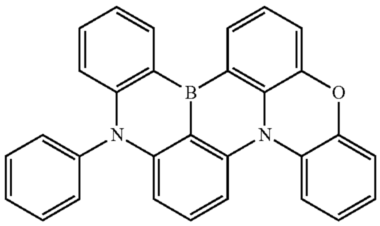
(2-2692)
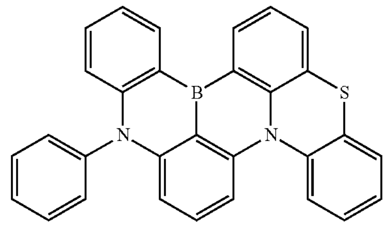
(2-2693)
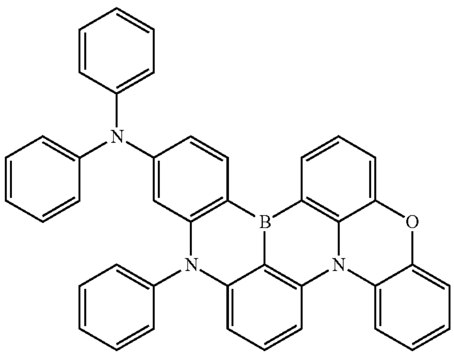
(2-2694)
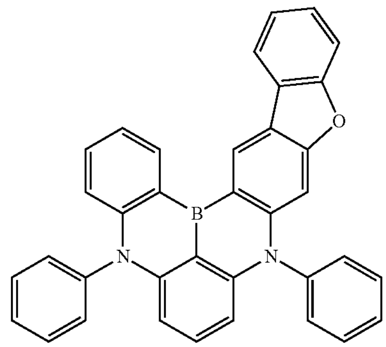
(2-2695)
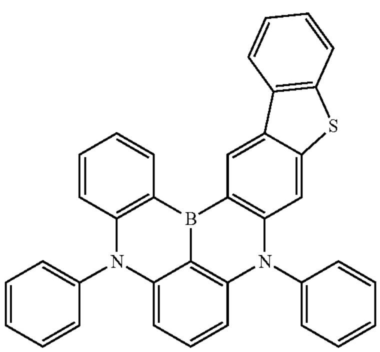
(2-2696)
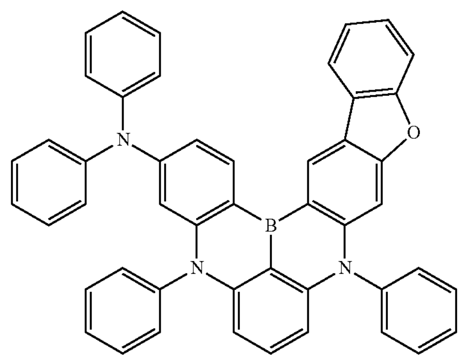
(2-2697)
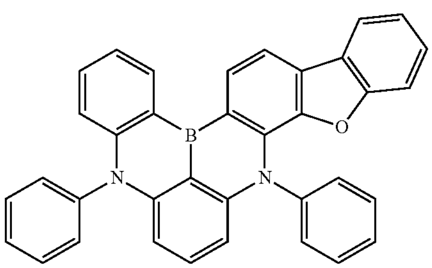
(2-2698)
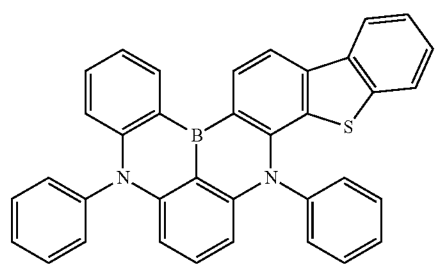
(2-2699)
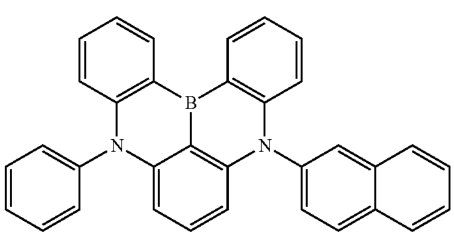
(2-2700)
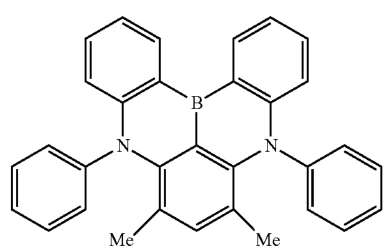

-continued
(2-2701)
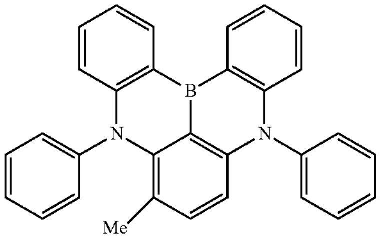
(2-2702)
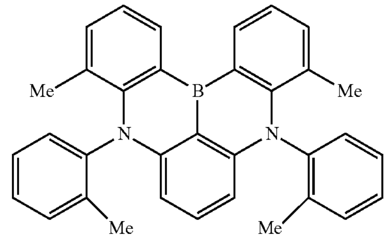
(2-2703)
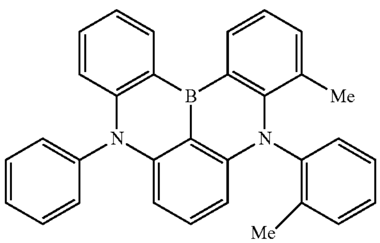
(2-2704)
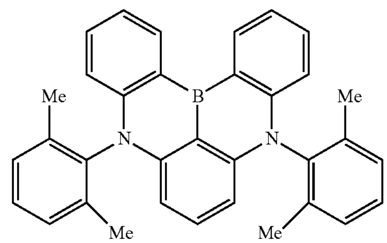
(2-2705)
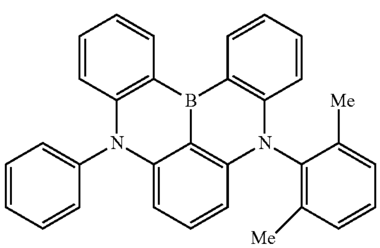
(2-2710)
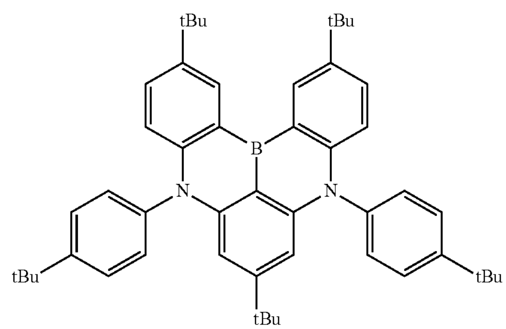
(2-2711)
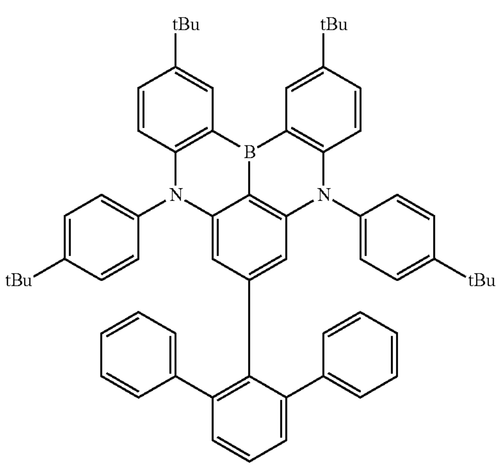
(2-2712)
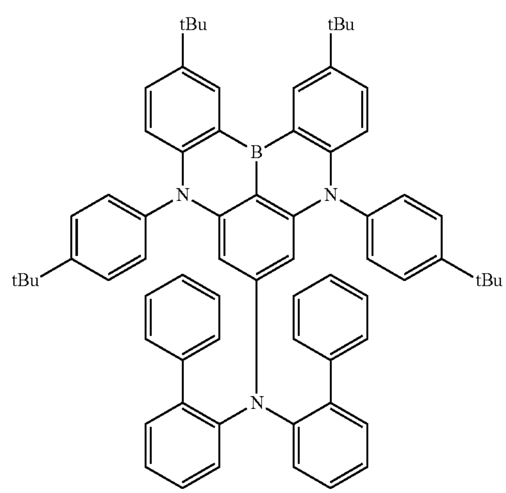

-continued
(2-2713)
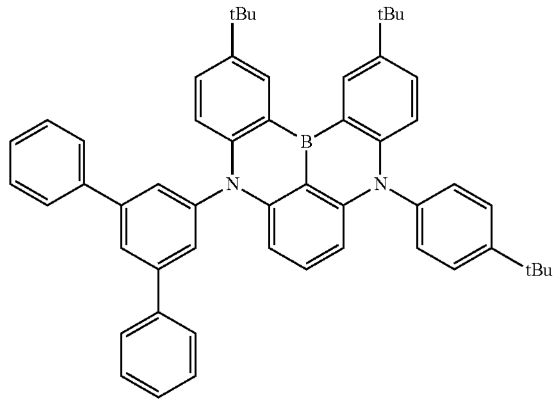
(2-2714)
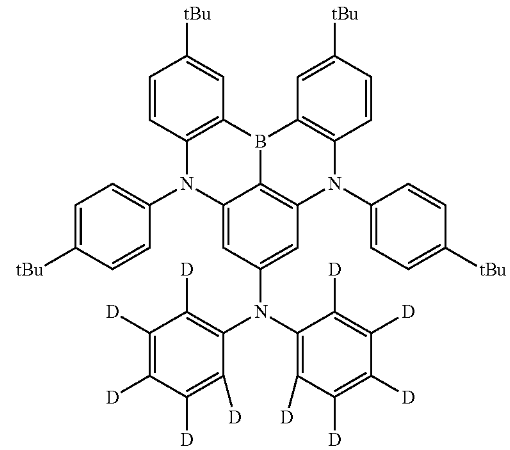
(2-2721)
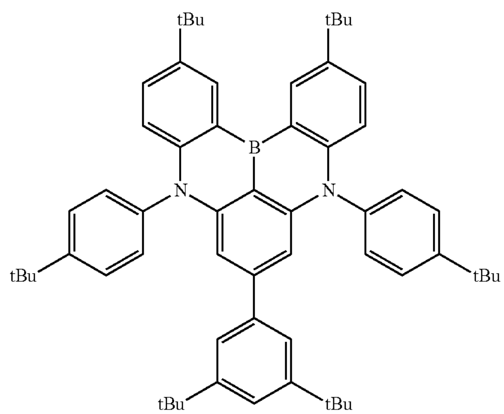
(2-2722)
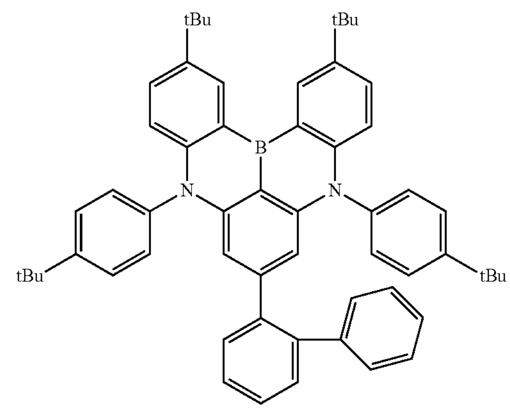
(2-2723)
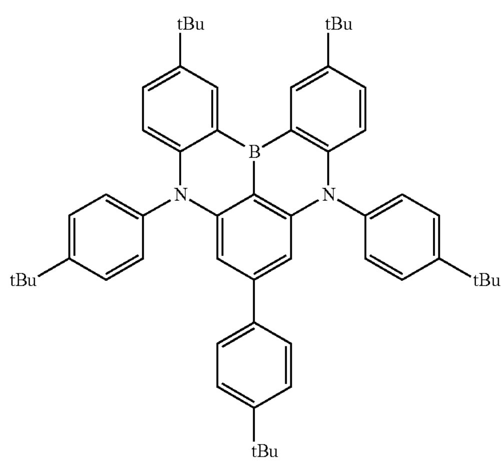
(2-2724)
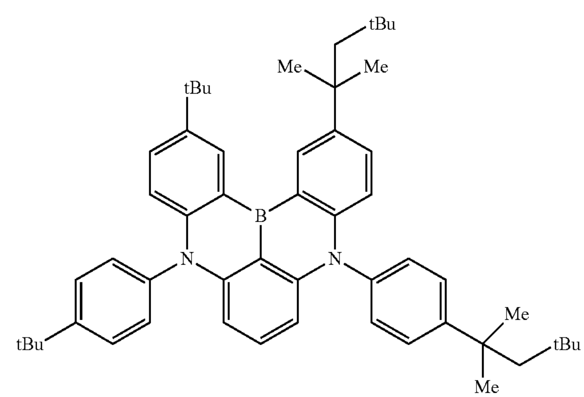

-continued
(2-2725)
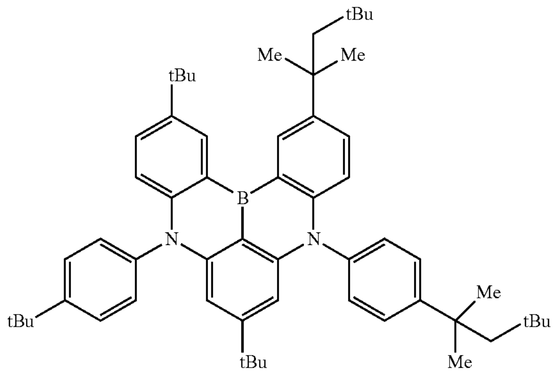
(2-2726)
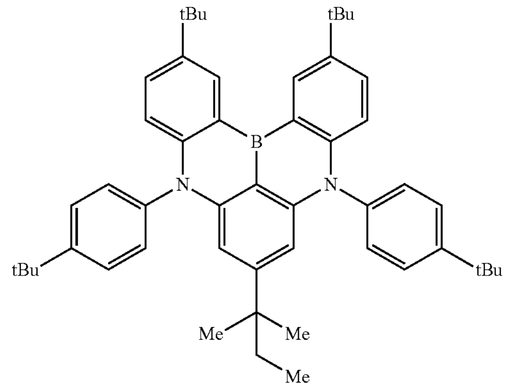
(2-2727)
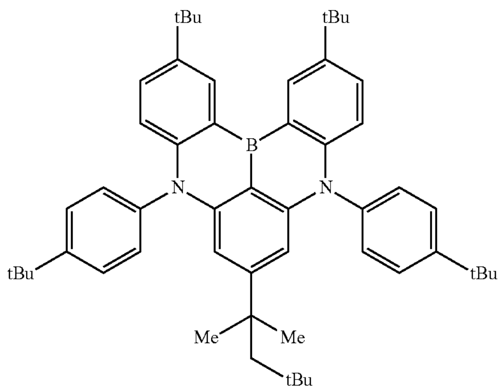
(2-2728)
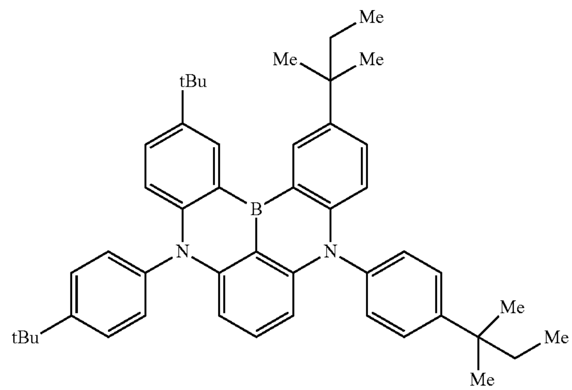
(2-2729)
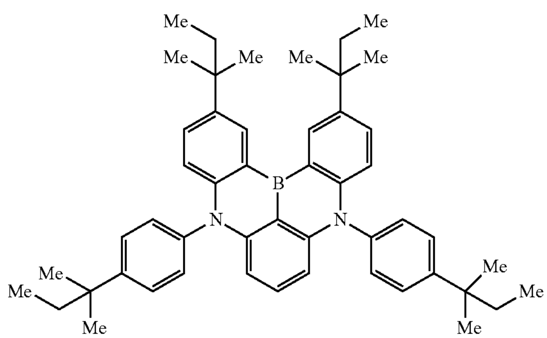
(2-2730)
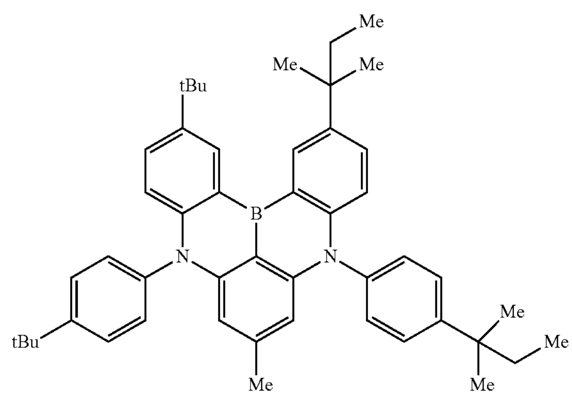
(2-2731)
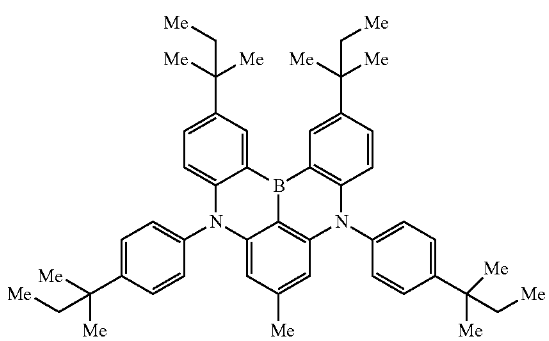
(2-2732)
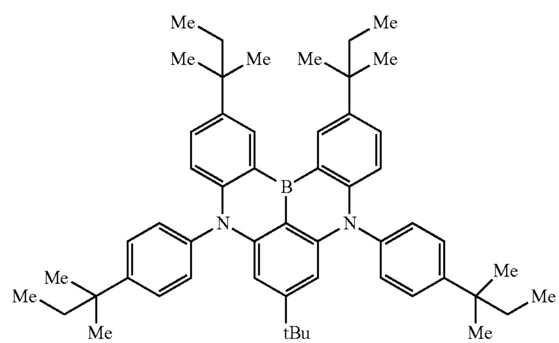

-continued
(2-2733)
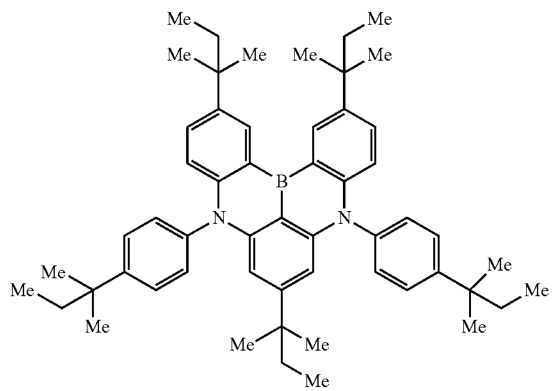
(2-2741)
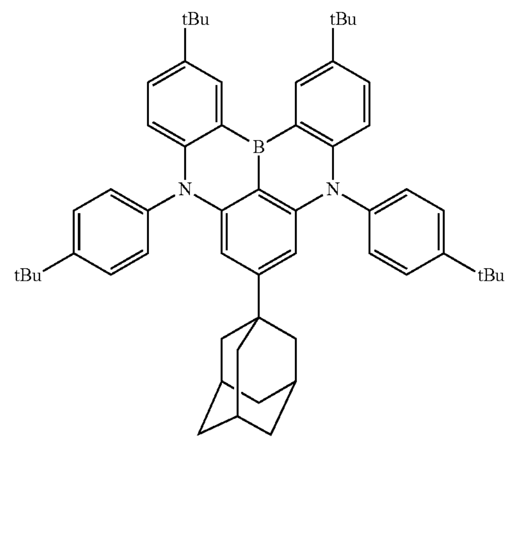
(2-2742)
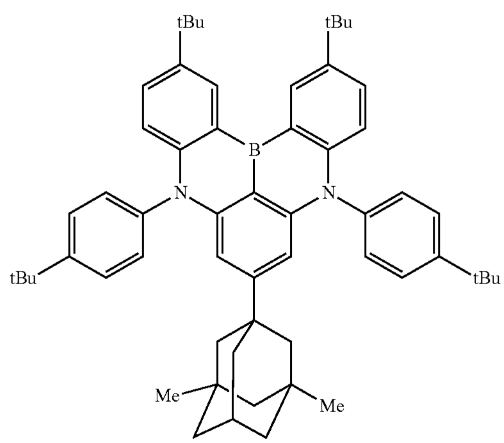
(2-2743)
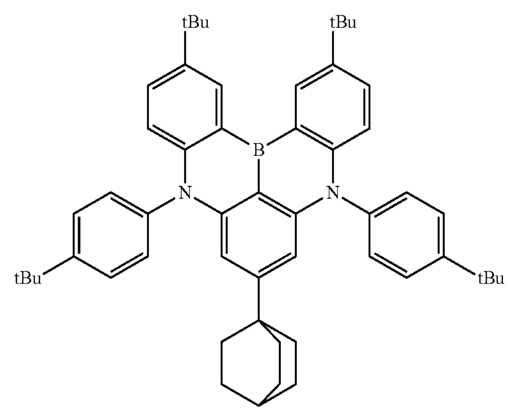
(2-2744)
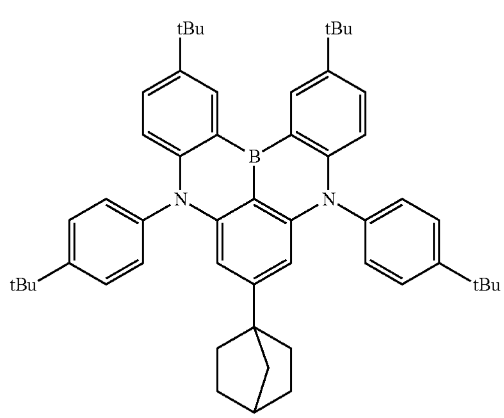
(2-2745)
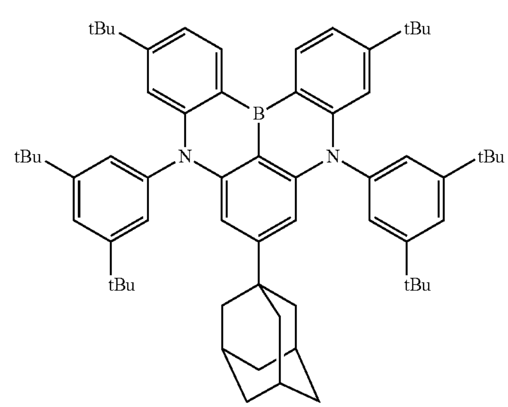

-continued
(2-5001)
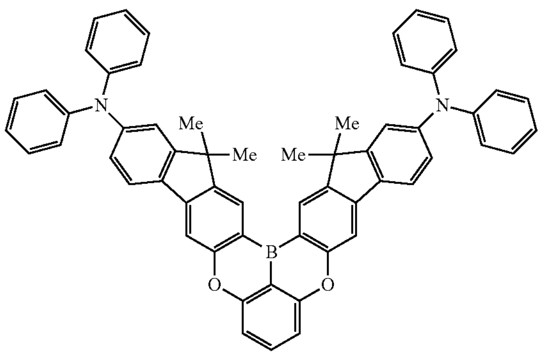
(2-5002)
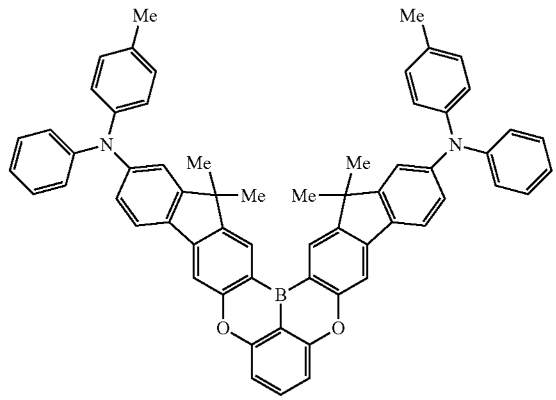
(2-5003)
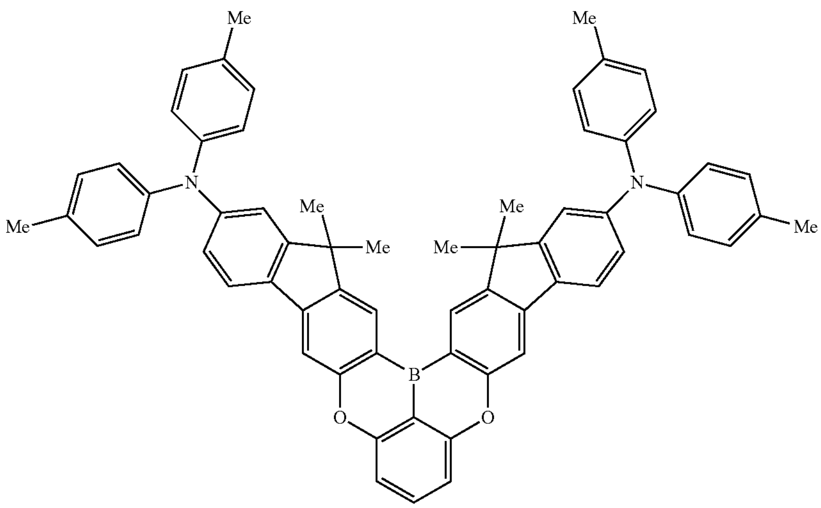
(2-5004)
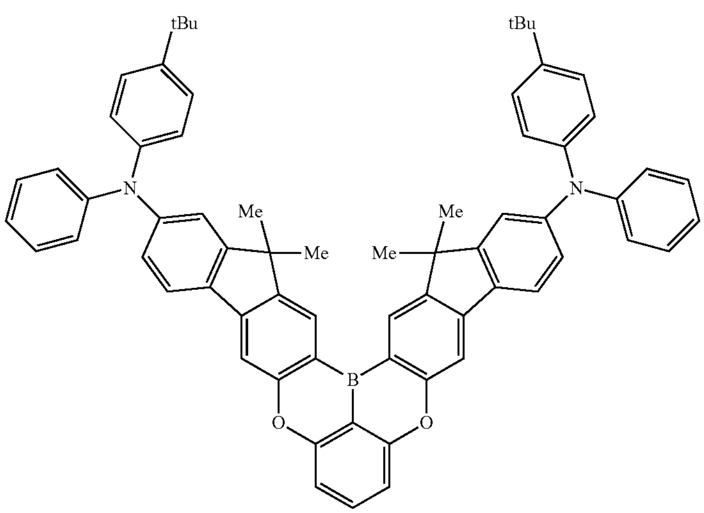

-continued
(2-5005)
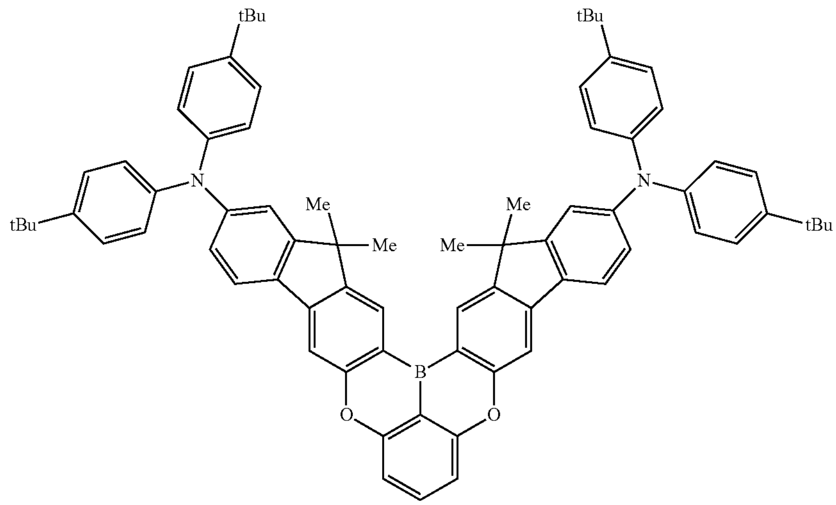
(2-5006)
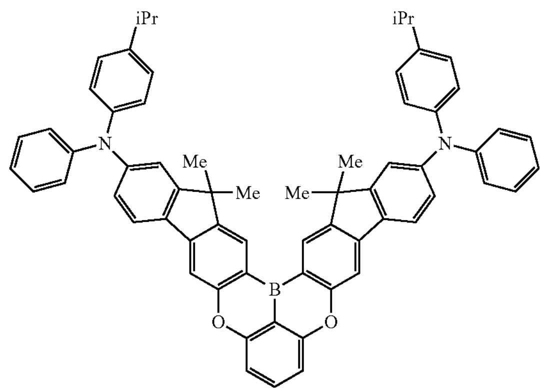
(2-5007)
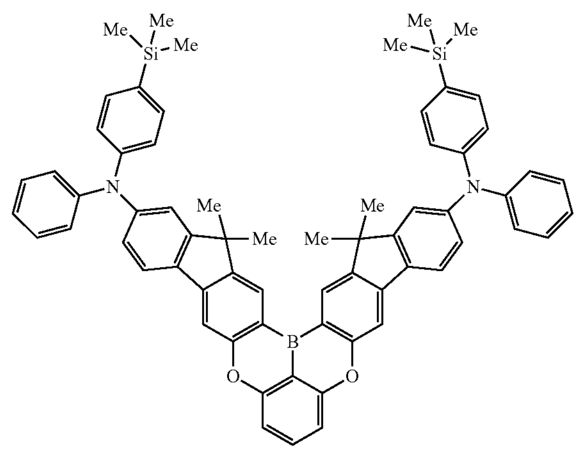
(2-5008)
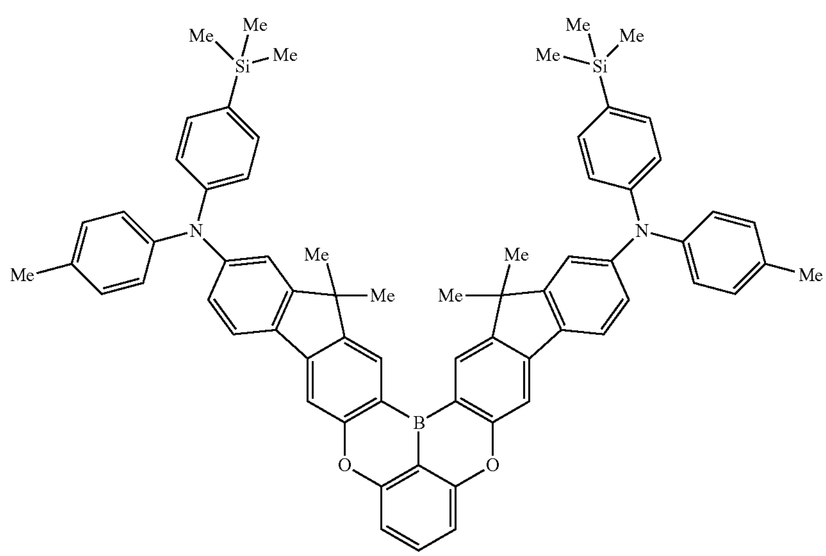

-continued
(2-5009)
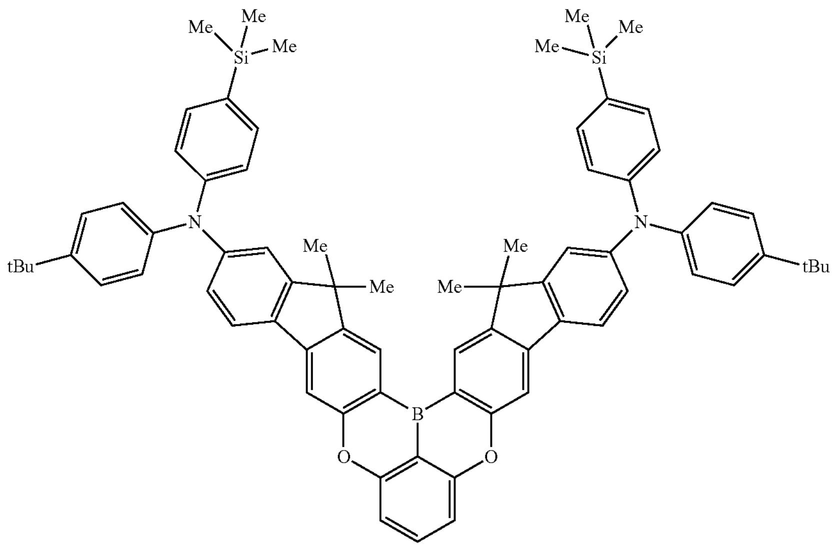
(2-5010)
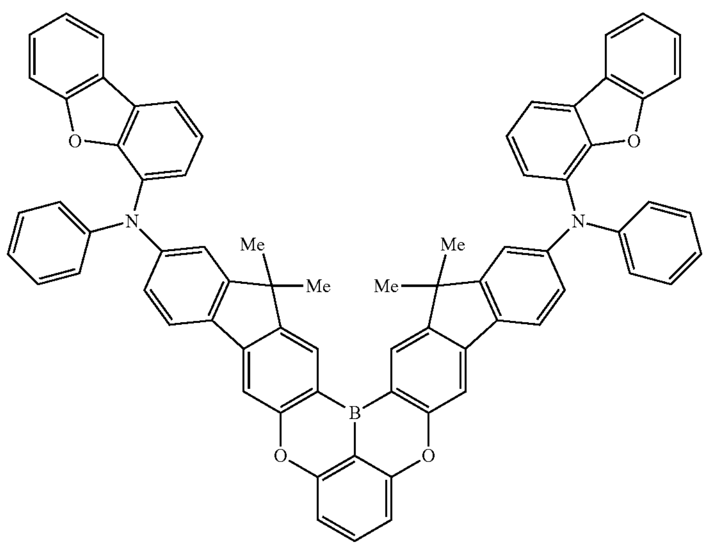
(2-5011)
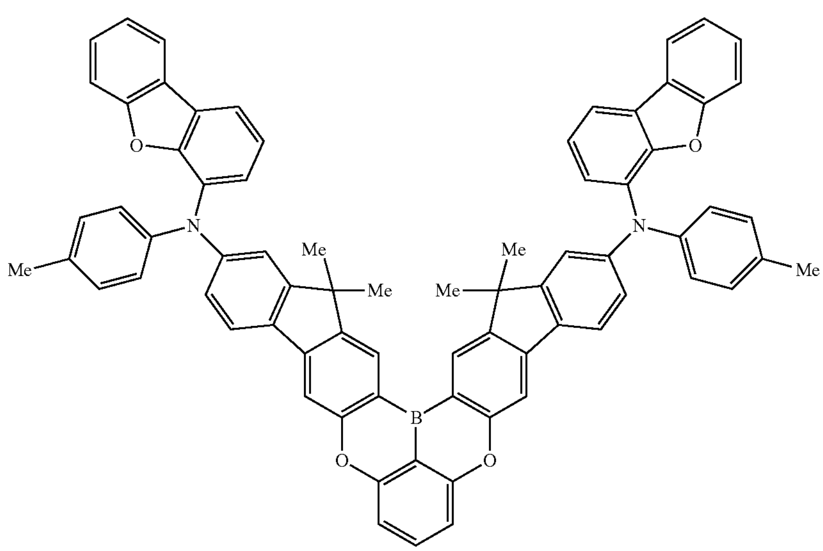

-continued
(2-5012)
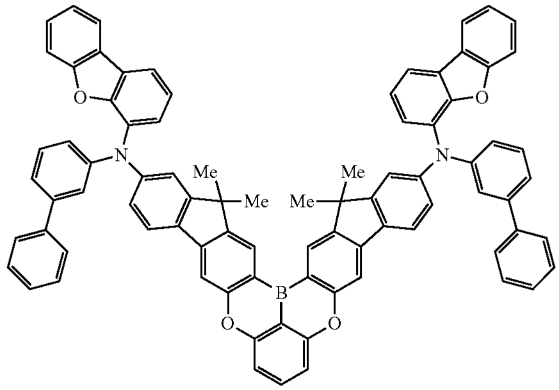
(2-5013)
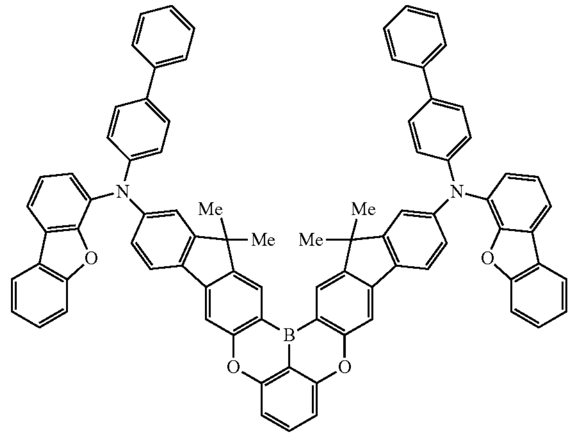
(2-5014)
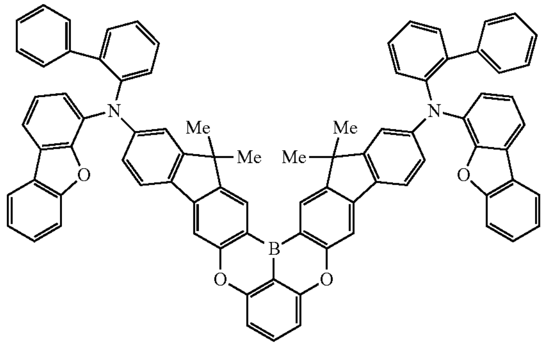
(2-5015)
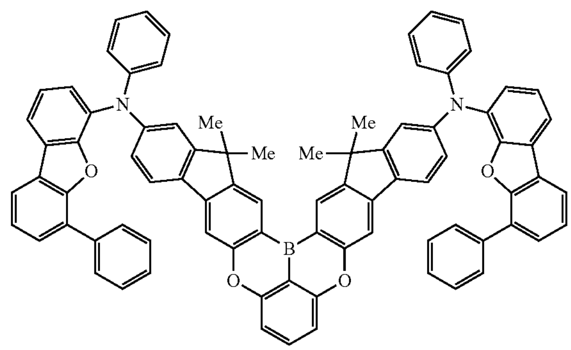
(2-5016)
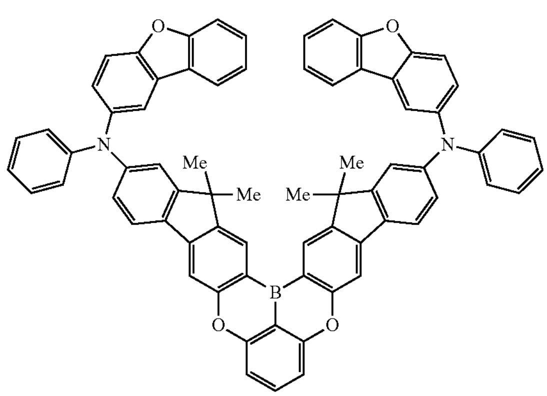
(2-5017)
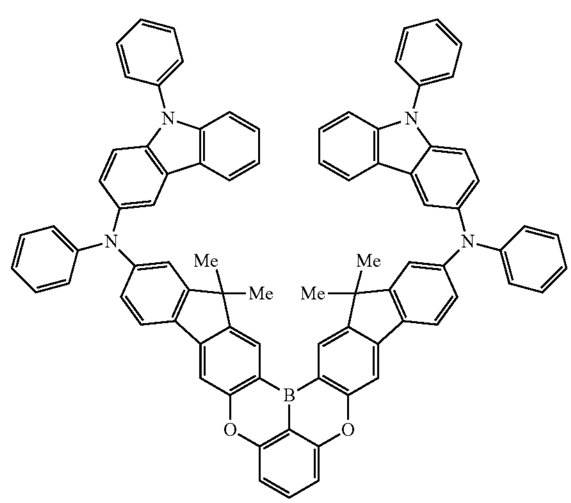

-continued
(2-5018)
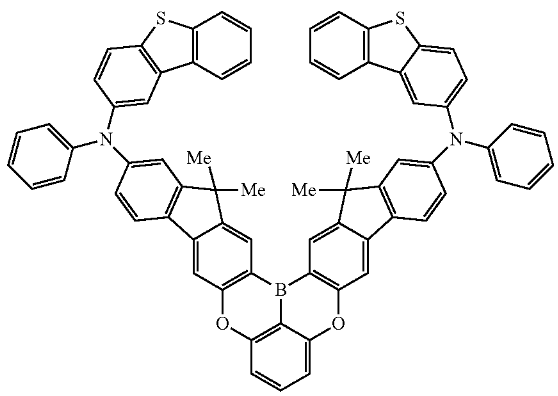
(2-5019)
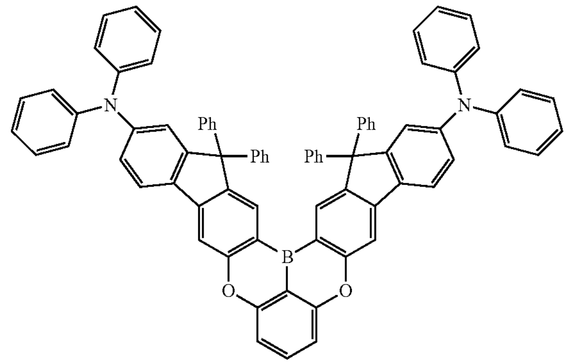
(2-5020)
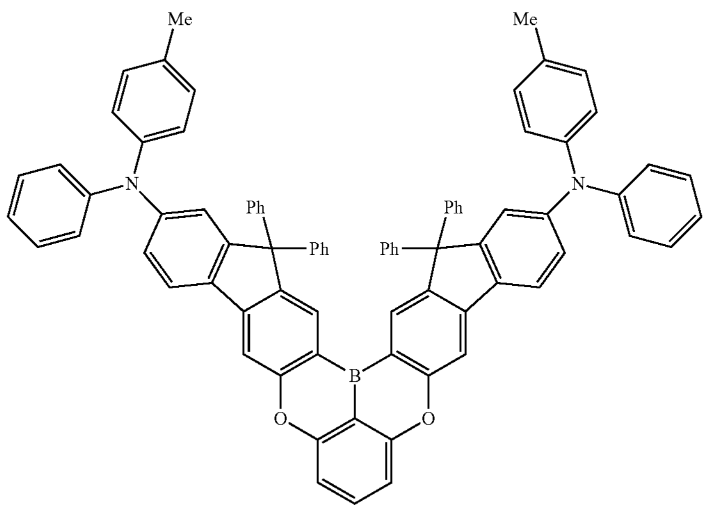
(2-5021)
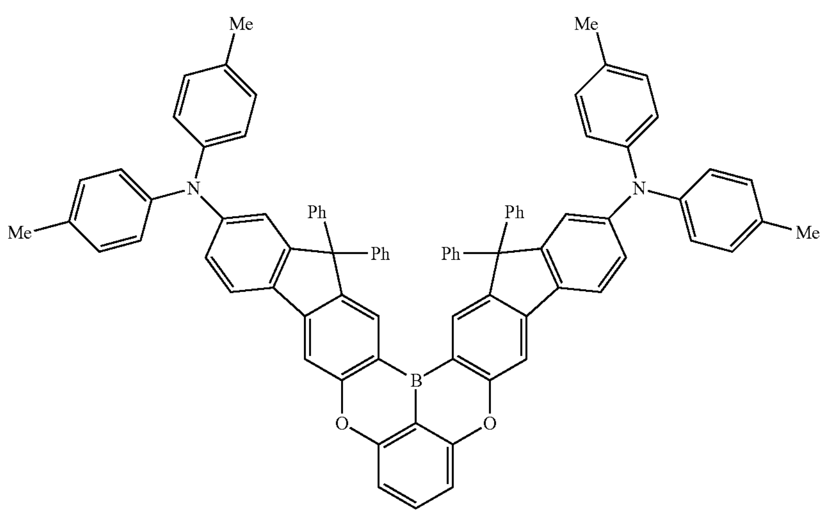

-continued
(2-5022)
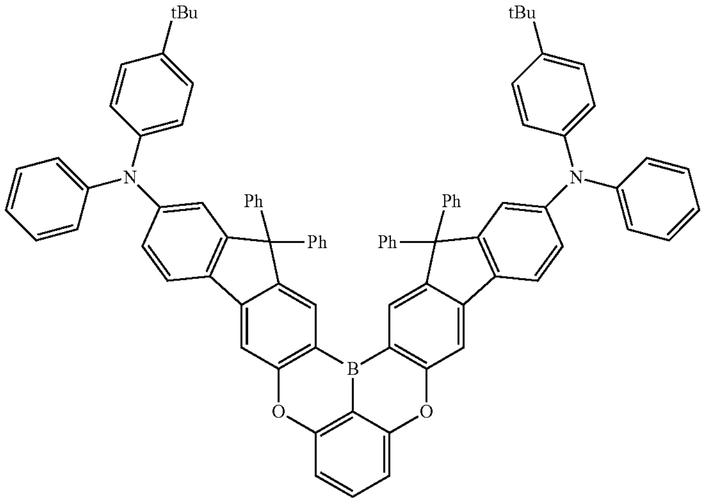
(2-5023)
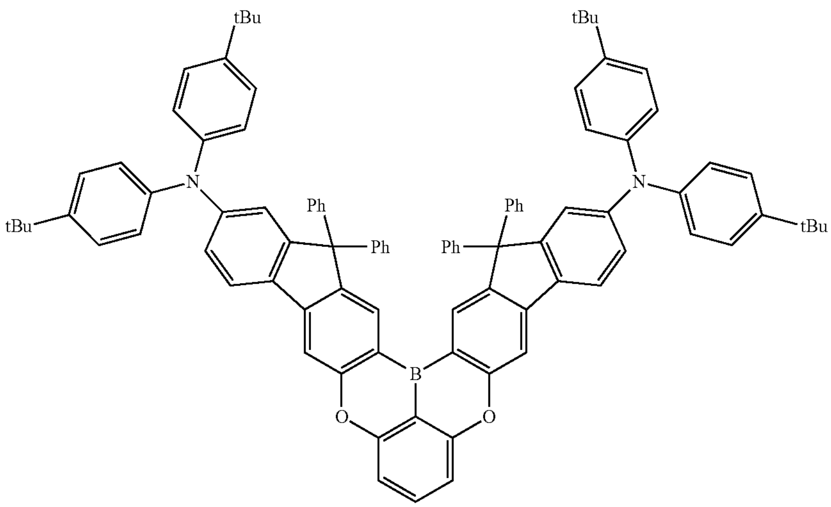
(2-5024)
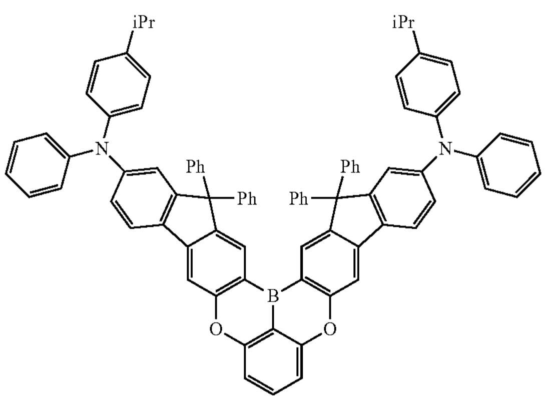
(2-5025)
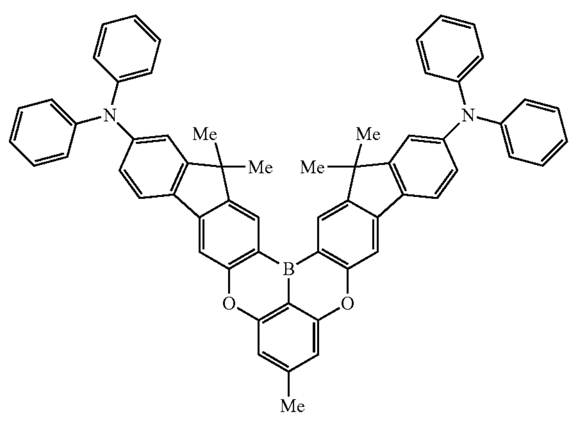

-continued
(2-5026)
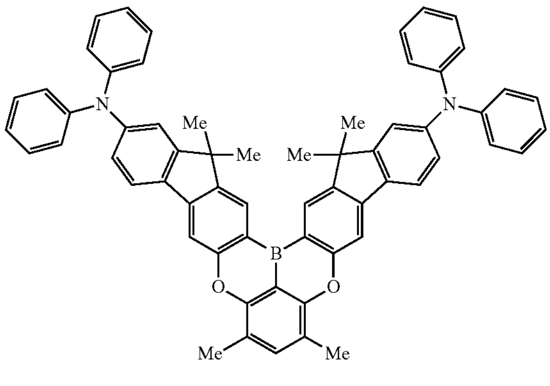
(2-5027)
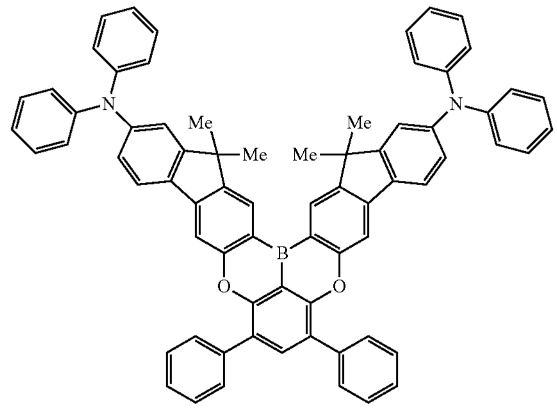
(2-5028)
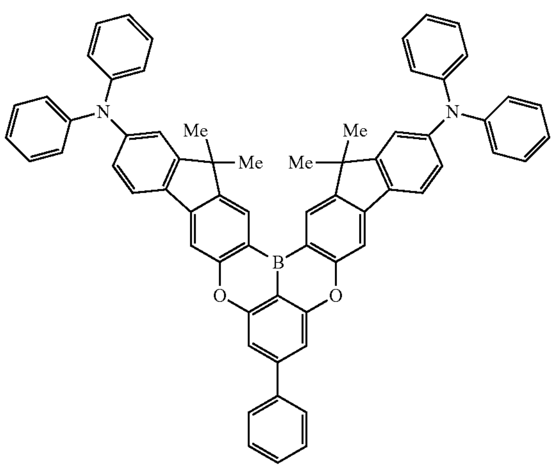
(2-5101)
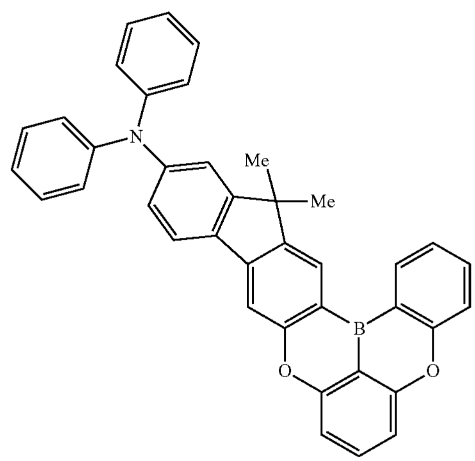
(2-5102)
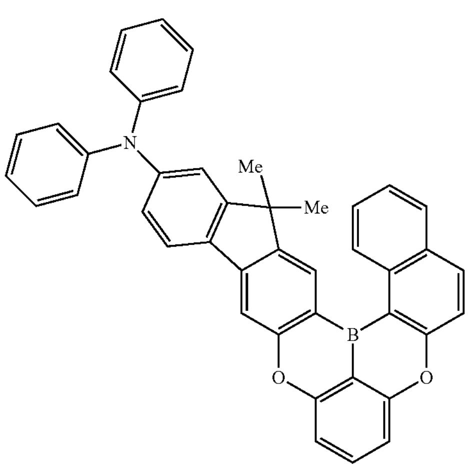
(2-5103)
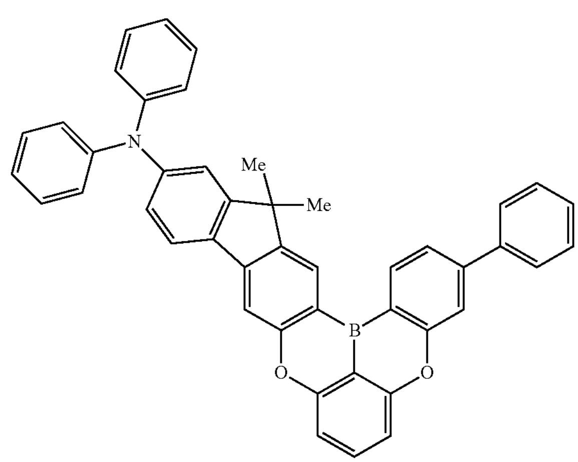

-continued
(2-5104)
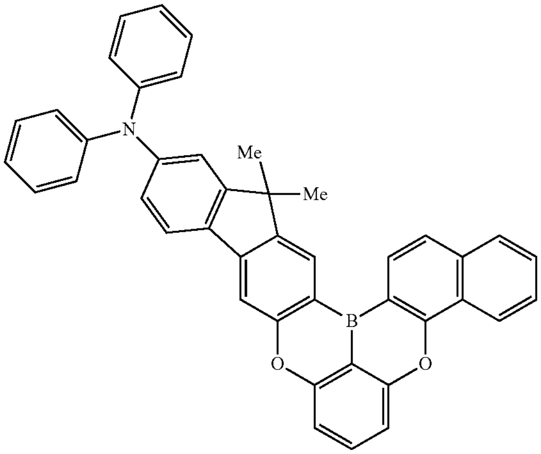
(2-5105)
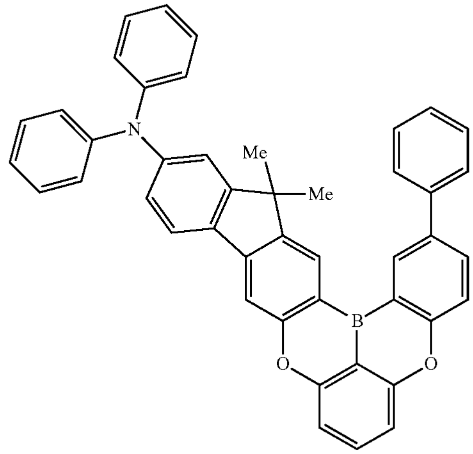
(2-5106)
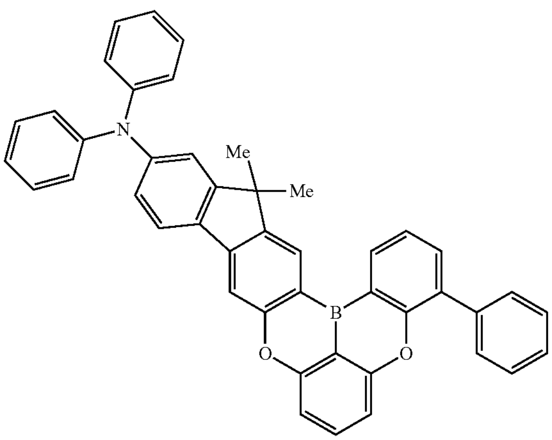
(2-5107)
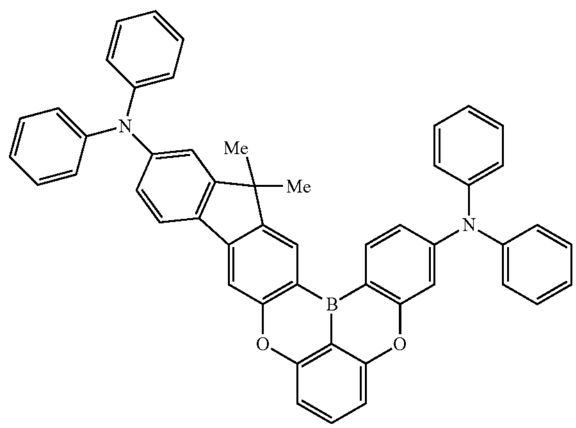
(2-5108)
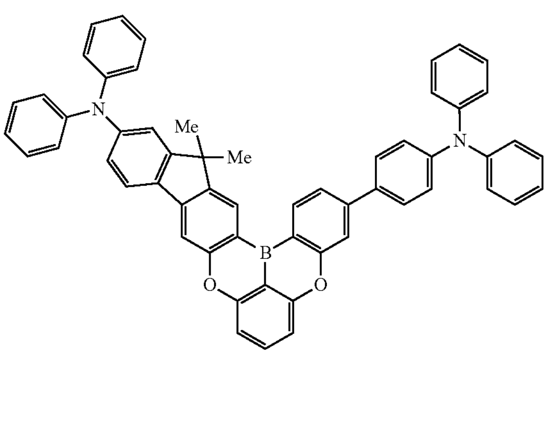
(2-5109)
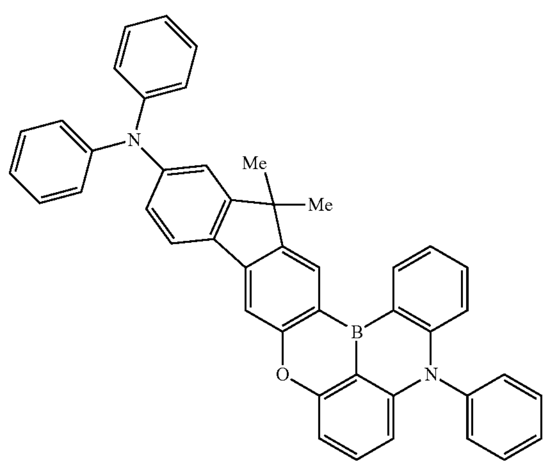

-continued
(2-5110)
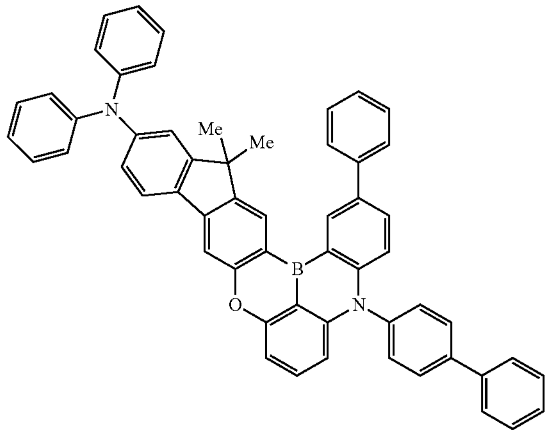
(2-5111)
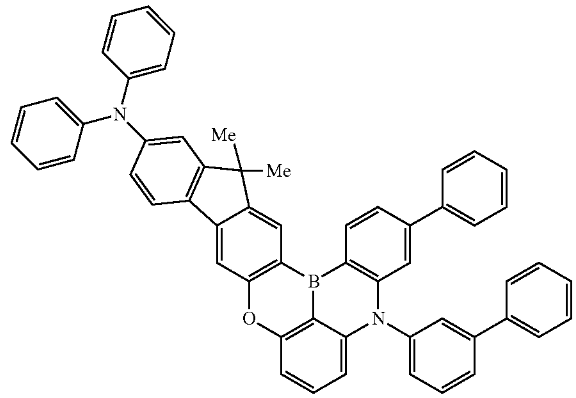
(2-5112)
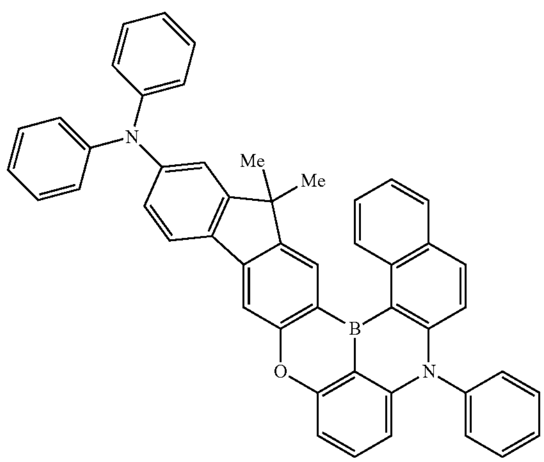
(2-5113)
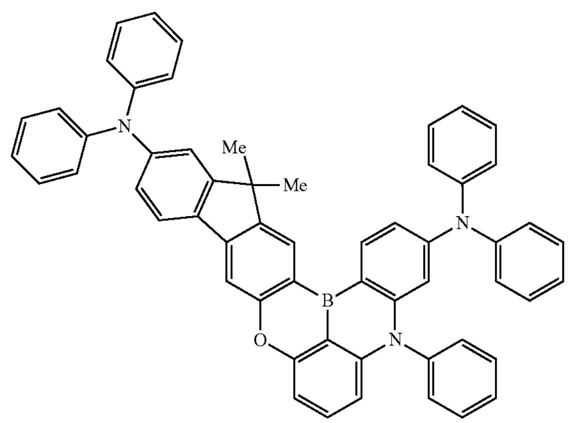
(2-5114)
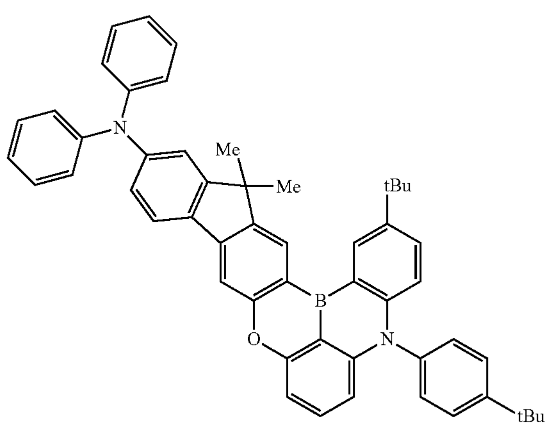
(2-5115)
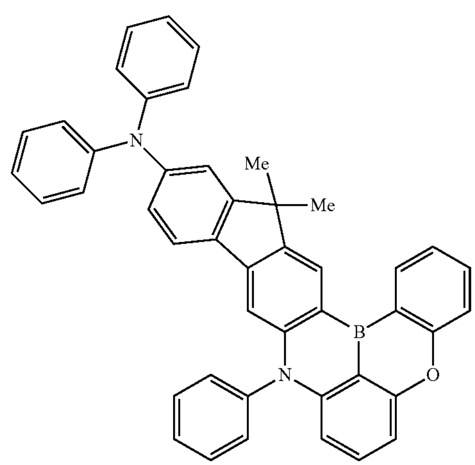

-continued
(2-5116)
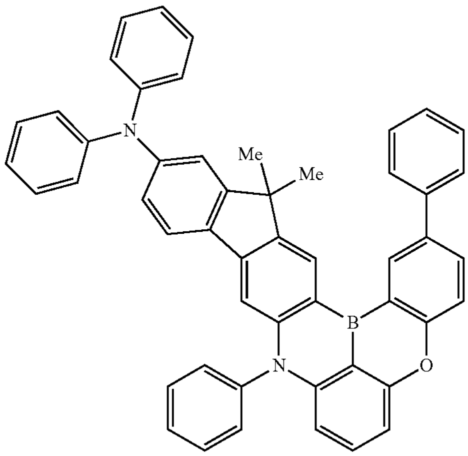
(2-5117)
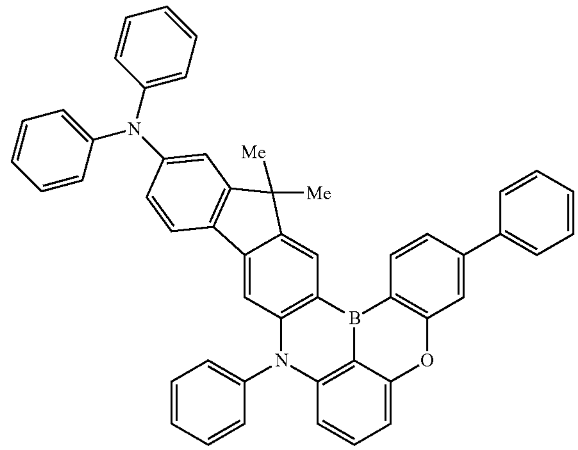
(2-5118)
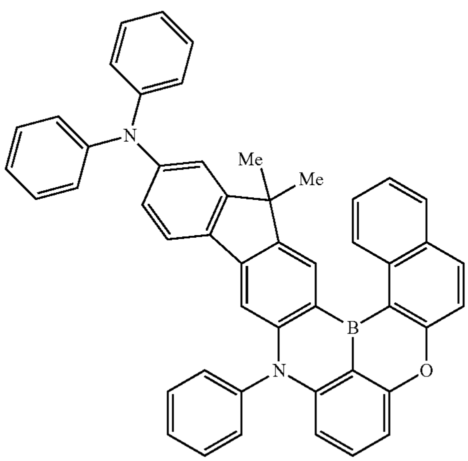
(2-5119)
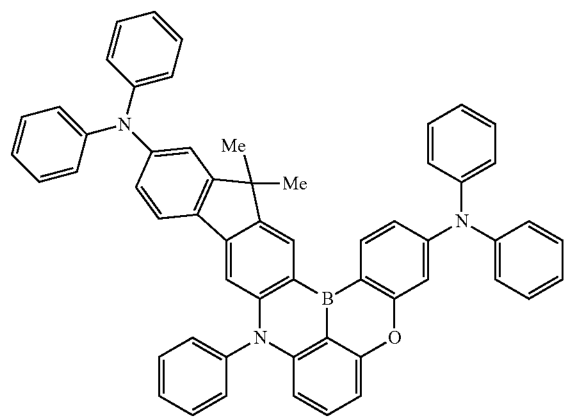
(2-5120)
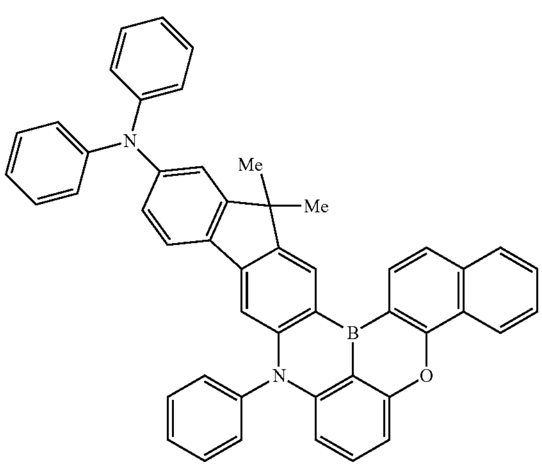
(2-5121)
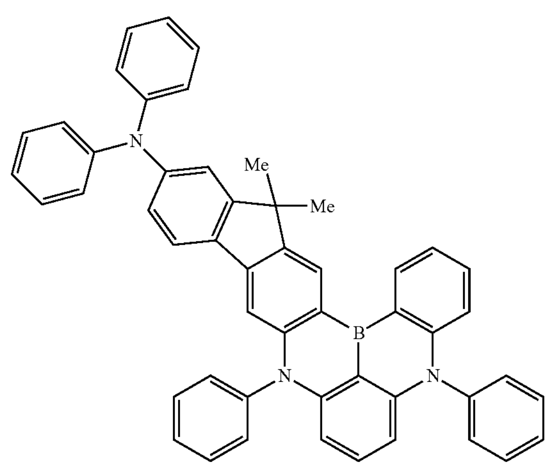

-continued (2-5122)

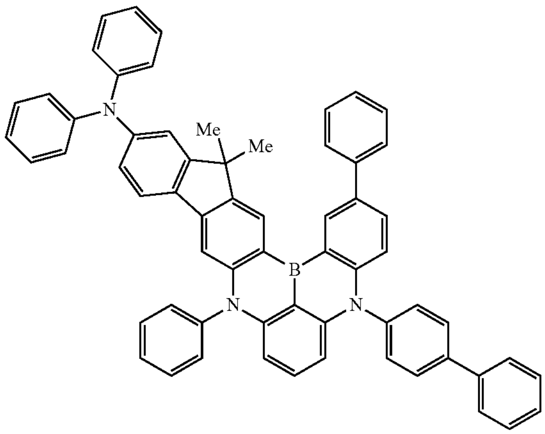

(2-5123)

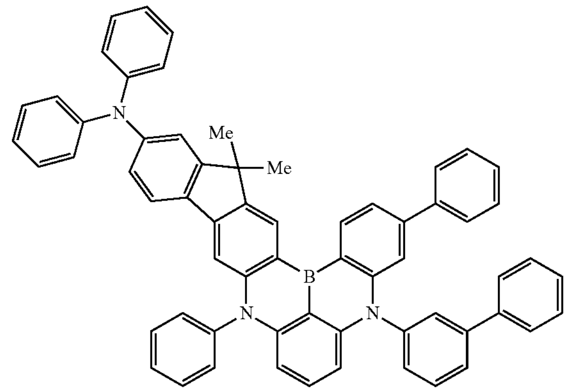

(2-5124)

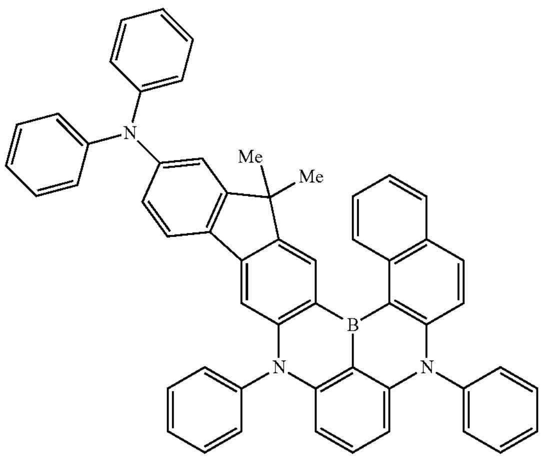

(2-5125)

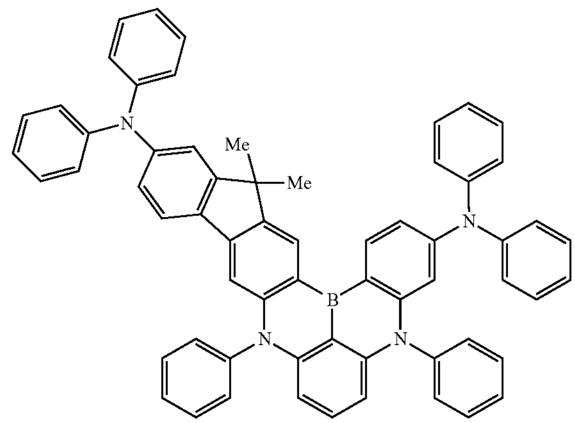

(2-5126)

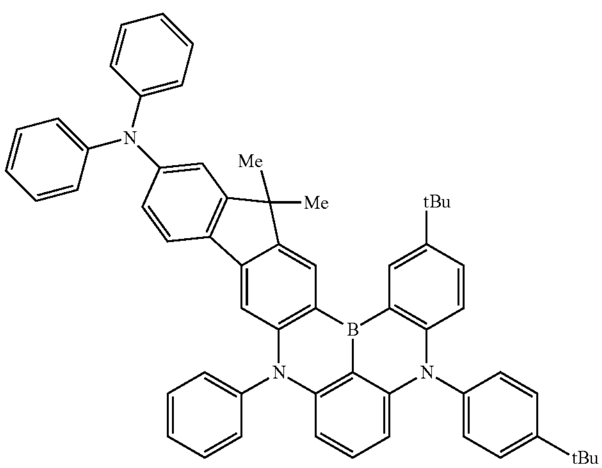

In the compound represented by the formula (2) and multimer thereof, an increase in T1 energy (an increase by approximately 0.01 to 0.1 eV) can be expected by introducing a phenyloxy group, a carbazolyl group, or a diphenylamino group into the para-position with respect to the central atom "B" (boron) in at least one of ring A, ring B and ring C (ring a, ring b and ring c). Particularly, by introducing a phenyloxy group into the para-position with respect to B (boron), the HOMO on the benzene ring which is at least one of ring A, ring B and ring C (ring a, ring b and ring c) is more localized to the meta-position with respect to the boron, and the LUMO is localized to the ortho- and para-positions with respect to the boron. Therefore, an increase in T1 energy can be particularly expected.

For the specific examples thereof, for example, compounds represented by the following formulas (2-4501) to (2-4522) can be mentioned.

In this regard, R in the formula represents an alkyl or a cycloalkyl, may be either linear or branched, and examples of the R include a linear alkyl having 1 to 24 carbon atoms and a branched alkyl having 3 to 24 carbon atoms. As the R, an alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 5 carbon atoms (branched alkyl having 3 to 5 carbon atoms) is particularly preferable. Alternatively, the R may be an alkyl having 1 to 4 carbon atoms (branched alkyl having 3 to 4 carbon atoms. Further, examples of the R include a cycloalkyl having 3 to 24 carbon atoms, a cycloalkyl having 3 to 20 carbon atoms, a cycloalkyl having 3 to 16 carbon atoms, a cycloalkyl having 3 to 14 carbon atoms, a cycloalkyl having 5 to 10 carbon atoms, a cycloalkyl having 5 to 8 carbon atoms, a cycloalkyl having 5 or 6 carbon atoms, and a cycloalkyl having 5 carbon atoms. In addition, as the R, additionally a phenyl can be mentioned.

Further, the "PhO—" is a phenyloxy, at least one hydrogen atom in the phenyloxy may be substituted by a linear or branched alkyl or a linear or branched cycloalkyl, and may be substituted by, for example, a linear alkyl having 1 to 24 carbon atoms, a branched alkyl having 3 to 24 carbon atoms, an alkyl having 1 to 18 carbon atoms (branched alkyl having 3 to 18 carbon atoms), an alkyl having 1 to 12 carbon atoms (branched alkyl having 3 to 12 carbon atoms), an alkyl having 1 to 6 carbon atoms (branched alkyl having 3 to 6 carbon atoms), or an alkyl having 1 to 5 carbon atoms (branched alkyl having 3 to 5 carbon atoms). In addition, at least one hydrogen atom in the phenyloxy may be substituted by the cycloalkyl described above.

(2-4501)

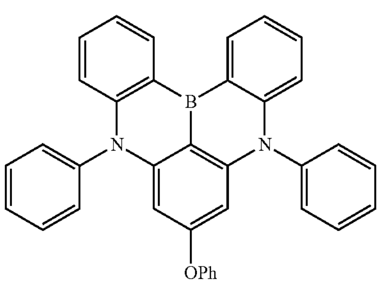

(2-4502)

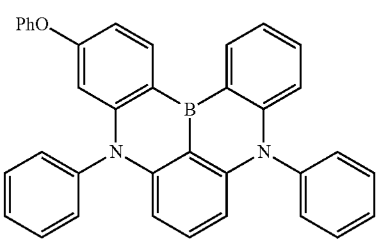

-continued (2-4503)

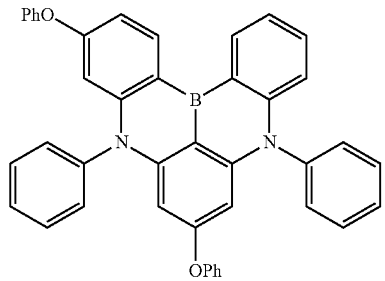

(2-4504)

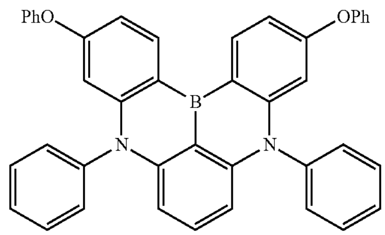

(2-4505)

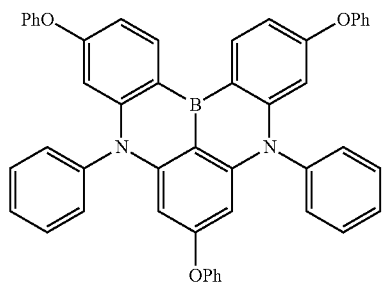

(2-4506)

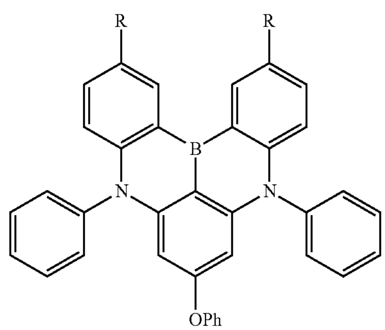

(2-4507)

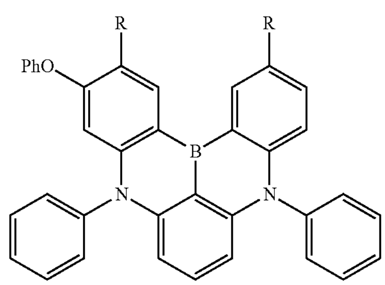

-continued
(2-4508)
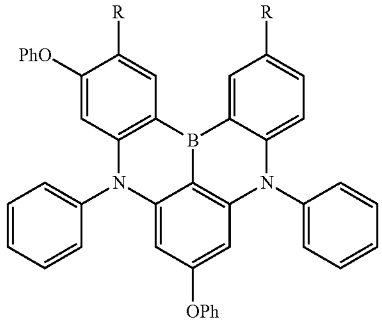
(2-4509)
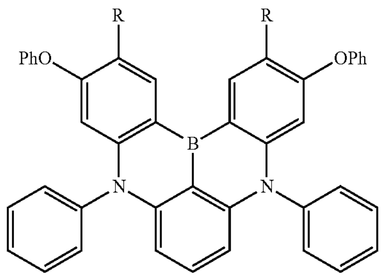
(2-4510)
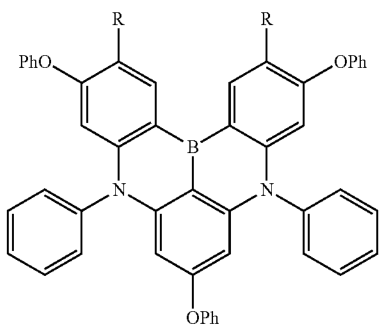
(2-4511)
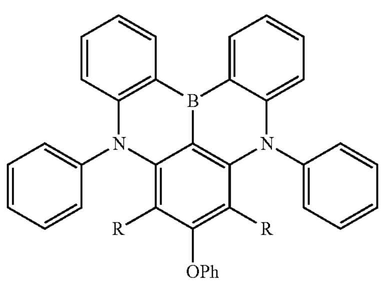
(2-4512)
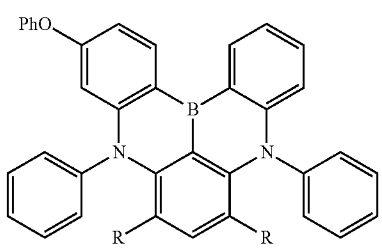
-continued
(2-4513)
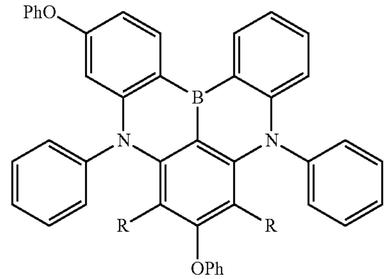
(2-4514)
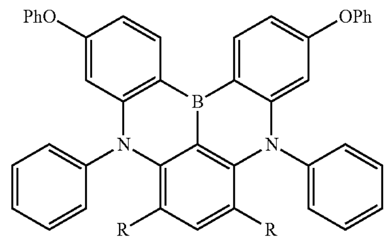
(2-4515)
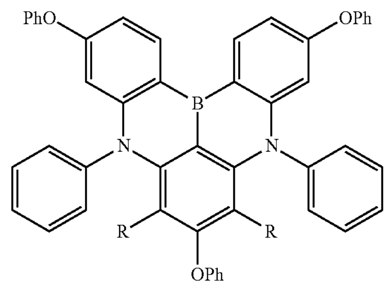
(2-4516)
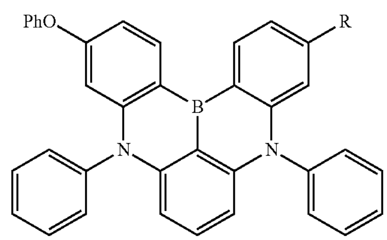
(2-4517)
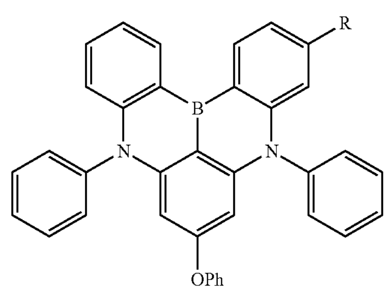
(2-4518)
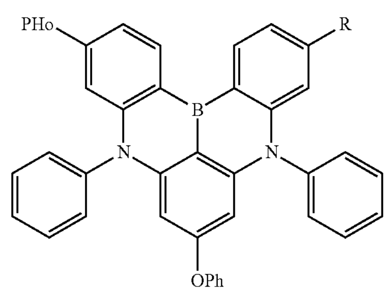

-continued (2-4519)

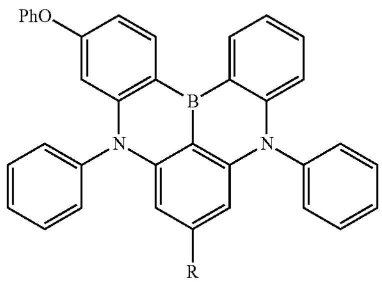

(2-4520)

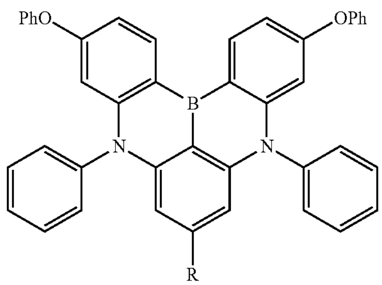

(2-4521)

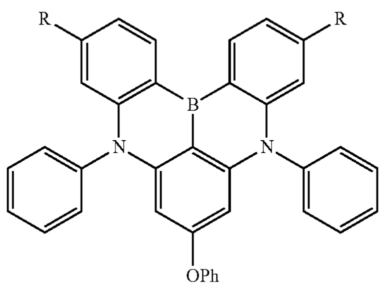

(2-4522)

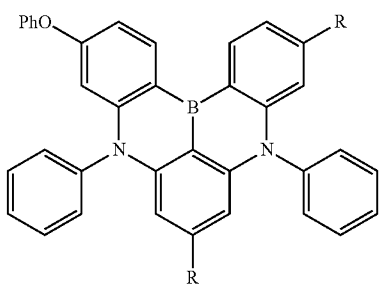

Further, as a specific example of the compound represented by the formula (2) and a multimer thereof, in the compound described above, a compound in which at least one hydrogen atom in one or a plurality of aromatic rings in the compound is substituted by one or a plurality of alkyls, cycloalkyls or aryls can be mentioned, and more preferably a compound substituted by 1 to 2 alkyls each having 1 to 12 carbon atoms, 1 to 2 cycloalkyls each having 3 to 16 carbon atoms, or 1 to 2 aryls each having 6 to 10 carbon atoms can be mentioned.

Specifically, the following compound can be mentioned. In the following formula, R independently represents an alkyl having 1 to 12 carbon atoms, a cycloalkyl having 3 to 16 carbon atoms, or an aryl having 6 to 10 carbon atoms, and preferably an alkyl having 1 to 5 carbon atoms, a cycloalkyl having 5 to 10 carbon atoms or a phenyl, and n is independently 0 to 2, and preferably 1.

(2-401-R)

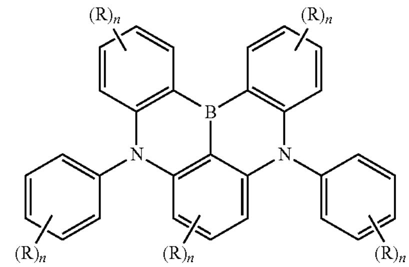

(2-411-R)

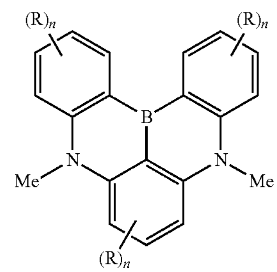

(2-447-R)

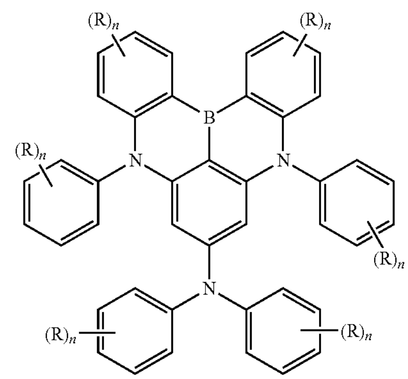

(2-1152-R)

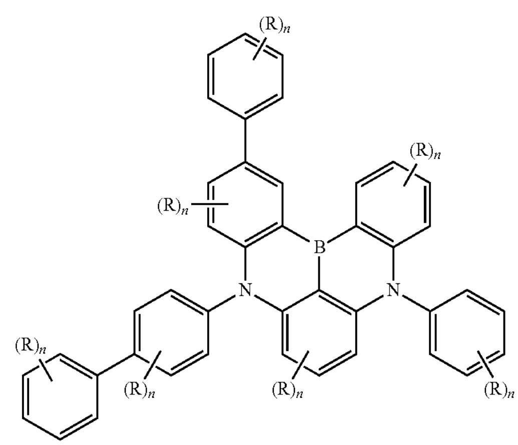

-continued
(2-2623-R)
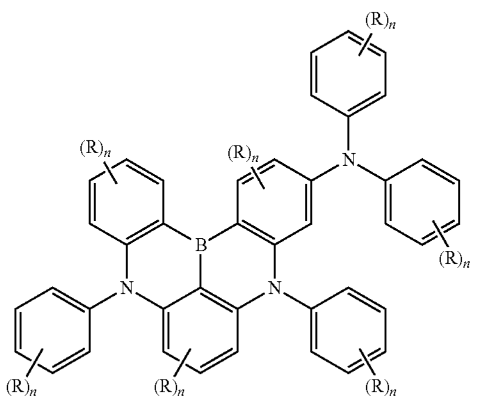
(2-422-R)
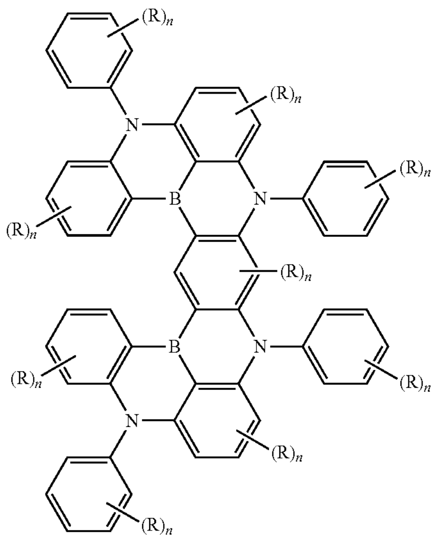
(2-1159-R)
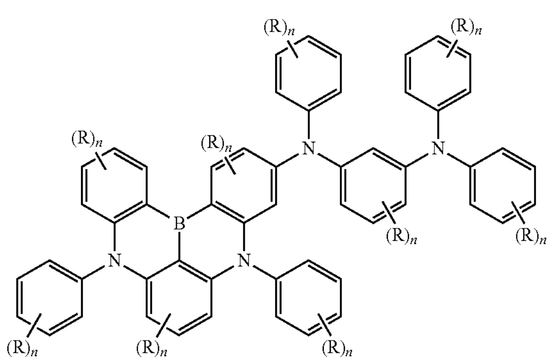
(2-2657-R)
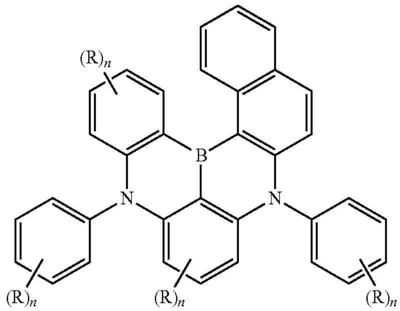
-continued
(2-2665-R)
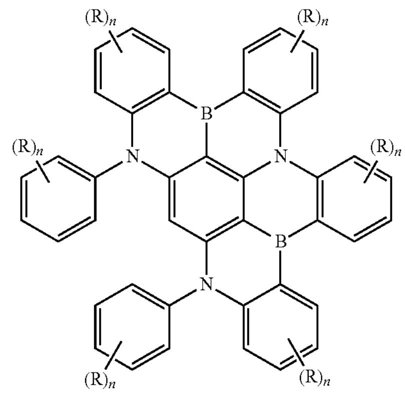
(2-2676-R)
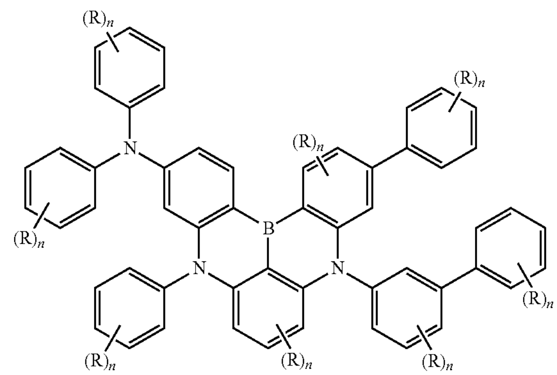
(2-2679-R)
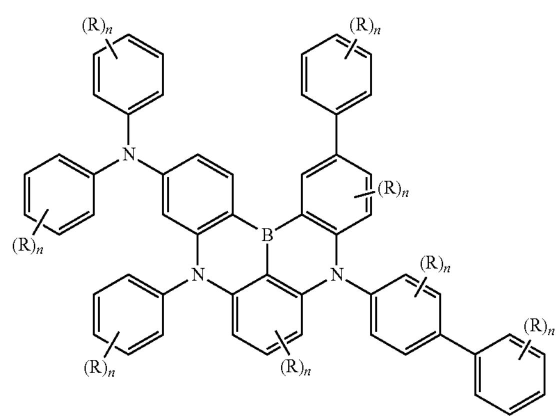
(2-2680-R)
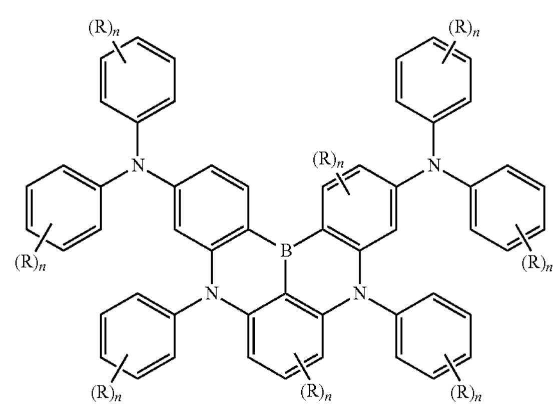

-continued (2-2681-R)

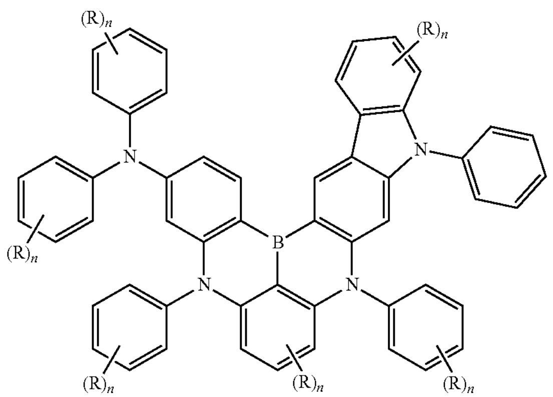

(2-2682-R)

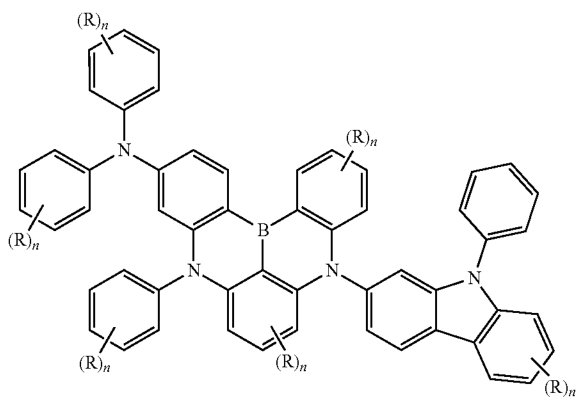

(2-2683-R)

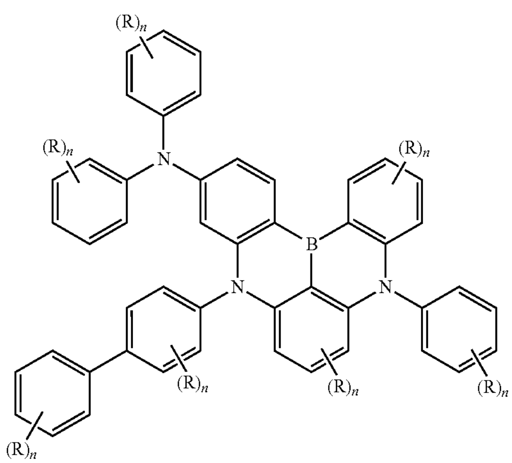

(2-2691-R)

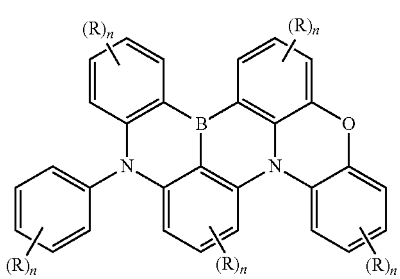

-continued (2-2699-R)

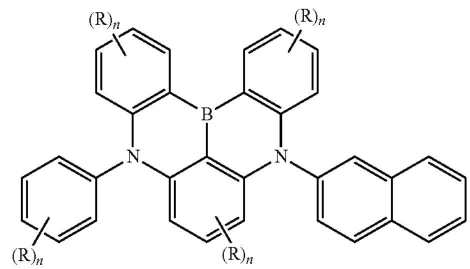

Furthermore, specific example of a compound represented by the formula (2) and multimer thereof, include a compound in which at least one hydrogen atom in one or more phenyl or one phenylene in the compound is substituted by one or more alkyls each having 1 to 5 carbon atoms or cycloalkyls each having 5 to 10 carbon atoms, preferably one or more alkyls each having 1 to 3 carbon atoms (preferably one or more methyl). More preferable examples thereof include a compound in which the hydrogen atoms at the ortho-positions of one phenyl (both of the two sites, preferably any one site) or the hydrogen atoms at the ortho-positions of one phenylene (all of the four sites at maximum, preferably any one site) are substituted by methyl.

By substitution of at least one hydrogen atom at the ortho-position of a phenyl or a p-phenylene at a terminal in the compound by a methyl or the like, adjacent aromatic rings are likely to intersect each other perpendicularly, and conjugation is weakened. As a result, triplet excitation energy ($E_T$) can be increased.

4. Method for Manufacturing a Compound Represented by General Formula (2) and Multimer Thereof In regard to the polycyclic aromatic compound represented by general formula (2) or (2') and multimer thereof, basically, an intermediate is manufactured by first bonding the ring A (ring a), ring B (ring b) and ring C (ring c) with bonding groups (groups containing $X^1$ or $X^2$) (first reaction), and then a final product can be manufactured by bonding the ring A (ring a), ring B (ring b) and ring C (ring c) with bonding groups (groups containing central atom “B” (boron)) (second reaction).

In the first reaction, a general reaction such as a Buchwald-Hartwig reaction can be utilized in a case of an amination reaction. In the second reaction, a Tandem Hetero-Friedel-Crafts reaction (continuous aromatic electrophilic substitution reaction, the same hereinafter) can be utilized.

Incidentally, in the schemes (2-1) to (2-13) described below, a case of >N—R is described as $X^1$ or $X^2$, but the same applies to a case of >O. Definitions of the symbols in the structural formulas in the schemes (2-1) to (2-13) are the same as those in formulas (2) and (2').

As illustrated in the following schemes (2-1) and (2-2), the second reaction is a reaction for introducing central atom “B” (boron) which bonds the ring A (ring a), ring B (ring b) and ring C (ring c). First, a hydrogen atom between $X^1$ and $X^2$ (>N—R) is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. In the second reaction, a Lewis acid such as aluminum trichloride may be added in order to accelerate the reaction.

Scheme (2-1)

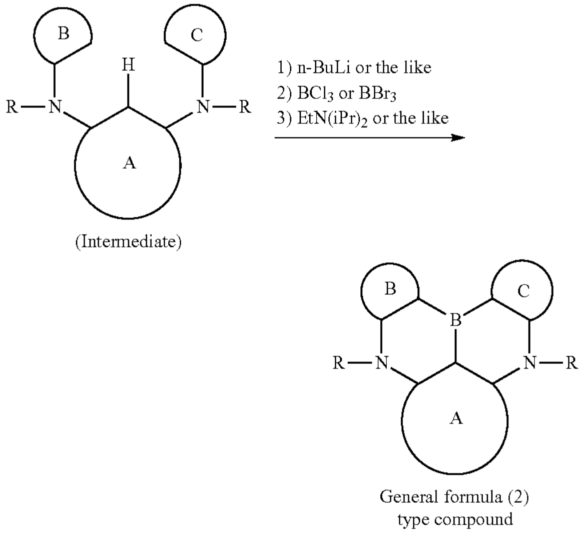

Scheme (2-2)

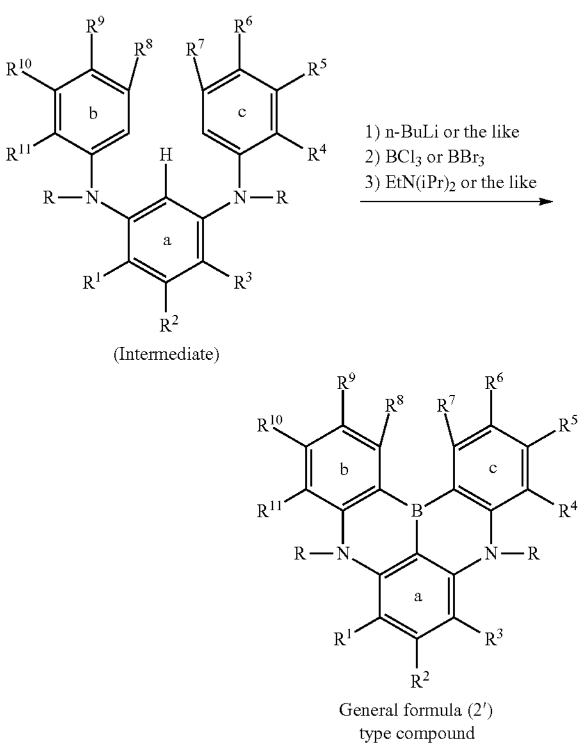

Incidentally, the scheme (2-1) or (2-2) mainly illustrates a method for manufacturing a compound represented by general formula (2) or (2'). However, a multimer thereof can be manufactured using an intermediate having a plurality of ring A's (ring a's), ring B's (ring b's) and ring C's (ring c's). More specifically, the manufacturing method will be described by the following schemes (2-3) to (2-5). In this case, a desired product may be obtained by increasing the amount of the reagent used therein such as butyllithium to a double amount or a triple amount.

Scheme (2-3)

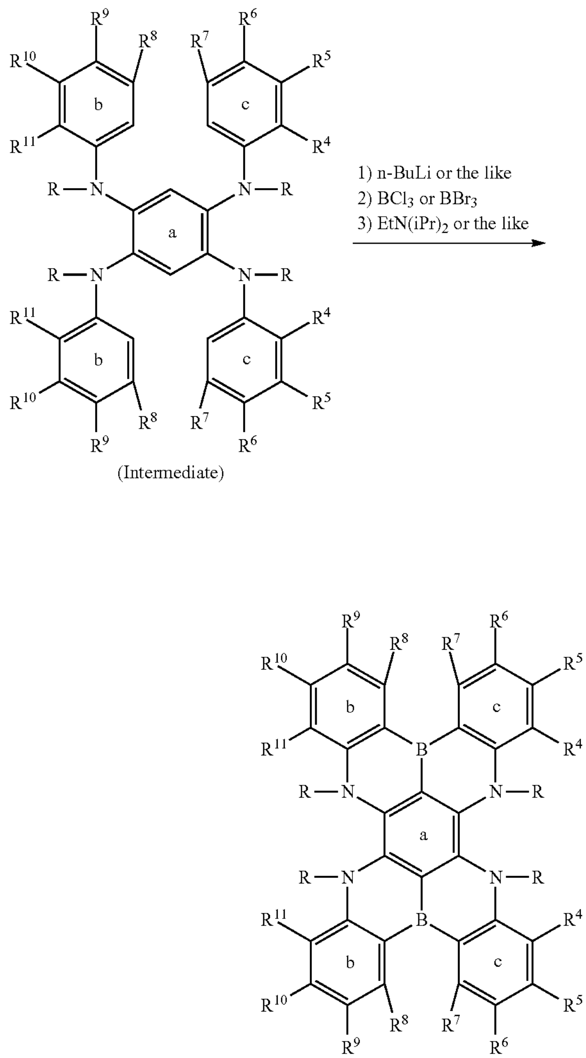

Scheme (2-4)

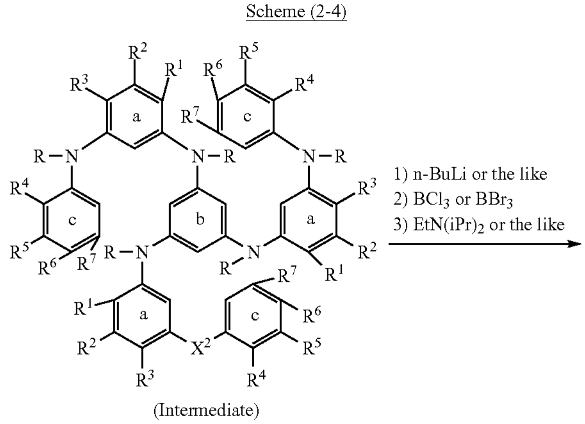

-continued

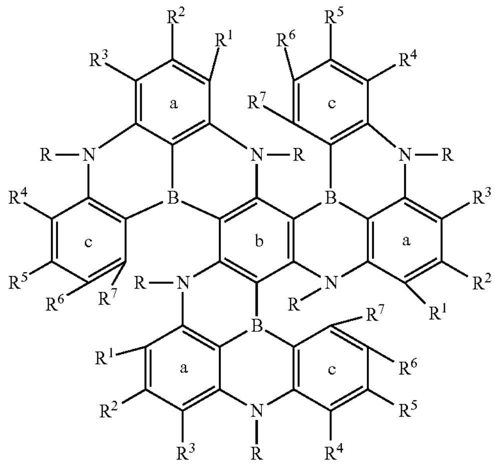

Scheme (2-5)

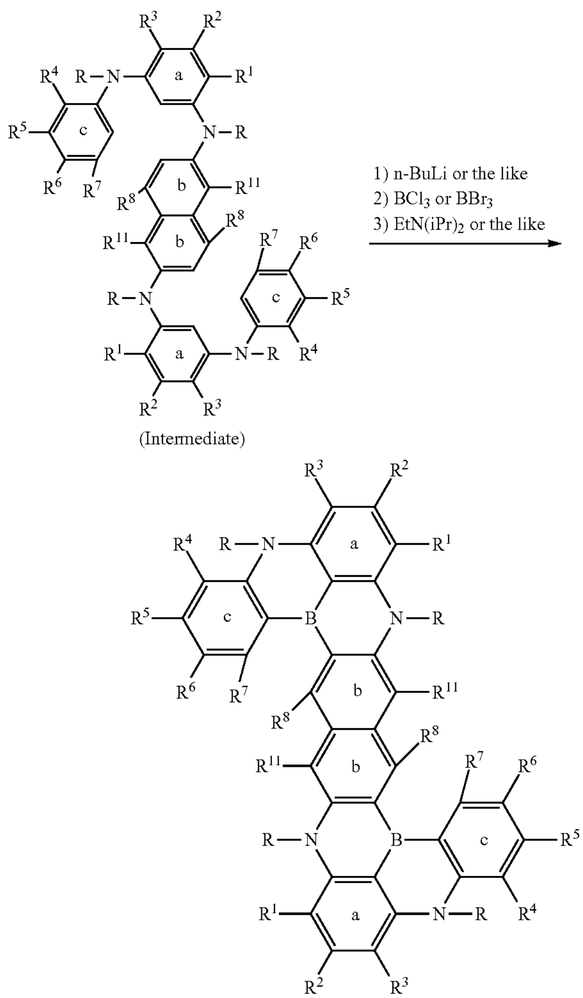

In the above schemes, lithium is introduced into a desired position by ortho-metalation. However, lithium can also be introduced into a desired position by halogen-metal exchange by introducing a bromine atom or the like to a position to which it is wished to introduce lithium, as in the following schemes (2-6) and (2-7).

Scheme (2-6)

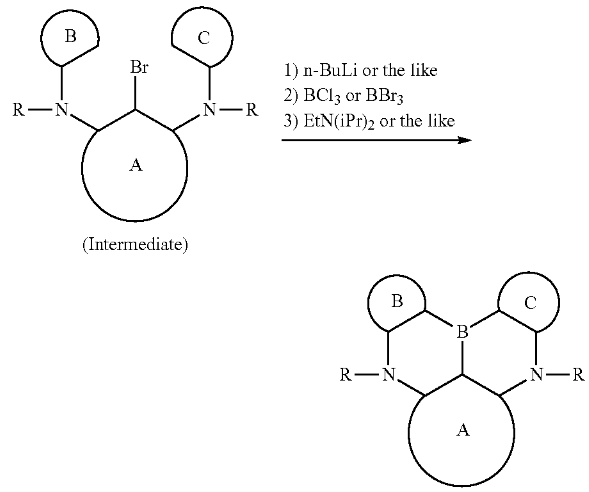

General formula (2) type compound

Scheme (2-7)

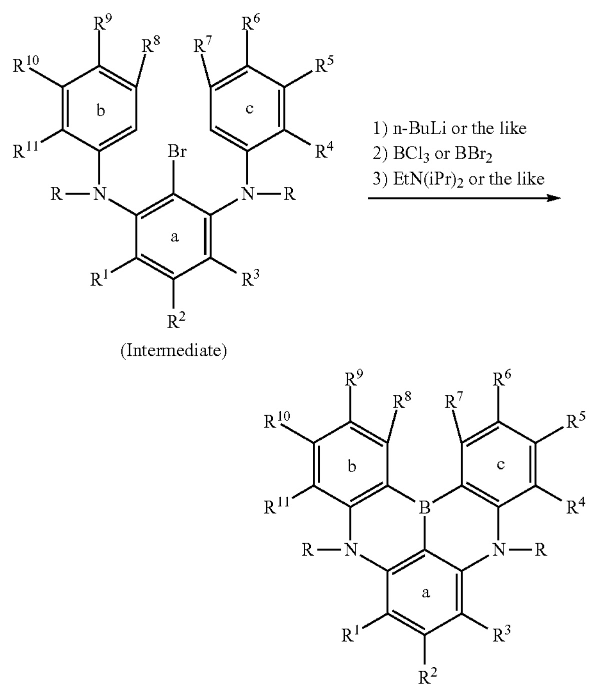

General formula (2′) type compound

Furthermore, also in regard to the method for manufacturing a multimer described in scheme (2-3), a lithium atom can be introduced to a desired position also by halogen-metal exchange by introducing a halogen atom such as a bromine atom or a chlorine atom to a position to which it is wished to introduce a lithium atom, as in the above schemes (2-6) and (2-7) (the following schemes (2-8), (2-9), and (2-10)).
Scheme (2-8)
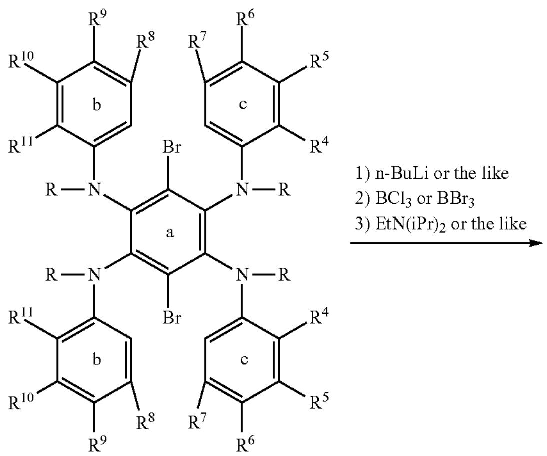
(Intermediate)
-continued
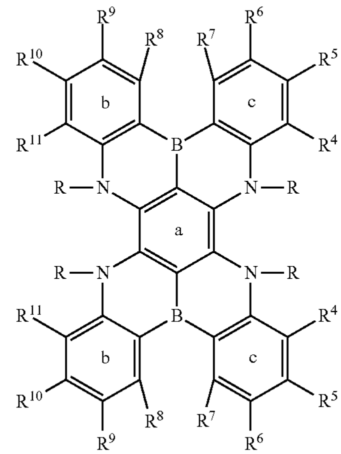
Scheme (2-9)
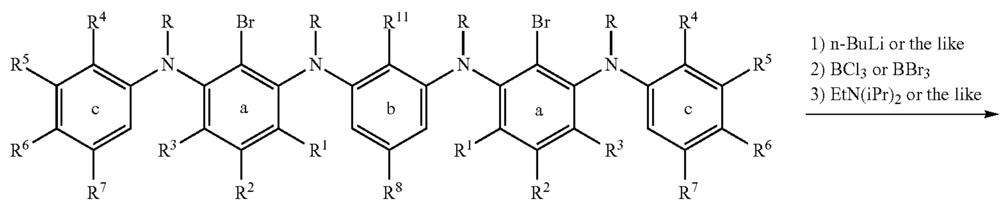
(Intermediate)
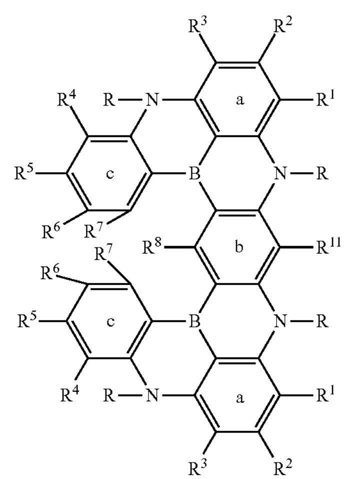

Scheme (2-10)

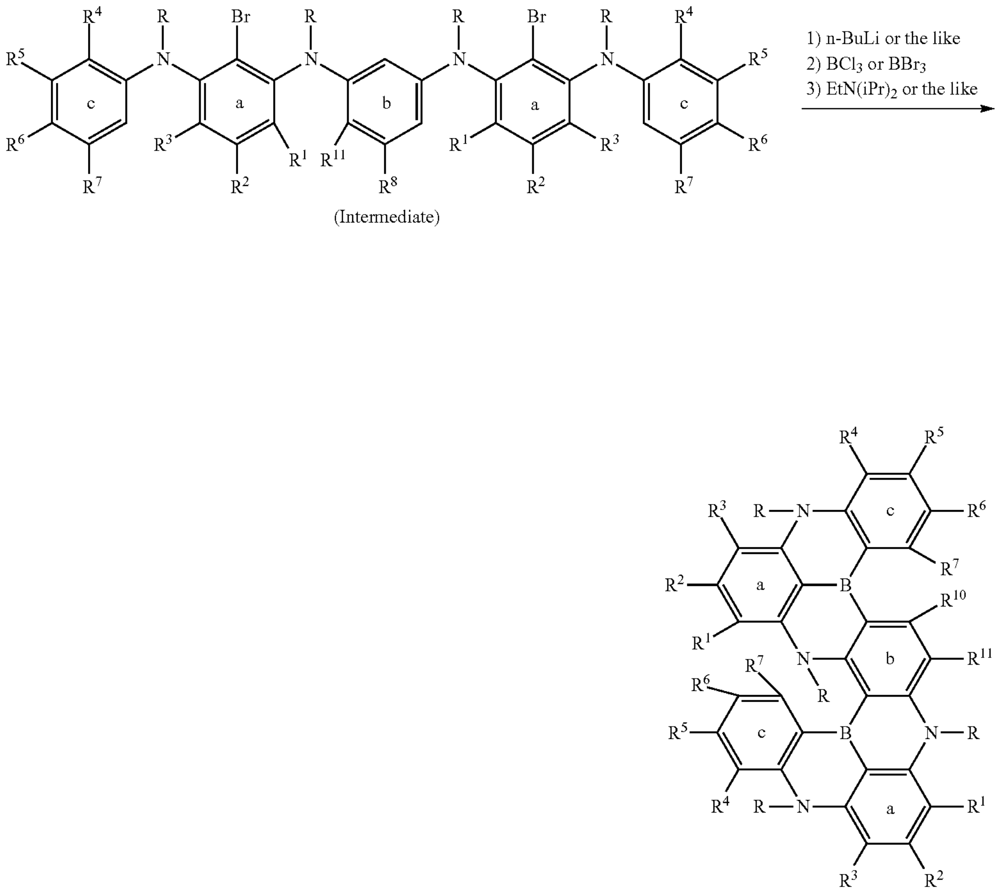

According to this method, a desired product can also be synthesized even in a case in which ortho-metalation cannot be achieved due to the influence of substituents, and therefore the method is useful.

Specific examples of the solvent used in the above reactions include t-butylbenzene and xylene.

By appropriately selecting the above synthesis method and appropriately selecting raw materials to be used, it is possible to synthesize a compound having a substituent at a desired position and a multimer thereof.

Furthermore, in general formula (2'), adjacent groups among the substituents $R^1$ to $R^{11}$ of the ring a, ring b and ring c may be bonded to each other to form an aryl ring or a heteroaryl ring together with the ring a, ring b or ring c, and at least one hydrogen atom in the ring thus formed may be substituted by an aryl or a heteroaryl. Therefore, in a compound represented by general formula (2'), a ring structure constituting the compound changes as represented by formulas (2'-1) and (2'-2) of the following schemes (2-11) and (2-12) according to a mutual bonding form of substituents in the ring a, ring b, and ring c. These compounds can be synthesized by applying synthesis methods illustrated in the above schemes (2-1) to (2-10) to intermediates illustrated in the following schemes (2-11) and (2-12).

Scheme (2-11)

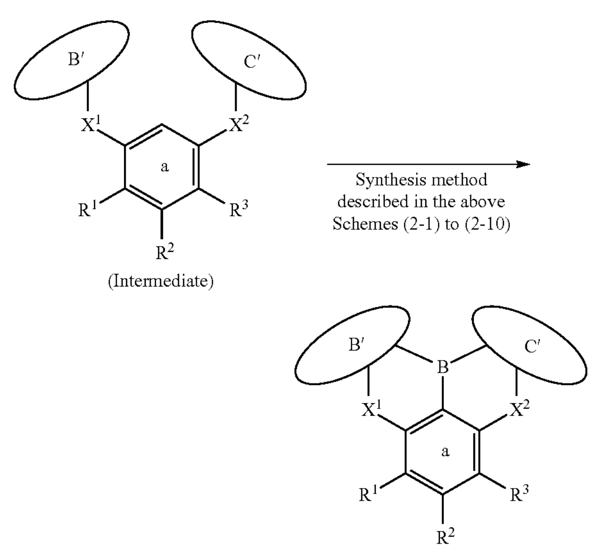

(2'-1)

Scheme (2-12)

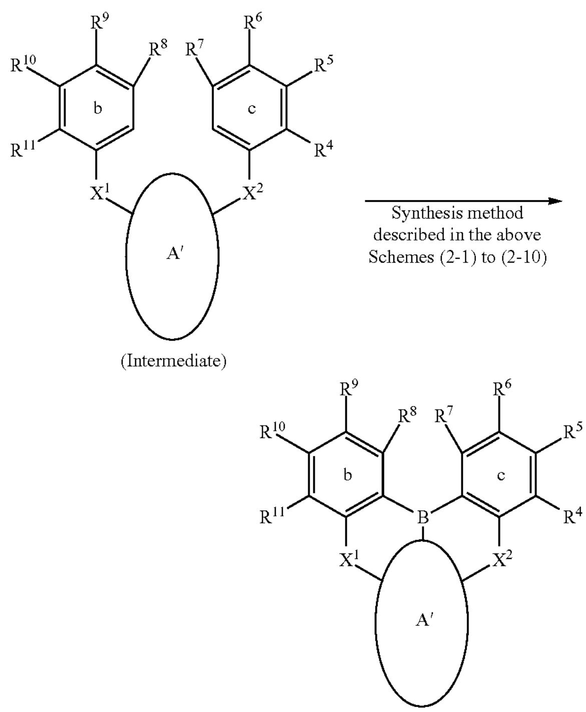

Ring A', ring B' and ring C' in the above formulas (2'-1) and (2'-2) each represent an aryl ring or a heteroaryl ring formed by bonding adjacent groups among the substituents $R^1$ to $R^{11}$ together with the ring a, ring b, and ring c, respectively (may also be a fused ring obtained by fusing another ring structure to the ring a, ring b, or ring c). Incidentally, although not indicated in the formula, there is also a compound in which all of the ring a, ring b, and ring c have been changed to the ring A', ring B' and ring C'.

Furthermore, the provision that "R of the >N—R is bonded to at least one of the ring a, ring b and ring c with —O—, —S—, —C(—R)$_2$—, or a single bond" in general formulas (2') can be expressed as a compound having a ring structure represented by formula (2'-3-1) of the following scheme (2-13), in which $X^1$ or $X^2$ is incorporated into the fused ring B' or fused ring C', or a compound having a ring structure represented by formula (2'-3-2) or (2'-3-3), in which $X^1$ or $X^2$ is incorporated into the fused ring A'. Such a compound can be synthesized by applying the synthesis methods illustrated in the schemes (2-1) to (2-10) to the intermediate represented by the following scheme (2-13).

Scheme (2-13)

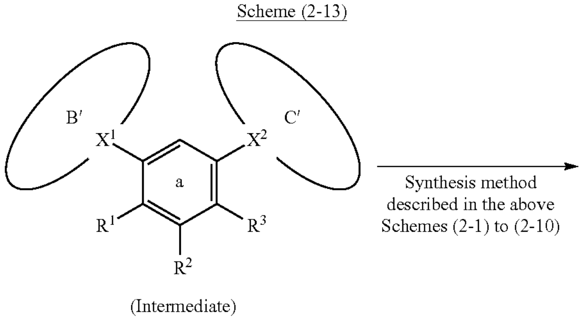

-continued

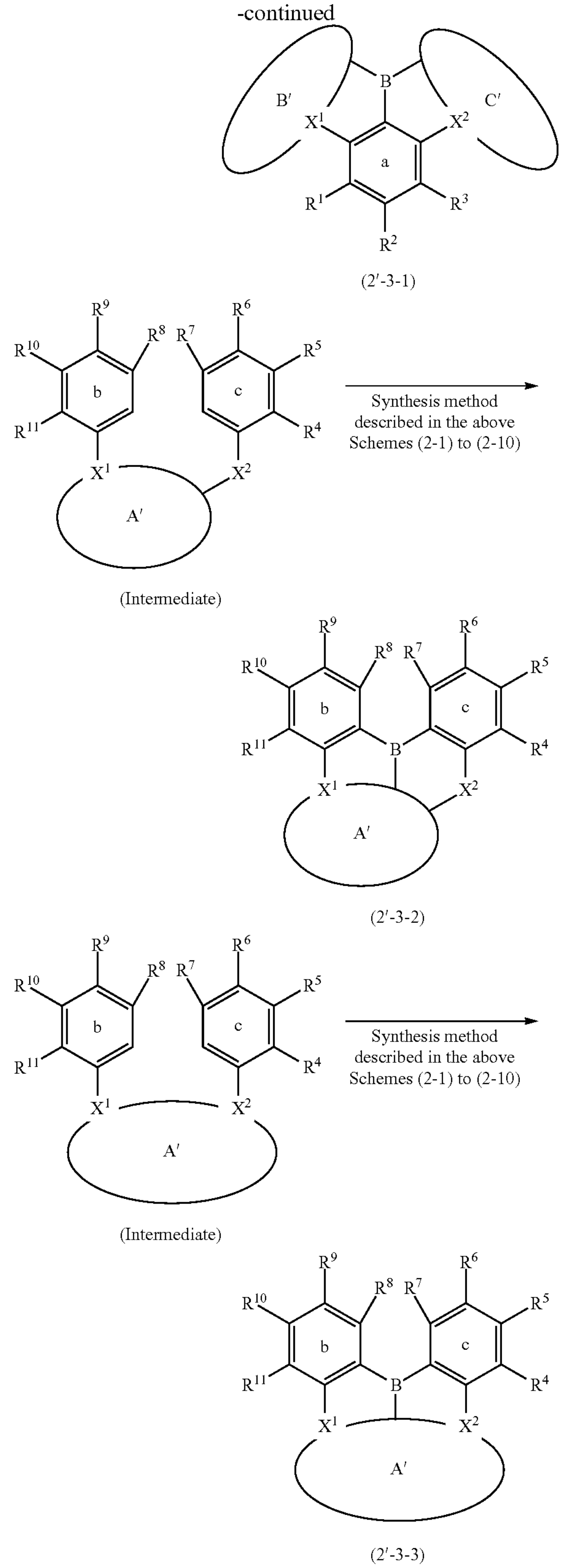

Furthermore, regarding the synthesis methods of the above schemes (2-1) to (2-13), there is shown an example of carrying out the Tandem Hetero-Friedel-Crafts reaction by ortho-metalating a hydrogen atom (or a halogen atom)

between $X^1$ and $X^2$ with butyllithium or the like, before boron trichloride, boron tribromide or the like is added. However, the reaction may also be carried out by adding boron trichloride, boron tribromide or the like without conducting ortho-metalation using buthyllithium or the like.

Note that examples of an ortho-metalation reagent used for the above schemes (2-1) to (2-13) include an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Incidentally, examples of a metal exchanging reagent for metal-"B" (boron) used for the above schemes (2-1) to (2-13) include a halide of boron such as trifluoride of boron, trichloride of boron, tribromide of boron, or triiodide of boron; an aminated halide of boron such as $CIPN(NEt_2)_2$; an alkoxylation product of boron; and an aryloxylation product of boron.

Incidentally, examples of the Brønsted base used for the above schemes (2-1) to (2-13) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$ (Ar represents an aryl such as phenyl).

Examples of a Lewis acid used for the above schemes (2-1) to (2-13) include $AlCl_3$, $AlBr_3$, $AlF_3$, $BF_3.OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In the above schemes (2-1) to (2-13), a Brønsted base or a Lewis acid may be used in order to accelerate the Tandem Hetero Friedel-Crafts reaction. However, in a case where a halide of boron such as trifluoride of boron, trichloride of boron, tribromide of boron, or triiodide of boron is used, an acid such as hydrogen fluoride, hydrogen chloride, hydrogen bromide, or hydrogen iodide is generated along with progress of an aromatic electrophilic substitution reaction. Therefore, it is effective to use a Brønsted base that captures an acid. On the other hand, in a case where an aminated halide of boron or an alkoxylation product of boron is used, an amine or an alcohol is generated along with progress of the aromatic electrophilic substitution reaction. Therefore, in many cases, it is not necessary to use a Brønsted base. However, leaving ability of an amino group or an alkoxy group is low, and therefore it is effective to use a Lewis acid that promotes leaving of these groups.

A compound represented by formula (2) or a multimer thereof also includes compounds in which at least a portion of hydrogen atoms are substituted by deuterium atoms or substituted by cyanos or halogen atoms such as fluorine atoms or chlorine atoms. However, these compounds can be synthesized as described above using raw materials that are deuterated, fluorinated, chlorinated or cyanated at desired sites.

5. Organic Device

The polycyclic aromatic compound according to the present invention can be used as a material for an organic device. Examples of the organic device include an organic electroluminescent element, an organic field effect transistor, and an organic thin film solar cell.

5-1. Organic Electroluminescent Element

The polycyclic aromatic compound represented by the general formula (1) can be used as, for example, a material for an organic electroluminescent element. Hereinafter, an organic EL element according to the present embodiment will be described in detail based on the drawings. FIG. 1 is a schematic cross-sectional view illustrating the organic EL element according to the present embodiment.

<Structure of Organic Electroluminescent Element>

An organic electroluminescent element 100 illustrated in FIG. 1 includes a substrate 101, a positive electrode 102 disposed on the substrate 101, a hole injection layer 103 disposed on the positive electrode 102, a hole transport layer 104 disposed on the hole injection layer 103, a light emitting layer 105 disposed on the hole transport layer 104, an electron transport layer 106 disposed on the light emitting layer 105, an electron injection layer 107 disposed on the electron transport layer 106, and a negative electrode 108 disposed on the electron injection layer 107.

Incidentally, the organic electroluminescent element 100 may be configured, by reversing the manufacturing order, to include, for example, the substrate 101, the negative electrode 108 disposed on the substrate 101, the electron injection layer 107 disposed on the negative electrode 108, the electron transport layer 106 disposed on the electron injection layer 107, the light emitting layer 105 disposed on the electron transport layer 106, the hole transport layer 104 disposed on the light emitting layer 105, the hole injection layer 103 disposed on the hole transport layer 104, and the positive electrode 102 disposed on the hole injection layer 103.

Not all of the above layers are essential. The configuration includes the positive electrode 102, the light emitting layer 105, and the negative electrode 108 as a minimum constituent unit, and optionally includes the hole injection layer 103, the hole transport layer 104, the electron transport layer 106, and the electron injection layer 107. Each of the above layers may be formed of a single layer or a plurality of layers.

A form of layers constituting the organic electroluminescent element may be, in addition to the above configuration form of "substrate/positive electrode/hole injection layer/hole transport layer/light emitting layer/electron transport layer/electron injection layer/negative electrode", a configuration form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic Electroluminescent Element>

The substrate 101 is a support of the organic electroluminescent element 100, and usually, quartz, glass, a metal, a plastic, and the like are used. The substrate 101 is formed into a plate shape, a film shape, or a sheet shape according to a purpose, and for example, a glass plate, a metal plate, a metal foil, a plastic film, and a plastic sheet are used therefor. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. An upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode in Organic Electroluminescent Element>

The positive electrode 102 plays a role of injecting a hole into the light emitting layer 105. Incidentally, in a case where at least one of the hole injection layer 103 and the hole transport layer 104 is disposed between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer including polythiophene such as poly(3-methylthiophene), polypyrrole, and polyaniline. In addition to these compounds, a material can be appropriately selected for use from materials used as a positive electrode of an organic electroluminescent element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of ITO can be arbitrarily selected according to a resistance value, but an ITO having a thickness of 50 to 300 nm is often used.

<Hole Injection Layer and Hole Transport Layer in Organic Electroluminescent Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 into the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron (III) chloride to the hole injection/transport material.

A hole injection/transport substance needs to efficiently inject/transport a hole coming from a positive electrode between electrodes to which an electric field is applied, and desirably has a high hole injection efficiency and transports an injected hole efficiently. For this purpose, a substance which has low ionization potential, large hole mobility, and further has excellent stability, and in which impurities serving as traps are not easily generated at the time of manufacturing and at the time of use, is preferable.

As a material to form the hole injection layer 103 and the hole transport layer 104, any compound can be selected for use from compounds that have been conventionally used as charge transport materials for holes in a photoconductive material, p-type semiconductors, and known compounds used in a hole injection layer and a hole transport layer of an organic electroluminescent element.

Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4$,$N^{4'}$-diphenyl-$N^4$,$N^{4'}$-bis(9-phenyl-9H-carbazol-3-yl)-[1,1'-biphenyl]-4,4'-diamine, $N^4$,$N^4$,$N^{4'}$,$N^{4'}$-tetra[1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film needed for manufacturing a luminescent element, can inject a hole from a positive electrode, and can transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, literature "M. Pfeiffer, A. Beyer, T. Fritz, K. Leo, Appl. Phys. Lett., 73(22), 3202-3204 (1998)" and literature "J. Blochwitz, M. Pheiffer, T. Fritz, K. Leo, Appl. Phys. Lett., 73(6), 729-731 (1998)"). These compounds generate a so-called hole by an electron migrating process in an electron-donating type base substance (hole transport substance). Electroconductivity of the base substance depends on the number and mobility of the holes fairly significantly. Known examples of a matrix substance having a hole transport characteristic include a benzidine derivative (TPD and the like), a starburst amine derivative (TDATA and the like), and a specific metal phthalocyanine (particularly, zinc phthalocyanine (ZnPc) and the like) (JP 2005-167175 A).

<Light Emitting Layer in Organic Electroluminescent Element>

The light emitting layer 105 is a layer that emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape and exhibits a strong light emission (fluorescence) efficiency in a solid state. For example, a material for the light emitting layer containing a polycyclic aromatic compound represented by the above general formula (1) as a host material and at least one of a polycyclic aromatic compound represented by the above general formula (2) and multimer thereof as a dopant material can be used.

The light emitting layer may be formed of a single layer or a plurality of layers, and each layer is formed of a material for a light emitting layer (a host material and a dopant material). Each of the host material and the dopant material may be formed of a single kind, or a combination of a plurality of kinds. The dopant material may be included in the host material wholly or partially. Regarding a doping method, doping can be performed by a co-deposition method with a host material, or alternatively, a dopant material may be mixed in advance with a host material, and then vapor deposition may be performed simultaneously.

The amount of use of a host material depends on the kind of the host material, and is only required to be determined according to a characteristic of the host material. The reference of the amount of use of a host material is preferably from 50 to 99.999% by weight, more preferably from 80 to 99.95% by weight, and still more preferably from 90 to 99.9% by weight with respect to the total amount of a material for a light emitting layer.

The amount of use of the dopant material depends on the kind of the dopant material, and may be determined according to a characteristic of the dopant material. The reference of the amount of use of a dopant is preferably from 0.001 to 50% by weight, more preferably from 0.05 to 20% by weight, and still more preferably from 0.1 to 10% by weight with respect to the total amount of a material for a light emitting layer. The amount of use within the above range is preferable, for example, from a viewpoint of being able to prevent a concentration quenching phenomenon.

Examples of the host material that can be used in combination with a polycyclic aromatic compound represented by the above general formula (1) include a fused ring derivative of anthracene, pyrene, or the like conventionally known as a luminous body, a bisstyryl derivative such as a bisstyrylanthracene derivative or a distyrylbenzene derivative, a tetraphenylbutadiene derivative, a cyclopentadiene derivative, a fluorene derivative, and a benzofluorene derivative.

Examples of the host material that can be used in combination with a polycyclic aromatic compound represented by the above general formula (1) include a carbazole-based compound and an anthracene-based compound represented by the following formulas.

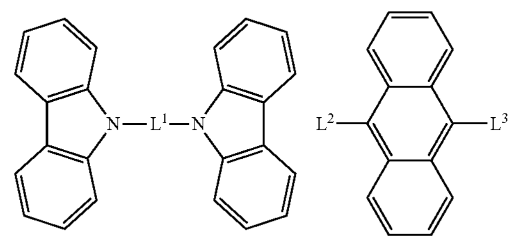

In the above formula, $L^1$ represents an arylene having 6 to 30 carbon atoms or a heteroarylene having 2 to 30 carbon atoms, an arylene having 6 to 24 carbon atoms is preferable, an arylene having 6 to 16 carbon atoms is more preferable, an arylene having 6 to 12 carbon atoms is further preferable, an arylene having 6 to 10 carbon atoms is particularly preferable. And, a heteroarylene having 2 to 25 carbon atoms is preferable, a heteroarylene having 2 to 20 carbon atoms is more preferable, a heteroarylene having 2 to 15 carbon atoms is further preferable, a heteroarylene having 2 to 10 carbon atoms is particularly preferable. Specific examples of arylene include divalent groups represented by remove any two hydrogen atoms from such as a benzene ring, a biphenyl ring, a naphthalene ring, a terphenyl ring, an acenaphthylene ring, a fluorene ring, a phenalene ring, a phenanthrene ring, a triphenylene ring, a pyrene ring, a naphthacene ring, a perylene ring and a pentacene ring. And, specific examples of heteroarylene include divalent groups represented by remove any two hydrogen atoms from such as a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, a phenazacillin ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, a thianthrene ring, an indolocarbazole ring, a benzoindolocarbazole ring, a benzobenzoindolocarbazole ring and a naphtbenzofuran ring.

In the above formula, $L^2$ and $L^3$ represent each independently an aryl having 6 to 30 carbon atoms or a heteroaryl having 2 to 30 carbon atoms. As the aryl, an aryl having 6 to 24 carbon atoms is preferable, an aryl having 6 to 16 carbon atoms is more preferable, an aryl having 6 to 12 carbon atoms is further preferable, an aryl having 6 to 10 carbon atoms is particularly preferable. Specific examples include monovalent groups represented by remove any one hydrogen atom from such as a benzene ring, a biphenyl ring, a naphthalene ring, a terphenyl ring, an acenaphthylene ring, a fluorene ring, a phenalene ring, a phenanthrene ring, a triphenylene ring, a pyrene ring, a naphthacene ring, a perylene ring and a pentacene ring. As the heteroaryl, a heteroaryl having 2 to 25 carbon atoms is preferable, a heteroaryl having 2 to 20 carbon atoms is more preferable, a heteroaryl having 2 to 15 carbon atoms is more preferable, and a heteroaryl having 2 to 10 carbon atoms is particularly preferable. Specific examples include monovalent groups represented by remove any one hydrogen atom from such as a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, a phenazacillin ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, a thianthrene ring, an indolocarbazole ring, a benzoindolocarbazole ring, a benzobenzoindolocarbazole ring and a naphtbenzofuran ring.

At least one hydrogen atom in the carbazole-based compound and the anthracene-based compound represented by the above formulas may be substituted by an alkyl having 1 to 6 carbon atoms, a cycloalkyl having 3 to 14 carbon atoms, cyano, halogen atom, or deuterium atom.

The anthracene-based compound as a host may be, for example, a compound represented by the following general formula (3).

(3)

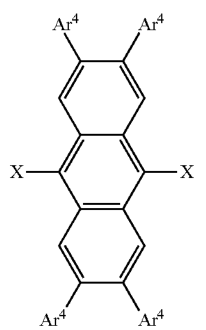

In formula (3),

X and $Ar^4$ each independently represent a hydrogen atom, an optionally substituted aryl, an optionally substituted heteroaryl, an optionally substituted diarylamino, an optionally substituted diheteroarylamino, an optionally substituted arylheteroarylamino, an optionally substituted alkyl, an optionally substituted cycloalkyl, an optionally substituted alkenyl, an optionally substituted alkoxy, an optionally substituted aryloxy, an optionally substituted arylthio, or an optionally substituted silyl, while not all the X's and $Ar^4$'s represent hydrogen atoms simultaneously, and at least one hydrogen atom in the compound represented by formula (3) may be substituted by a halogen atom, a cyano, a deuterium atom, or an optionally substituted heteroaryl.

In addition, a multimer (preferably a dimer) may be formed using the structure represented by the formula (3) as a unit structure. In this case, for example, a form in which the unit structures represented by the formula (3) are bonded to each other via X. Examples of X include a single bond, arylene (such as phenylene, biphenylene, and naphthylene), and heteroarylene (a group having a divalent valence such as a pyridine ring, a dibenzofuran ring, a dibenzothiophene ring, a carbazole ring, a benzocarbazole ring and a phenyl-substituted carbazole ring).

The above aryl, heteroaryl, diarylamino, diheteroarylamino, arylheteroarylamino, alkyl, a cycloalkyl, alkenyl, alkoxy, aryloxy, arylthio, and silyl are described in detail in the following preferable embodiment. In addition, examples of a substituent for these groups include an aryl, a heteroaryl, a diarylamino, a diheteroarylamino, an arylheteroarylamino, an alkyl, a cycloalkyl, an alkenyl, an alkoxy, an aryloxy, an arylthio, and a silyl, and these are also described in detail in the following preferable embodiment.

A preferable embodiment of the anthracene-based compound will be described below. The definitions of symbols in the following structures are the same as the above definitions.

(3)

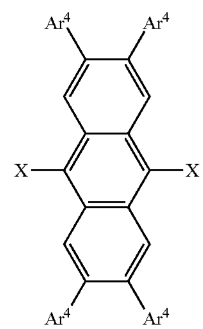

(3-X1)

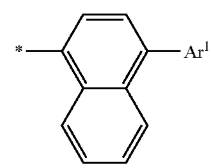

(3-X2)

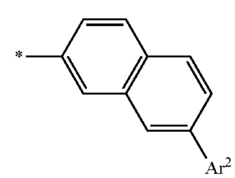

(3-X3)

$* - Ar^3$ (A)

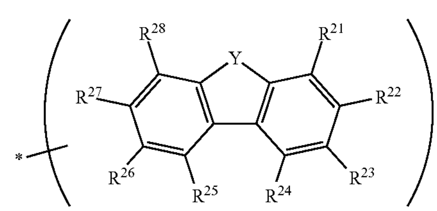

In formula (3), X's each independently represent a group represented by the above formula (3-X1), (3-X2), or (3-X3). The group represented by formula (3-X1), (3-X2), or (3-X3) is bonded to an anthracene ring of formula (3) at *. Preferably, two X's do not simultaneously represent the group represented by formula (3-X3). More preferably, two X's do not simultaneously represent the group represented by formula (3-X2).

In addition, a multimer (preferably a dimer) may be formed using the structure represented by the formula (3) as a unit structure. In this case, for example, a form in which the unit structures represented by the formula (3) are bonded to each other via X. Examples of X include a single bond, arylene (such as phenylene, biphenylene, and naphthylene), and heteroarylene (a group having a divalent valence such as a pyridine ring, a dibenzofuran ring, a dibenzothiophene ring, a carbazole ring, a benzocarbazole ring and a phenyl-substituted carbazole ring).

A naphthylene moiety in formula (3-X1) or (3-X2) may be fused with one benzene ring. A structure fused in this way is as follows.

(3-X1-1)

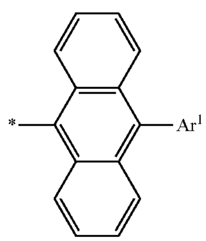

(3-X1-2)

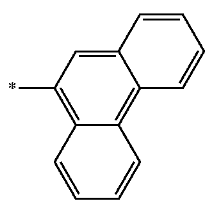

(3-X1-3)

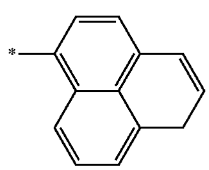

(3-X1-4)

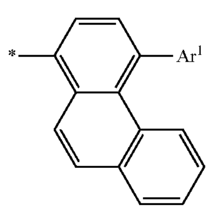

(3-X1-5)

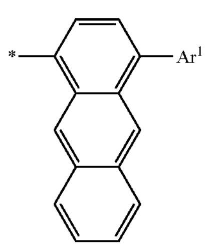

-continued (3-X1-6)

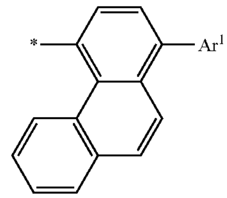

(3-X2-1)

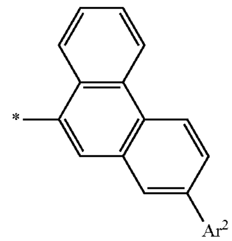

(3-X2-2)

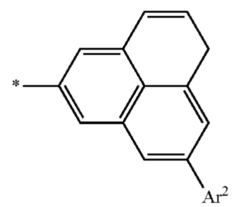

(3-X2-3)

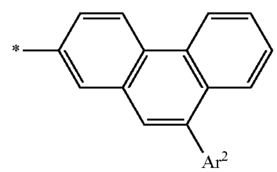

(3-X2-4)

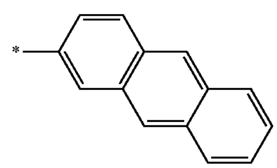

(3-X2-5)

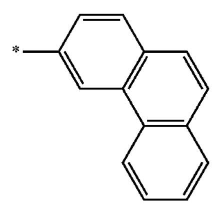

(3-X2-6)

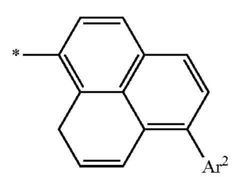

$Ar^1$ and $Ar^2$ each independently represent a hydrogen atom, a phenyl, a biphenylyl, a terphenylyl, a quaterphenylyl, a naphthyl, a phenanthryl, a fluorenyl, a benzofluorenyl, a chrysenyl, a triphenylenyl, a pyrenyl, or a group represented by the above formula (A) (including a carbazolyl group, a benzocarbazolyl group, and a phenyl-substituted carbazolyl group). Incidentally, when $Ar^1$ or $Ar^2$ is a group represented by formula (A), the group represented by formula (A) is bonded to a naphthalene ring in formula (3-X1) or (3-X2) at *.

$Ar^3$ represents a phenyl, a biphenylyl, a terphenylyl, a quaterphenylyl, a naphthyl, a phenanthryl, a fluorenyl, a benzofluorenyl, a chrysenyl, a triphenylenyl, a pyrenyl, or a group represented by the above formula (A) (including a carbazolyl group, a benzocarbazolyl group, and a phenyl-substituted carbazolyl group). Incidentally, when $Ar^3$ is a group represented by formula (A), the group represented by formula (A) is bonded to a single bond indicated by the straight line in formula (3-X3) at *. That is, the anthracene ring of formula (3) and the group represented by formula (A) are directly bonded to each other.

$Ar^3$ may have a substituent, and at least one hydrogen atom in $Ar^3$ may be further substituted by an alkyl having 1 to 4 carbon atoms, a cycloalkyl having 5 to 10 carbon atoms, a phenyl, a biphenylyl, a terphenylyl, a naphthyl, a phenanthryl, a fluorenyl, a chrysenyl, a triphenylenyl, a pyrenyl, or a group represented by the above formula (A) (including a carbazolyl group and a phenyl-substituted carbazolyl group). Incidentally, when the substituent possessed by $Ar^3$ is a group represented by formula (A), the group represented by formula (A) is bonded to $Ar^3$ in formula (3-X3) at *.

$Ar^4$'s each independently represent a hydrogen atom, a phenyl, a biphenylyl, a terphenylyl, a naphthyl, or a silyl substituted by at least one of an alkyl having 1 to 4 carbon atoms (such as a methyl, an ethyl and t-butyl) and a cycloalkyl having 5 to 10 carbon atoms.

Examples of the alkyl having 1 to 4 carbon atoms by which a silyl is substituted include a methyl, an ethyl, a propyl, an i-propyl, a butyl, a sec-butyl, a t-butyl, and a cyclobutyl, and three hydrogen atoms in the silyl are each independently substituted by the alkyl.

Specific examples of the "silyl substituted by alkyl having 1 to 4 carbon atoms" include a trimethylsilyl, a triethylsilyl, a tripropylsilyl, a tri-i-propylsilyl, a tributylsilyl, a tri sec-butylsilyl, a tri-t-butylsilyl, an ethyl dimethylsilyl, a propyldimethylsilyl, an i-propyldimethylsilyl, a butyldimethylsilyl, a sec-butyldimethylsilyl, a t-butyldimethylsilyl, a methyldiethylsilyl, a propyldiethylsilyl, an i-propyldiethylsilyl, a butyldiethylsilyl, a sec-butyl diethylsilyl, a t-butyldiethylsilyl, a methyldipropylsilyl, an ethyldipropylsilyl, a butyldipropylsilyl, a sec-butyldipropylsilyl, a t-butyldipropylsilyl, a methyl di-i-propylsilyl, an ethyl di-i-propylsilyl, a butyl di-i-propylsilyl, a sec-butyl di-i-propylsilyl, and a t-butyl di-i-propylsilyl.

Examples of the cycloalkyl having 5 to 10 carbon atoms by which a silyl is substituted include cyclopentyl, cyclohexyl, cycloheptyl, cyclooctyl, cyclononyl, cyclodecyl, Norbornenyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, decahydronaphthalenyl, and decahydroazulenyl, and three hydrogen atoms in the silyl are each independently substituted by the cycloalkyl.

Specific examples of the "silyl substituted by cycloalkyl having 5 to 10 carbon atoms" include tricyclopentylsilyl and tricyclohexylsilyl.

The substituted silyls include a dialkylcycloalkylsilyl substituted by two alkyls and one cycloalkyl, and an alkyldicycloalkylsilyl substituted by one alkyl and two cycloalkyls. Specific examples of the alkyl and cycloalkyl for substitution include the groups described above.

Furthermore, a hydrogen atom in a chemical structure of an anthracene-based compound represented by general formula (3) may be substituted by a group represented by the above formula (A). When the hydrogen atom is substituted by a group represented by formula (A), at least one hydrogen atom in the compound represented by formula (3) is substituted by the group represented by formula (A) at *.

The group represented by formula (A) is one of substituents that can be possessed by an anthracene-based compound represented by formula (3).

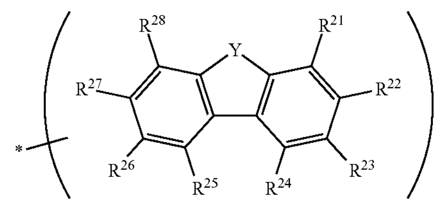

(A)

In the above formula (A), Y represents —O—, —S—, or >N— $R^{29}$, $R^{21}$ to $R^{28}$ each independently represent a hydrogen atom, an optionally substituted alkyl, an optionally substituted cycloalkyl, an optionally substituted aryl, an optionally substituted heteroaryl, an optionally substituted alkoxy, an optionally substituted aryloxy, an optionally substituted arylthio, a trialkylsilyl, a tricycloalkylsilyl, a dialkylcycloalkylsilyl, an alkyldicycloalkylsilyl, an optionally substituted amino, a halogen atom, a hydroxy, or a cyano, adjacent groups out of $R^{21}$ to $R^{28}$ may be bonded to each other to form a hydrocarbon ring, an aryl ring, or a heteroaryl ring, and $R^{29}$ represents a hydrogen atom or an optionally substituted aryl.

The "alkyl" as the "optionally substituted alkyl" in $R^{21}$ to $R^{28}$ may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable.

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

The "cycloalkyl" as the "optionally substituted cycloalkyl" in $R^{21}$ to $R^{29}$ include a cycloalkyl having 3 to 24 carbon atoms, a cycloalkyl having 3 to 20 carbon atoms, a cycloalkyl having 3 to 16 carbon atoms, a cycloalkyl having 3 to 14 carbon atoms, a cycloalkyl having 5 to 10 carbon atoms, a cycloalkyl having 5 to 8 carbon atoms, a cycloalkyl having 5 or 6 carbon atoms, and a cycloalkyl having 5 carbon atoms.

Specific examples of the "cycloalkyl" include cyclopropyl, cyclobutyl, cyclopentyl, cyclohexyl, cycloheptyl, cyclooctyl, cyclononyl, cyclodecyl, and alkyl having 1 to 4 carbon atoms (especially, methyl) substitutes thereof, norbornenyl, bicyclo[1.0.1]butyl, bicyclo[1.1.1]pentyl, bicyclo [2.0.1]pentyl, bicyclo[1.2.1]hexyl, bicyclo[3.0.1]hexyl, bicyclo[2.1.2]heptyl, bicyclo[2.2.2]octyl, adamantyl, diamantyl, decahydronaphthalenyl, and decahydroazulenyl.

Examples of the "aryl" as the "optionally substituted aryl" in $R^{21}$ to $R^{28}$ include an aryl having 6 to 30 carbon atoms. An aryl having 6 to 16 carbon atoms is preferable, an aryl having 6 to 12 carbon atoms is more preferable, and an aryl having 6 to 10 carbon atoms is particularly preferable.

Specific examples of the "aryl" include phenyl which is a monocyclic system; biphenylyl which is a bicyclic system; naphthyl which is a fused bicyclic system; terphenylyl (m-terphenylyl, o-terphenylyl, or p-terphenylyl) which is a tricyclic system; acenaphthylenyl, fluorenyl, phenalenyl, and phenanthrenyl which are fused tricyclic systems; triphenylenyl, pyrenyl, and naphthacenyl which are fused tetracyclic systems; and perylenyl and pentacenyl which are fused pentacyclic systems.

Examples of the "heteroaryl" as the "optionally substituted heteroaryl" in $R^{21}$ to $R^{28}$ include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the heteroaryl include a heterocyclic ring containing 1 to 5 heteroatoms, selected from an oxygen atom, a sulfur atom, and a nitrogen atom in addition to a carbon atom as a ring-constituting atom.

Specific examples of the "heteroaryl" include pyrrolyl, oxazolyl, isoxazolyl, thiazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, pteridinyl, carbazolyl, acridinyl, phenoxathiinyl, phenoxazinyl, phenothiazinyl, phenazinyl, phenazasilinyl, indolizinyl, furanyl, benzofuranyl, isobenzofuranyl, dibenzofuranyl, naphthobenzofuranyl, thiophenyl, benzothiophenyl, isobenzothiophenyl, dibenzothiophenyl, naphtobenzothiophenyl, benzophosphoryl, dibenzophosphoryl, a monovalent group represented by removing any one hydrogen atom from a benzophosphole oxide ring, a monovalent group represented by removing any one hydrogen atom from a dibenzophosphole oxide ring, furazanyl, thianthrenyl, indolocarbazolyl, benzoindolocarbazolyl, and benzobenzoindolocarbazolyl.

Examples of the "alkoxy" as the "optionally substituted alkoxy" in $R^{21}$ to $R^{28}$ include a linear alkoxy having 1 to 24 carbon atoms and a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 to 4 carbon atoms) is particularly preferable.

Specific examples of the "alkoxy" include a methoxy, an ethoxy, a propoxy, an isopropoxy, a butoxy, an isobutoxy, a s-butoxy, a t-butoxy, a pentyloxy, a hexyloxy, a heptyloxy, an octyloxy, and the like.

Examples of the "aryloxy" as the "optionally substituted aryloxy" in $R^{21}$ to $R^{28}$ include a group in which a hydrogen atom of an —OH group is substituted by an aryl. For this aryl, those described as the above "aryl" in $R^{21}$ to $R^{28}$ can be cited.

Examples of the "arylthio" as the "optionally substituted arylthio" in $R^{21}$ to $R^{28}$ include a group in which a hydrogen atom of an —SH group is substituted by an aryl. For this aryl, those described as the above "aryl" in $R^{21}$ to $R^{28}$ can be cited.

Examples of the "trialkylsilyl" in $R^{21}$ to $R^{20}$ include a group in which three hydrogen atoms in a silyl group are each independently substituted by an alkyl. For this alkyl, those described as the above "alkyl" in $R^{21}$ to $R^{28}$ can be cited. A preferable alkyl for substitution is an alkyl having 1 to 4 carbon atoms, and specific examples thereof include methyl, ethyl, propyl, i-propyl, butyl, sec-butyl, t-butyl, cyclobutyl, and the like.

Specific examples of the "trialkylsilyl" include a trimethylsilyl, a triethylsilyl, a tripropylsilyl, a tri-i-propylsilyl, a tributylsilyl, a tri sec-butylsilyl, a tri-t-butylsilyl, an ethyl dimethylsilyl, a propyldimethylsilyl, an i-propyldimethylsilyl, a butyldimethylsilyl, a sec-butyldimethylsilyl, a t-butyldimethylsilyl, a methyldiethylsilyl, a propyldiethylsilyl, an i-propyldiethylsilyl, a butyldiethylsilyl, a sec-butyl diethylsilyl, a t-butyldiethylsilyl, a methyldipropylsilyl, an ethyldipropylsilyl, a butyldipropylsilyl, a sec-butyldipropylsilyl, a t-butyldipropylsilyl, a methyl di-i-propylsilyl, an ethyl di-i-propylsilyl, a butyl di-i-propylsilyl, a sec-butyl di-i-propylsilyl, a t-butyl di-i-propylsilyl, and the like.

Examples of the "tricycloalkylsilyl" in $R^{21}$ to $R^{28}$ include a group in which three hydrogen atoms in a silyl group are each independently substituted by a cycloalkyl. For this cycloalkyl, those described as the above "cycloalkyl" in $R^{21}$ to $R^{28}$ can be cited. A preferable cycloalkyl for substitution is a cycloalkyl having 5 to 10 carbon atoms, and specific examples thereof include cyclopentyl, cyclohexyl, cycloheptyl, cyclooctyl, cyclononyl, cyclodecyl, bicyclo[1.1.1]pentyl, bicyclo[2.0.1]pentyl, bicyclo[1.2.1]hexyl, bicyclo[3.0.1]hexyl, bicyclo[2.1.2]heptyl, bicyclo[2.2.2]octyl, adamantyl, decahydronaphthalenyl, and decahydroazulenyl, and the like.

Specific examples of the "tricycloalkylsilyl" include tricyclopentylsilyl and tricyclohexylsilyl.

Specific examples of the dialkylcycloalkylsilyl substituted by two alkyls and one cycloalkyl and the alkyldicycloalkylsilyl substituted by one alkyl and two cycloalkyls include a silyl substituted by a group selected from the specific alkyls and cycloalkyls described above.

Examples of the "substituted amino" as the "optionally substituted amino" in $R^{21}$ to $R^{29}$ include an amino group in which for example two hydrogen atoms are substituted by an aryl or a heteroaryl. A group in which two hydrogen atoms are substituted by aryls is a diaryl-substituted amino, a group in which two hydrogen atoms are substituted by heteroaryls is a diheteroaryl-substituted amino, and a group in which two hydrogen atom are substituted by an aryl and a heteroaryl is an arylheteroaryl-substituted amino. For the aryl and heteroaryl, those described as the above "aryl" and "heteroaryl" in $R^{21}$ to $R^{28}$ can be cited.

Specific examples of the "substituted amino" include diphenylamino, dinaphthylamino, phenylnaphthylamino, dipyridylamino, phenylpyridylamino, and naphthylpyridylamino.

Examples of the "halogen atom" in $R^{21}$ to $R^{28}$ include a fluorine atom, a chlorine atom, a bromine atom, and an iodine atom.

Some of the groups described as $R^{21}$ to $R^{28}$ may be substituted as described above, and examples of the substituent in this case include an alkyl, a cycloalkyl, an aryl, and a heteroaryl. For the alkyl, cycloalkyl, aryl, or heteroaryl, those described as the above "alkyl", "cycloalkyl", "aryl" or "heteroaryl" in $R^{21}$ to $R^{28}$ can be cited.

$R^{29}$ in ">N—$R^{29}$" as Y is a hydrogen or an optionally substituted aryl. For the aryl, those described as the above "aryl" in $R^{21}$ to $R^{28}$ can be cited. As the substituent, those described as the substituent for $R^{21}$ to $R^{28}$ can be cited.

Adjacent groups among $R^{21}$ to $R^{28}$ may be bonded to each other to form a hydrocarbon ring, an aryl ring, or a heteroaryl ring. Examples of a case of not forming a ring include a group represented by the following formula (A-1). Examples of a case of forming a ring include groups represented by the following formulas (A-2) to (A-14). Y and * in the formula have the same definitions as above. Note that at least one hydrogen atom in a group represented by any one of formulas (A-1) to (A-14) may be substituted by an alkyl, a cycloalkyl, an aryl, a heteroaryl, an alkoxy, an aryloxy, an arylthio, a trialkylsilyl, a tricycloalkylsilyl, a dialkylcycloalkylsilyl, an alkyldicycloalkylsilyl, a diaryl-substituted amino, a diheteroaryl-substituted amino, an aryl-heteroaryl-substituted amino, a halogen atom, a hydroxy, or a cyano.

(A-1)

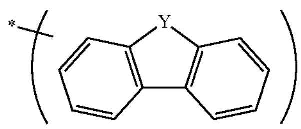

(A-2)

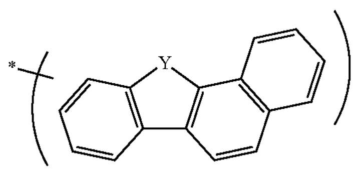

(A-3)

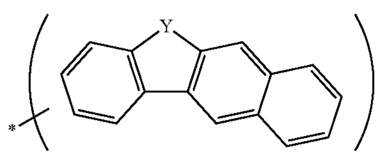

(A-4)

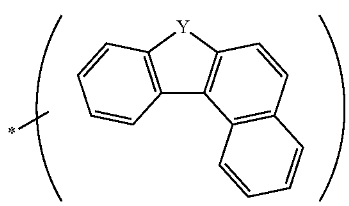

(A-5)

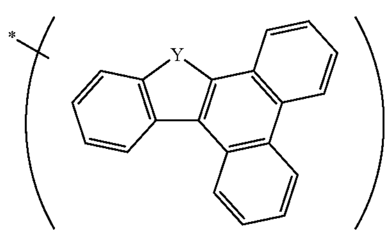

(A-6)

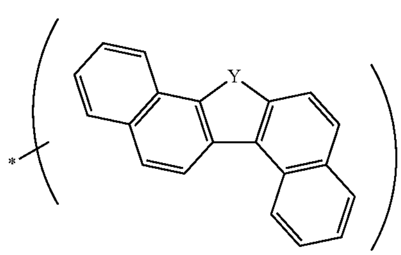

-continued (A-7)

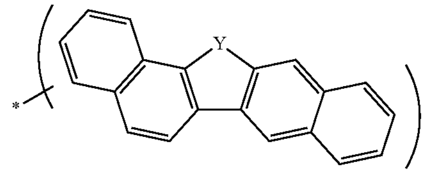

(A-8)

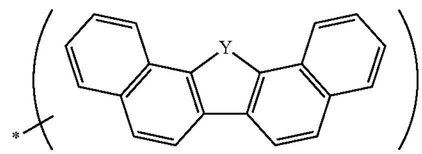

(A-9)

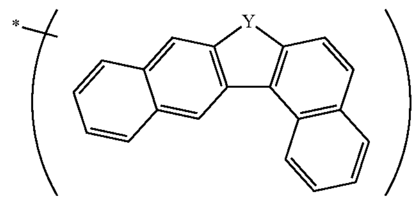

(A-10)

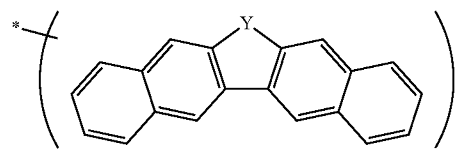

(A-11)

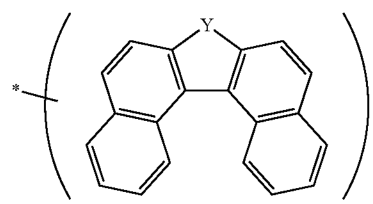

(A-12)

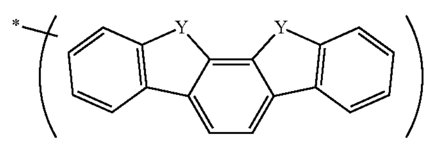

(A-13)

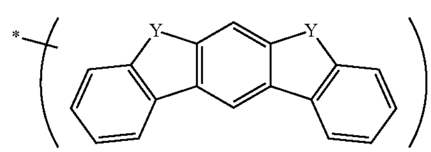

(A-14)

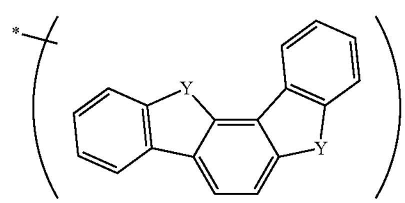

Examples of the ring formed by bonding adjacent groups to each other include a cyclohexane ring in a case of a hydrocarbon ring. Examples of the aryl ring and heteroaryl ring include ring structures described in the above "aryl" and "heteroaryl" in $R^{21}$ to $R^{28}$, and these rings are formed so as to be fused with one or two benzene rings in the above formula (A-1).

Examples of the group represented by formula (A) include a group represented by any one of the above formulas (A-1) to (A-14). A group represented by any one of the above formulas (A-1) to (A-5) and (A-12) to (A-14) is preferable, a group represented by any one of the above formulas (A-1) to (A-4) is more preferable, a group represented by any one of the above formulas (A-1), (A-3), and (A-4) is more preferable, and a group represented by the above formula (A-1) is still more preferable.

The group represented by formula (A), at * in formula (A) is bonded to a naphthalene ring in formula (3-X1) or (3-X2), a single bond in formula (3-X3), or $Ar^3$ in formula (3-X3), and is substituted by at least one hydrogen atom of the compound represented by formula (3) as described above. Among these bonding forms, a form of bonding to at least one of a naphthalene ring in formula (3-X1) or (3-X2), a single bond in formula (3-X3) and $Ar^3$ in formula (3-X3) is preferable.

Bonding positions of the naphthalene ring in formula (3-X1) or (3-X2), the single bond in formula (3-X3), and $Ar^3$ in formula (3-X3) in the structure of the group represented by formula (A), and a position at which at least one hydrogen atom in the compound represented by formula (3) is substituted in the structure of the group represented by formula (A) may be any position in the structure of formula (A). For example, bonding can be made at any one of the two benzene rings in the structure of formula (A), at any ring formed by bonding adjacent groups among $R^{21}$ to $R^{28}$ in the structure of formula (A), or at any position in $R^{29}$ in ">N—$R^{29}$" as Y in the structure of formula (A).

Examples of the group represented by formula (A) include the following groups. Y and * in the formula have the same definitions as above.

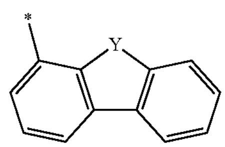

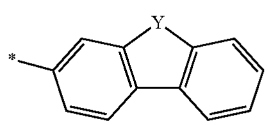

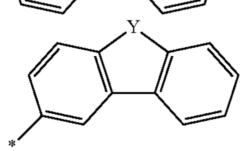

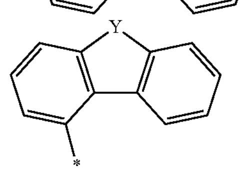

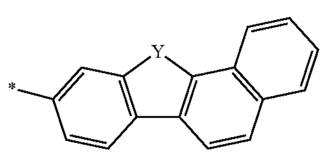

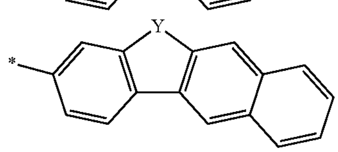

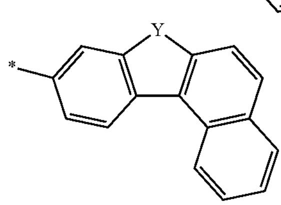

-continued

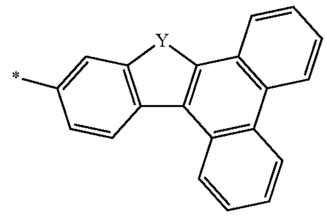

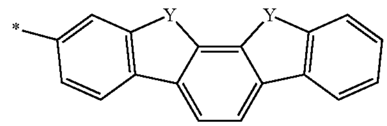

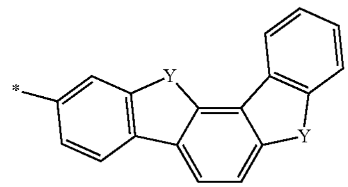

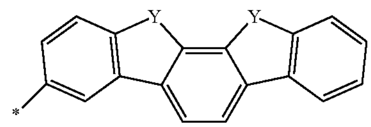

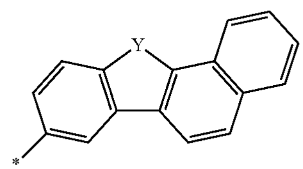

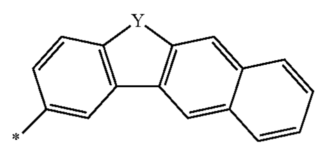

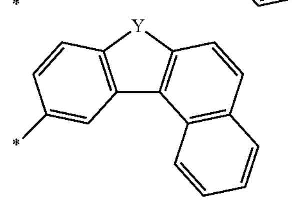

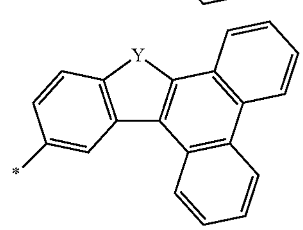

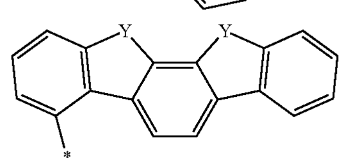

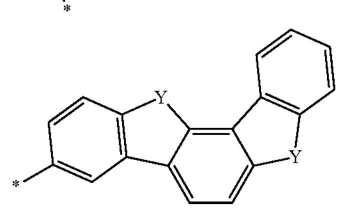

-continued
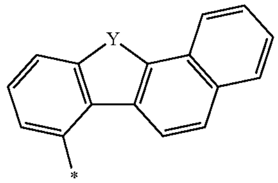
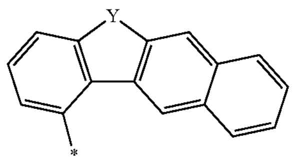
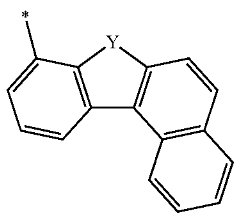
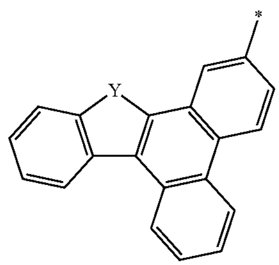
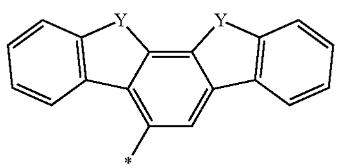
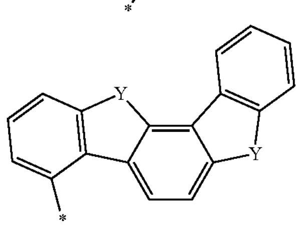
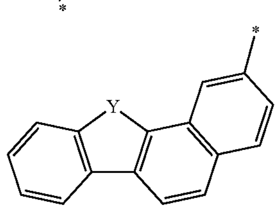
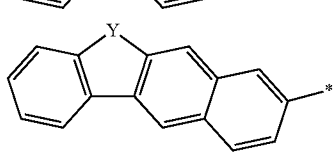
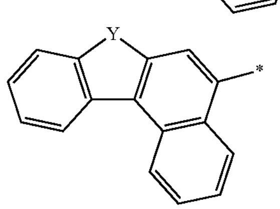
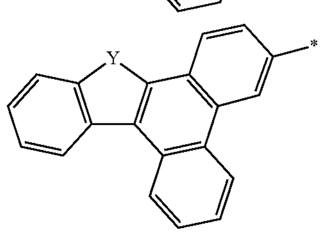
-continued
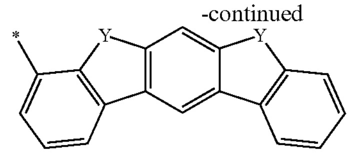
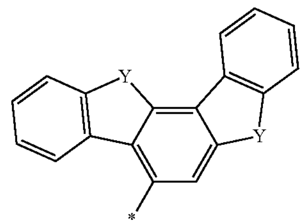
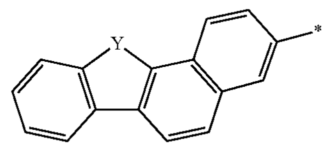
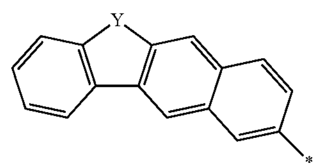
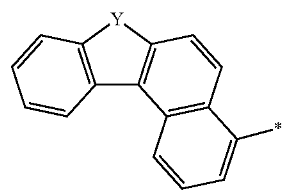
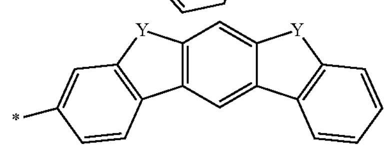
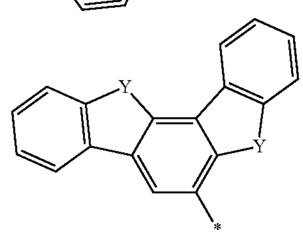
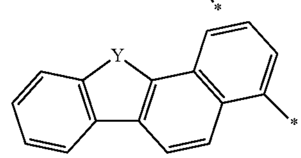
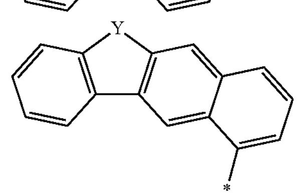
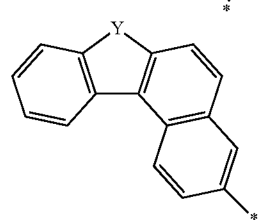

-continued

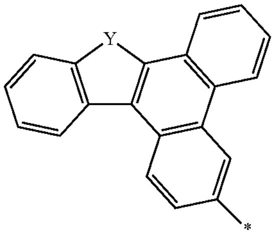

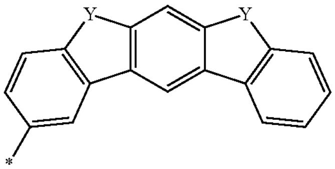

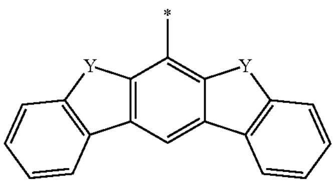

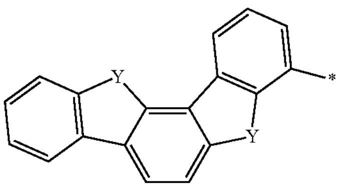

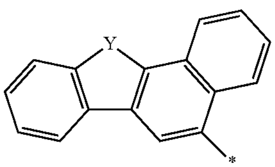

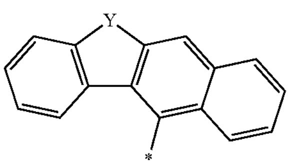

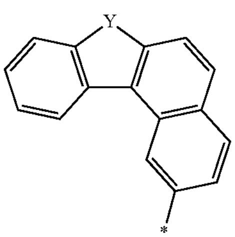

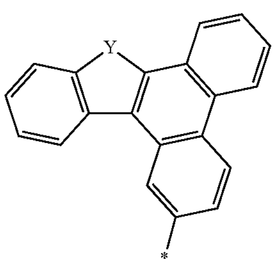

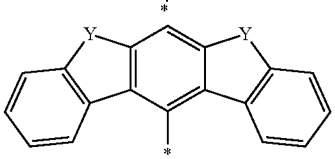

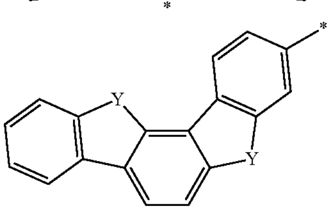

Furthermore, all or a portion of the hydrogen atoms in the chemical structure of an anthracene-based compound represented by general formula (3) may be halogen atoms, cyanos, or deuterium atoms.

Specific examples of the anthracene-based compound include compounds represented by the following formulas (3-1) to (3-72). Incidentally, in the each structural formula, "Me" represents a methyl group, "D" represents a deuterium atom, and "tBu" represents a t-butyl group.

(3-1)

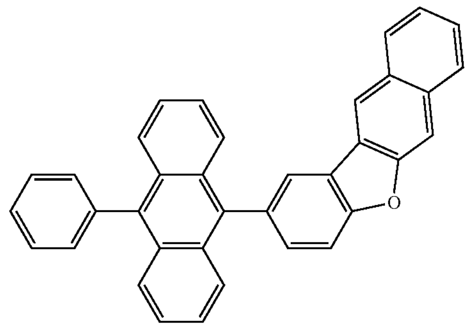

(3-2)

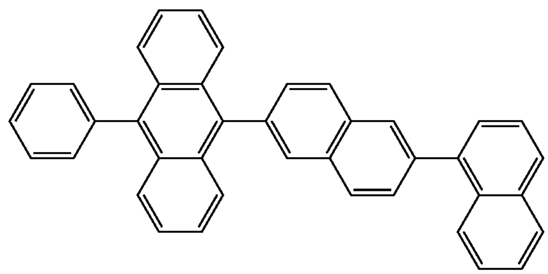

(3-3)

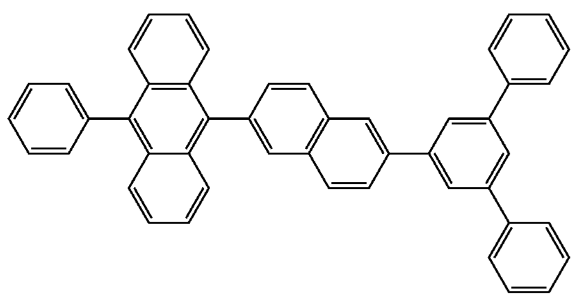

(3-4)

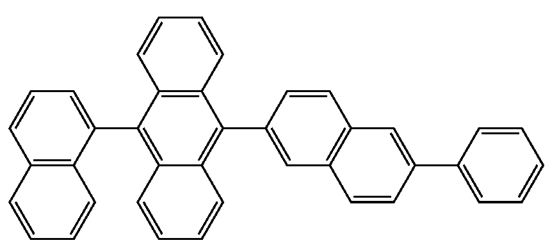

-continued
(3-5)
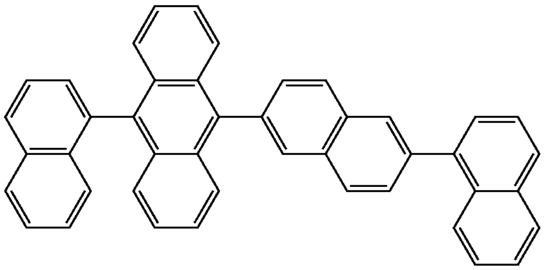
(3-6)
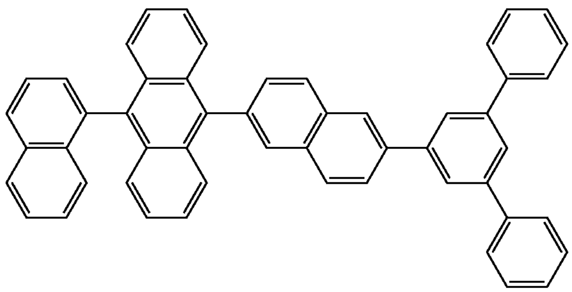
(3-7)
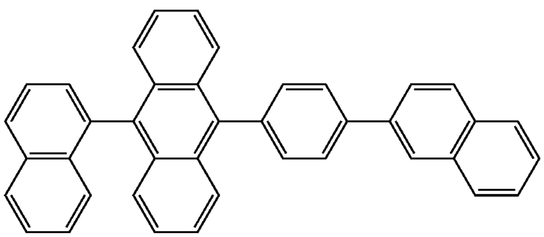
(3-8)
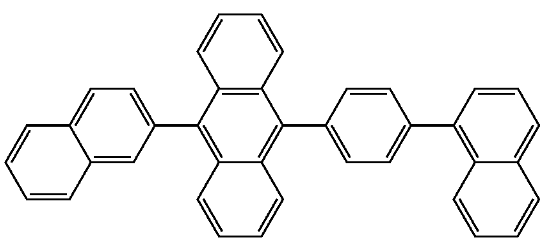
(3-9)
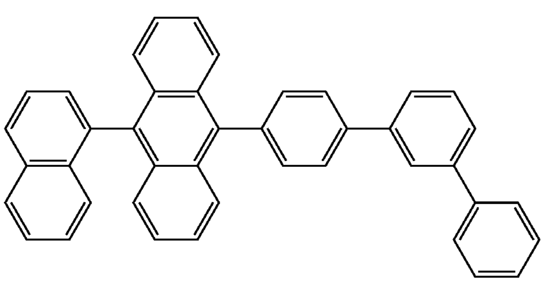
-continued
(3-10)
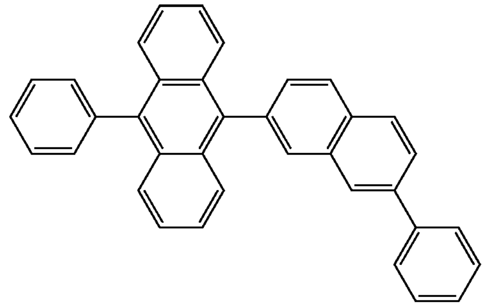
(3-11)
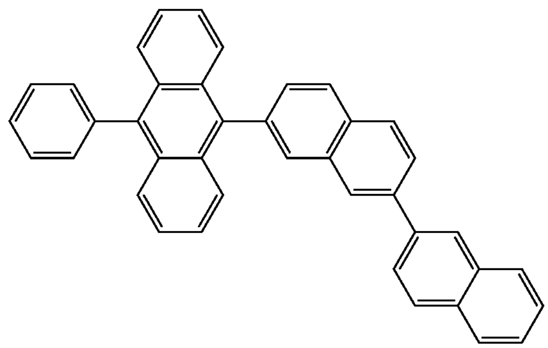
(3-12)
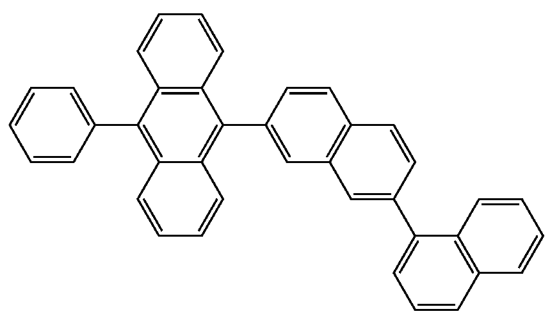
(3-13)
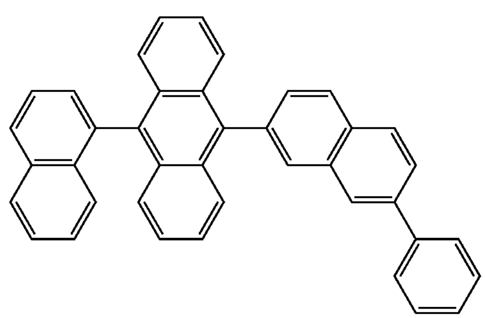

-continued
(3-14)
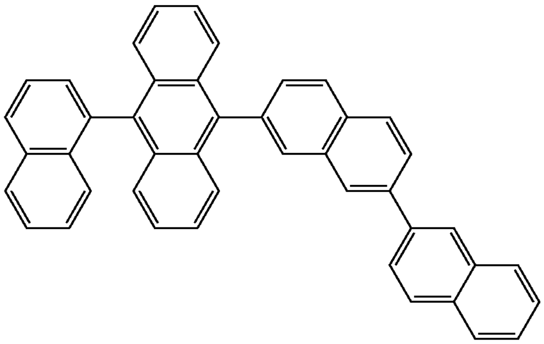
(3-15)
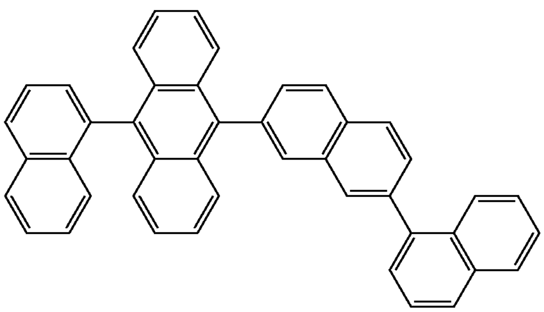
(3-16)
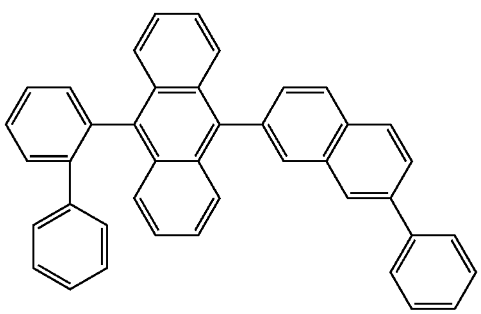
(3-17)
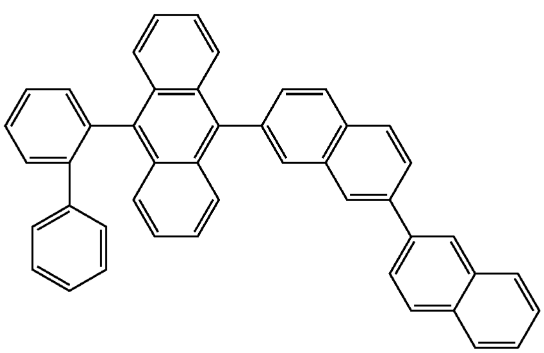
-continued
(3-18)
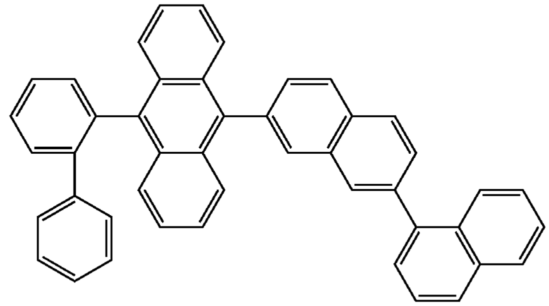
(3-21)
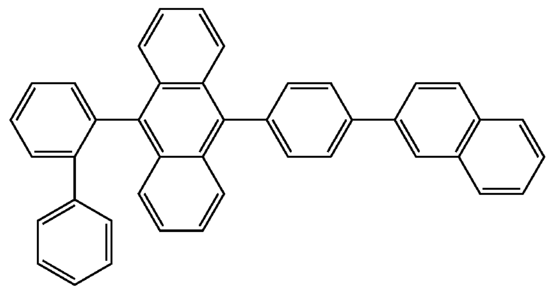
(3-22)
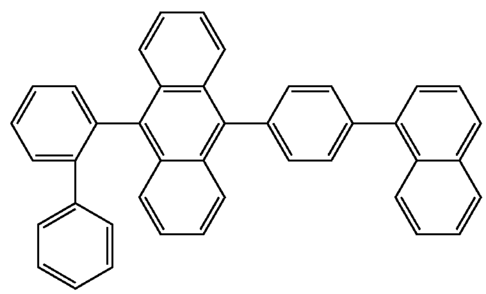
(3-23)
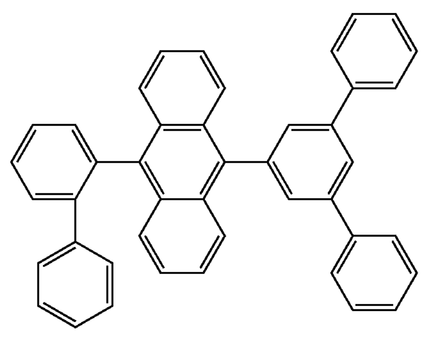
(3-24)
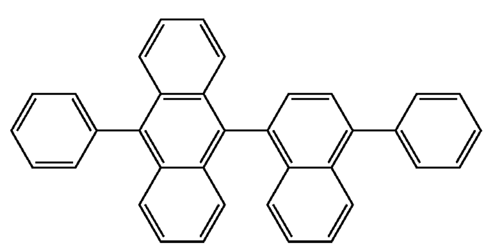

-continued
(3-25)
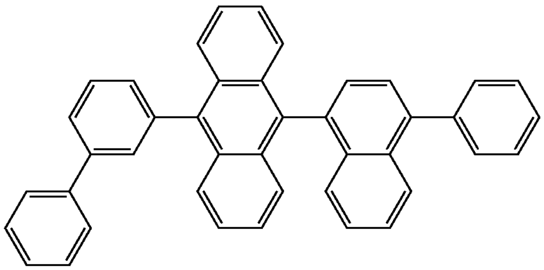
(3-26)
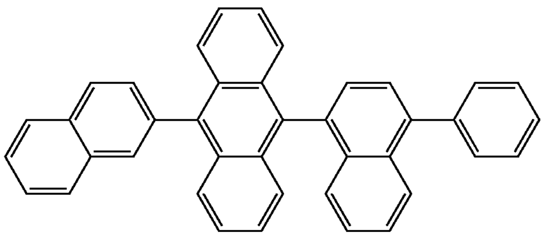
(3-27)
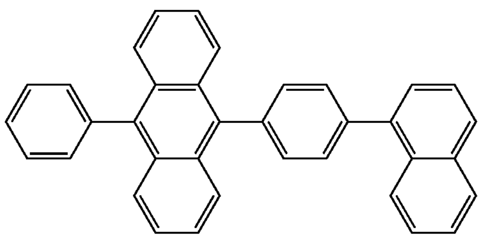
(3-28)
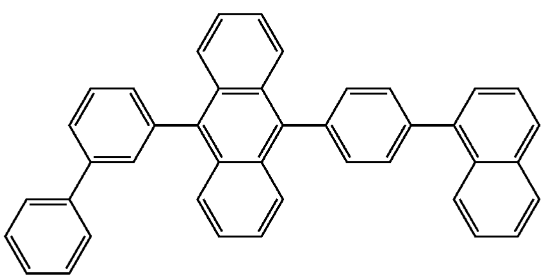
(3-29)
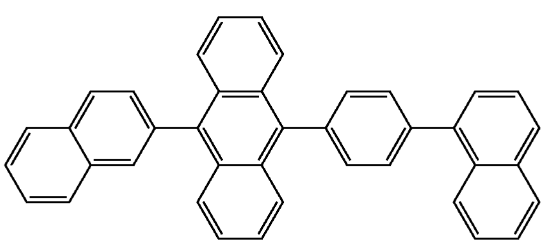
(3-30)
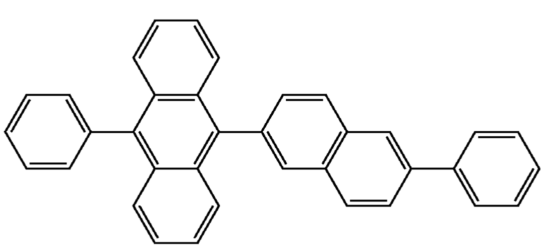
-continued
(3-31)
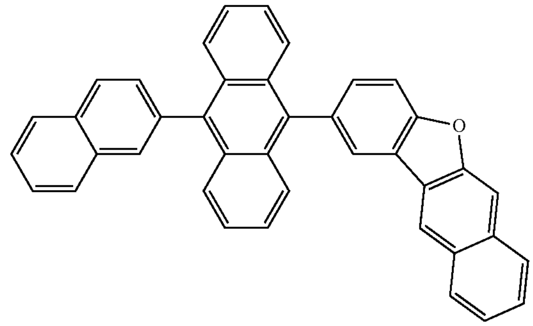
(3-32)
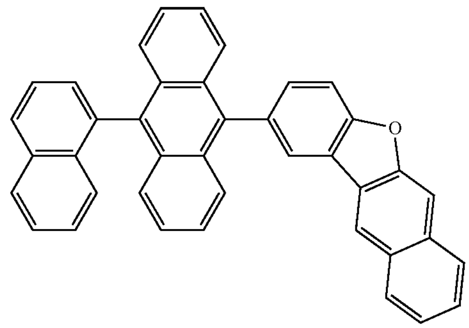
(3-33)
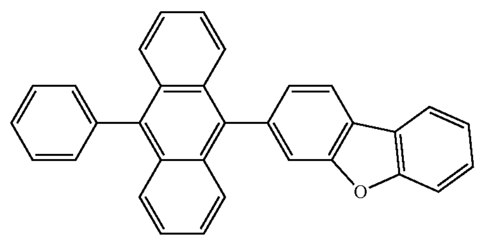
(3-34)
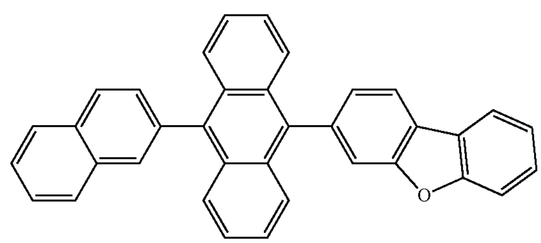
(3-35)
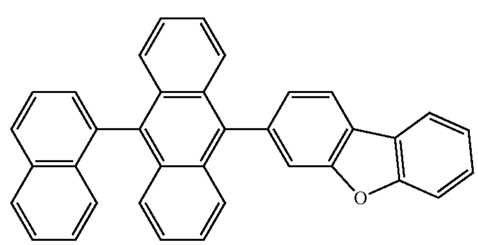

-continued
(3-36)
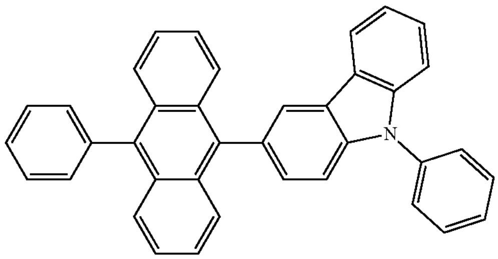
(3-37)
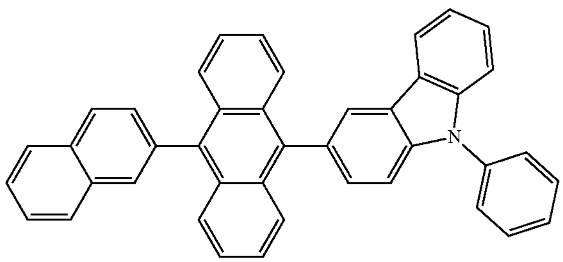
(3-38)
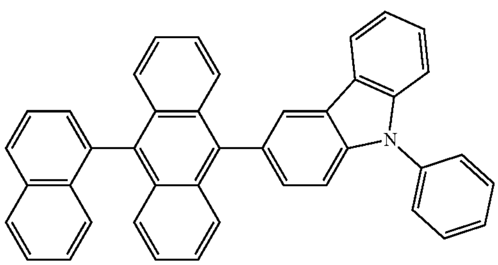
(3-41)
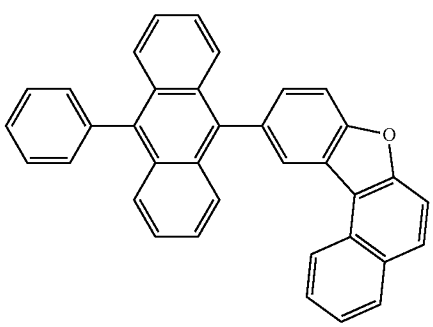
(3-42)
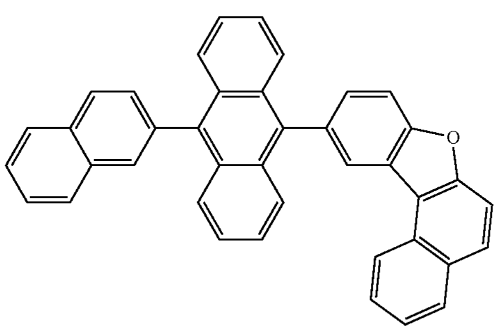
-continued
(3-43)
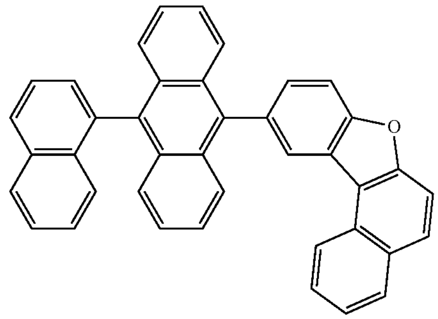
(3-44)
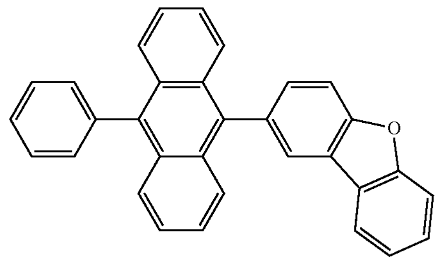
(3-45)
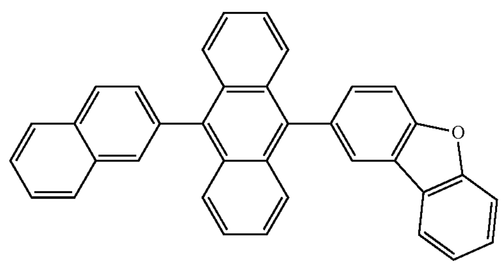
(3-46)
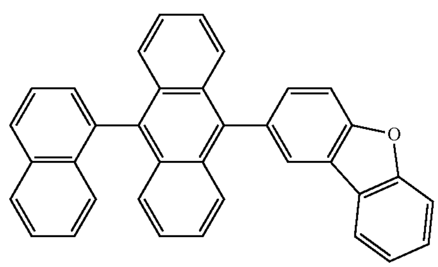
(3-47)
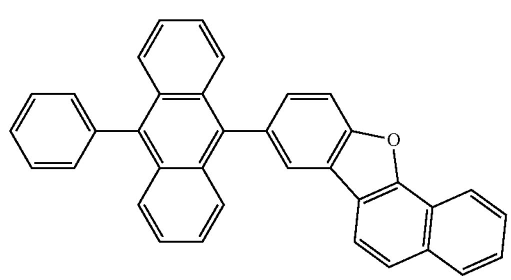

-continued
(3-48)
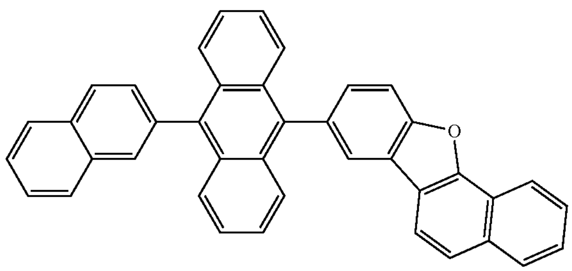
(3-49)
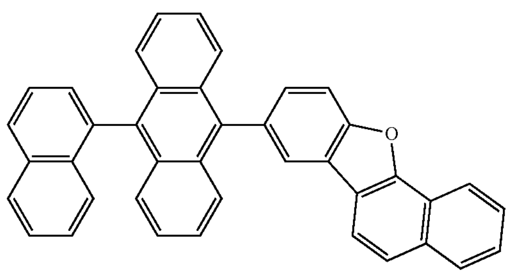
(3-50)
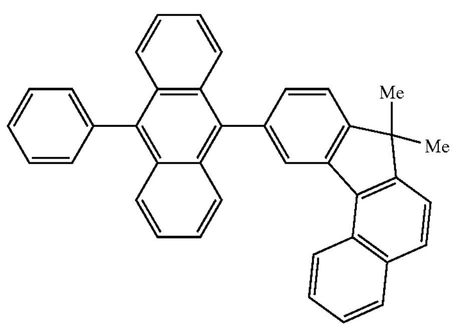
(3-51)
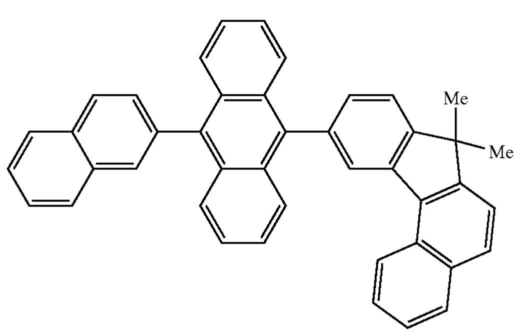
(3-52)
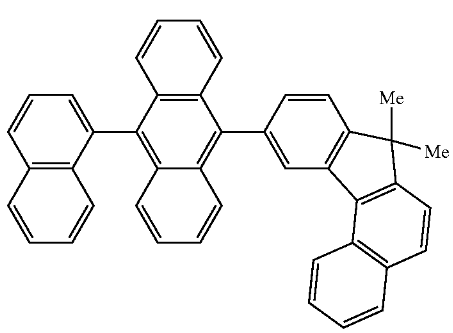
-continued
(3-53)
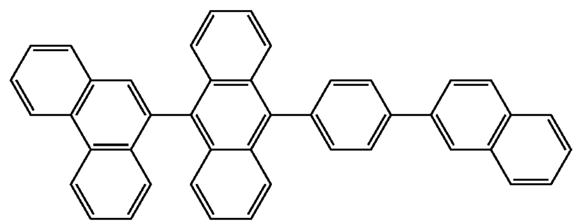
(3-54)
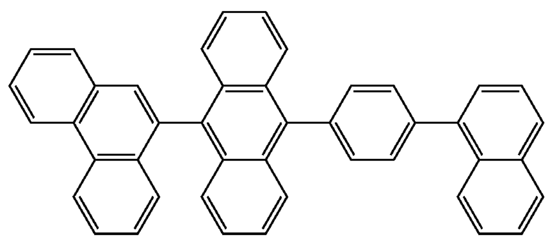
(3-55)
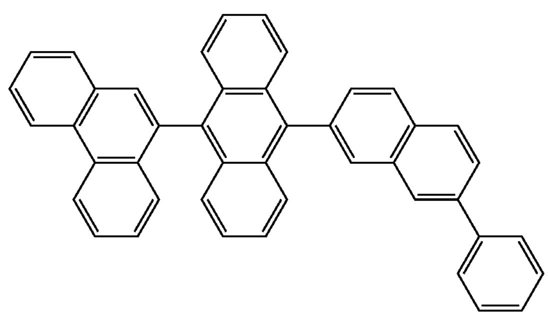
(3-56)
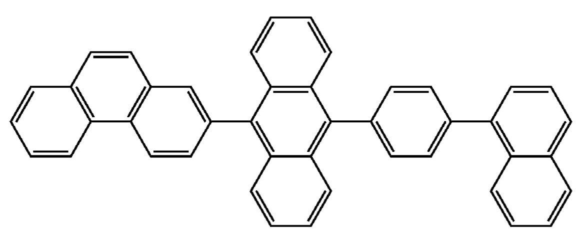
(3-57)
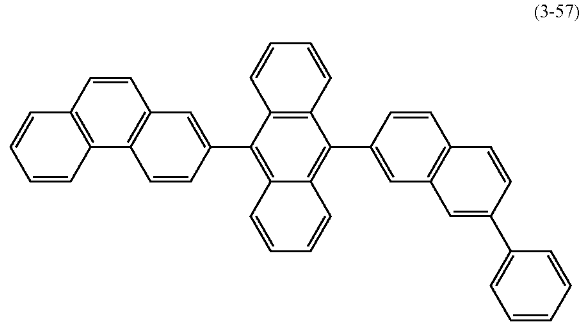

-continued
(3-58)
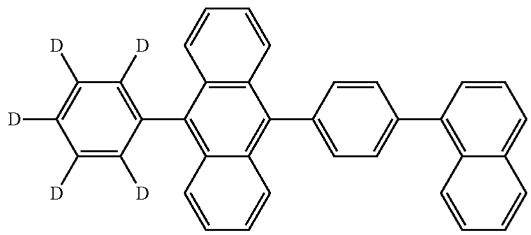
(3-61)
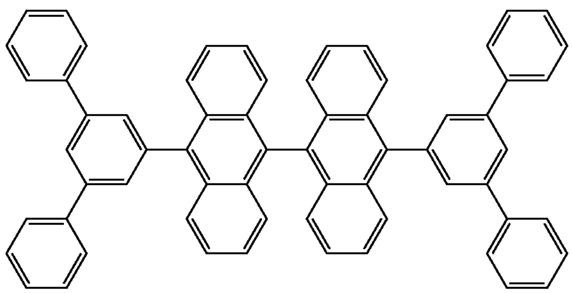
(3-62)
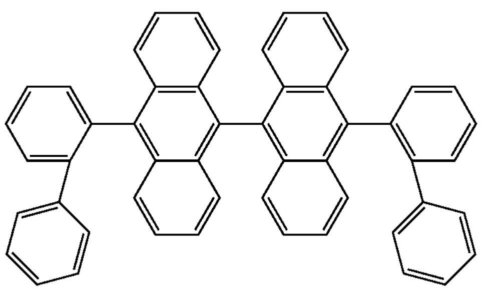
(3-63)
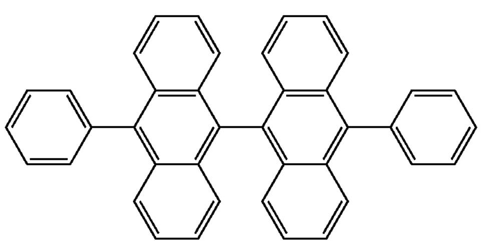
(3-64)
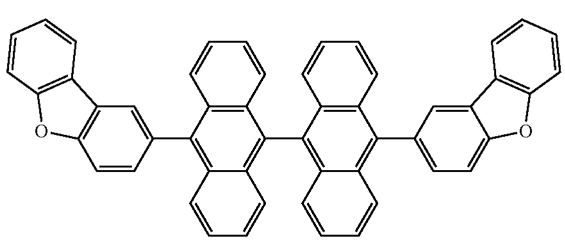
(3-65)
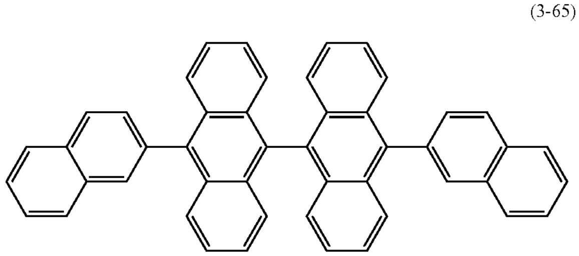
-continued
(3-66)
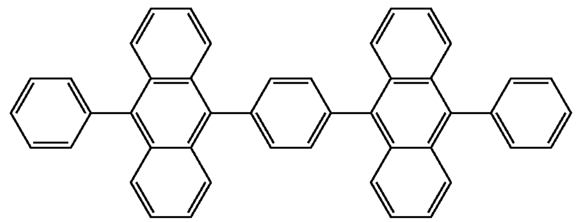
(3-67)
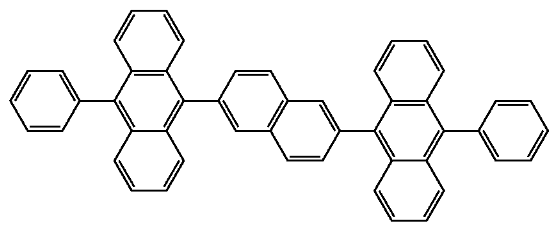
(3-68)
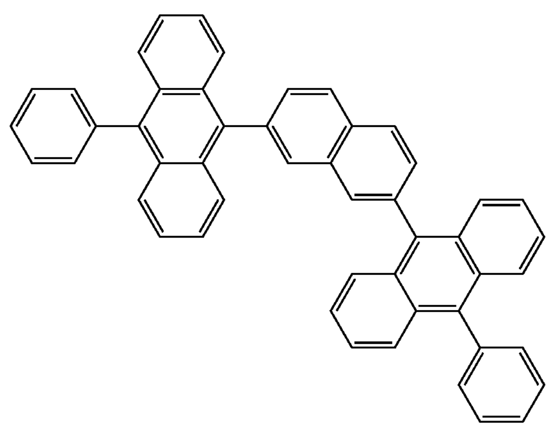
(3-69)
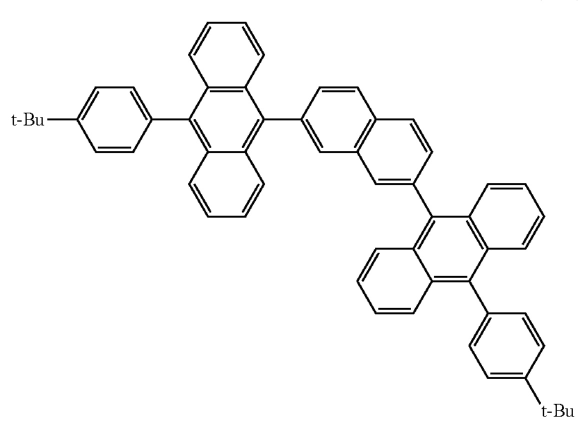

-continued (3-70)

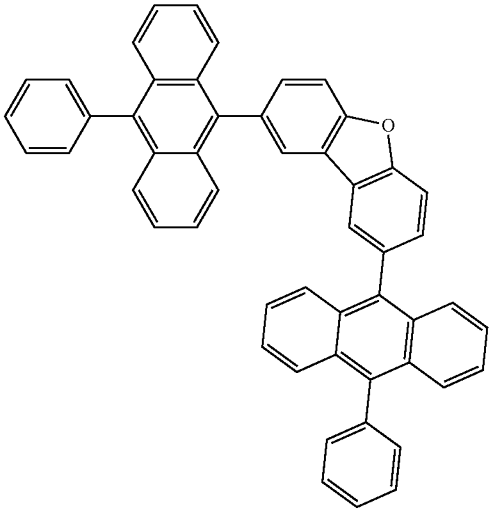

(3-71)

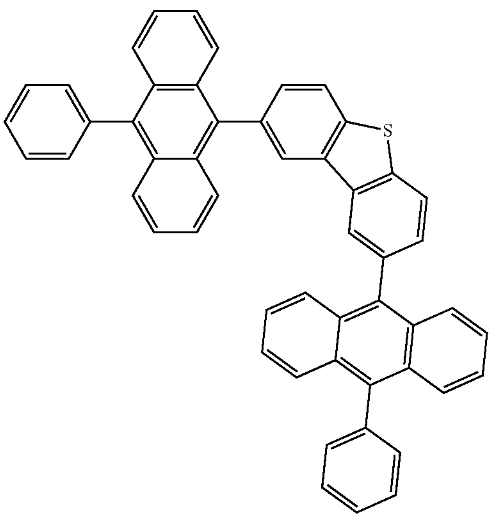

(3-72)

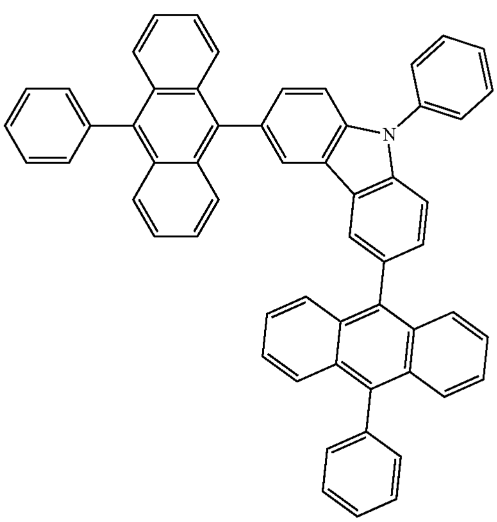

The anthracene-based compound represented by formula (3) can be manufactured by using a compound having a reactive group at desired position of the anthracene skeleton and a compound having a reactive group at partial structure such as X, $Ar^4$, formula (A) and the like as starting raw materials and applying Suzuki coupling, Negishi coupling, or another well-known coupling reaction. Examples of a reactive group of these reactive compounds include a halogen atom and boronic acid. As a specific manufacturing method, for example, the synthesis method in paragraphs [0089] to [0175] of WO 2014/141725 A can be referred to.

Regarding the host material, as other examples, host materials described in Advanced Materials, 2017, 29, 1605444, Journal of Material Chemistry C, 2016, 4, 11355-11381, Chemical Science, 2016, 7, 3355-3363, and Thin Solid Films, 2016, 619, 120-124 can be used. Since the TADF organic EL element requires high Tl energy as a host material of a light emitting layer, the host material for a phosphorescent organic EL element described in Chemistry Society Reviews, 2011, 40, 2943-2970 can also be used as a host material for the TADF organic EL element.

More specifically, the host compound has at least one structure selected from a partial structure (H-A) group represented by the following formulas. At least one hydrogen atom in each structure in the partial structure (H-A) group may be substituted by any structure in the partial structure (H-A) group or a partial structure (H—B) group, and at least one hydrogen atom in these structures may be substituted by a deuterium atom, a halogen atom, cyano, an alkyl having 1 to 4 carbon atoms (for example, methyl or t-butyl), an cycloalkyl having 5 to 10 carbon atoms (for example, cyclohexyl or adamantyl), trimethylsilyl, or phenyl.

(H-A)

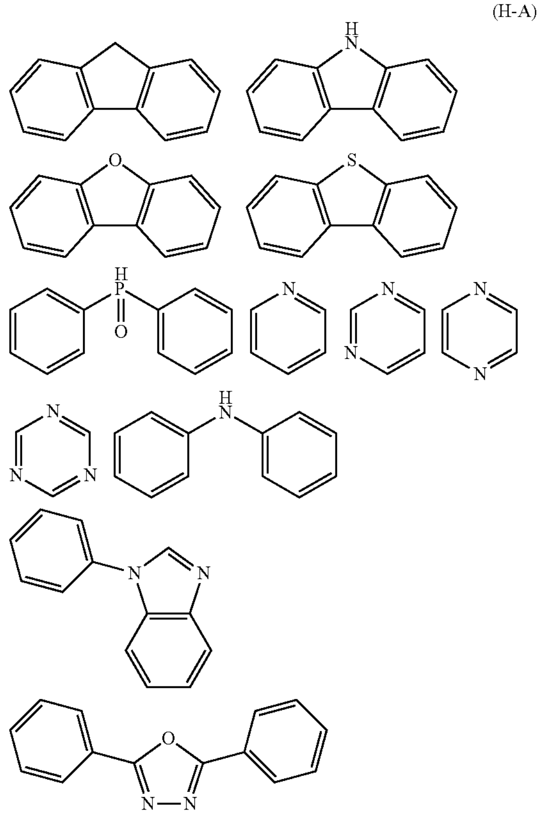

-continued

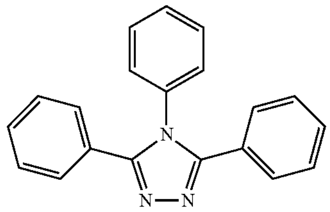

(H-B)

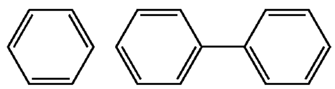

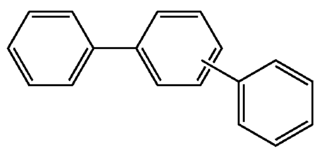

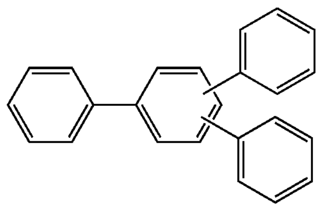

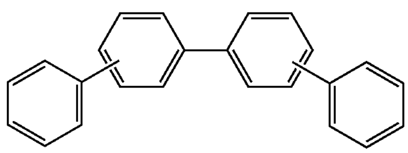

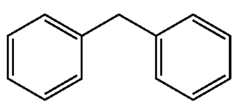

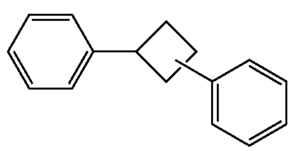

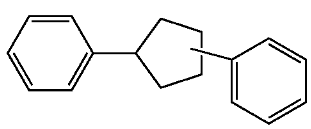

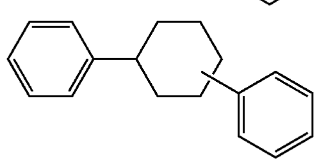

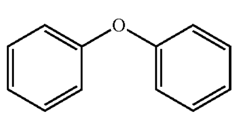

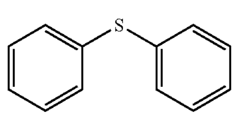

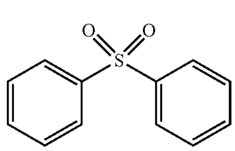

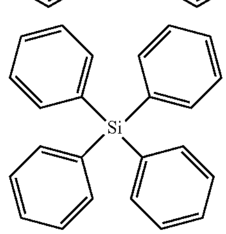

-continued

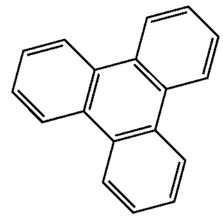

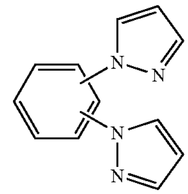

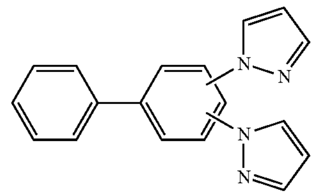

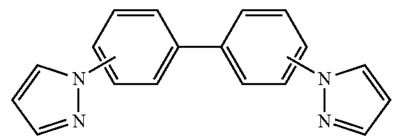

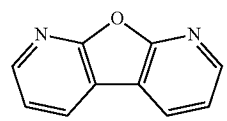

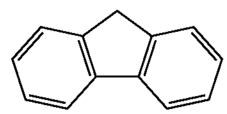

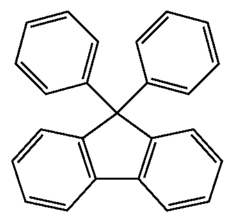

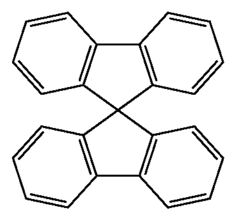

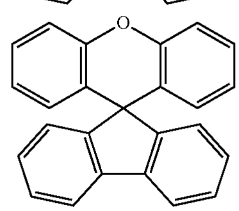

The host compound is preferably a compound represented by any one of structural formulas listed below. Among these compounds, the host compound is more preferably a compound having one to three structures selected from the above partial structure (H-A) group and one structure selected from the above partial structure (H—B) group, still more preferably a compound having a carbazole group as the partial structure (H-A) group, and particularly preferably a compound represented by the following formula (Cz-201), (Cz-202), (Cz-203), (Cz-204), (Cz-212), (Cz-221), (Cz-222), (Cz-261), or (Cz-262). Note that in the structural formulas listed below, at least one hydrogen atom may be substituted by a halogen atom, cyano, an alkyl having 1 to 4 carbon atoms (for example, methyl or t-butyl), an cycloalkyl having 5 to 10 carbon atoms (for example, cyclohexyl or adamantyl), phenyl, naphthyl, or the like.

(Cz-201)
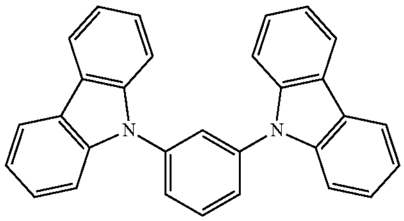
(Cz-202)
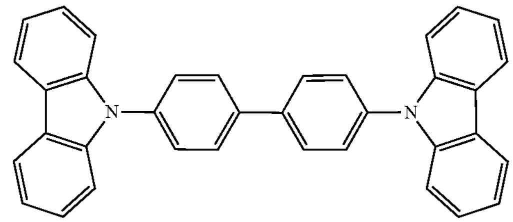
(Cz-203)
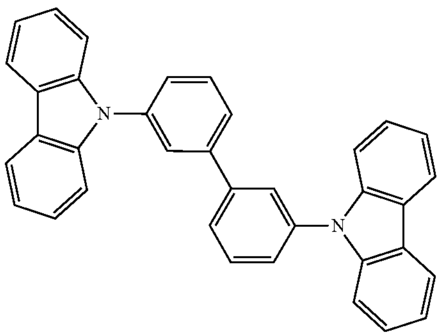
(Cz-204)
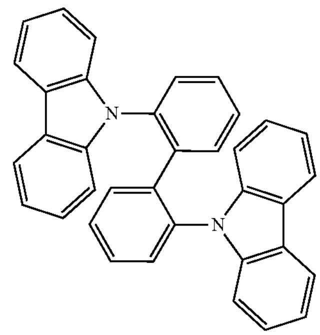
(Cz-212)
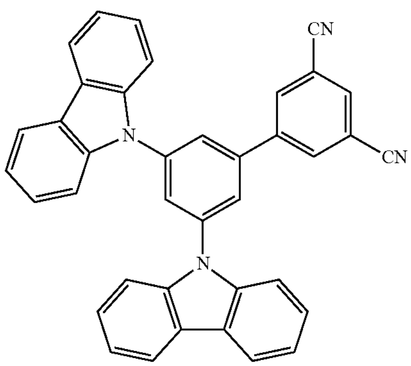
(Cz-221)
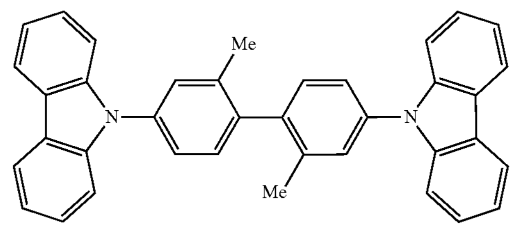
(Cz-222)
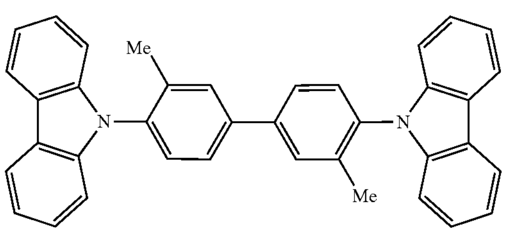
(Cz-261)
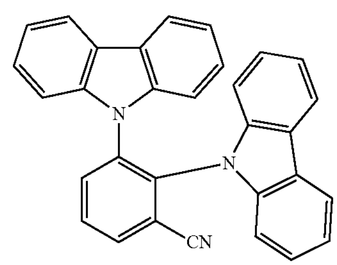
(Cz-262)
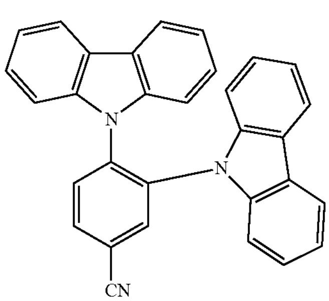

-continued
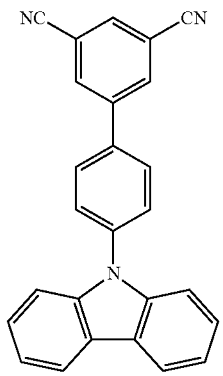
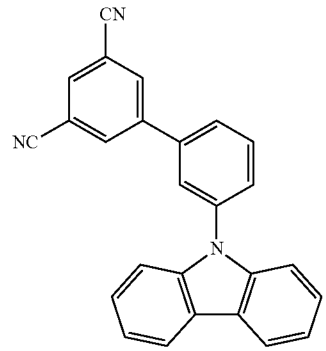
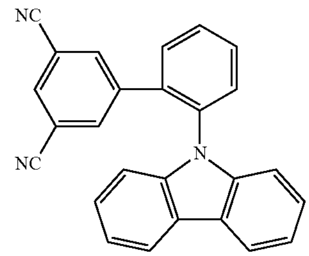
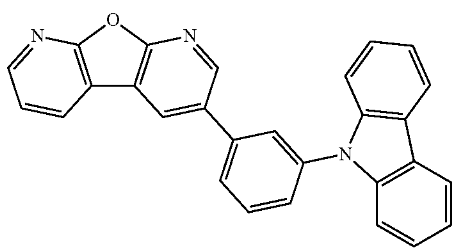
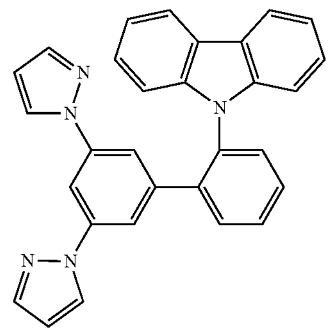
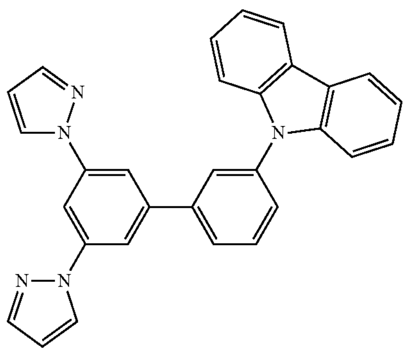
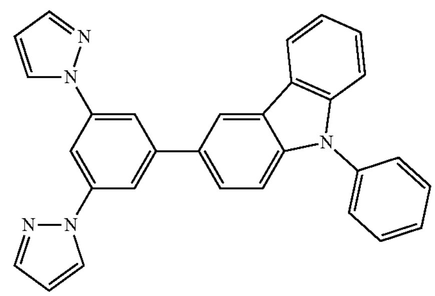
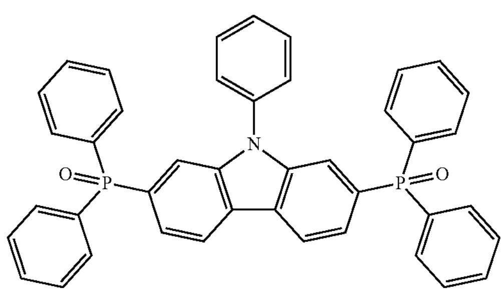
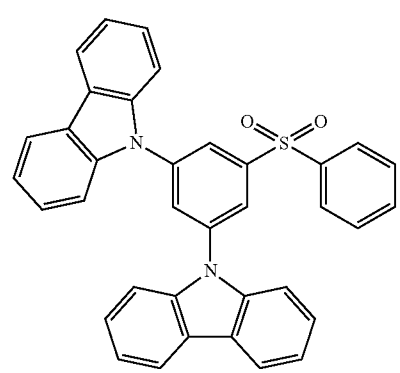
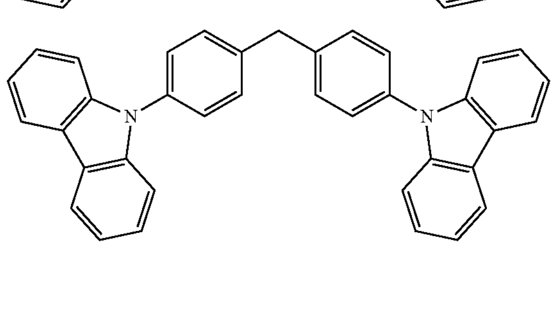
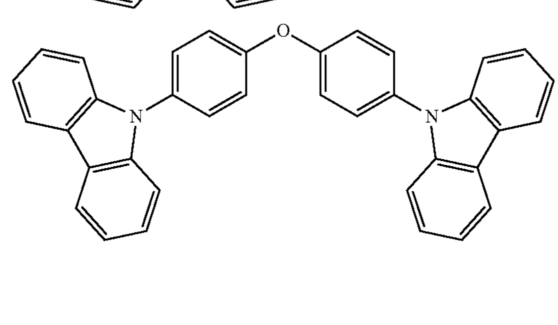

-continued
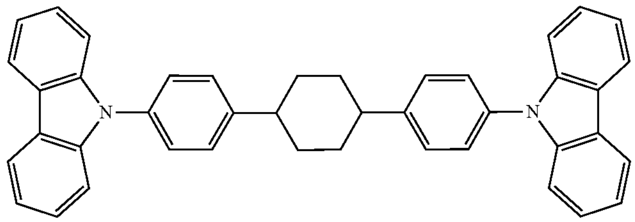
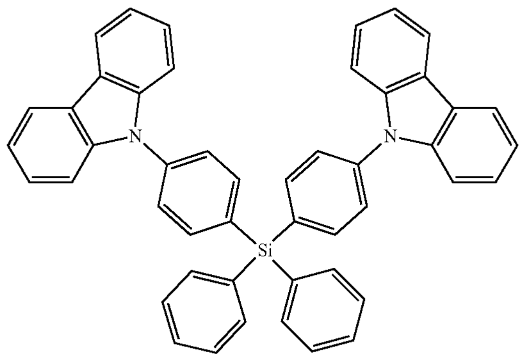
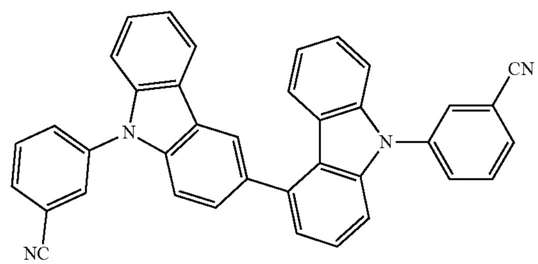
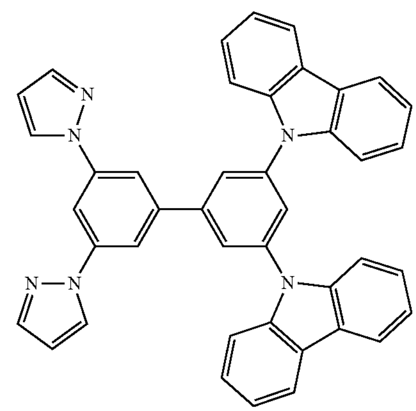
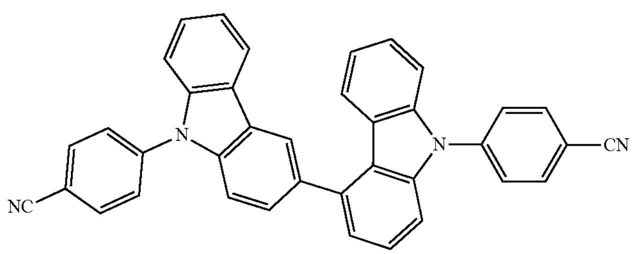
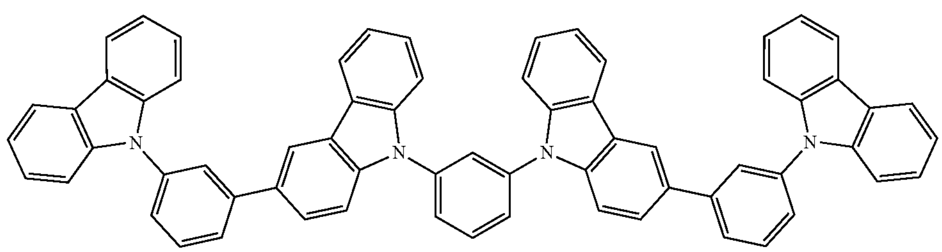
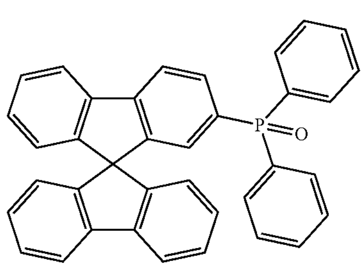
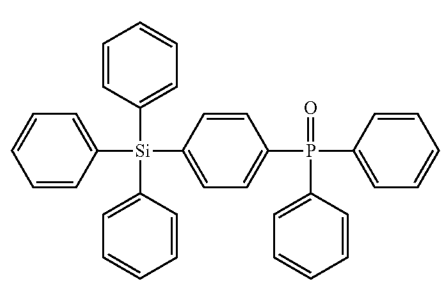

-continued
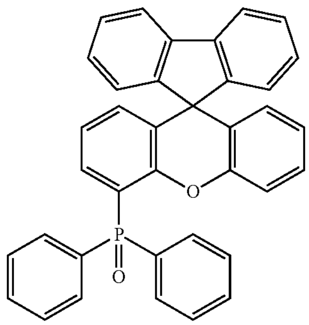
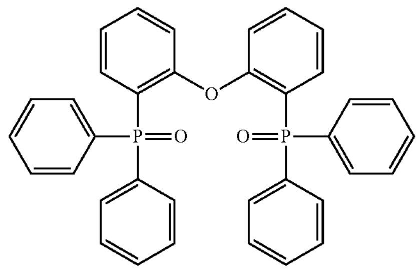
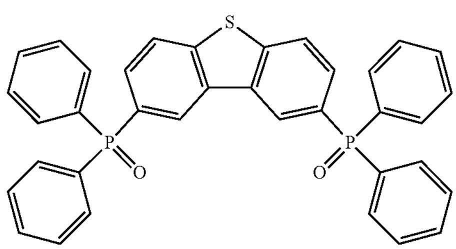
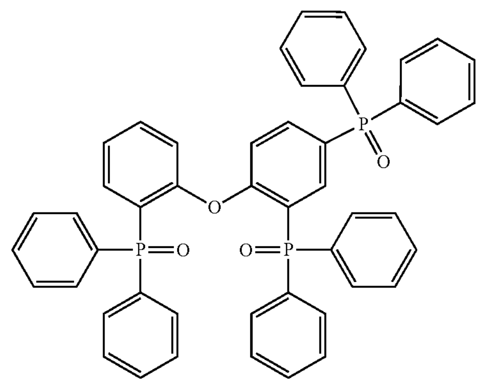
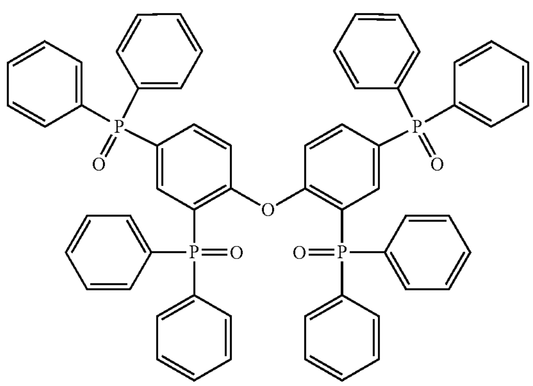
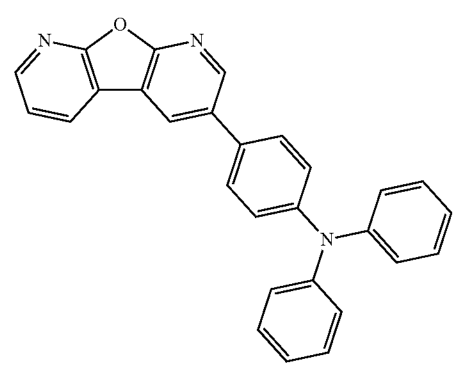
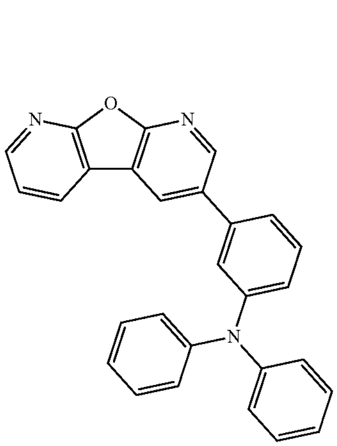
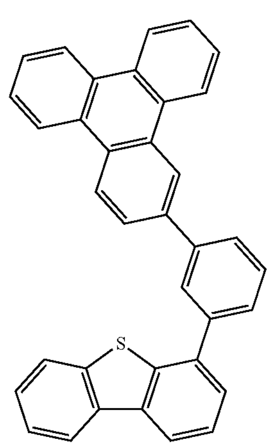
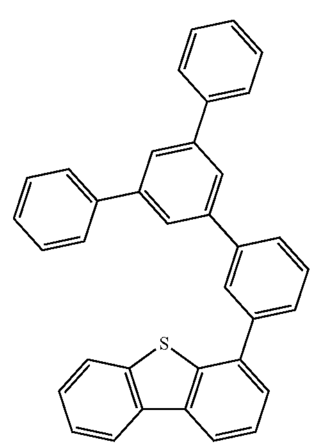

-continued

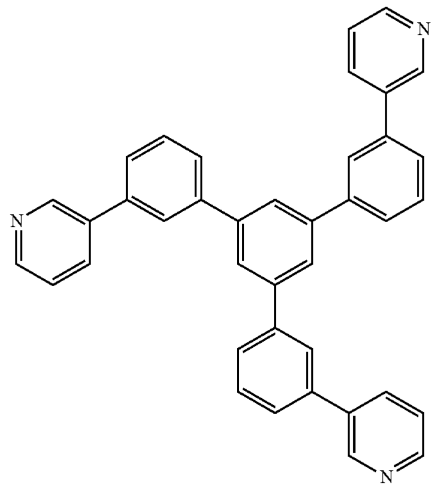

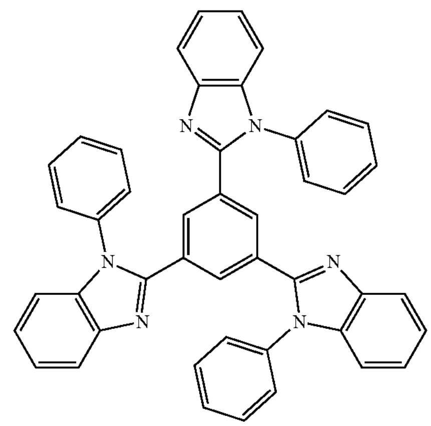

Furthermore, the dopant material is not particularly limited, and existing compounds can be used. The dopant material can be selected from various materials depending on the desired color of emitted light. Specific examples of the dopant material include a condensed ring derivative of phenanthrene, anthracene, pyrene, tetracene, pentacene, perylene, naphthopyrene, dibenzopyrene, rubrene, chrysene, or the like, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JPH01-245087 A), a bisstyrylarylene derivative (JPH02-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

If the examples are listed for each color of emitted light, examples of blue to bluish green dopant materials include an aromatic hydrocarbon compound such as naphthalene, anthracene, phenanthrene, pyrene, triphenylene, perylene, fluorene, indene, or chrysene, and derivatives thereof, an aromatic heterocyclic compound such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, and derivatives thereof, a distyrylbenzene derivative, a tetraphenylbutadiene derivative, a stilbene derivative, an aldazine derivative, a coumarin derivative, an azole derivative such as imidazole, thiazole, thiadiazole, carbazole, oxazole, oxadiazole, or triazole, and metal complexes thereof, and an aromatic amine derivative represented by N,N'-diphenyl-N,N'-di(3-methylphenyl)-4,4'-diphenyl-1,1'-diamine.

Furthermore, examples of a green to yellow dopant material include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples of the green-yellow dopant material include compounds obtained by introducing a substituent capable of shifting a wavelength to a longer wavelength, such as an aryl, a heteroaryl, an arylvinyl, an amino, or a cyano to the above compounds listed as examples of the blue to bluish green dopant material.

Furthermore, examples of an orange to red dopant material include a naphthalimide derivative such as bis(diisopropylphenyl)perylene tetracarboxylic acid imide, a perinone derivative, a rare earth complex such as a Eu complex containing acetylacetone, benzoylacetone, phenanthroline, or the like as a ligand, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples of the orange to red dopant material include compounds obtained by introducing a substituent capable of shifting a wavelength to a longer wavelength, such as an aryl, a heteroaryl, an arylvinyl, an amino, or a cyano to the above compounds listed as examples of the blue to bluish green and green to yellow dopant materials.

In addition to the above compounds, a dopant can be appropriately selected for use from compounds and the like described in "Kagaku Kogyo (Chemical Industry)", June 2004, p. 13, and reference literatures and the like described therein.

Among the dopant materials described above, an amine having a stilbene structure, a perylene derivative, a borane derivative, an aromatic amine derivative, a coumarin derivative, a pyran derivative, and a pyrene derivative are particularly preferable.

An amine having a stilbene structure is represented by the following formula, for example.

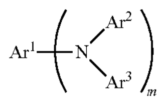

In the formula, $Ar^1$ represents an m-valent group derived from an aryl having 6 to 30 carbon atoms, $Ar^2$ and $Ar^3$ each independently represent an aryl having 6 to 30 carbon atoms, at least one of $Ar^1$ to $Ar^3$ has a stilbene structure, at least one hydrogen of $Ar^1$ to $Ar^3$ may be substituted by an aryl, a heteroaryl, an alkyl, a cycloalkyl, a tri-substituted silyl (a silyl tri-substituted by at least one of an aryl, an alkyl and a cycloalkyl) or a cyano, and m represents an integer of 1 to 4.

The amine having a stilbene structure is more preferably a diaminostilbene represented by the following formula.

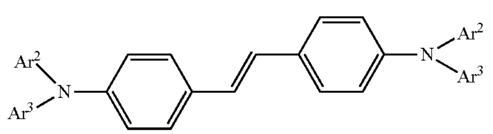

In the formula, $Ar^2$ and $Ar^3$ each independently represent an aryl having 6 to 30 carbon atoms, and $Ar^2$ and $Ar^3$ may be substituted by an aryl, a heteroaryl, an alkyl, a cycloalkyl, a tri-substituted silyl (a silyl tri-substituted by at least one of an aryl, an alkyl and a cycloalkyl) or a cyano.

Specific examples of the aryl having 6 to 30 carbon atoms include phenyl, naphthyl, acenaphthylenyl, fluorenyl, phenalenyl, phenanthrenyl, anthryl, fluoranthenyl, triphenylenyl, pyrenyl, chrysenyl, naphthacenyl, perylenyl, stilbenyl, distyrylphenyl, distyrylbiphenylyl, distyrylfluorenyl and the like.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis[4"-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Furthermore, amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl)perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Furthermore, perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, JP 2001-217077 A, and the like may also be used.

Examples of the borane derivative include 1,8-diphenyl-10-(dimesitylboryl) anthracene, 9-phenyl-10-(dimesitylboryl) anthracene, 4-(9'-anthryl) dimesitylborylnaphthalene, 4-(10'-phenyl-9'-anthryl) dimesitylborylnaphthalene, 9-(dimesitylboryl) anthracene, 9-(4'-biphenylyl)-10-(dimesitylboryl) anthracene, and 9-(4'-(N-carbazolyl)phenyl)-10-(dimesitylboryl) anthracene.

Furthermore, a borane derivative described in WO 2000/40586 A or the like may also be used.

An aromatic amine derivative is represented by the following formula, for example.

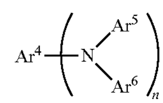

In the formula, $Ar^4$ represents an n-valent group derived from an aryl having 6 to 30 carbon atoms, $Ar^5$ and $Ar^6$ each independently represent an aryl having 6 to 30 carbon atoms, at least one hydrogen of $Ar^4$ to $Ar^6$ may be substituted by an aryl, a heteroaryl, an alkyl, a cycloalkyl, a tri-substituted silyl (a silyl tri-substituted by at least one of an aryl, an alkyl and a cycloalkyl) or a cyano, and n represents an integer of 1 to 4.

Particularly, an aromatic amine derivative in which $Ar^4$ represents a divalent group derived from anthracene, chrysene, fluorene, benzofluorene, or pyrene, $Ar^5$ and $Ar^6$ each independently represent an aryl having 6 to 30 carbon atoms, at least one hydrogen of $Ar^4$ to $Ar^6$ may be substituted by an aryl, a heteroaryl, an alkyl, a cycloalkyl, a tri-substituted silyl (a silyl tri-substituted by at least one of an aryl, an alkyl and a cycloalkyl) or a cyano, and n represents 2, is more preferable.

Specific examples of the aryl having 6 to 30 carbon atoms include benzene, naphthalene, acenaphthylene, fluorene phenalene, phenanthrene, anthracene, fluoranthene, triphenylene, pyrene, chrysene, naphthacene, perylene, and pentacene.

Examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra(m-tolyl)chrysene-6,12-diamine, N,N,N',N'-tetrakis(4-isopropylphenyl)chrysene-6,12-diamine, N,N,N',N'-tetra(naphthalen-2-yl)chrysene-6,12-dimine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Furthermore, examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3, 4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1,N^6$-diphenyl-$N^1,N^6$-bis(4-trimethylsilanyl-phenyl)-1H,8H-pyrene-1,6-diamine.

Furthermore, examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl)anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylamino-phenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl)anthracene.

Furthermore, examples thereof further include [4-(4-diphenylamino-phenyl)naphthalen-1-yl]-diphenylamine, [6-(4-diphenylamino-phenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, and 4,4"-bis[6-diphenylaminonaphthalen-2-yl]-p-terphenyl.

Furthermore, an aromatic amine derivative described in JP 2006-156888 A or the like may also be used.

Examples of the coumarin derivative include coumarin-6 and coumarin-334.

Furthermore, a coumarin derivative described in JP 2004-43646 A, JP 2001-76876 A, JP 6-298758 A, or the like may also be used.

Examples of the pyran derivative include DCM and DCJTB described below.

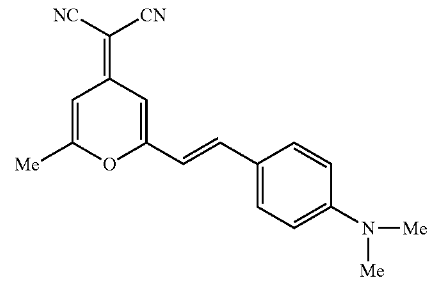

DCM

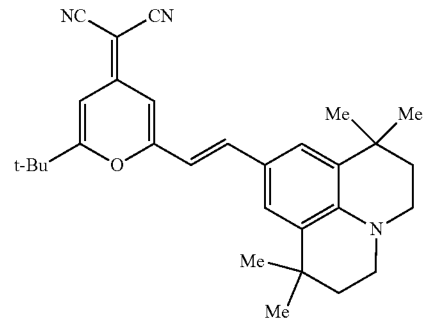

DCJTB

Furthermore, a pyran derivative described in JP 2005-126399 A, JP 2005-097283 A, JP 2002-234892 A, JP 2001-220577 A, JP 2001-081090 A, JP 2001-052869 A, or the like may also be used.

<Electron Injection Layer and Electron Transport Layer in Organic Electroluminescent Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymeric binder.

An electron injection/transport layer is a layer that manages injection of an electron from a negative electrode and transport of an electron, and is preferably a layer that has high electron injection efficiency and can efficiently transport an injected electron. For this purpose, a substance which has high electron affinity, large electron mobility, and excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing light emission efficiency is equal to that of a material having high electron transporting ability. Therefore, the electron injection/transport layer according to the present embodiment may also include a function of a layer that can efficiently prevent migration of a hole.

A material (electron transport material) for forming the electron transport layer 106 or the electron injection layer 107 can be arbitrarily selected for use from compounds conventionally used as electron transfer compounds in a photoconductive material, and known compounds that are used in an electron injection layer and an electron transport layer of an organic EL element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the above materials, a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, a quinolinol-based metal complex are preferable.

<Borane Derivative>

The borane derivative is, for example, a compound represented by the following general formula (ETM-1), and specifically disclosed in JP 2007-27587 A.

(ETM-1)

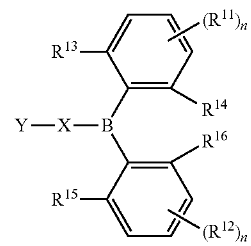

In the above formula (ETM-1), $R^{11}$ and $R^{12}$ each independently represent at least one of a hydrogen atom, an alkyl, a cycloalkyl, an optionally substituted aryl, a substituted silyl, an optionally substituted nitrogen-containing heterocyclic ring, and a cyano, $R^{13}$ to $R^{16}$ each independently represent an optionally substituted alkyl, an optionally substituted cycloalkyl, or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. Further, examples of the substituent in the case of being "optionally substituted" or "substituted" include an aryl, a heteroaryl, an alkyl, and a cycloalkyl.

Among compounds represented by the above general formula (ETM-1), a compound represented by the following general formula (ETM-1-1) and a compound represented by the following general formula (ETM-1-2) are preferable.

(ETM-1-1)

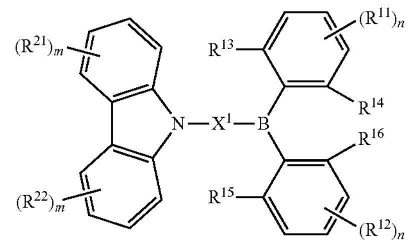

In formula (ETM-1-1), $R^{11}$ and $R^{12}$ each independently represent at least one of a hydrogen atom, an alkyl, a cycloalkyl, an optionally substituted aryl, a substituted silyl, an optionally substituted nitrogen-containing heterocyclic ring, and a cyano, $R^{13}$ to $R^{16}$ each independently represent an optionally substituted alkyl, an optionally substituted cycloalkyl, or an optionally substituted aryl, $R^{21}$ and $R^{22}$ each independently represent at least one of a hydrogen atom, an alkyl, a cycloalkyl, an optionally substituted aryl, a substituted silyl, an optionally substituted nitrogen-containing heterocyclic ring, and a cyano, $X^1$ represents an optionally substituted arylene having 20 or fewer carbon atoms, n's each independently represent an integer of 0 to 3, and m's each independently represent an integer of 0 to 4. Further, examples of the substituent in the case of being "optionally substituted" or "substituted" include an aryl, a heteroaryl, an alkyl, and a cycloalkyl.

(ETM-1-2)

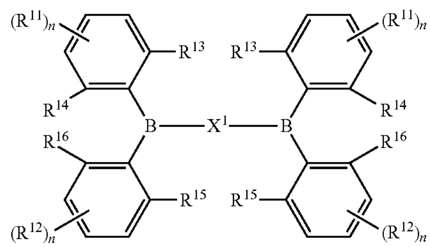

In formula (ETM-1-2), $R^{11}$ and $R^{12}$ each independently represent at least one of a hydrogen atom, an alkyl, a cycloalkyl, an optionally substituted aryl, a substituted silyl, an optionally substituted nitrogen-containing heterocyclic ring, and a cyano, $R^{13}$ to $R^{16}$ each independently represent an optionally substituted alkyl, an optionally substituted cycloalkyl, or an optionally substituted aryl, $X^1$ represents an optionally substituted arylene having 20 or fewer carbon atoms, and n's each independently represent an integer of 0 to 3. Further, examples of the substituent in the case of being "optionally substituted" or "substituted" include an aryl, a heteroaryl, an alkyl, and a cycloalkyl.

Specific examples of $X^1$ include divalent groups represented by the following formulas (X-1) to (X-9).

(X-1)

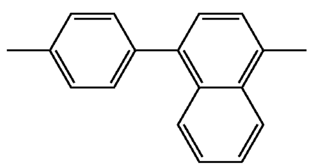

(X-2)

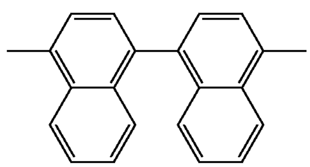

(X-3)

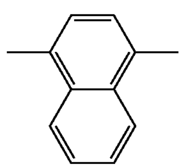

(X-4)

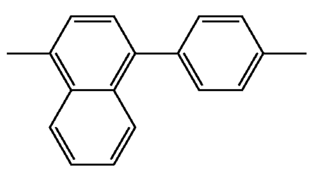

(X-5)

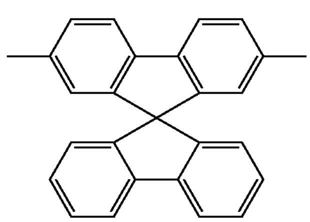

-continued (X-6)

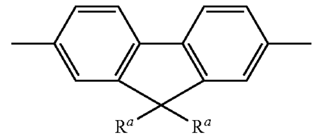

(X-7)

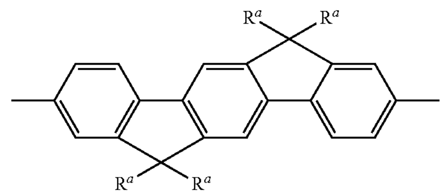

(X-8)

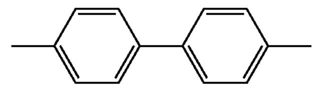

(X-9)

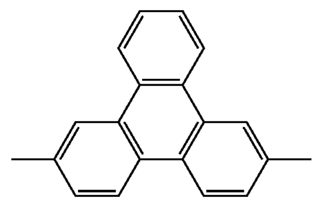

(In each formula, $R^a$'s each independently represent an alkyl group, a cycloalkyl group, or an optionally substituted phenyl group.)

Specific examples of this borane derivative include the following compound.

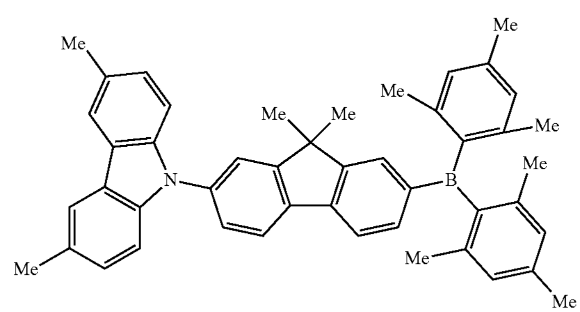 [SMILES: Cc1cc(C)c(B(c2ccc3c(c2)C(C)(C)c2cc(-n4c5ccc(C)cc5c5cc(C)ccc54)ccc2-3)c2c(C)cc(C)cc2C)c(C)c1]

This borane derivative can be manufactured using known raw materials and known synthesis methods.

<Pyridine Derivative>

A pyridine derivative is, for example, a compound represented by the following formula (ETM-2), and preferably a compound represented by formula (ETM-2-1) or (ETM-2-2).

(ETM-2)

$\Phi$—(Pyridine-based substituent)$_n$

-continued (ETM-2-1)

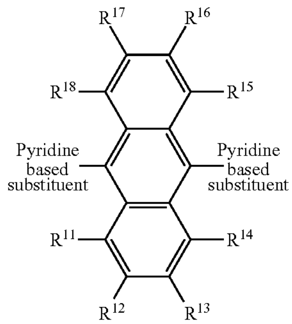

(ETM-2-2)

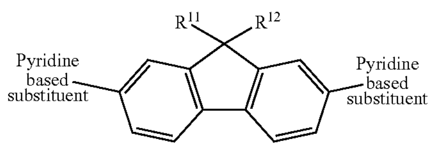

ϕ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In the above formula (ETM-2-1), $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms).

In the above formula (ETM-2-2), $R^{11}$ and $R^{12}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and $R^{11}$ and $R^{12}$ may be bonded to each other to form a ring.

In each formula, the “pyridine-based substituent” is any one of the following formulas (Py-1) to (Py-15), and the pyridine-based substituents may be each independently substituted by an alkyl having 1 to 4 carbon atoms or a cycloalkyl having 5 to 10 carbon atoms. The pyridine-based substituent may be bonded to ϕ, an anthracene ring, or a fluorene ring in each formula via a phenylene group or a naphthylene group.

(Py-1)

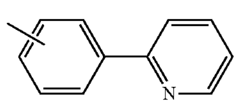

(Py-2)

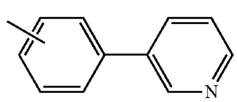

(Py-3)

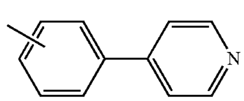

(Py-4)

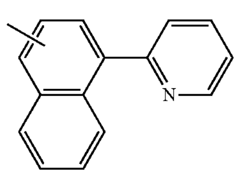

-continued (Py-5)

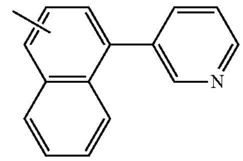

(Py-6)

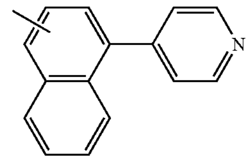

(Py-7)

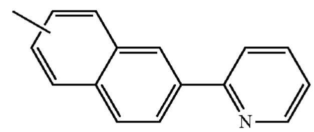

(Py-8)

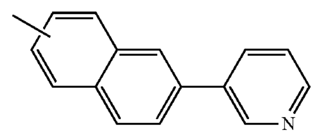

(Py-9)

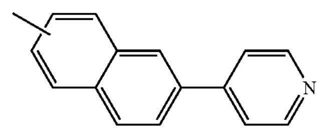

(Py-10)

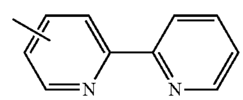

(Py-11)

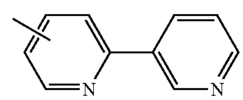

(Py-12)

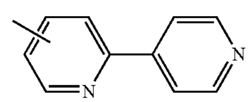

(Py-13)

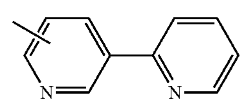

(Py-14)

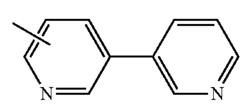

(Py-15)

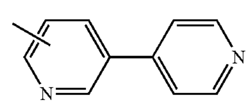

The pyridine-based substituent is any one of the above-formulas (Py-1) to (Py-15). However, among these formulas, the pyridine-based substituent is preferably any one of the following formulas (Py-21) to (Py-44).

(Py-21)
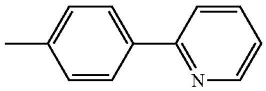
(Py-22)
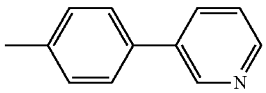
(Py-23)
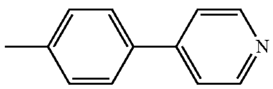
(Py-24)
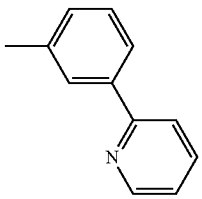
(Py-25)
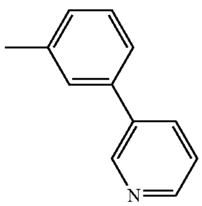
(Py-26)
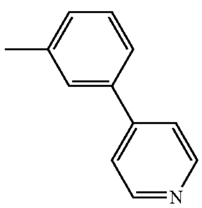
(Py-27)
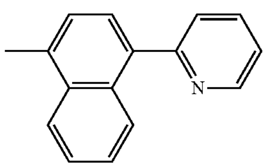
(Py-28)
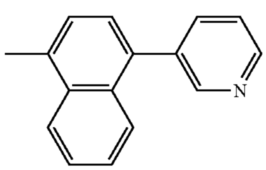
(Py-29)
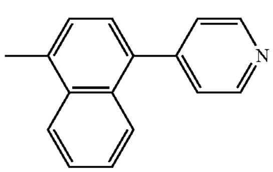
(Py-30)
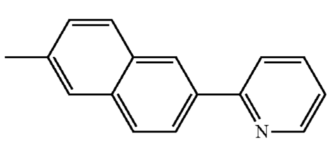
-continued
(Py-31)
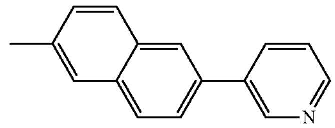
(Py-32)
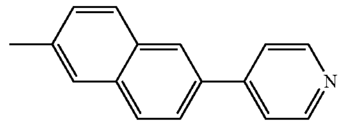
(Py-33)
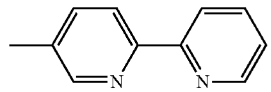
(Py-34)
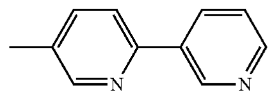
(Py-35)
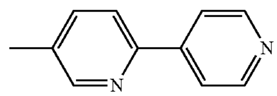
(Py-36)
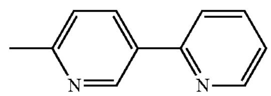
(Py-37)
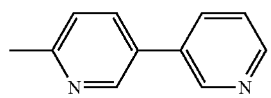
(Py-38)
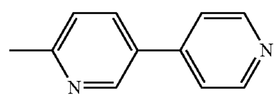
(Py-39)
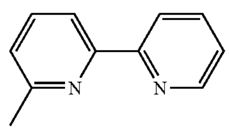
(Py-40)
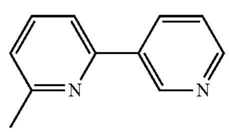
(Py-41)
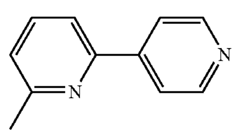
(Py-42)
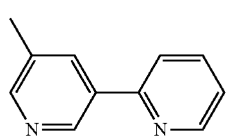
(Py-43)
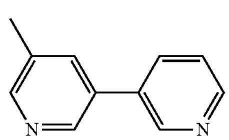

-continued (Py-44)

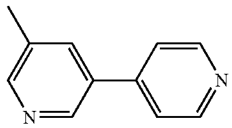

At least one hydrogen atom in each pyridine derivative may be substituted by a deuterium atom. One of the two "pyridine-based substituents" in the above formulas (ETM-2-1) and (ETM-2-2) may be substituted by an aryl.

The "alkyl" in $R^{11}$ to $R^{18}$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbons (branched alkyl having 3 to 12 carbons). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 to 4 carbon atoms).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

As the alkyl having 1 to 4 carbon atoms by which the pyridine-based substituent is substituted, the above description of the alkyl can be cited.

Examples of the "cycloalkyl" in $R^{11}$ to $R^{18}$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms.

Specific examples of the "cycloalkyl" include a cyclopropyl, a cyclobutyl, a cyclopentyl, a cyclohexyl, a methylcyclopentyl, a cycloheptyl, a methylcyclohexyl, a cyclooctyl, and a dimethylcyclohexyl.

As the cycloalkyl having 5 to 10 carbon atoms by which the pyridine-based substituent is substituted, the above description of the cycloalkyl can be cited.

As the "aryl" in $R^{11}$ to $R^{18}$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl which is a monocyclic aryl; (1-,2-) naphthyl which is a fused bicyclic aryl; acenaphthylene-(1-, 3-,4-,5-)yl, a fluorene-(1-,2-,3-,4-,9-)yl, phenalene-(1-, 2-)yl, and (1-,2-,3-,4-,9-)phenanthryl which are fused tricyclic aryls; triphenylene-(1-, 2-)yl, pyrene-(1-,2-, 4-)yl, and naphthacene-(1-, 2-, 5-)yl which are fused tetracyclic aryls; and perylene-(1-,2-,3-)yl and pentacene-(1-, 2-, 5-, 6-)yl which are fused pentacyclic aryls.

Preferable examples of the "aryl having 6 to 30 carbon atoms" include a phenyl, a naphthyl, a phenanthryl, a chrysenyl, and a triphenylenyl. More preferable examples thereof include a phenyl, a 1-naphthyl, a 2-naphthyl, and a phenanthryl. Particularly preferable examples thereof include a phenyl, a 1-naphthyl, and a 2-naphthyl.

$R^{11}$ and $R^{12}$ in the above formula (ETM-2-2) may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this pyridine derivative include the following compounds.

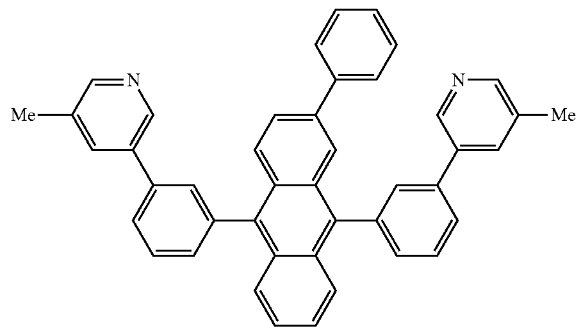

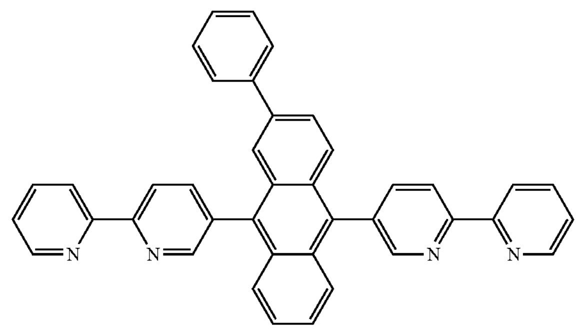

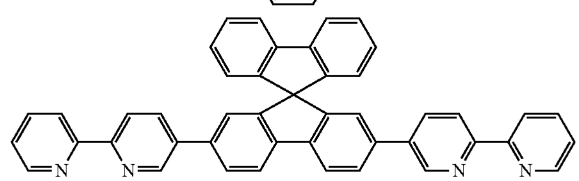

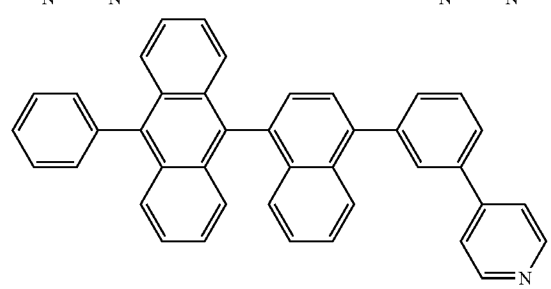

This pyridine derivative can be manufactured using known raw materials and known synthesis methods.

<Fluoranthene Derivative>

The fluoranthene derivative is, for example, a compound represented by the following general formula (ETM-3), and specifically disclosed in WO 2010/134352 A.

(ETM-3)

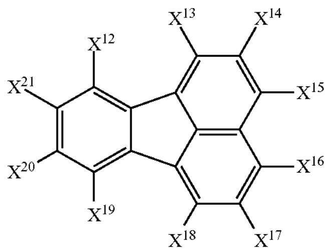

In the above formula (ETM-3), $X^{12}$ to $X^{21}$ each represent a hydrogen atom, a halogen atom, a linear, branched or cyclic alkyl, a linear, branched or cyclic alkoxy, a substituted or unsubstituted aryl, or a substituted or unsubstituted heteroaryl. Examples of the substituent in the case of being substituted include an aryl, a heteroaryl, an alkyl, and a cycloalkyl.

Specific examples of this fluoranthene derivative include the following compounds.

(ETM-3-1)

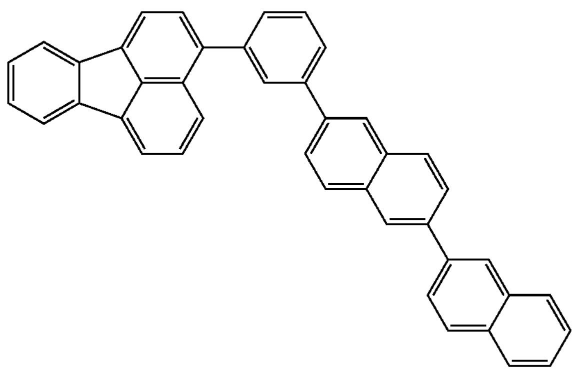

(ETM-3-2)

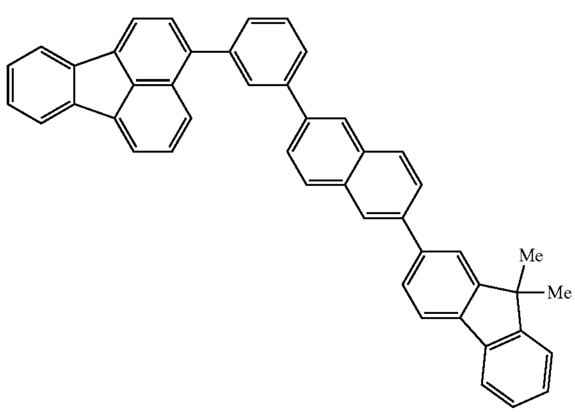

-continued (ETM-3-3)

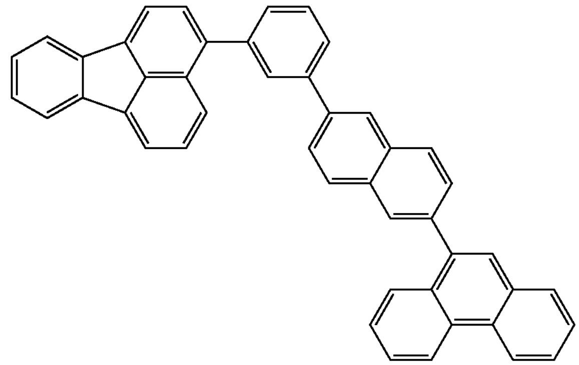

<BO-Based Derivative>

The BO-based derivative is, for example, a polycyclic aromatic compound represented by the following formula (ETM-4) or a polycyclic aromatic compound multimer having a plurality of structures represented by the following formula (ETM-4).

(ETM-4)

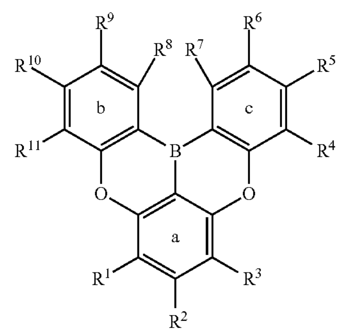

$R^1$ to $R^{11}$ each independently represent a hydrogen atom, an aryl, a heteroaryl, a diarylamino, a diheteroarylamino, an arylheteroarylamino, a diarylboryl (two aryls may be linked via a single bond or a linking group), an alkyl, a cycloalkyl, an alkoxy, or an aryloxy, while at least one hydrogen atom in these may be substituted by an aryl, a heteroaryl, an alkyl, or a cycloalkyl.

Adjacent groups among $R^1$ to $R^{11}$ may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, a diarylboryl (two aryls may be linked via a single bond or a linking group), an alkyl, a cycloalkyl, an alkoxy, or an aryloxy, while at least one hydrogen atom in these may be substituted by an aryl, a heteroaryl, an alkyl, or a cycloalkyl.

At least one hydrogen atom in a compound or structure represented by formula (ETM-4) may be substituted by a halogen atom or a deuterium atom.

For description of a substituent in formula (ETM-4), a form of ring formation, and a multimer formed by combining a plurality of structures of formula (ETM-4), the description of a polycyclic aromatic compound represented by the above general formula (2) and a multimer thereof can be cited.

Specific examples of this BO-based derivative include the following compound.

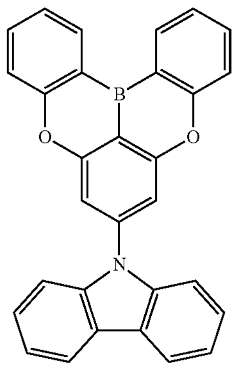 [SMILES: c1ccc2c(c1)Oc1cc(-n3c4ccccc4c4ccccc43)cc3c1B2c1ccccc1O3]

This BO-based derivative can be manufactured using known raw materials and known synthesis methods.

<Anthracene Derivative>

One of the anthracene derivatives is, for example, a compound represented by the following formula (ETM-5-1).

(ETM-5-1)

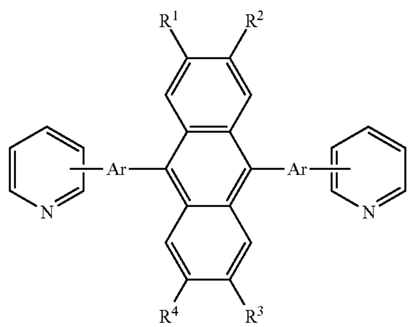

Ar's each independently represent a divalent benzene or naphthalene, $R^1$ to $R^4$ each independently represent a hydrogen atom, an alkyl having 1 to 6 carbon atoms, a cycloalkyl having 3 to 6 carbon atoms, or an aryl having 6 to 20 carbon atoms.

Ar's can be each independently selected from a divalent benzene and naphthalene appropriately. Two Ar's may be different from or the same as each other, but are preferably the same from a viewpoint of easiness of synthesis of an anthracene derivative. Ar is bonded to pyridine to form "a moiety formed of Ar and pyridine". For example, this moiety is bonded to anthracene as a group represented by any one of the following formulas (Py-1) to (Py-12).

(Py-1)

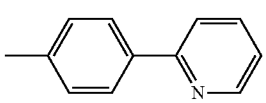

(Py-2)

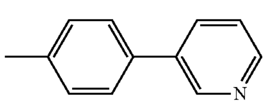

-continued (Py-3)

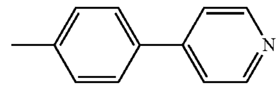

(Py-4)

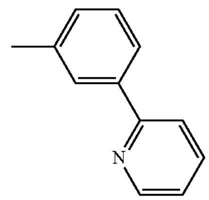

(Py-5)

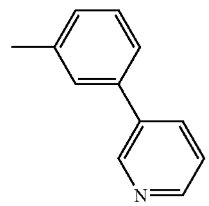

(Py-6)

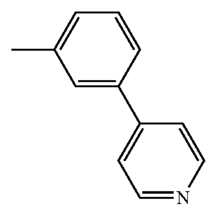

(Py-7)

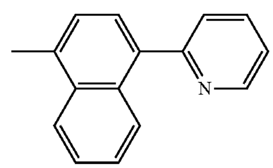

(Py-8)

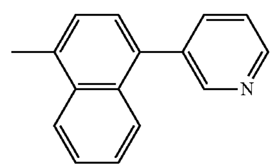

(Py-9)

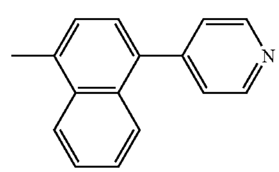

(Py-10)

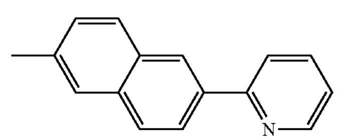

(Py-11)

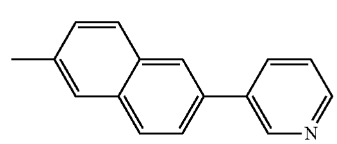

-continued (Py-12)

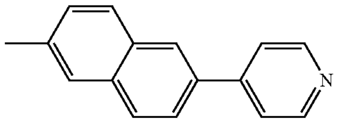

Among these groups, a group represented by any one of the above formulas (Py-1) to (Py-9) is preferable, and a group represented by any one of the above formulas (Py-1) to (Py-6) is more preferable. Two "moieties formed of Ar and pyridine" bonded to anthracene may have the same structure as or different structures from each other, but preferably have the same structure from a viewpoint of easiness of synthesis of an anthracene derivative. However, two "moieties formed of Ar and pyridine" preferably have the same structure or different structures from a viewpoint of element characteristics.

The alkyl having 1 to 6 carbon atoms in $R^1$ to $R^4$ may be either linear or branched. That is, the alkyl having 1 to 6 carbon atoms is a linear alkyl having 1 to 6 carbon atoms or a branched alkyl having 3 to 6 carbon atoms. More preferably, the alkyl having 1 to 6 carbon atoms is an alkyl having 1 to 4 carbon atoms (branched alkyl having 3 to 4 carbon atoms). Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, and 2-ethylbutyl. Methyl, ethyl, n-propyl, isopropyl, n-butyl, isobutyl, s-butyl, and t-butyl are preferable. Methyl, ethyl, and a t-butyl are more preferable.

Specific examples of the cycloalkyl having 3 to 6 carbon atoms in $R^1$ to $R^4$ include a cyclopropyl, a cyclobutyl, a cyclopentyl, a cyclohexyl, a methylcyclopentyl, a cycloheptyl, a methylcyclohexyl, a cyclooctyl, and a dimethylcyclohexyl.

For the aryl having 6 to 20 carbon atoms in $R^1$ to $R^4$, an aryl having 6 to 16 carbon atoms is preferable, an aryl having 6 to 12 carbon atoms is more preferable, and an aryl having 6 to 10 carbon atoms is particularly preferable.

Specific examples of the "aryl having 6 to 20 carbon atoms" include phenyl, (o-, m-, p-) tolyl, (2,3-, 2,4-, 2,5-, 2,6-, 3,4-, 3,5-) xylyl, mesityl (2,4,6-trimethylphenyl), and (o-, m-, p-)cumenyl which are monocyclic aryls; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; anthracene-(1-, 2-, 9-)yl, acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; triphenylene-(1-, 2-)yl, pyrene-(1-, 2-, 4-)yl, and tetracene-(1-, 2-, 5-)yl which are fused tetracyclic aryls; and perylene-(1-, 2-, 3-)yl which is a fused pentacyclic aryl.

The "aryl having 6 to 20 carbon atoms" is preferably a phenyl, a biphenylyl, a terphenylyl, or a naphthyl, more preferably a phenyl, a biphenylyl, a 1-naphthyl, a 2-naphthyl, or an m-terphenyl-5'-yl, still more preferably a phenyl, a biphenylyl, a 1-naphthyl, or a 2-naphthyl, and most preferably a phenyl.

One of the anthracene derivatives is, for example, a compound represented by the following formula (ETM-5-2).

(ETM-5-2)

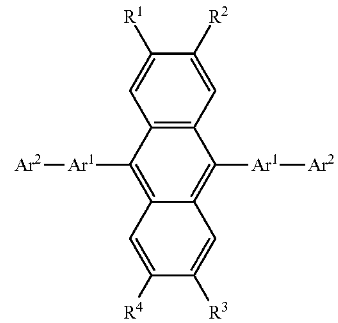

$Ar^1$'s each independently represent a single bond, a divalent benzene, naphthalene, anthracene, fluorene, or phenalene.

$Ar^2$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include a phenyl, a biphenylyl, a naphthyl, a terphenylyl, an anthracenyl, an acenaphthylenyl, a fluorenyl, a phenalenyl, a phenanthryl, a triphenylenyl, a pyrenyl, a tetracenyl, and a perylenyl.

$R^2$ to $R^4$ each independently represent a hydrogen atom, an alkyl having 1 to 6 carbon atoms, a cycloalkyl having 3 to 6 carbon atoms, or an aryl having 6 to 20 carbon atoms. The description as in the above formula (ETM-5-1) can be cited.

Specific examples of these anthracene derivatives include the following compounds.

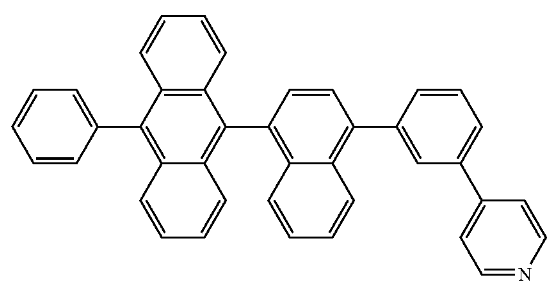

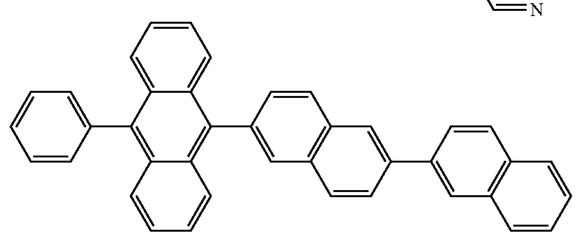

These anthracene derivatives can be manufactured using known raw materials and known synthesis methods.

<Benzofluorene Derivative>

The benzofluorene derivative is, for example, a compound represented by the following formula (ETM-6).

(ETM-6)

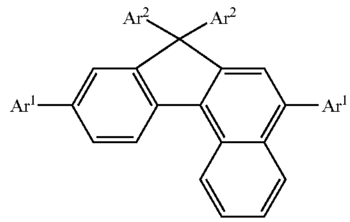

$Ar^1$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include a phenyl, a biphenylyl, a naphthyl, a terphenylyl, an anthracenyl, an acenaphthylenyl, a fluorenyl, a phenalenyl, a phenanthryl, a triphenylenyl, a pyrenyl, a tetracenyl, and a perylenyl.

$Ar^2$'s each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and two $Ar^2$'s may be bonded to each other to form a ring.

The "alkyl" in $Ar^2$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbons (branched alkyl having 3 to 12 carbons). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 to 4 carbon atoms). Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, and 1-methylhexyl.

Examples of the "cycloalkyl" in $Ar^2$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms. Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the "aryl" in $Ar^2$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl, naphthyl, acenaphthylenyl, fluorenyl, phenalenyl, phenanthryl, triphenylenyl, pyrenyl, naphthacenyl, perylenyl, and pentacenyl.

Two $Ar^2$'s may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this benzofluorene derivative include the following compounds.

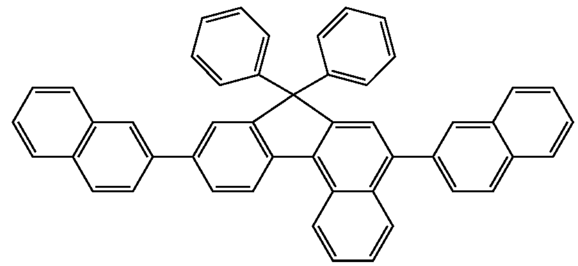

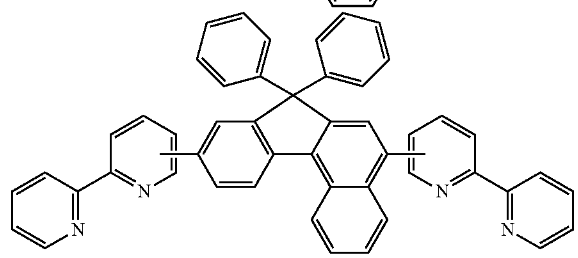

This benzofluorene derivative can be manufactured using known raw materials and known synthesis methods.

<Phosphine Oxide Derivative>

The phosphine oxide derivative is, for example, a compound represented by the following formula (ETM-7-1). Details are also described in WO 2013/079217 A.

(ETM-7-1)

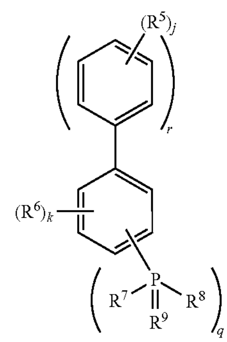

$R^5$ represents a substituted or unsubstituted, alkyl having 1 to 20 carbon atoms, cycloalkyl having 3 to 20 carbon atoms, aryl having 6 to 20 carbon atoms, or heteroaryl having 5 to 20 carbon atoms, $R^6$ represents CN, a substituted or unsubstituted, alkyl having 1 to 20 carbons, cycloalkyl having 3 to 20 carbon atoms, heteroalkyl having 1 to 20 carbons, aryl having 6 to 20 carbons, heteroaryl having 5 to 20 carbons, alkoxy having 1 to 20 carbons, or aryloxy having 6 to 20 carbon atoms, $R^7$ and $R^8$ each independently represent a substituted or unsubstituted, aryl having 6 to 20 carbon atoms or heteroaryl having 5 to 20 carbon atoms, $R^9$ represents an oxygen atom or a sulfur atom, j represents 0 or 1, k represents 0 or 1, r represents an integer of 0 to 4, and q represents an integer of 1 to 3.

Examples of the substituent in the case of being substituted include an aryl, a heteroaryl, an alkyl, and a cycloalkyl.

The phosphine oxide derivative may be, for example, a compound represented by the following formula (ETM-7-2).

(ETM-7-2)

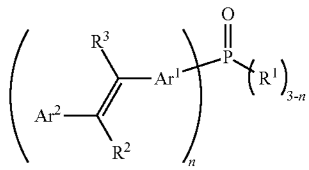

$R^1$ to $R^3$ may be the same as or different from each other and are selected from a hydrogen atom, an alkyl group, a cycloalkyl group, an aralkyl group, an alkenyl group, a cycloalkenyl group, an alkynyl group, an alkoxy group, an alkylthio group, a cycloalkylthio group, an aryl ether group, an aryl thioether group, an aryl group, a heterocyclic group, a halogen atom, a cyano group, an aldehyde group, a carbonyl group, a carboxyl group, an amino group, a nitro group, a silyl group, and a fused ring formed with an adjacent substituent.

$Ar^1$'s may be the same as or different from each other, and represents an arylene group or a heteroarylene group. $Ar^2$'s may be the same as or different from each other, and represents an aryl group or a heteroaryl group. However, at least one of $Ar^1$ and $Ar^2$ has a substituent or forms a fused ring with an adjacent substituent. n represents an integer of 0 to 3. When n is 0, no unsaturated structure portion is present. When n is 3, $R^1$ is not present.

Among these substituents, the alkyl group represents a saturated aliphatic hydrocarbon group such as a methyl group, an ethyl group, a propyl group, or a butyl group. This saturated aliphatic hydrocarbon group may be unsubstituted or substituted. The substituent in a case of being substituted is not particularly limited, and examples thereof include an alkyl group, an aryl group, and a heterocyclic group, and this point is also common to the following description. The number of carbon atoms in the alkyl group is not particularly limited, but is usually in a range of 1 to 20 from a viewpoint of availability and cost.

The cycloalkyl group represents a saturated alicyclic hydrocarbon group such as a cyclopropyl, a cyclohexyl, a norbornyl, or an adamantyl. This saturated alicyclic hydrocarbon group may be unsubstituted or substituted. The carbon number of the alkyl group moiety is not particularly limited, but is usually in a range of 3 to 20.

Furthermore, the aralkyl group represents an aromatic hydrocarbon group via an aliphatic hydrocarbon, such as a benzyl group or a phenylethyl group. Both the aliphatic hydrocarbon and the aromatic hydrocarbon may be unsubstituted or substituted. The carbon number of the aliphatic moiety is not particularly limited, but is usually in a range of 1 to 20.

The alkenyl group represents an unsaturated aliphatic hydrocarbon group containing a double bond, such as a vinyl group, an allyl group, or a butadienyl group. This unsaturated aliphatic hydrocarbon group may be unsubstituted or substituted. The carbon number of the alkenyl group is not particularly limited, but is usually in a range of 2 to 20.

The cycloalkenyl group represents an unsaturated alicyclic hydrocarbon group containing a double bond, such as a cyclopentenyl group, a cyclopentadienyl group, or a cyclohexene group. This unsaturated alicyclic hydrocarbon group may be unsubstituted or substituted.

The alkynyl group represents an unsaturated aliphatic hydrocarbon group containing a triple bond, such as an acetylenyl group. This unsaturated aliphatic hydrocarbon group may be unsubstituted or substituted. The carbon number of the alkynyl group is not particularly limited, but is usually in a range of 2 to 20.

The alkoxy group represents an aliphatic hydrocarbon group via an ether bond, such as a methoxy group. The aliphatic hydrocarbon group may be unsubstituted or substituted. The carbon number of the alkoxy group is not particularly limited, but is usually in a range of 1 to 20.

The alkylthio group is a group in which an oxygen atom of an ether bond of an alkoxy group is substituted by a sulfur atom.

The cycloalkylthio group is a group in which an oxygen atom of an ether bond of a cycloalkoxy group is substituted by a sulfur atom.

The aryl ether group represents an aromatic hydrocarbon group via an ether bond, such as a phenoxy group. The aromatic hydrocarbon group may be unsubstituted or substituted. The carbon number of the aryl ether group is not particularly limited, but is usually in a range of 6 to 40.

The aryl thioether group is a group in which an oxygen atom of an ether bond of an aryl ether group is substituted by a sulfur atom.

Furthermore, the aryl group represents an aromatic hydrocarbon group such as a phenyl group, a naphthyl group, a biphenylyl group, a phenanthryl group, a terphenyl group, or a pyrenyl group. The aryl group may be unsubstituted or substituted. The carbon number of the aryl group is not particularly limited, but is usually in a range of 6 to 40.

Furthermore, the heterocyclic group represents a cyclic structural group having an atom other than a carbon atom, such as a furanyl group, a thiophenyl group, an oxazolyl group, a pyridyl group, a quinolinyl group, or a carbazolyl group. This cyclic structural group may be unsubstituted or substituted. The carbon number of the heterocyclic group is not particularly limited, but is usually in a range of 2 to 30.

Halogen refers to fluorine, chlorine, bromine, and iodine.

The aldehyde group, the carbonyl group, and the amino group can include those substituted by an aliphatic hydrocarbon, an alicyclic hydrocarbon, an aromatic hydrocarbon, a heterocyclic ring, or the like.

Furthermore, the aliphatic hydrocarbon, the alicyclic hydrocarbon, the aromatic hydrocarbon, and the heterocyclic ring may be unsubstituted or substituted.

The silyl group represents, for example, a silicon compound group such as a trimethylsilyl group. This silicon compound group may be unsubstituted or substituted. The number of carbon atoms of the silyl group is not particularly limited, but is usually in a range of 3 to 20. The number of silicon atoms is usually 1 to 6.

The fused ring formed with an adjacent substituent is, for example, a conjugated or unconjugated fused ring formed between $Ar^1$ and $R^2$, $Ar^1$ and $R^3$, $Ar^2$ and $R^2$, $Ar^2$ and $R^3$, $R^2$ and $R^3$, or $Ar^1$ and $Ar^2$. Here, when n is 1, two $R^1$'s may form a conjugated or nonconjugated fused ring. These fused rings may contain a nitrogen atom, an oxygen atom, or a sulfur atom in the ring structure, or may be fused with another ring.

Specific examples of this phosphine oxide derivative include the following compounds.

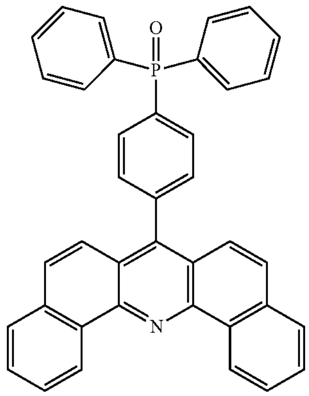

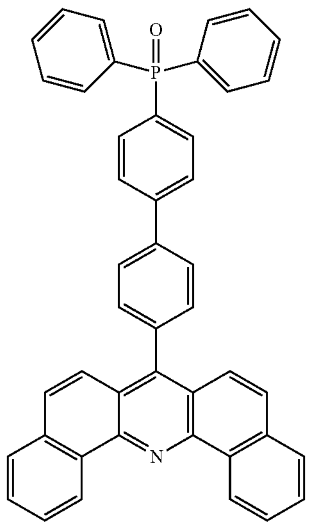

This phosphine oxide derivative can be manufactured using known raw materials and known synthesis methods.

<Pyrimidine Derivative>

The pyrimidine derivative is, for example, a compound represented by the following formula (ETM-8), and preferably a compound represented by the following formula (ETM-8-1). Details are also described in WO 2011/021689 A.

(ETM-8)

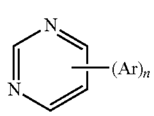

(ETM-8-1)

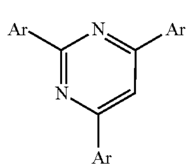

Ar's each independently represent an optionally substituted aryl or an optionally substituted heteroaryl. n represents an integer of 1 to 4, preferably an integer of 1 to 3, and more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the heteroaryl include pyrrolyl, oxazolyl, isoxazolyl, thiazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, pteridinyl, carbazolyl, acridinyl, phenoxathiinyl, phenoxazinyl, phenothiazinyl, phenazinyl, phenazasilinyl, indolizinyl, furanyl, benzofuranyl, isobenzofuranyl, dibenzofuranyl, naphthobenzofuranyl, thiophenyl, benzothiophenyl, isobenzothiophenyl, dibenzothiophenyl, naphtobenzothiophenyl, benzophosphoryl, dibenzophosphoryl, a monovalent group represented by removing any one hydrogen atom from a benzophosphole oxide ring, a monovalent group represented by removing any one hydrogen atom from a dibenzophosphole oxide ring, furazanyl, thianthrenyl, indolocarbazolyl, benzoindolocarbazolyl, and benzobenzoindolocarbazolyl.

At least one hydrogen of the above aryl and heteroaryl may be substituted, and may be each substituted by, for example, the above aryl or heteroaryl.

Specific examples of this pyrimidine derivative include the following compound.

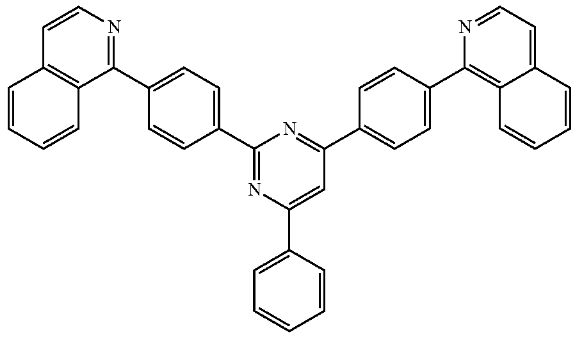 [SMILES: c1ccc(-c2cc(-c3ccc(-c4nccc5ccccc45)cc3)nc(-c3ccc(-c4nccc5ccccc45)cc3)n2)cc1]

This pyrimidine derivative can be manufactured using known raw materials and known synthesis methods.

<Carbazole Derivative>

The carbazole derivative is, for example, a compound represented by the following formula (ETM-9), or a multimer obtained by bonding a plurality of the compounds with a single bond or the like. Details are described in US 2014/0197386 A.

(ETM-9)

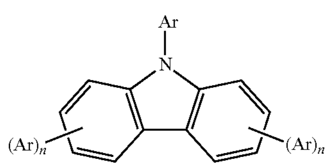

Ar's each independently represent an optionally substituted aryl or an optionally substituted heteroaryl. n independently represents an integer of 0 to 4, preferably an integer of 0 to 3, and more preferably 0 or 1.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the heteroaryl include pyrrolyl, oxazolyl, isoxazolyl, thiazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, pteridinyl, carbazolyl, acridinyl, phenoxathiinyl, phenoxazinyl, phenothiazinyl, phenazinyl, phenazasilinyl, indolizinyl, furanyl, benzofuranyl, isobenzofuranyl, dibenzofuranyl, naphthobenzofuranyl, thiophenyl, benzothiophenyl, isobenzothiophenyl, dibenzothiophenyl, naphtobenzothiophenyl, benzophosphoryl, dibenzophosphoryl, a monovalent group represented by removing any one hydrogen atom from a benzophosphole oxide ring, a monovalent group represented by removing any one hydrogen atom from a dibenzophosphole oxide ring, furazanyl, thianthrenyl, indolocarbazolyl, benzoindolocarbazolyl, and benzobenzoindolocarbazolyl.

At least one hydrogen of the above aryl and heteroaryl may be substituted, and may be each substituted by, for example, the above aryl or heteroaryl.

The carbazole derivative may be a multimer obtained by bonding a plurality of compounds represented by the above formula (ETM-9) with a single bond or the like. In this case, the compounds may be bonded with an aryl ring (preferably, a polyvalent benzene ring, naphthalene ring, anthracene ring, fluorene ring, benzofluorene ring, phenalene ring, phenanthrene ring or triphenylene ring) in addition to a single bond.

Specific examples of this carbazole derivative include the following compounds.

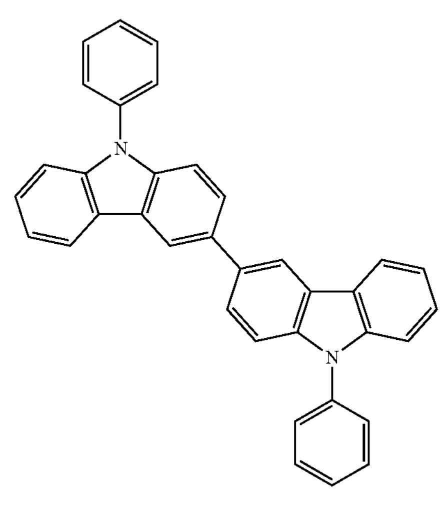

-continued

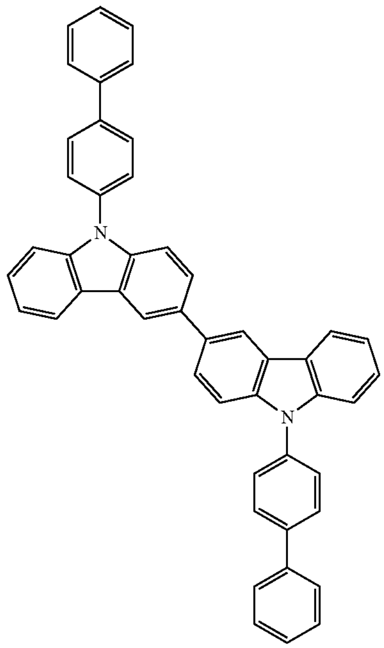

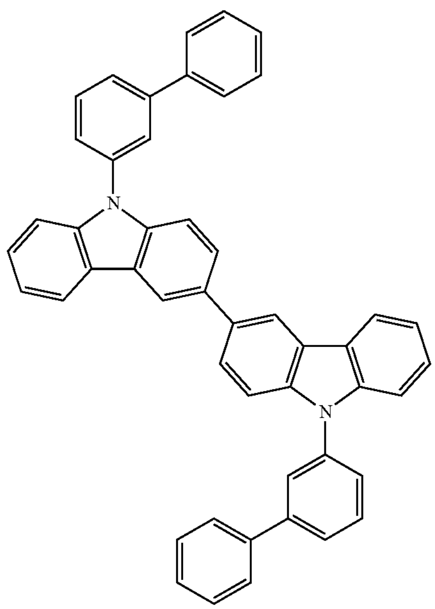

This carbazole derivative can be manufactured using known raw materials and known synthesis methods.

<Triazine Derivative>

The triazine derivative is, for example, a compound represented by the following formula (ETM-10), and preferably a compound represented by the following formula (ETM-10-1). Details are described in US 2011/0156013 A.

(ETM-10)

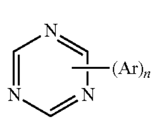

-continued (ETM-10-1)

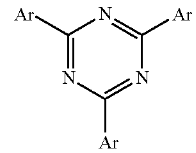

Ar's each independently represent an optionally substituted aryl or an optionally substituted heteroaryl. n represents an integer of 1 to 4, preferably 1 to 3, more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. In addition, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the heteroaryl include pyrrolyl, oxazolyl, isoxazolyl, thiazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, pteridinyl, carbazolyl, acridinyl, phenoxathiinyl, phenoxazinyl, phenothiazinyl, phenazinyl, phenazasilinyl, indolizinyl, furanyl, benzofuranyl, isobenzofuranyl, dibenzofuranyl, naphthobenzofuranyl, thiophenyl, benzothiophenyl, isobenzothiophenyl, dibenzothiophenyl, naphtobenzothiophenyl, benzophosphoryl, dibenzophosphoryl, a monovalent group represented by removing any one hydrogen atom from a benzophosphole oxide ring, a monovalent group represented by removing any one hydrogen atom from a dibenzophosphole oxide ring, furazanyl, thianthrenyl, indolocarbazolyl, benzoindolocarbazolyl, and benzobenzoindolocarbazolyl.

At least one hydrogen of the above aryl and heteroaryl may be substituted, and may be each substituted by, for example, the above aryl or heteroaryl.

Specific examples of this triazine derivative include the following compounds.

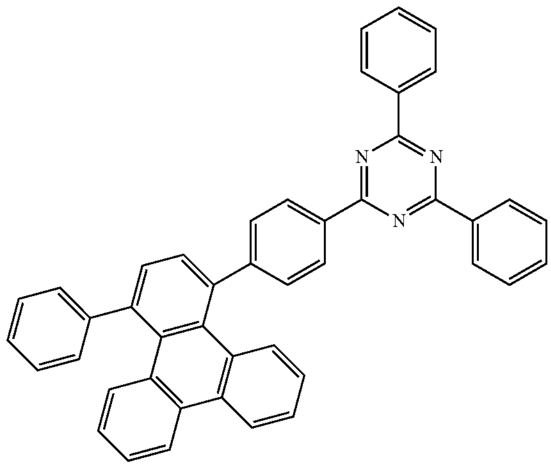

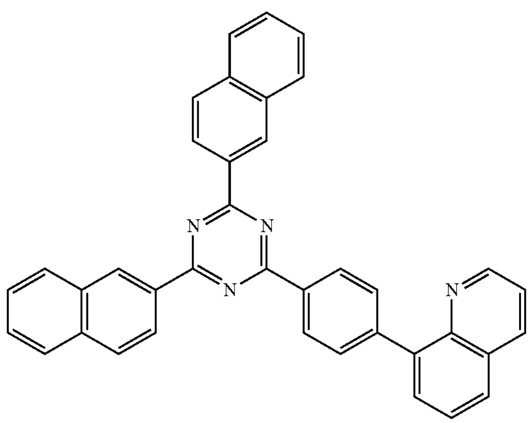

This triazine derivative can be manufactured using known raw materials and known synthesis methods.

<Benzimidazole Derivative>

The benzimidazole derivative is, for example, a compound represented by the following formula (ETM-11).

$\phi$-(Benzimidazole-based substituent)$_n$ (ETM-11)

$\phi$ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "benzimidazole-based substituent" is a substituent in which the pyridyl group in the "pyridine-based substituent" in the formulas (ETM-2), (ETM-2-1), and (ETM-2-2) is substituted by a benzimidazole group, and at least one hydrogen atom in the benzimidazole derivative may be substituted by a deuterium atom.

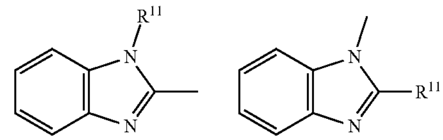

benzimidazole group $R^{11}$ in the above benzimidazole represents a hydrogen atom, an alkyl having 1 to 24 carbon atoms, a cycloalkyl having 3 to 12 carbon atoms, or an aryl having 6 to 30 carbon atoms. The description of $R^{11}$ in the above formulas (ETM-2-1), and (ETM-2-2) can be cited.

Furthermore, $\phi$ is preferably an anthracene ring or a fluorene ring. For the structure in this case, the structure of the above formula (ETM-2-1) or (ETM-2-2) can be cited. For $R^{11}$ to $R^{18}$ in each formula, those described in the above formula (ETM-2-1) or (ETM-2-2) can be cited. In the above formula (ETM-2-1) or (ETM-2-2), a form in which two pyridine-based substituents are bonded has been described. However, when these substituents are substituted by benzimidazole-based substituents, both the pyridine-based substituents may be substituted by benzimidazole-based substituents (that is, n=2), or one of the pyridine-based substituents may be substituted by a benzimidazole-based substituent and the other pyridine-based substituent may be substituted by any one of $R^{11}$ to $R^{18}$ (that is, n=1). Furthermore, for example, at least one of $R^{11}$ to $R^{18}$ in the above formula (ETM-2-1) may be substituted by a benzimidazole-based substituent and the "pyridine-based substituent" may be substituted by any one of $R^{11}$ to $R^{18}$.

Specific examples of this benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

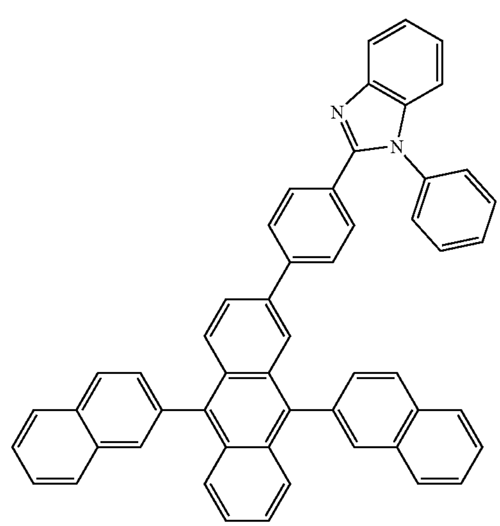

-continued

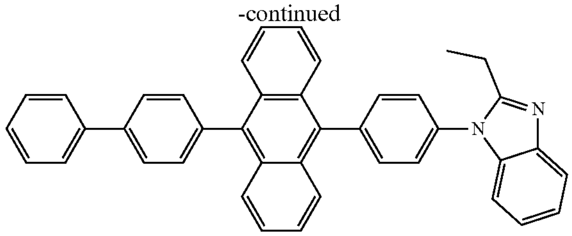

This benzimidazole derivative can be manufactured using known raw materials and known synthesis methods.

<Phenanthroline Derivative>

The phenanthroline derivative is, for example, a compound represented by the following formula (ETM-12) or (ETM-12-1). Details are described in WO 2006/021982 A.

(ETM-12)

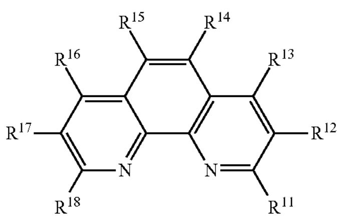

(ETM-12-1)

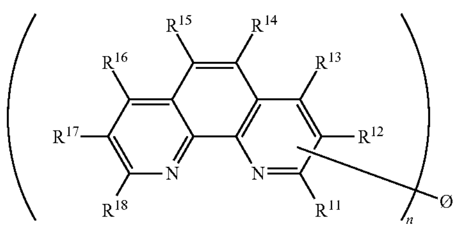

$\phi$ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In each formula, $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms). In the above formula (ETM-12-1), any one of $R^{11}$ to $R^{18}$ is bonded to O which is an aryl ring.

At least one hydrogen atom in each phenanthroline derivative may be substituted by a deuterium atom.

For the alkyl, cycloalkyl, and aryl in $R^{11}$ to $R^{18}$, the description of $R^{11}$ to $R^{18}$ in the above formula (ETM-2) can be cited. In addition to the above, examples of the $\phi$ include those having the following structural formulas. Note that R's in the following structural formulas each independently represent a hydrogen atom, methyl, ethyl, isopropyl, cyclohexyl, phenyl, 1-naphthyl, 2-naphthyl, biphenylyl, or terphenylyl.

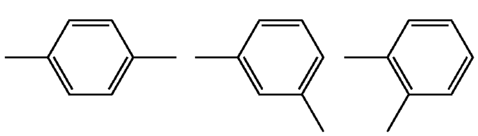

-continued

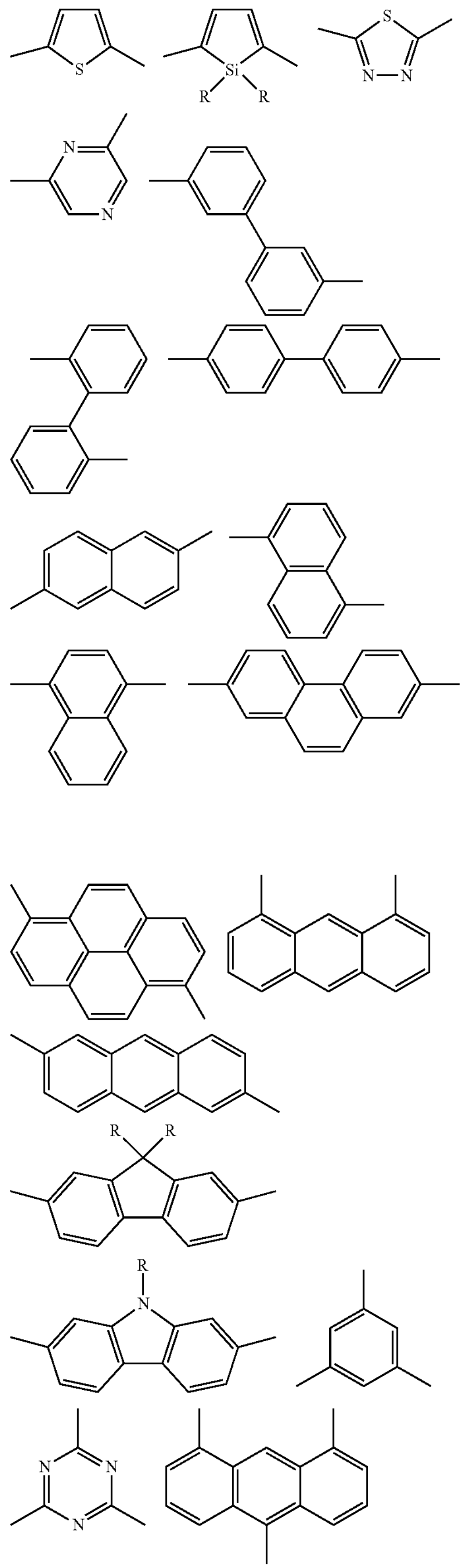

-continued

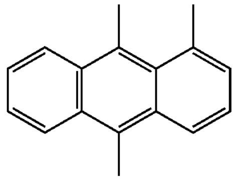

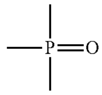

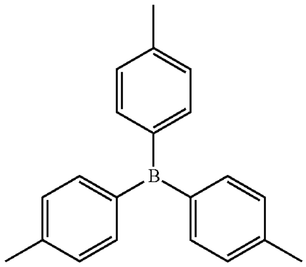

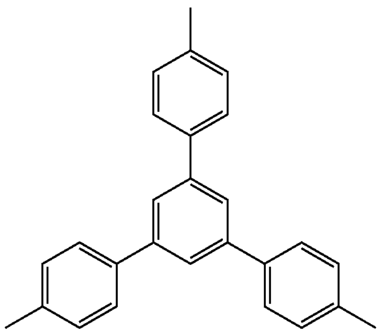

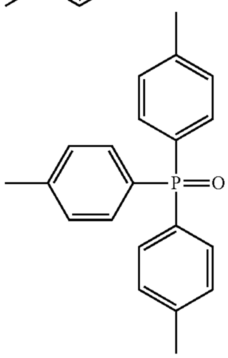

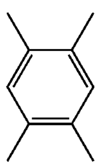

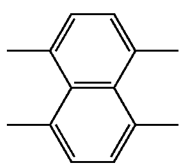

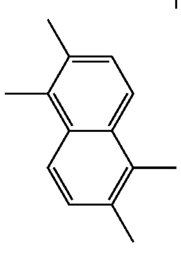

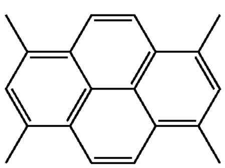

Specific examples of this phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bis(1,10-phenanthrolin-5-yl), bathocuproine, 1,3-bis(2-phenyl-1,10-phenanthrolin-9-yl)benzene, and a compound represented by the following structure.

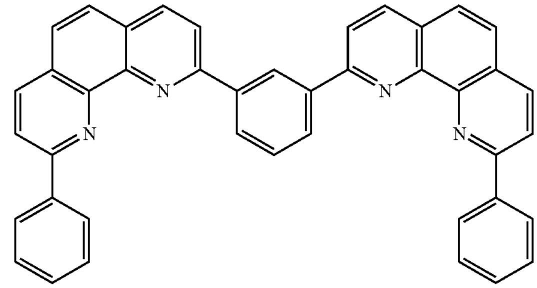 [SMILES: c1ccc(-c2ccc3ccc4ccc(-c5cccc(-c6ccc7ccc8ccc(-c9ccccc9)nc8c7n6)c5)nc4c3n2)cc1]

This phenanthroline derivative can be manufactured using known raw materials and known synthesis methods.

<Quinolinol-Based Metal Complex>

The quinolinol-based metal complex is, for example, a compound represented by the following general formula (ETM-13).

(ETM-13)

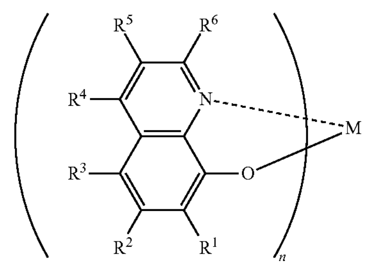

In the formula, $R^1$ to $R^6$ each independently represent a hydrogen atom, a fluorine atom, an alkyl, a cycloalkyl, an aralkyl, an alkenyl, a cyano, an alkoxy, or an aryl, M represents Li, Al, Ga, Be, or Zn, and n represents an integer of 1 to 3.

Specific examples of the quinolinol-based metal complex include 8-quinolinol lithium, tris(8-quinolinolato) aluminum, tris(4-methyl-8-quinolinolato) aluminum, tris(5-methyl-8-quinolinolato) aluminum, tris(3,4-dimethyl-8-quinolinolato) aluminum, tris(4,5-dimethyl-8-quinolinolato) aluminum, tris(4,6-dimethyl-8-quinolinolato) aluminum, bis(2-methyl-8-quinolinolato) (phenolato) aluminum, bis(2-methyl-8-quinolinolato) (2-methylphenolato) aluminum, bis(2-methyl-8-quinolinolato) (3-methylphenolato) aluminum, bis(2-methyl-8-quinolinolato) (4-methylphenolato) aluminum, bis(2-methyl-8-quinolinolato) (2-phenylphenolato) aluminum, bis(2-methyl-8-quinolinolato) (3-phenylphenolato) aluminum, bis(2-methyl-8-quinolinolato) (4-phenylphenolato) aluminum, bis(2-methyl-8-quinolinolato) (2,3-dimethylphenolato) aluminum, bis(2-methyl-8-quinolinolato) (2,6-dimethylphenolato) aluminum, bis(2-methyl-8-quinolinolato) (3,4-dimethylphenolato) aluminum, bis(2-methyl-8-quinolinolato) (3,5-dimethylphenolato) aluminum, bis(2-methyl-8-quinolinolato) (3,5-di-t-butylphenolato) aluminum, bis(2-methyl-8-quinolinolato) (2,6-diphenylphenolato) aluminum, bis(2-methyl-8-quinolinolato) (2,4,6-triphenylphenolato) aluminum, bis(2-methyl-8-quinolinolato) (2,4,6-trimethylphenolato) aluminum, bis(2-methyl-8-quinolinolato)(2,4,5,6-tetramethylphenolato) aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato) aluminum, bis(2,4-dimethyl-8-quinolinolato) (3-phenylphenolato) aluminum, bis(2,4-dimethyl-8-quinolinolato) (4-phenylphenolato) aluminum, bis(2,4-dimethyl-8-quinolinolato) (3,5-dimethylphenolato) aluminum, bis(2,4-dimethyl-8-quinolinolato) (3,5-di-t-butylphenolato) aluminum, bis(2-methyl-8-quinolinolato) aluminum-μ-oxo-bis(2-methyl-8-quinolinolato) aluminum, bis(2,4-dimethyl-8-quinolinolato) aluminum-μ-oxo-bis(2,4-dimethyl-8-quinolinolato) aluminum, bis(2-methyl-4-ethyl-8-quinolinolato) aluminum-μ-oxo-bis(2-methyl-4-ethyl-8-quinolinolato) aluminum, bis(2-methyl-4-methoxy-8-quinolinolato) aluminum-μ-oxo-bis(2-methyl-4-methoxy-8-quinolinolato) aluminum, bis(2-methyl-5-cyano-8-quinolinolato) aluminum-μ-oxo-bis(2-methyl-5-cyano-8-quinolinolato) aluminum, bis(2-methyl-5-trifluoromethyl-8-quinolinolato) aluminum-μ-oxo-bis(2-methyl-5-trifluoromethyl-8-quinolinolato) aluminum, and bis(10-hydroxybenzo[h]quinoline) beryllium.

This quinolinol-based metal complex can be manufactured using known raw materials and known synthesis methods.

<Thiazole Derivative and Benzothiazole Derivative>

The thiazole derivative is, for example, a compound represented by the following formula (ETM-14-1).

$$\phi\text{-(Thiazole-based substituent)}_n \qquad \text{(ETM-14-1)}$$

The benzothiazole derivative is, for example, a compound represented by the following formula (ETM-14-2).

$$\phi\text{-(Benzothiazole-based substituent)}_n \qquad \text{(ETM-14-2)}$$

ϕ in each formula represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "thiazole-based substituent" or a "benzothiazole-based substituent" is a substituent in which the pyridyl group in the "pyridine-based substituent" in the formulas (ETM-2), (ETM-2-1), and (ETM-2-2) is substituted by the following thiazole group or benzothiazole group, and at least one hydrogen atom in the thiazole derivative and the benzothiazole derivative may be substituted by a deuterium atom.

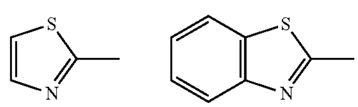

thiazole group benzothiazole group

Furthermore, ϕ is preferably an anthracene ring or a fluorene ring. For the structure in this case, the structure of the above formula (ETM-2-1) or (ETM-2-2) can be cited. For $R^{11}$ to $R^{18}$ in each formula, those described in the above formula (ETM-2-1) or (ETM-2-2) can be cited. In the above formula (ETM-2-1) or (ETM-2-2), a form in which two pyridine-based substituents are bonded has been described. However, when these substituents are substituted by thiazole-based substituents (or benzothiazole-based substituents), both the pyridine-based substituents may be substituted by thiazole-based substituents (or benzothiazole-based substituents) (that is, n=2), or one of the pyridine-based substituents may be substituted by a thiazole-based substituent (or benzothiazole-based substituent) and the other pyridine-based substituent may be substituted by any one of $R^{11}$ to $R^{18}$ (that is, n=1). Furthermore, for example, at least one of $R^{11}$ to $R^{18}$ in the above formula (ETM-2-1) may be substituted by a thiazole-based substituent (or benzothiazole-based substituent) and the "pyridine-based substituent" may be substituted by any one of $R^{11}$ to $R^{18}$.

These thiazole derivatives or benzothiazole derivatives can be manufactured using known raw materials and known synthesis methods.

An electron transport layer or an electron injection layer may further contain a substance that can reduce a material to form an electron transport layer or an electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV), and an alkaline earth metal such as Ca (work function 2.9 eV), Sr (work function 2.0 to 2.5 eV), or Ba (work function 2.52 eV). A reducing substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

<Negative Electrode in Organic Electroluminescent Element>

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to the materials to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and alloys thereof (a magnesium-silver alloy, a magnesium-indium alloy, an aluminum-lithium alloy such as lithium fluoride/aluminum, and the like) are preferable. In order to enhance element characteristics by increasing electron injection efficiency, lithium, sodium, potassium, cesium, calcium, magnesium, or an alloy containing these low work function-metals is effective. However, many of these low work function-metals are generally unstable in air. In order to ameliorate this problem, for example, a method for using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. These method for manufacturing an electrode are not particularly limited as long as being capable of conduction, such as resistance heating, electron beam deposition, sputtering, ion plating, or coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin.

<Method for Manufacturing Organic Electroluminescent Element>

Each layer constituting an organic electroluminescent element can be formed by forming thin films of the materials to constitute each layer by methods such as a vapor deposition method, resistance heating deposition, electron beam deposition, sputtering, a molecular lamination method, a printing method, a spin coating method, a casting method, and a coating method. The film thickness of each layer thus formed is not particularly limited, and can be appropriately set according to a property of a material, but is usually within a range of 2 nm to 5000 nm. The film thickness can be usually measured using a crystal oscillation type film thickness analyzer or the like. In a case of forming a thin film using a vapor deposition method, deposition conditions depend on the kind of a material, an intended crystal structure and association structure of the film, and the like. It is preferable to appropriately set the vapor deposition conditions generally in ranges of a crucible for vapor deposition heating temperature of +50 to +400° C., a degree of vacuum of $10^{-6}$ to $10^{-3}$ Pa, a rate of deposition of 0.01 to 50 nm/sec, a substrate temperature of −150 to +300° C., and a film thickness of 2 nm to 5 μm.

Next, as an example of a method for manufacturing an organic electroluminescent element, a method for manufacturing an organic electroluminescent element formed of positive electrode/hole injection layer/hole transport layer/light emitting layer including a host material and a dopant material/electron transport layer/electron injection layer/negative electrode will be described. A thin film of a positive electrode material is formed on an appropriate substrate by a vapor deposition method or the like to manufacture a positive electrode, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is formed by a vapor deposition method or the like to obtain a negative electrode. An intended organic electroluminescent element is thereby obtained. Incidentally, in manufacturing the above organic electroluminescent element, it is also possible to manufacture the organic electroluminescent element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic electroluminescent element thus obtained, it is only required to apply the voltage by assuming a positive electrode as a positive polarity and assuming a negative electrode as a negative polarity. By applying a voltage of about 2 to 40 V, light emission can be observed from a transparent or semitransparent electrode side (the positive electrode or the negative electrode, or both the electrodes). This organic electroluminescent element also emits light even in a case where a pulse current or an alternating current is applied. Note that a waveform of an alternating current applied may be any waveform.

<Application Examples of Organic Electroluminescent Element>

The present invention can also be applied to a display apparatus including an organic electroluminescent element, a lighting apparatus including an organic electroluminescent element, or the like.

The display apparatus or lighting apparatus including an organic electroluminescent element can be manufactured by a known method such as connecting the organic electroluminescent element according to the present embodiment to a known driving apparatus, and can be driven by appropriately using a known driving method such as direct driving, pulse driving, or alternating driving.

Examples of the display apparatus include panel displays such as color flat panel displays; and flexible displays such as flexible organic electroluminescent (EL) displays (see, for example, JP H10-335066 A, JP 2003-321546 A, JP 2004-281086 A, and the like). Examples of a display method of the display include at least one of a matrix method and a segment method. Note that the matrix display and the segment display may co-exist in the same panel.

The matrix refers to a system in which pixels for display are arranged two-dimensionally as in a lattice form or a mosaic form, and characters or images are displayed by an assembly of pixels. The shape or size of the pixel depends on intended use. For example, for display of images and characters of a personal computer, a monitor, or a television, square pixels each having a size of 300 μm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method or the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-119211 A). The backlight is mainly used for enhancing visibility of a display apparatus that is not self-luminous, and is used in a liquid crystal display apparatus, a timepiece, an audio apparatus, an automotive panel, a display panel, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

In addition, at present, applications of a multicolor technique according to a color conversion system to a liquid crystal display, an organic EL display, lighting, and the like have been actively studied. The color conversion means that the light emitted from a light emitter is converted to light having a longer wavelength (wavelength conversion), and for example, refers to conversion of blue light emission to green light emission or red light emission. By forming a composition having a wavelength conversion function into a film and combining the film with, for example, a blue light source, three primary colors of blue, green, and red can be extracted from the blue light source, that is, white light can be extracted. By using a white light source formed by the combination of such a blue light source and a film having the wavelength conversion function as a light source unit, and by combining the light source unit, a liquid crystal driving part, and a color filter, a full-color display can be produced. In addition, if there is no liquid crystal driving part, the light source unit can be used as it is as a white light source, and can be applied, for example, as a white light source of light-emitting diode (LED) lighting or the like. Further, by using a blue organic EL element as a light source in combination with a film converting to green and red, a full-color organic EL display that does not use a metal mask can be produced. In addition, by using a blue micro-LED as a light source in combination with a film converting to green and red, a full-color micro-LED display can be produced at a low cost.

A polycyclic aromatic compound represented by the above general formula (1) is useful as a fluorescent material that gives blue light emission or green light emission having high color purity by excitation light, and can also be used as a material having such a wavelength conversion function. Specifically, a polycyclic aromatic compound represented by the formula (1) can be used as, for example, a wavelength conversion material that converts light having a wavelength of 300 nm to 449 nm to blue light emission with a narrow half-value width (25 nm or less, or even 20 nm or less) having a maximum value at 450 nm to 500 nm. Further, the polycyclic aromatic compound represented by the formula (1) can be used as, for example, a wavelength conversion material that converts light having a wavelength of 300 nm to 499 nm to green light emission with a narrow half-value width (25 nm or less, or even 20 nm or less) having a maximum value at 500 nm to 570 nm.

A composition having a wavelength conversion function may contain a binder resin, other additive agents, and a solvent in addition to the polycyclic aromatic compound of the formula (1). As the binder resin, for example, resins described in paragraphs [0173] to [0176] of WO 2016/190283 A can be used. As other additive agents, compounds described in paragraphs [0177] to [0181] of WO 2016/190283 A can be used. Further, as the solvent, a solvent that can appropriately dissolve these materials may be used.

A wavelength conversion film contains a wavelength conversion layer formed by curing a composition having a wavelength conversion function. A known film forming method can be referred to as a method for producing a wavelength conversion layer from a composition. The wavelength conversion film may consist only of a wavelength conversion layer formed of a composition containing the polycyclic aromatic compound of the formula (1), or may contain other wavelength conversion layers (for example, a wavelength conversion layer that converts blue light to green light or red light, or a wavelength conversion layer that converts blue light or green light to red light). In addition, the wavelength conversion film may contain a substrate layer, or a barrier layer to prevent a color conversion layer from deteriorating due to oxygen, moisture, or heat.

5-2. Other Organic Devices

The polycyclic aromatic compound according to the present invention can be used for producing an organic field effect transistor, an organic thin film solar cell, or the like, in addition to the organic electroluminescent element described above.

The organic field effect transistor refers to a transistor that controls a current by an electric field generated by voltage input, and is provided with a gate electrode in addition to a source electrode and a drain electrode. The organic field effect transistor is a transistor in which when a voltage is applied to a gate electrode, an electric field is generated, a flow of the electrons (or holes) flowing between a source electrode and a drain electrode is arbitrarily blocked, and thus a current can be controlled. A field effect transistor is easier to be reduced in size as compared with a simple transistor (bipolar transistor), and is frequently used as an element constituting an integrated circuit or the like.

The structure of the organic field effect transistor is sufficient as long as it is usually provided with a source electrode and a drain electrode being in contact with an organic semiconductor active layer that has been formed by using the polycyclic aromatic compound according to the present invention, and further provided with a gate electrode by sandwiching in between an insulating layer (dielectric layer) being in contact with the organic semiconductor active layer. Examples of the element structure include the following structures.

(1) Substrate/gate electrode/insulator layer/source electrode and drain electrode/organic semiconductor active layer
(2) Substrate/gate electrode/insulator layer/organic semiconductor active layer/source electrode and drain electrode
(3) Substrate/organic semiconductor active layer/source electrode and drain electrode/insulator layer/gate electrode
(4) Substrate/source electrode and drain electrode/organic semiconductor active layer/insulator layer/gate electrode The organic field effect transistors constituted as described above can be applied as a pixel drive switching element of an active matrix drive-type liquid crystal display or an organic electroluminescence display, and the like.

The organic thin film solar cell has a structure in which a positive electrode of indium tin oxide (ITO) or the like, a hole transport layer, a photoelectric conversion layer, an electron transport layer, and a negative electrode are stacked in layers on a transparent substrate such as glass. The photoelectric conversion layer has a p-type semiconductor layer on the positive electrode side and an n-type semiconductor layer on the negative electrode side. The polycyclic aromatic compound according to the present invention can be used as a material for a hole transport layer, a p-type semiconductor layer, an n-type semiconductor layer, or an electron transport layer, depending on the physical properties. The polycyclic aromatic compound according to the present invention can function as a hole transport material or an electron transport material in an organic thin film solar cell. The organic thin film solar cell may be appropriately provided, in addition to those described above, with a hole block layer, an electron block layer, an electron injection layer, a hole injection layer, a smoothing layer, and the like. For the organic thin film solar cell, known materials used for an organic thin film solar cell can be appropriately selected and used in combination.

EXAMPLE

Hereinafter, the present invention will be described more specifically by way of Examples, but the present invention is not limited thereto. First, synthesis examples of a polycyclic aromatic compound will be described below.

Synthesis Example (1)

Compound (1-1): Synthesis of 4-(2-(10-phenylanthracene-9-yl)phenyl)-5,9-dioxa-13b-boranaphtho[3,2,1-de]anthracene (1-1)

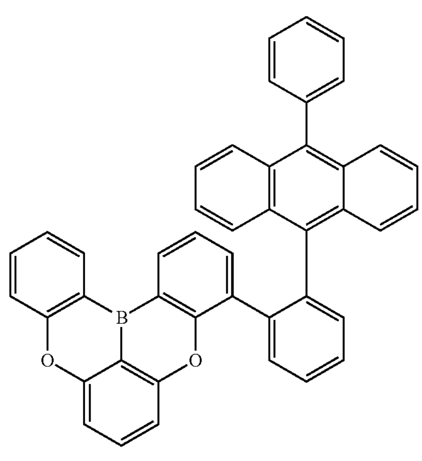

Into a flask, 2-bromo-1-fluoro-3-phenoxybenzene (50 g), 2-chlorophenol (28.9 g), potassium carbonate (77.6 g), and N-methylpyrrolidone (50 ml) were placed, and the mixture in the flask was stirred at a reflux temperature for 6 hours under a nitrogen atmosphere. The reaction mixture was cooled, a solid was removed by filtration, and then the solvent in the filtrate was concentrated under reduced pressure. The obtained oil was diluted with toluene, the diluted oil was washed with water, and the organic layer was concentrated under reduced pressure. The obtained oil was decolorized by using silica gel, and then the solvent was distilled off under reduced pressure to obtain 2-bromo-1-(2-chlorophenoxy)-3-phenoxybenzene as a yellow oil (70 g).

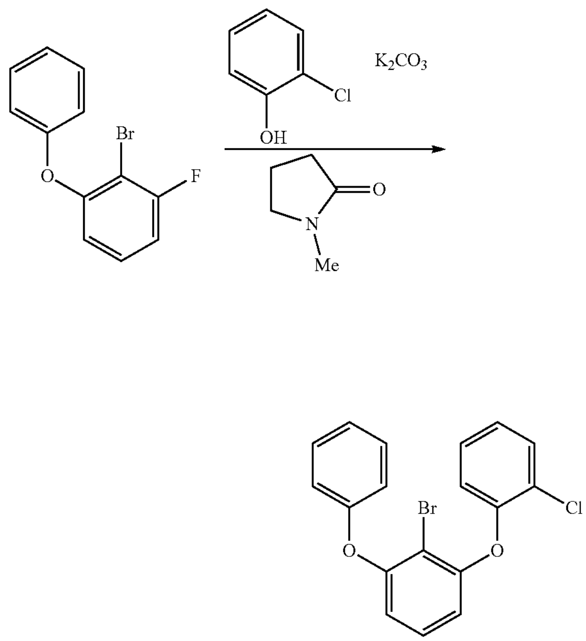

Into a flask, 2-bromo-1-(2-chlorophenoxy)-3-phenoxybenzene (70 g), and tetrahydrofuran (100 ml) were placed, a solution of isopropylmagnesium chloride-lithium chloride complex in tetrahydrofuran (1.1 mol/L, 280 ml) was added dropwise into the mixture in the flask, the resultant mixture was stirred at a room temperature for 3 hours, and further into the thus obtained mixture, 2-isopropoxy-4,4,5,5-tetramethyl-1,3,2-dioxaborolane (69.3 g) was added dropwise, and the obtained resultant mixture was stirred at a room temperature for 2 hours. Into the reaction mixture, water and toluene were added, and the tetrahydrofuran was distilled off under reduced pressure. Into the obtained mixture, dilute hydrochloric acid was added to separate an organic layer, and then the organic layer was washed with water. The thus obtained organic layer was decolorized by using silica gel, and then the solvent was distilled off under reduced pressure to obtain 2-(2-(2-chlorophenoxy)-6-phenoxyphenyl)-4,4,5,5-tetramethyl-1,3,2-dioxaborolane as a light brown oil (73 g).

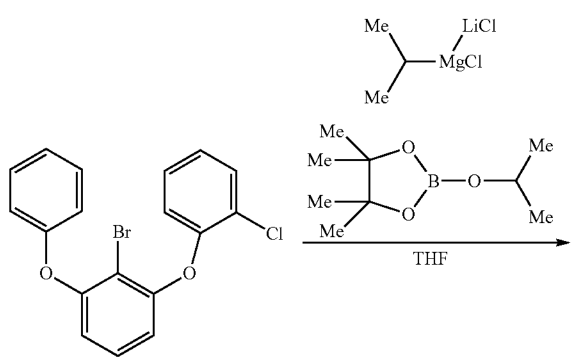

-continued

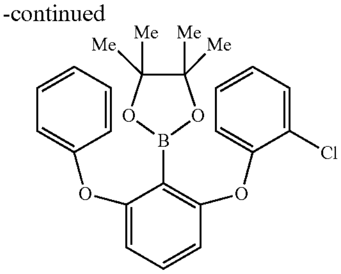

Into a flask, toluene (300 ml), 2-(2-(2-chlorophenoxy)-6-phenoxyphenyl)-4,4,5,5-tetramethyl-1,3,2-dioxaborolane (50 g), and N,N-diisopropylethylamine (15.3 g) were placed, aluminum chloride (158 g) was divided and added into the mixture in the flask, the resultant mixture was heated to 90° C. and stirred at the same temperature for 1 hour. The reaction mixture was cooled, and the cooled mixture was added into ice water. Into the thus obtained mixture, toluene was added to separate an organic layer, and the organic layer was washed with water. The thus obtained organic layer was concentrated under reduced pressure to obtain a solid, the obtained solid was decolorized by using silica gel, and then the solvent was distilled off under reduced pressure to obtain a yellow solid. Further, the obtained solid was recrystallized by using toluene and heptane to obtain 4-chloro-5,9-dioxa-13b-boranaphtho[3,2,1-de]anthracene as a cream-colored solid (22 g)

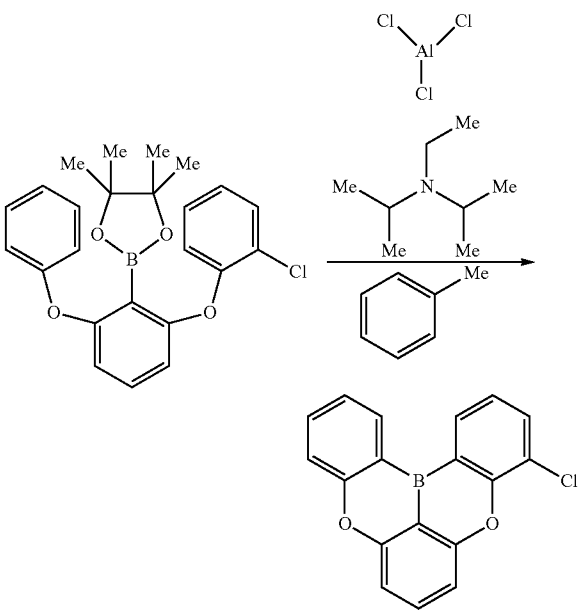

Into a flask, 3-chloro-5,9-dioxa-13b-boranaphtho[3,2,1-de]anthracene (22 g), 4,4,4',4'-5,5,5',5'-octamethyl-2,2'-bi(1,3,2-dioxaborolane) (36.7 g), palladium acetate (0.81 g), potassium acetate (14.2 g), dicyclohexyl(2',6'-dimethoxy-[1,1'-biphenyl]-2-yl)phosphane (5.93 g), potassium carbonate (10 g) and cyclopentyl methyl ether (200 ml) were placed, and the mixture in the flask was stirred at a reflux temperature for 2 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was decolorized by using silica gel, and then the solvent was distilled off under reduced pressure. Further, the thus obtained solid was recrystallized by using toluene and heptane to obtain 3-(4,4,5,5-tetramethyl-1,3,2-dioxaborolane-2-yl)-5,9-dioxa-13b-boranaphtho[3,2,1-de]anthracene as a pale yellow solid (28 g).

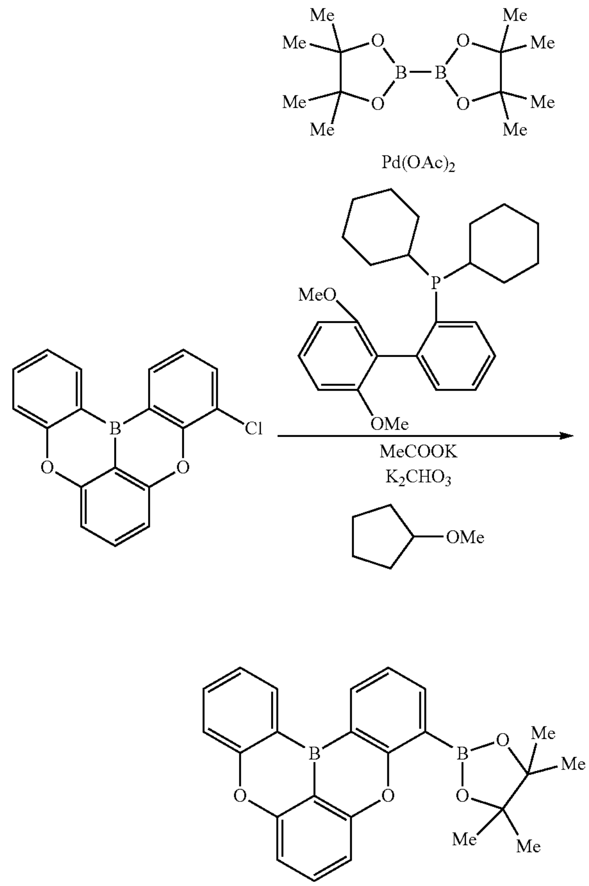 [SMILES: CC1(C)OB(B2OC(C)(C)C(C)(C)O2)OC1(C)C ; Clc1cccc2c1Oc1cccc3c1B2c1ccccc1O3 ; COc1cccc(OC)c1-c1ccccc1P(C1CCCCC1)C1CCCCC1 ; COC1CCCC1 ; CC1(C)OB(c2cccc3c2Oc2cccc4c2B3c2ccccc2O4)OC1(C)C ; "Pd(OAc)2"]

Into a flask, 3-(4,4,5,5-tetramethyl-1,3,2-dioxaborolane-2-yl)-5,9-dioxa-13b-boranaphtho[3,2,1-de]anthracene (28 g), 1,2-dichlorobenzene (16.2 g), palladium acetate (0.81 g), potassium carbonate (20.2 g), dicyclohexyl(2',6'-dimethoxy-[1,1'-biphenyl]-2-yl)phosphane (6 g), tetrabutylammonium bromide (TBAB, 7.1 g), toluene (100 ml), Solmix A-11 (solmix, 20 ml), and water (10 ml) were placed, and the mixture in the flask was stirred at a reflux temperature for 2 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was decolorized by using silica gel, and then the solvent was distilled off under reduced pressure. Further, the obtained solid was washed with Solmix A-11 to obtain 4-(2-chlorophenyl)-5,9-dioxa-13b-boranaphtho[3,2,1-de]anthracene as a pale yellow solid (19.6 g).

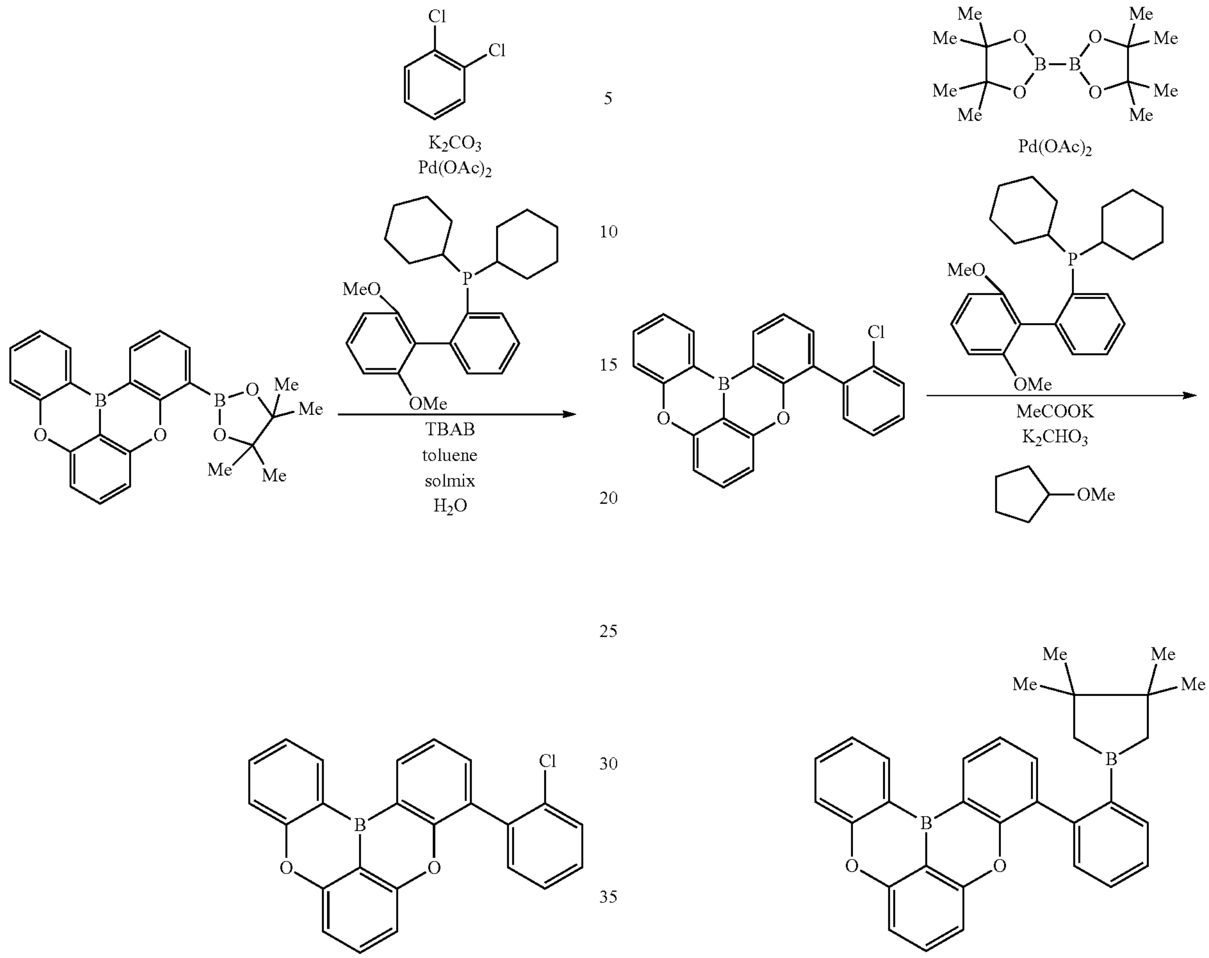

Into a flask, 4-(2-chlorophenyl)-5,9-dioxa-13b-boranaphtho[3,2,1-de]anthracene (19.6 g), 4,4,4',4'-5,5,5',5'-octamethyl-2,2'-bi(1,3,2-dioxaborolane) (19.6 g), palladium acetate (0.58 g), potassium acetate (10.1 g), dicyclohexyl (2',6'-dimethoxy-[1,1'-biphenyl]-2-yl)phosphane (4.23 g), potassium carbonate (7.12 g), and cyclopentyl methyl ether (200 ml) were placed, and the mixture in the flask was stirred at a reflux temperature for 2 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was decolorized by using silica gel, and then the solvent was distilled off under reduced pressure. The resultant solid was dissolved in Solmix A-11, and the insoluble matters were separated by filtration. Heptane was added into the filtrate to obtain 3-(2-(4,4,5,5-tetramethyl-1,3,2-dioxaborolane-2-yl)phenyl)-5,9-dioxa-13b-boranaphtho[3,2,1-de]anthracene as a pale yellow solid (7 g).

Into a flask, 3-(2-(4,4,5,5-tetramethyl-1,3,2-dioxaborolane-2-yl)phenyl)-5,9-dioxa-13b-boranaphtho[3,2,1-de]anthracene (7 g), 9-bromo-10-phenyl anthracene (5.9 g), palladium acetate (0.17 g), potassium carbonate (4.1 g), dicyclohexyl(2',6'-dimethoxy-[1,1'-biphenyl]-2-yl)phosphane (1.2 g), tetrabutylammonium bromide (TBAB, 1.4 g), toluene (50 ml), Solmix A-11 (solmix, 10 ml), and water (5 ml) were placed, and the mixture in the flask was stirred at a reflux temperature for 2 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was purified on silica gel by using toluene and heptane. The solid obtained by concentrating the organic layer containing a target product under reduced pressure was recrystallized by using cyclopentyl methyl ether and Solmix A-11 to obtain a white solid compound (1-1) (0.24 g).

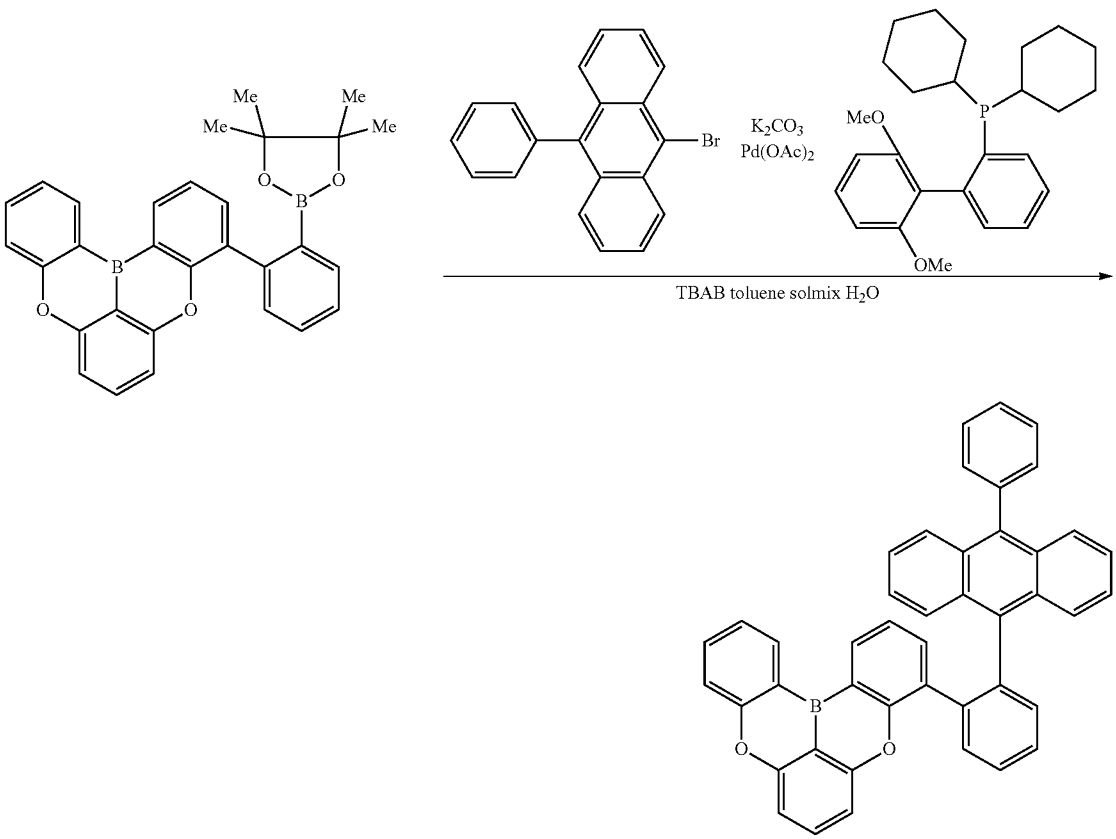

(1-1)

The structure of the obtained compound was confirmed by NMR measurement.

$^1$H-NMR (400 MHz, $CDCl_3$): δ −8.92-8.84 (m, 2H), 7.78-7.72 (m, 4H), 7.63-7.52 (m, 5H), 7.47-7.53 (m, 2H), 7.38-7.25 (m, 8H), 7.16-7.14 (m, 2H), 6.99-6.90 (m, 4H).

Synthesis Example (2)

Compound (1-2): Synthesis of 8-(2-(10-phenylanthracene-9-yl)phenyl)-5,9-dioxa-13b-boranaphtho[3,2,1-de]anthracene (1-2)

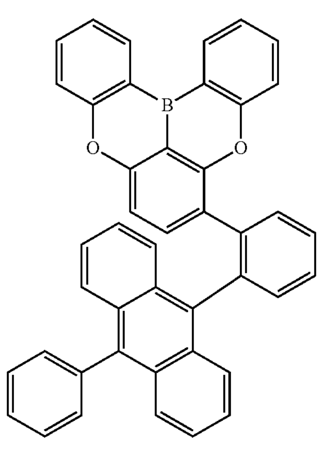

First, into a flask, diphenoxybenzene (26 g), and ortho-xylene (300 ml) were placed, a 1.6 M n-butyllithium hexane solution (75 ml) was added into the mixture in the flask at 0° C. under a nitrogen atmosphere. The resultant mixture was stirred for 30 minutes, and then the mixture was heated to 70° C. and further stirred for 4 hours. The obtained mixture was heated and stirred at 100° C. under a nitrogen stream to distill off the hexane, and then the resultant mixture was cooled to −20° C., boron tribromide (11.4 ml) was added into the cooled mixture, and the obtained mixture was stirred for 1 hour. The resultant mixture was heated to a room temperature and stirred for 1 hour, and then into the obtained mixture, N,N-diisopropylethylamine (34.2 ml) was added, and the resultant mixture was heated and stirred at 120° C. for 5 hours. After that, N,N-diisopropylethylamine (17.1 ml) was added into the obtained mixture, the resultant mixture was filtered by using a Florisil short pass column, and the solvent was distilled off under reduced pressure to obtain a crude product. The crude product was washed by using methanol to obtain 5,9-dioxa-13b-boranaphtho[3,2,1-de]anthracene as a white solid (12.1 g).

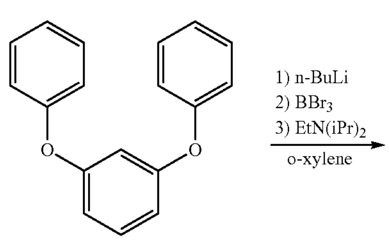

-continued

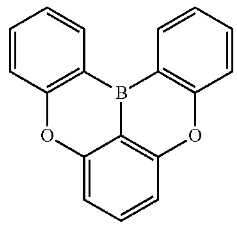

The structure of the obtained compound was confirmed by NMR measurement.

$^1$H-NMR (400 MHz, $CDCl_3$): δ=8.69 (dd, 2H), 7.79 (t, 1H), 7.70 (ddd, 2H), 7.54 (dt, 2H), 7.38 (ddd, 2H), 7.22 (d, 2H).

Next, 5,9-dioxa-13b-boranaphtho[3,2,1-de]anthracene (7 g), N-bromo succinic acid imide (5 g), and tetrahydrofuran (50 ml) were mixed and stirred for 1 hour under a room temperature. Into the reaction mixture, toluene and water were added to separate an organic layer. The organic layer was concentrated under reduced pressure to obtain a solid, the obtained solid was decolorized by using silica gel, and then the solvent was distilled off under reduced pressure to obtain 8-bromo-5,9-dioxa-13b-boranaphtho[3,2,1-de] anthracene as a white solid (8.1 g).

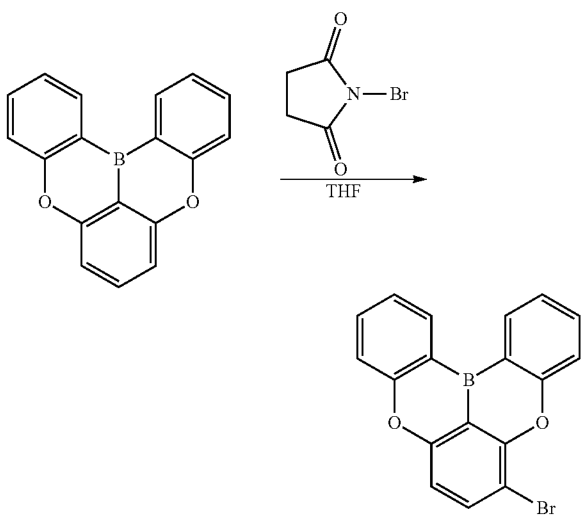

Into a flask, 8-bromo-5,9-dioxa-13b-boranaphtho[3,2,1-de]anthracene (8.1 g), 4,4,4',4'-5,5,5',5'-octamethyl-2,2'-bi (1,3,2-dioxaborolane) (8.8 g), [1,1'-bis(diphenylphosphino) ferrocene]palladium(II) dichloride dichloromethane adduct (1 g), potassium acetate (4.6 g), potassium carbonate (3.2 g) and cyclopentyl methyl ether (50 ml) were placed, and the mixture in the flask was stirred at a reflux temperature for 3 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was decolorized by using silica gel, and then the solvent was distilled off under reduced pressure to obtain 6-(4,4,5,5-tetramethyl-1,3,2-dioxaborolane-2-yl)-5,9-dioxa-13b-boranaphtho[3,2,1-de]anthracene as a white solid (8.7 g).

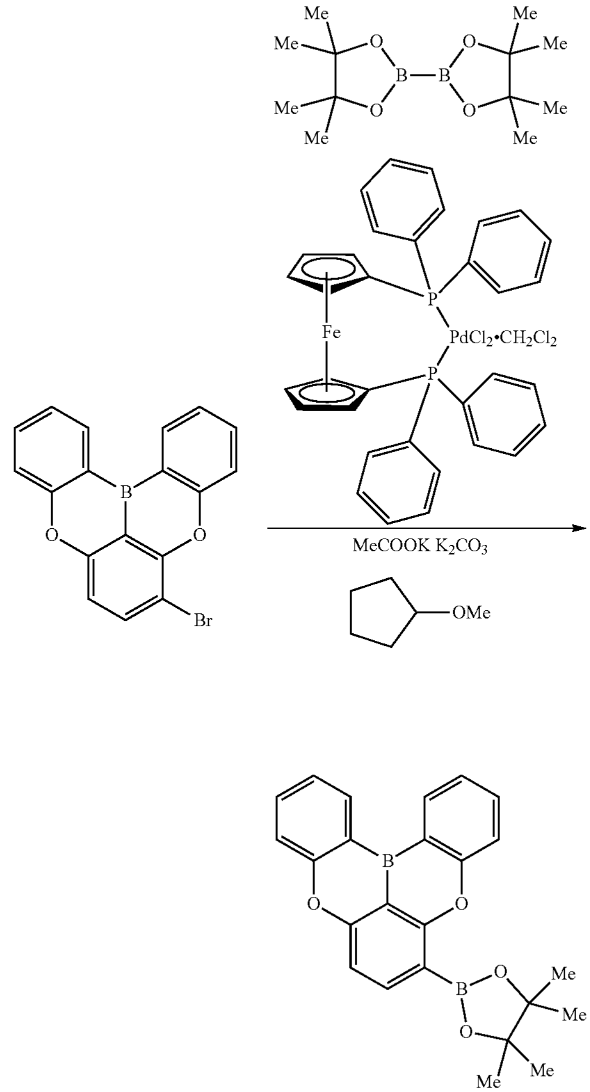

Into a flask, 6-(4,4,5,5-tetramethyl-1,3,2-dioxaborolane-2-yl)-5,9-dioxa-13b-boranaphtho[3,2,1-de]anthracene (8.7 g), 1,2-dichlorobenzene (6.5 g), palladium acetate (0.25 g), potassium carbonate (6.1 g), dicyclohexyl(2',6'-dimethoxy-[1,1'-biphenyl]-2-yl)phosphane (0.9 g), tetrabutylammonium bromide (TBAB, 2.1 g), toluene (80 ml), Solmix A-11 (solmix, 40 ml), and water (10 ml) were placed, and the mixture in the flask was stirred at a reflux temperature for 2.5 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was decolorized by using silica gel, and then the solvent was distilled off under reduced pressure to obtain 8-(2-chlorophenyl)-5,9-dioxa-13b-boranaphtho[3,2,1-de]anthracene as a pale yellow solid (5.8 g).

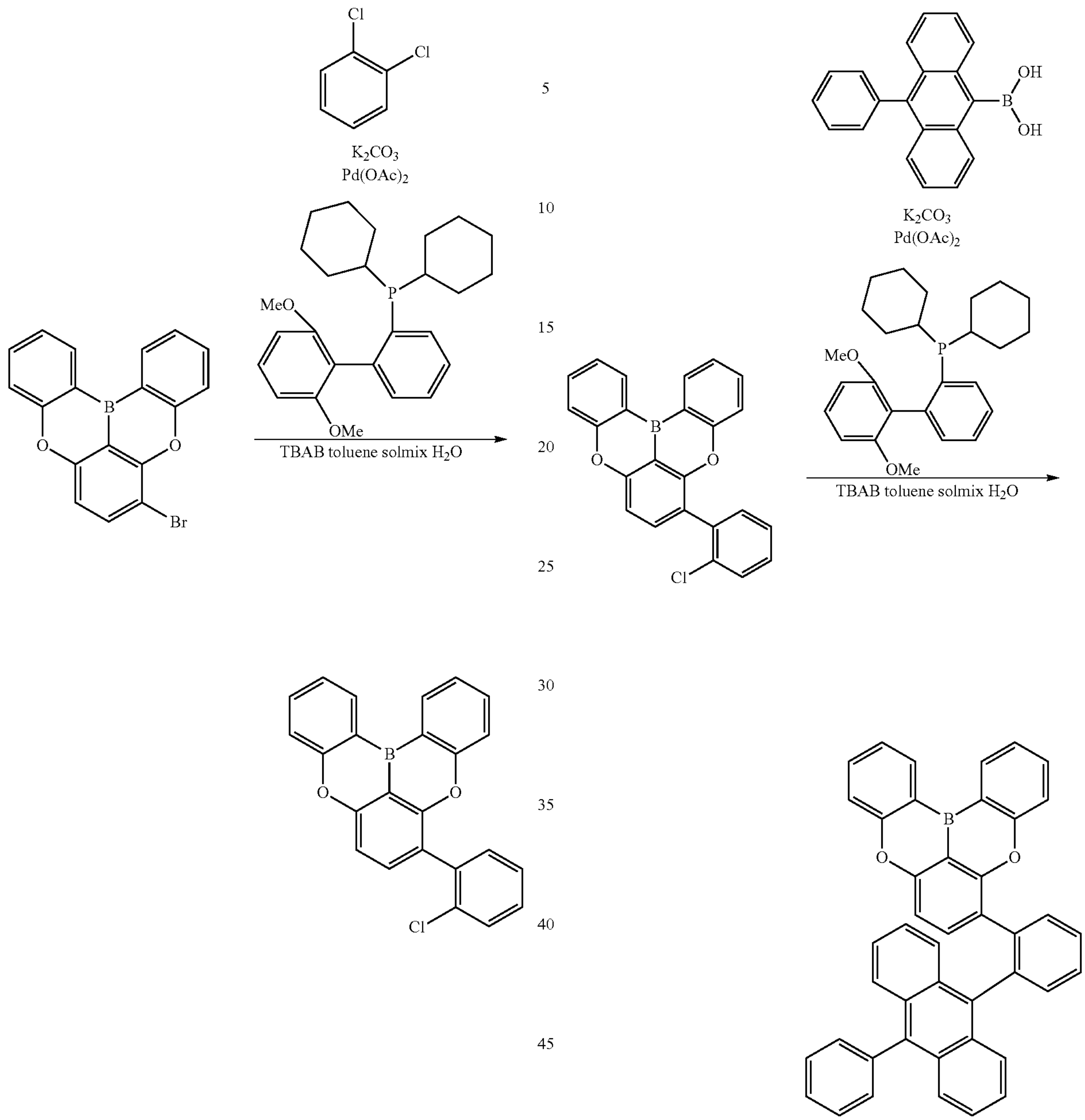

(1-2)

Into a flask, 8-(2-chlorophenyl)-5,9-dioxa-13b-boranaphtho[3,2,1-de]anthracene (5.8 g), (10-phenyl-anthracene-9-yl)boronic acid (9.1 g), palladium acetate (0.17 g), potassium carbonate (4.2 g), dicyclohexyl(2',6'-dimethoxy-[1,1'-biphenyl]-2-yl)phosphane (0.63 g), tetrabutylammonium bromide (TBAB, 1.5 g), toluene (60 ml), Solmix A-11 (solmix, 30 ml), and water (15 ml) were placed, and the mixture in the flask was stirred at a reflux temperature for 4 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was purified on silica gel by using toluene and heptane. Further, the solid obtained by concentrating the organic layer containing a target product under reduced pressure was recrystallized by using cyclopentyl methyl ether and Solmix A-11 to obtain a white solid compound (1-2) (0.48 g).

The structure of the obtained compound was confirmed by NMR measurement.

$^1$H-NMR (400 MHz, $CDCl_3$): δ=8.60-8.56 (m, 2H), 7.91-7.89 (m, 2H), 7.83-7.81 (m, 1H), 7.69-7.64 (m, 3H), 7.59-7.12 (m, 18H), 6.57-6.56 (m, 1H).

Synthesis Example (3)

Compound (1-3): Synthesis of 2-(2-(10-phenylanthracene-9-yl)phenyl)-5,9-dioxa-13b-boranaphtho[3,2,1-de]anthracene (1-3)

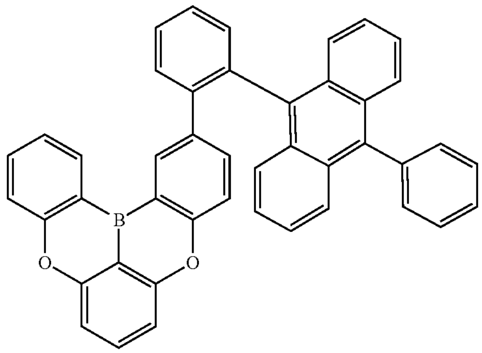

Into a flask, 2-bromo-1-fluoro-3-phenoxybenzene (43.3 g), 4-chlorophenol (25 g), potassium carbonate (44.8 g), and N-methylpyrrolidone (50 ml) were placed, and the mixture in the flask was stirred at a reflux temperature for 42 hours under a nitrogen atmosphere. The reaction mixture was cooled, a solid was removed by filtration, and the solvent in the filtrate was concentrated under reduced pressure. The obtained oil was diluted with toluene, the diluted oil was washed with water, and the organic layer was decolorized by using silica gel and concentrated under reduced pressure. The obtained solid matter was washed with heptane and dried under reduced pressure to obtain 2-bromo-1-(4-chlorophenoxy)-3-phenoxybenzene as a white oil (54.9 g).

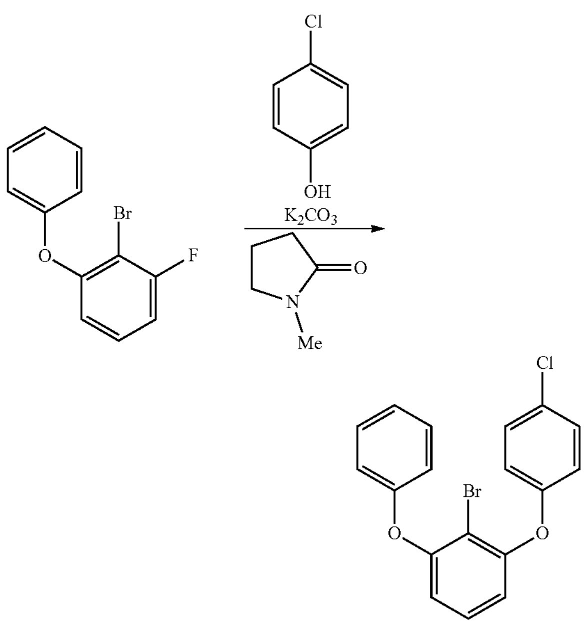

Into a flask, 2-bromo-1-(4-chlorophenoxy)-3-phenoxybenzene (54.8 g), and tetrahydrofuran (250 ml) were placed, a solution of isopropylmagnesium chloride-lithium chloride complex in tetrahydrofuran (1.29 mol/L, 169 ml) was added dropwise into the mixture in the flask, the resultant mixture was stirred at a room temperature for 2 hours, and further into the thus obtained mixture, 2-isopropoxy-4,4,5,5-tetramethyl-1,3,2-dioxaborolane (48.9 g) was added dropwise, and the obtained resultant mixture was stirred at a room temperature for 2 hours. Into the reaction mixture, water and toluene were added, and the tetrahydrofuran was distilled off under reduced pressure. Into the obtained mixture, dilute hydrochloric acid was added to separate an organic layer, and the organic layer was washed with water. The thus obtained organic layer was decolorized by using silica gel, and then the solvent was distilled off under reduced pressure to obtain 2-(2-(4-chlorophenoxy)-6-phenoxyphenyl)-4,4,5,5-tetramethyl-1,3,2-dioxaborolane as a white solid (57.1 g).

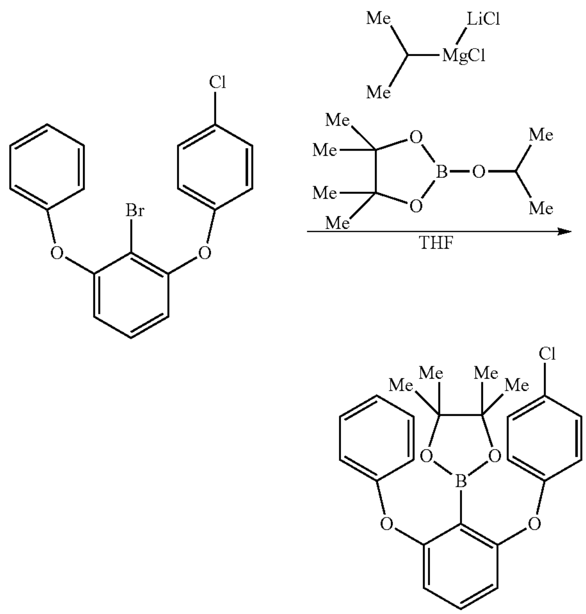

Into a flask, chlorobenzene (450 ml), and aluminum chloride (53.9 g) were placed, the mixture in the flask was heated to 120° C., a solution of 2-(2-(4-chlorophenoxy)-6-phenoxyphenyl)-4,4,5,5-tetramethyl-1,3,2-dioxaborolane (57 g) and chlorobenzene (100 ml) was added into the heated mixture, and the resultant mixture was stirred at the same temperature for 2 hours. The reaction mixture was cooled, and the cooled mixture was added into ice water. The precipitated solid was filtered and washed with Solmix A-11 to obtain a milky white solid. An organic layer separated from the filtrate was concentrated under reduced pressure to obtain a milky white solid. These solids were collectively washed (with heptane/toluene=9/1 (capacity ratio)) to obtain 2-chloro-5,9-dioxa-13b-boranaphtho[3,2,1-de]anthracene as a light-color solid (19.3 g).

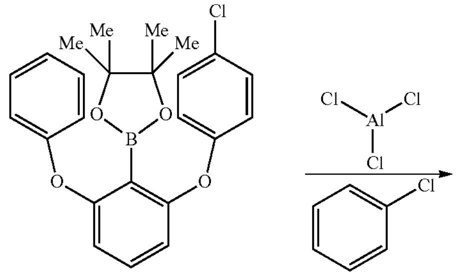

-continued

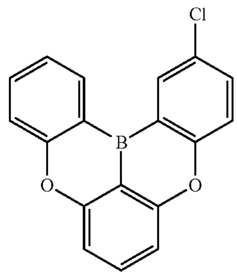

-continued

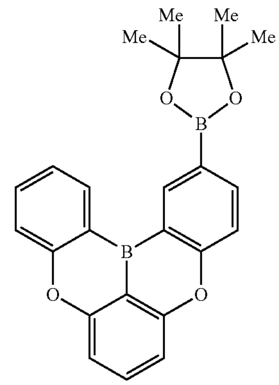

Into a flask, 3-chloro-5,9-dioxa-13b-boranaphtho[3,2,1-de]anthracene (8 g), 4,4,4',4'-5,5,5',5'-octamethyl-2,2'-bi(1,3,2-dioxaborolane) (10 g), palladium acetate (0.29 g), potassium acetate (5.2 g), dicyclohexyl(2',6'-dimethoxy-[1,1'-biphenyl]-2-yl)phosphane (1.1 g), potassium carbonate (3.6 g), and cyclopentyl methyl ether (80 ml) were placed, and the mixture in the flask was stirred at a reflux temperature for 3 hours. The reaction mixture was cooled to a room temperature, a solid was removed by filtration under reduced pressure, and then the solvent in the filtrate was distilled off under reduced pressure. The obtained solid was decolorized by using silica gel, and then the solvent was distilled off under reduced pressure. The obtained solid was washed with Solmix A-11 to obtain 2-(4,4,5,5-tetramethyl-1,3,2-dioxaborolane-2-yl)-5,9-dioxa-13b-boranaphtho[3,2,1-de]anthracene as a pale yellow solid (7.5 g).

Into a flask, 2-(4,4,5,5-tetramethyl-1,3,2-dioxaborolane-2-yl)-5,9-dioxa-13b-boranaphtho[3,2,1-de]anthracene (7.5 g), 1,2-dichlorobenzene (4.2 g), palladium acetate (0.09 g), potassium carbonate (5.2 g), dicyclohexyl(2',6'-dimethoxy-[1,1'-biphenyl]-2-yl)phosphane (0.39 g), tetrabutylammonium bromide (TBAB, 1.8 g), toluene (80 ml), Solmix A-11 (solmix, 40 ml), and water (20 ml) were placed, and the mixture in the flask was stirred at a reflux temperature for 3 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was decolorized by using silica gel, and then the solvent was distilled off under reduced pressure. Further, the obtained solid was washed with Solmix A-11 to obtain 2-(2-chlorophenyl)-5,9-dioxa-13b-boranaphtho[3,2,1-de]anthracene as a pale yellow solid (6.4 g).

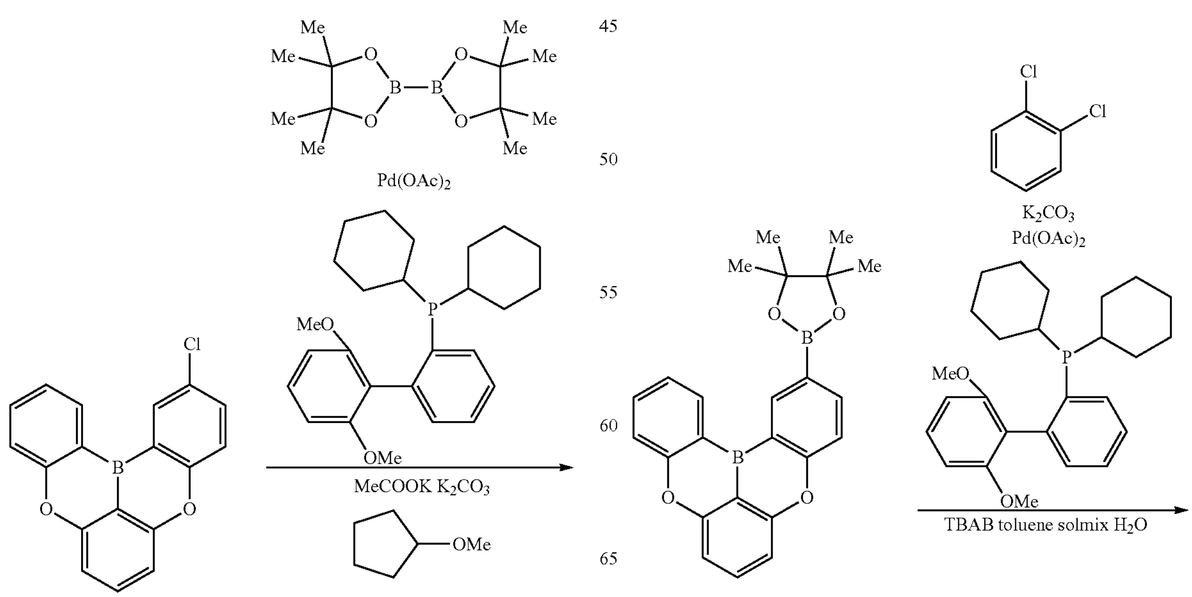

-continued

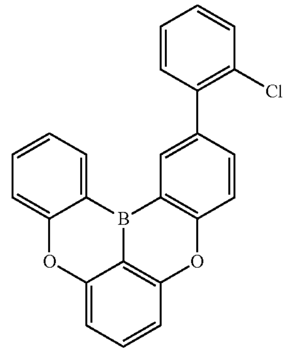

Into a flask, 2-(2-chlorophenyl)-5,9-dioxa-13b-boranaphtho[3,2,1-de]anthracene (6.4 g), (10-phenyl-anthracene-9-yl)boronic acid (6 g), palladium acetate (0.19 g), potassium carbonate (4.7 g), dicyclohexyl(2',6'-dimethoxy-[1,1'-biphenyl]-2-yl)phosphane (0.69 g), tetrabutylammonium bromide (TBAB, 1.6 g), toluene (60 ml), Solmix A-11 (solmix, 30 ml), and water (15 ml) were placed, and the mixture in the flask was stirred at a reflux temperature for 2 hours. The reaction mixture was cooled to a room temperature, water was added into the cooled mixture to separate an organic layer, and then the organic layer was washed with water. The thus obtained organic layer was concentrated under reduced pressure to obtain a solid, the obtained solid was purified on silica gel by using toluene and heptane. Further, the solid obtained by concentrating the organic layer containing a target product under reduced pressure was recrystallized by using toluene and Solmix A-11 to obtain a white solid compound (1-3) (0.88 g).

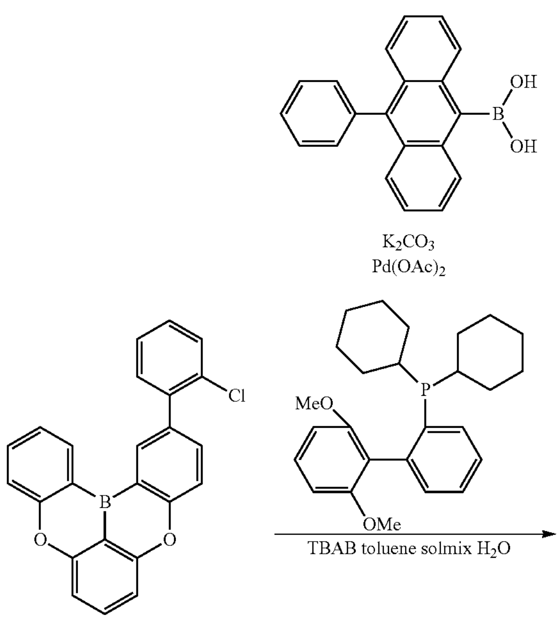

-continued

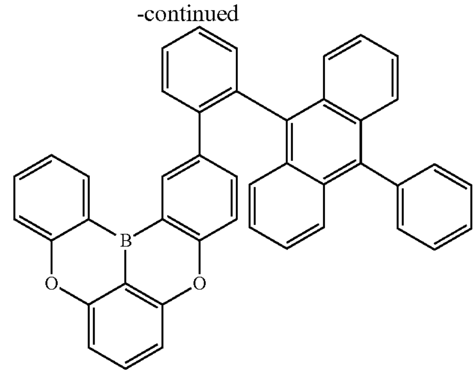

(1-3)

The structure of the obtained compound was confirmed by NMR measurement.

$^1$H-NMR (400 MHz, $CDCl_3$): δ=8.04 (d, 1H), 7.83-7.69 (m, 4H), 7.63-7.49 (m, 7H), 7.43-7.18 (m, 11H), 7.05-6.87 (m, 4H).

The polycyclic aromatic compounds according to the present invention can be synthesized by a method according to Synthesis Examples described above by appropriately changing the compounds of raw materials.

Hereinafter, Examples of an organic EL element using the compound of the present invention will be described in order to describe the present invention in more detail, but the present invention is not limited thereto.

Organic EL elements according to Examples 1 to 3 and Comparative Examples 1 to 2 were manufactured. For each of these elements, voltage (V), emission wavelength (nm), and external quantum efficiency (%) were measured at the time of light emission at 1000 cd/m$^2$. As lifetime of the elements, Time (hr) to retain luminance of 90% or more of the initial luminance was also measured at the time of light emission at a current value of 10 mA/cm$^2$.

The quantum efficiency of a luminescent element includes an internal quantum efficiency and an external quantum efficiency. However, the internal quantum efficiency indicates a ratio at which external energy injected as electrons (or holes) into a light emitting layer of a luminescent element is purely converted into photons. Meanwhile, the external quantum efficiency is a value calculated based on the amount of photons emitted to an outside of the luminescent element. A part of the photons generated in the light emitting layer is absorbed or reflected continuously inside the luminescent element, and is not emitted to the outside of the luminescent element. Therefore, the external quantum efficiency is lower than the internal quantum efficiency.

A method for measuring the external quantum efficiency is as follows. Using a voltage/current generator R6144 manufactured by Advantest Corporation, a voltage at which luminance of an element was 1000 cd/m$^2$ was applied to cause the element to emit light. Using a spectral radiance meter SR-3AR manufactured by TOPCON Co., spectral radiance in a visible light region was measured from a direction perpendicular to a light emitting surface. Assuming that the light emitting surface is a perfectly diffusing surface, a numerical value obtained by dividing a spectral radiance value of each measured wavelength component by wavelength energy and multiplying the obtained value by π is the number of photons at each wavelength. Subsequently, the number of photons was integrated in the observed entire wavelength region, and this number was taken as the total number of photons emitted from the element. A numerical value obtained by dividing an applied current value by an elementary charge is taken as the number of carriers injected into the element. The external quantum efficiency is a numerical value obtained by dividing the total number of photons emitted from the element by the number of carriers injected into the element.

Example 1

A flattening ITO sputter film (manufactured by GEOMATEC Co., Ltd.) having a thickness of 120 nm was film-formed on a glass substrate (manufactured by Opto Science, Inc.) having a size of 26 mm×28 mm×0.7 mm to obtain a transparent support substrate. The transparent support substrate was fixed to a substrate holder of a commercially available vapor deposition apparatus (manufactured by Choshu Industry Co., Ltd.), and vapor deposition boats made of tantalum and containing HI, IL, HT-1, HT-2, a compound (1-1), a compound (2-2619), ET-1 and ET-2, respectively, and vapor deposition boats made aluminum nitride and containing Liq, LiF and aluminum, respectively were mounted on the apparatus.

The following layers were sequentially formed on the ITO film of the transparent support substrate. The pressure in a vacuum chamber was reduced to $5\times10^{-4}$ Pa. First, the HI was heated and deposited so as to have a film thickness of 40 nm, the IL was heated and deposited so as to have a film thickness of 5 nm, the HT-1 was heated and deposited so as to have a film thickness of 45 nm, and the HT-2 was heated and deposited so as to have a film thickness of 10 nm, sequentially on the ITO film to form a positive hole layer formed of the four layers. Next, the compound (1-1) and the compound (2-2619) were heated at the same time and deposited so as to have a film thickness of 25 nm to form a light emitting layer. The deposition rate was adjusted so that the weight ratio of the compound (1-1) to the compound (2-2619) was approximately 98 to 2. Further, the ET-1 was heated and deposited so as to have a film thickness of 5 nm, and then the ET-2 and the Liq were heated at the same time and deposited so as to have a film thickness of 25 nm to form an electron layer formed of the two layers. The deposition rate was adjusted so that the weight ratio of the ET-2 to the Liq was approximately 50 to 50. The deposition rate of each layer was 0.01 to 1 nm/second. After that, the LiF was heated and deposited at a deposition rate of 0.01 to 0.1 nm/second so as to have a film thickness of 1 nm, and then the aluminum was heated and deposited so as to have a film thickness of 100 nm to form a negative electrode, and as a result, an organic EL element was obtained.

When DC voltage was applied by using an ITO electrode as the positive electrode and a LiF/aluminum electrode as the negative electrode, and the characteristics at the time of emission of 1000 cd/m$^2$ were measured, Blue light emission at a wavelength of 462 nm was obtained, the driving voltage was 4.11 V, and the external quantum efficiency was 7.95%. Further, the time for maintaining a luminance of 90% or more of the initial luminance was 108 hours.

Examples 2 to 3 and Comparative Examples 1 to 2

An organic EL element was produced in accordance with Example 1 except that the host material and the dopant material were changed to the materials described in the following Table 1, and the organic EL characteristics were measured in a similar manner as in Example 1.

A material composition of each of the layers in the organic EL elements produced according to Examples 1 to 3 and Comparative Examples 1 to 2 is shown in Table 1.

TABLE 1

| | Hole Injectuion Layer 1 (40 nm) | Hole Injectuion Layer 2 (5 nm) | Hole Transport Layer 1 (45 nm) | Hole Transport Layer 2 (10 nm) | Light Emitting Layer (25 nm) | | Electron Transport Layer 1 (5 nm) | Electron Transport Layer 2 (25 nm) | Negative Electrode (1 nm/ 100 nm) |
|---|---|---|---|---|---|---|---|---|---|
| | | | | | Host | Dopant | | | |
| Example 1 | HI | IL | HT-1 | HT-2 | Compound (1-1) | Compound (2-2619) | ET-1 | ET-2 + Lig | LiF/ Al |
| Example 2 | HI | IL | HT-1 | HT-2 | Compound (1-2) | Compound (2-2619) | ET-1 | ET-2 + Lig | LiF/ Al |
| Example 3 | HI | IL | HT-1 | HT-2 | Compound (1-3) | Compound (2-2619) | ET-1 | ET-2 + Lig | LiF/ Al |
| Comparative Example 1 | HI | IL | HT-1 | HT-2 | EM-1 | Compound (2-2619) | ET-1 | ET-2 + Lig | LiF/ Al |
| Comparative Example 2 | HI | IL | HT-1 | HT-2 | EM-2 | Compound (2-2619) | ET-1 | ET-2 + Lig | LiF/ Al |

In the above Table, the "HI" is N$^4$,N$^{4'}$-diphenyl-N$^4$,N$^{4'}$-bis(9-phenyl-9H-carbazole-3-yl)-[1,1'-biphenyl]-4,4'-diamine, the "IL" is 1,4,5,8,9,12-hexaazatriphenylenehexacarbonitrile, the "HT-1" is N-([1,1'-biphenyl]-4-yl)-9,9-dimethyl-N-(4-(9-phenyl-9H-carbazole-3-yl)phenyl)-9H-fluorene-2-amine, the "HT-2" is N,N-bis(4-(dibenzo[b,d]furan-4-yl)phenyl)-[1,1':4',1"-terphenyl]-4-amine, the "EM-1" is 9-(5,9-dioxa-13b-boranaphtho[3,2,1-de]anthracene-7-yl)-9H-carbazole, the "EM-2" is 9-(4-(5,9-dioxa-13b-boranaphtho[3,2,1-de]anthracene-7-yl)phenyl)-9H-carbazole, the compound (2-2619) is 2,12-di-t-butyl-5,9-bis(4-(t-butyl)phenyl)-7-methyl-5,9-dihydro-5,9-diaza-13b-boranaphtho[3,2,1-de]anthracene, the "ET-1" is 4,6,8,10-tetraphenyl[1,4]benzoxaborinino[2,3,4-kl]phenoxaborinine, and the "ET-2" is 3,3'-((2-phenyl anthracene-9,10-diyl)bis(4,1-phenylene))bis(4-methylpyridine). The chemical structures are shown below together with the "Liq".

HI
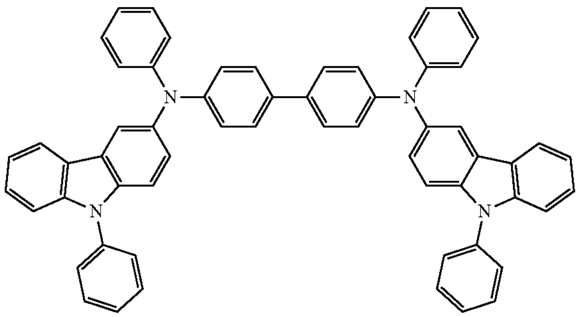
IL
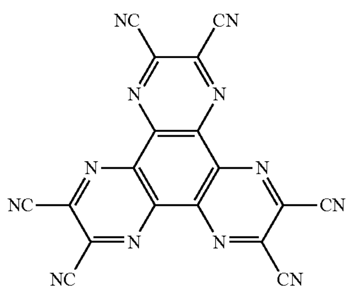
HT-1
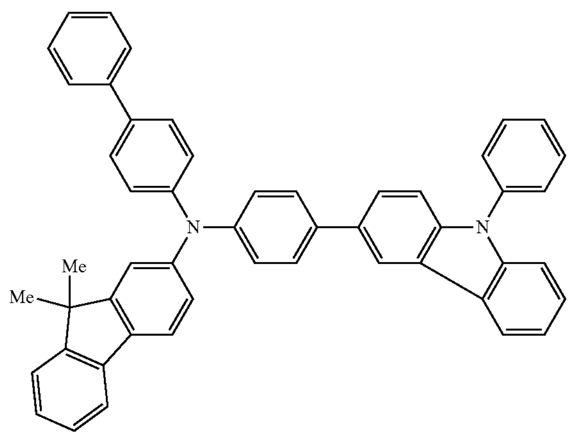
HT-2
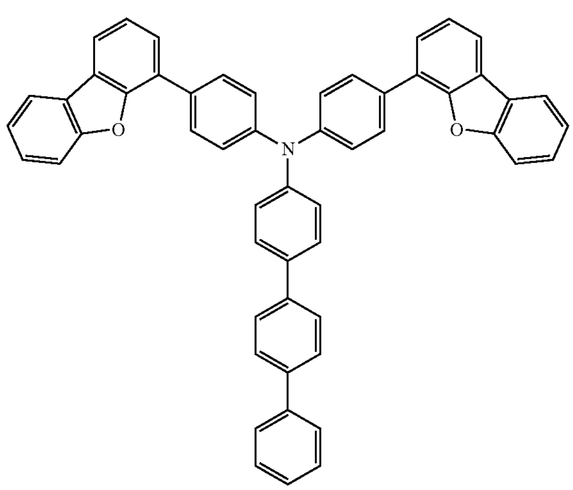
-continued
EM-1
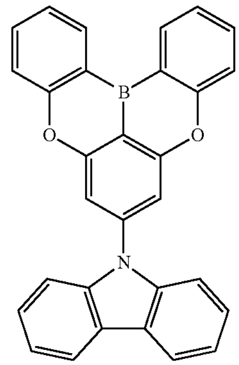
EM-2
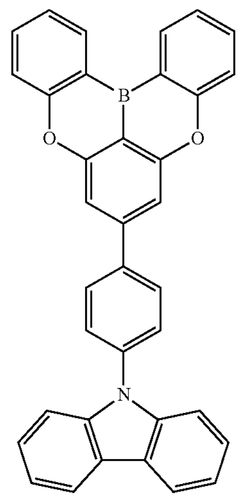
Compound (2-2619)
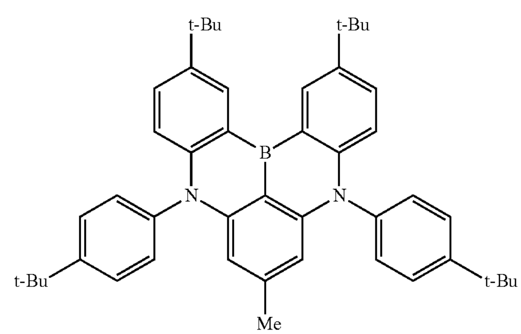
ET-1
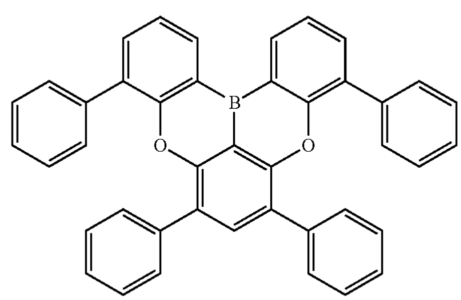

-continued

ET-2

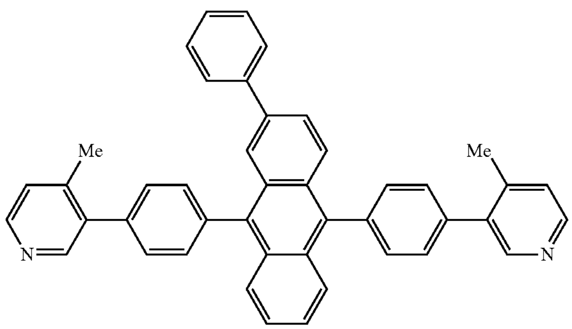

Liq

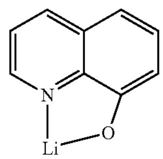

For the organic EL elements produced according to Examples 1 to 3 and Comparative Examples 1 to 2, DC voltage was applied by using an ITO electrode as the positive electrode and a LiF/aluminum electrode as the negative electrode, and the wavelength, driving voltage, external quantum efficiency, and lifetime (time for maintaining a luminance of 90% or more of the initial luminance) at the time of emission of 1000 cd/m$^2$ were measured, and the measurement results are shown in Table 2.

TABLE 2

| | Light Emitting Layer | | Wavelength | Voltage | External Quantum Efficiency | |
|---|---|---|---|---|---|---|
| | Host | Dopant | (nm) | (V) | ( % ) | Lifetime (hr) |
| Example 1 | Compound (1-1) | Compound (2-2619) | 462 | 4.11 | 7.95 | 108 |
| Example 2 | Compound (1-2) | Compound (2-2619) | 461 | 4.28 | 8.30 | 23 |
| Example 3 | Compound (1-3) | Compound (2-2619) | 461 | 4.23 | 8.43 | 158 |
| Comparative Example 1 | EM-1 | Compound (2-2619) | 460 | 3.87 | 6.55 | 3 |
| Comparative Example 2 | EM-2 | Compound (2-2619) | 463 | 3.66 | 5.61 | 12 |

As described above, some of the compounds according to the present invention have been subjected to evaluation as a material for an organic EL element, and shown to be excellent materials for organic devices, and the other compounds that have not been evaluated have the same basic skeletons and are compounds having similar structures as a whole, and it can be understood by those skilled in the art that the other compounds are also excellent materials for organic devices in a similar way.

INDUSTRIAL APPLICABILITY

According to preferable aspects of the present invention, by producing an organic EL element with the use of a material for a light emitting layer containing a polycyclic aromatic compound represented by the formula (1), in particular, a material for a light emitting layer containing at least one of a polycyclic aromatic compound represented by the formula (2) and a polycyclic aromatic compound multimer having a plurality of structures represented by the formula (2), which gives optimum luminescence characteristics in combination of a polycyclic aromatic compound represented by the formula (1), an organic EL element in which one or more of the quantum efficiency and the element lifetime are excellent can be provided.

REFERENCE SIGNS LIST

100 Organic electroluminescent element
101 Substrate
102 Positive electrode
103 Hole injection layer
104 Hole transport layer
105 Light emitting layer
106 Electron transport layer
107 Electron injection layer
108 Negative electrode

The invention claimed is:

1. A polycyclic aromatic compound represented by the following general formula (1)

(1)

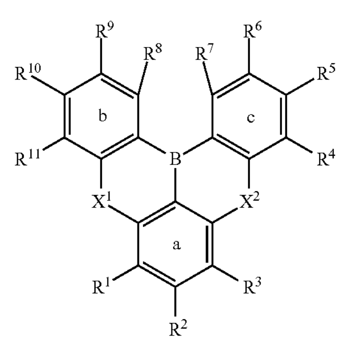

wherein in the above formula (1), $X^1$ and $X^2$ each independently represent >O, >S or >Se, $R^1$ to $R^{11}$ each independently represent a hydrogen atom, an alkyl, a cycloalkyl, or an aryl that may be substituted by an alkyl or a cycloalkyl, adjacent groups among $R^1$ to $R^{11}$ may be bonded to each other to form an aryl ring together with ring a, ring b, or ring c, at least one hydrogen atom in the formed aryl ring may be substituted by an alkyl, a cycloalkyl, or an aryl that may be substituted by an alkyl or a cycloalkyl, and at least one of $R^1$ to $R^{11}$ is independently a group represented by the following formula (Z-1), (Z-1)

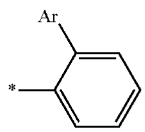

wherein the symbol * represents a bonding position, Ar is a tricyclic or higher fused aryl, at least one hydrogen atom in the fused aryl may be substituted by an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms, and at least one hydrogen atom in the compound represented by the above formula (1) may be substituted by a halogen atom, a cyano or a deuterium atom.

2. The polycyclic aromatic compound described in claim 1, wherein $R^1$ to $R^{11}$ each independently represent a hydrogen atom, an alkyl having 1 to 12 carbon atoms, a cycloalkyl having 3 to 16 carbon atoms, or an aryl having 6 to 18 carbon atoms that may be substituted by an alkyl having 1 to 12 carbon atoms or a cycloalkyl having 3 to 16 carbon atoms, adjacent groups among $R^1$ to $R^{11}$ may be bonded to each other to form an aryl ring having 10 to 20 carbon atoms together with ring a, ring b, or ring c, at least one hydrogen atom in the formed aryl ring may be substituted by an alkyl having 1 to 12 carbon atoms, a cycloalkyl having 3 to 16 carbon atoms, or an aryl having 6 to 18 carbon atoms that may be substituted by an alkyl having 1 to 12 carbon atoms or a cycloalkyl having 3 to 16 carbon atoms, and at least one of $R^1$ to $R^{11}$ is independently a group represented by the above formula (Z-1).

3. The polycyclic aromatic compound described in claim 1, wherein at least one of $R^4$ to $R^{11}$ is independently a group represented by the above formula (Z-1).

4. The polycyclic aromatic compound described in claim 1, wherein Ar is independently a group represented by any one of the following formulas (Ar-1) to (Ar-12), (Ar-1)

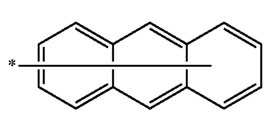

-continued (Ar-2)

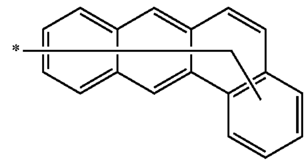

(Ar-3)

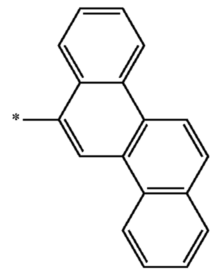

(Ar-4)

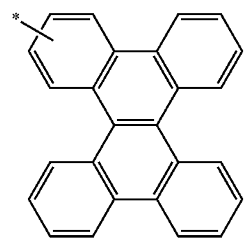

(Ar-5)

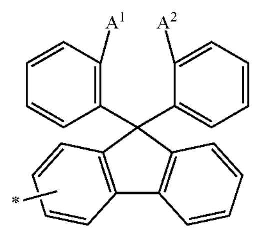

(Ar-6)

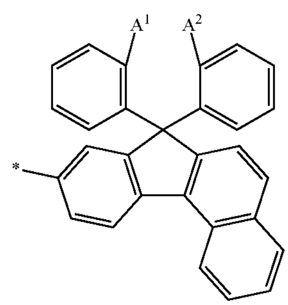

(Ar-7)

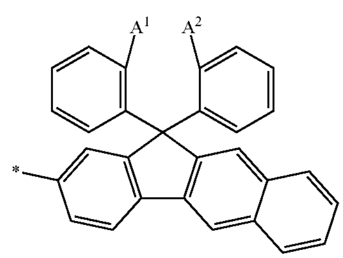

-continued (Ar-8)

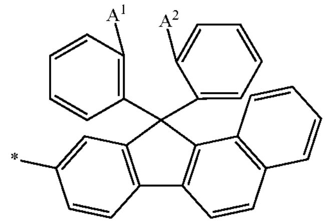

(Ar-9)

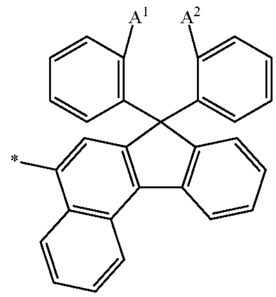

(Ar-10)

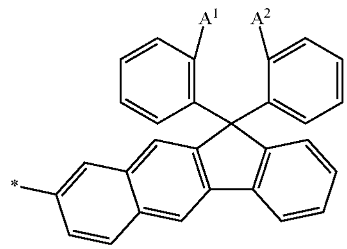

(Ar-11)

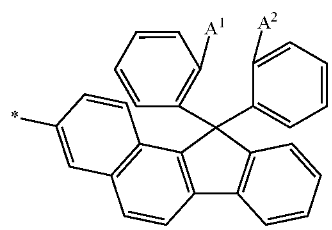

(Ar-12)

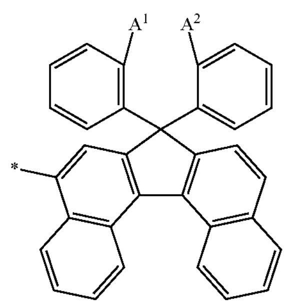

wherein the group represented by any one of the above formulas (Ar-1) to (Ar-12) is bonded to the group represented by the above formula (Z-1) at * in each formula, at least one hydrogen atom in the group represented by any one of the above formulas (Ar-1) to (Ar-12) may be substituted by an alkyl having 1 to 5 carbon atoms, a cycloalkyl having 5 to 10 carbon atoms, an aryl having 6 to 18 carbon atoms that may be substituted by an alkyl having 1 to 5 carbon atoms or a cycloalkyl having 5 to 10 carbon atoms, or a heteroaryl having 2 to 18 carbon atoms that may be substituted by an alkyl having 1 to 5 carbon atoms or a cycloalkyl having 5 to 10 carbon atoms, and $A^1$ and $A^2$ both may be hydrogen atoms, respectively, or may be bonded to each other to form a spiro ring.

5. The polycyclic aromatic compound described in claim 1, wherein Ar is independently a group represented by the following formula (Ar-1-1), (Ar-1-2), (Ar-2-1), (Ar-2-2), (Ar-2-3), (Ar-3-1), (Ar-4-1), (Ar-5-1), (Ar-5-2), (Ar-5-3), (Ar-6-1), (Ar-7-1), (Ar-8-1), (Ar-9-1), (Ar-10-1), (Ar-11-1), or (Ar-12-1), (Ar-1-1)

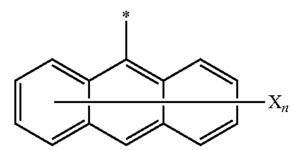

(Ar-1-2)

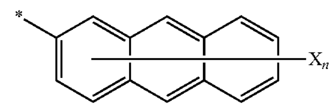

(Ar-3-1)

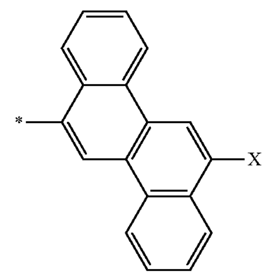

(Ar-2-1)

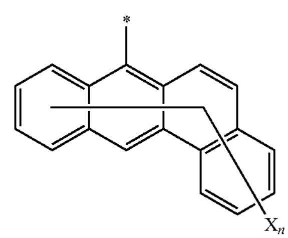

(Ar-2-2)

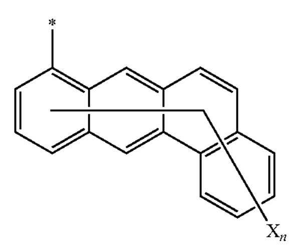

(Ar-2-3)

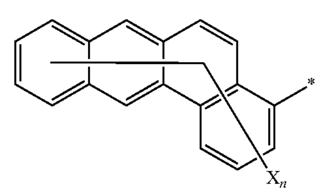

-continued (Ar-4-1)

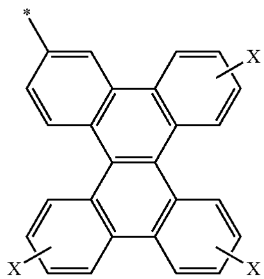

(Ar-5-1)

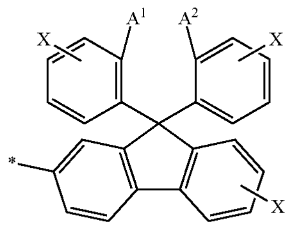

(Ar-5-2)

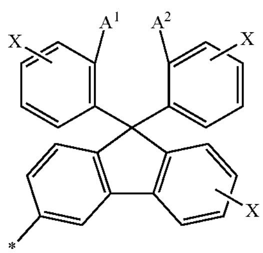

(Ar-5-3)

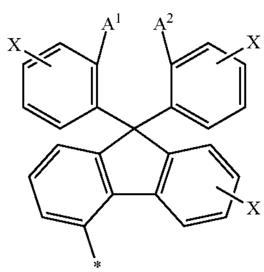

(Ar-6-1)

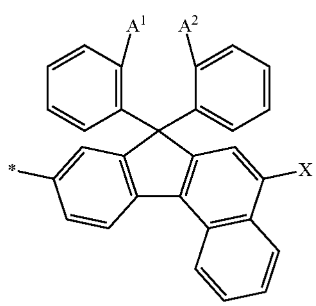

(Ar-7-1)

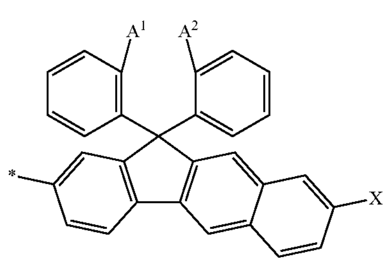

-continued (Ar-8-1)

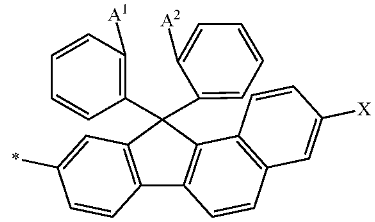

(Ar-9-1)

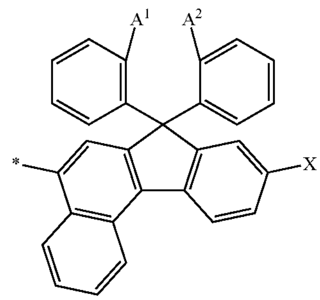

(Ar-10-1)

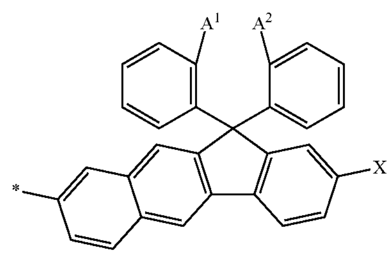

(Ar-11-1)

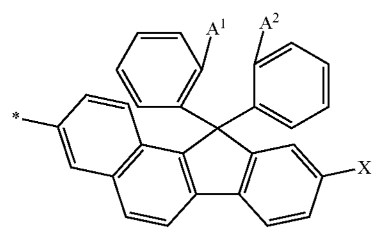

(Ar-12-1)

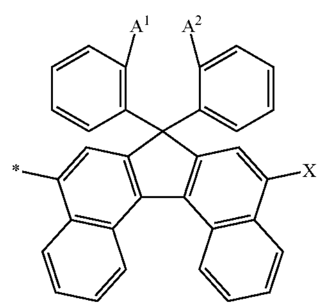

wherein in the above formulas (Ar-1-1) to (Ar-12-1), X independently represents a hydrogen atom, an alkyl having 1 to 5 carbon atoms, a cycloalkyl having 5 to 10 carbon atoms, or an aryl having 6 to 10 carbon atoms that may be substituted by an alkyl having 1 to 5 carbon atoms or a cycloalkyl having 5 to 10 carbon atoms, $A^1$ and $A^2$ both may be hydrogen atoms, respectively, or may be bonded to each other to form a spiro ring, "—Xn" in each of the formulas (Ar-1-1), (Ar-1-2), (Ar-2-1), (Ar-2-2) and (Ar-2-3) represents that n pieces of Xs are each independently bonded to any positions, and n is 1 or 2, and each of the formulas is bonded to the group represented by the above formula (Z-1) at *.

6. The polycyclic aromatic compound described in claim 1, wherein Ar is independently a group represented by the following formula (Ar-1-1a) or (Ar-1-2a), (Ar-1-1a)

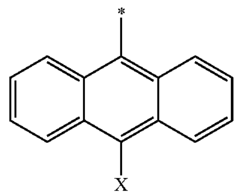

(Ar-1-2a)

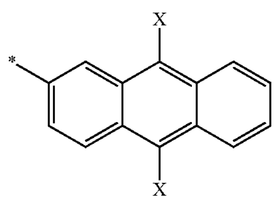

wherein in the above formulas (Ar-1-1a) and (Ar-1-2a), X independently represents a hydrogen atom, an alkyl having 1 to 5 carbon atoms, a cycloalkyl having 5 to 10 carbon atoms, or an aryl having 6 to 10 carbon atoms that may be substituted by an alkyl having 1 to 5 carbon atoms or a cycloalkyl having 5 to 10 carbon atoms, each of the formulas is bonded to the group represented by the above formula (Z-1) at *.

7. The polycyclic aromatic compound described in claim 1, wherein $X^1$ and $X^2$ are each >O.

8. The polycyclic aromatic compound described in claim 1, represented by any one of the following formula (1-1)

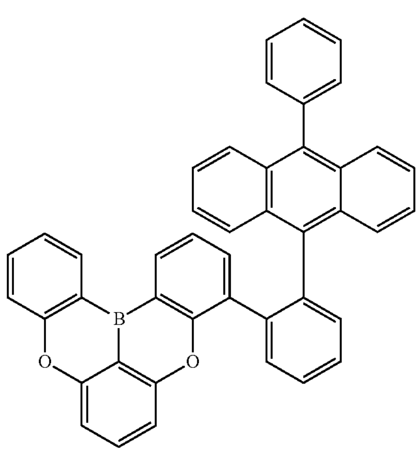

-continued (1-2)

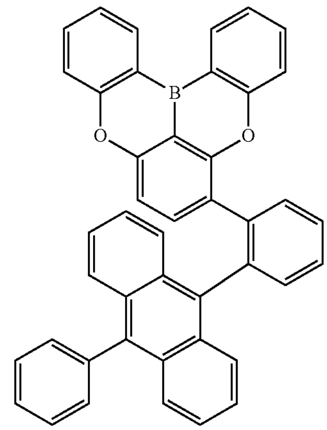

(1-3)

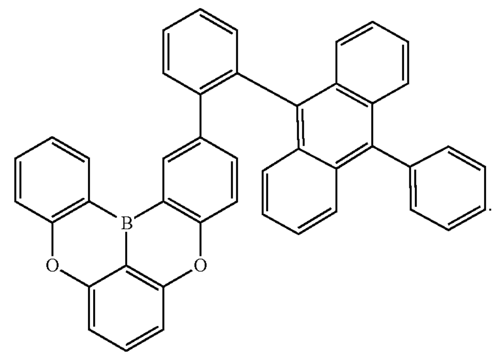

9. A material for an organic device, comprising the polycyclic aromatic compound described in claim 1.

10. The material for an organic device described in claim 9, in which the material for an organic device is a material for an organic electroluminescent element, a material for an organic field effect transistor, or a material for an organic thin film solar cell.

11. The material for an organic device described in claim 10, in which the material for an organic electroluminescent element is a material for a light emitting layer.

12. The material for an organic device described in claim 11, further comprising at least one of a polycyclic aromatic compound represented by the following general formula (2) and a polycyclic aromatic compound multimer having a plurality of structures represented by the following general formula (2), (2)

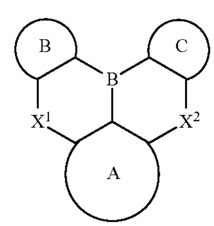

wherein in the above formula (2), ring A, ring B and ring C each independently represent an aryl ring or a heteroaryl ring, and at least one hydrogen atom in these rings may be substituted by a substituent, $X^1$ and $X^2$ each independently represent >O or >N—R, R of the >N—R represents an aryl that may be substituted by a substituent, or a heteroaryl that may be substituted by a substituent, an alkyl that may be substituted by a substituent, or a cycloalkyl that may be substituted by a substituent, and R of the >N—R may be bonded to at least one of the ring A, the ring B and ring C with a linking group or a single bond, and at least one hydrogen atom in a compound or structure represented by the formula (2) may be substituted by a halogen atom, a cyano or a deuterium atom.

13. An organic electroluminescent element, comprising: a pair of electrodes composed of a positive electrode and a negative electrode; and a light emitting layer disposed between the pair of electrodes and comprising the material for an organic device described in claim 11.

14. The organic electroluminescent element described in claim 13, further comprising at least one of an electron transport layer and an electron injection layer disposed between the negative electrode and the light emitting layer, in which at least one of the electron transport layer and the electron injection layer comprises at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex.

15. The organic electroluminescent element described in claim 14, in which at least one of the electron transport layer and the electron injection layer further comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

16. A display apparatus or a lighting apparatus comprising the organic electroluminescent element described in claim 13.

* * * * *